United States Patent
Aoki

(10) Patent No.: US 10,782,619 B2
(45) Date of Patent: Sep. 22, 2020

(54) MOVABLE BODY APPARATUS, MOVING METHOD, EXPOSURE APPARATUS, EXPOSURE METHOD, FLAT-PANEL DISPLAY MANUFACTURING METHOD, AND DEVICE MANUFACTURING METHOD

(71) Applicant: NIKON CORPORATION, Tokyo (JP)

(72) Inventor: Yasuo Aoki, Zushi (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/337,226

(22) PCT Filed: Sep. 29, 2017

(86) PCT No.: PCT/JP2017/035507
§ 371 (c)(1),
(2) Date: Aug. 12, 2019

(87) PCT Pub. No.: WO2018/062497
PCT Pub. Date: Apr. 5, 2018

(65) Prior Publication Data
US 2019/0371643 A1    Dec. 5, 2019

(30) Foreign Application Priority Data

Sep. 30, 2016  (JP) ................................ 2016-195222

(51) Int. Cl.
*G03F 7/20* (2006.01)
(52) U.S. Cl.
CPC ...... *G03F 7/70775* (2013.01); *G03F 7/70716* (2013.01); *G03F 7/70725* (2013.01)
(58) Field of Classification Search
CPC ............ G03F 7/70716; G03F 7/70766; G03F 7/70725; G03F 7/70775
See application file for complete search history.

(56) References Cited

U.S. PATENT DOCUMENTS 5,729,331 A    3/1998 Tanaka et al.
6,552,775 B1   4/2003 Yanagihara et al.
(Continued)

FOREIGN PATENT DOCUMENTS

WO    2010/131485 A1    11/2010
WO    2015/147319 A1    10/2015

OTHER PUBLICATIONS

Dec. 12, 2017 International Search Report issued in International Patent Application No. PCT/JP2017/035507.
(Continued)

*Primary Examiner* — Steven Whitesell Gordon
(74) *Attorney, Agent, or Firm* — Oliff PLC

(57) ABSTRACT

A movable body apparatus is provided with: a substrate holder which holds a substrate and which can move in the X- and Y-axis directions; a Y coarse movement stage which can move in the Y-axis direction; a first measurement system which acquires position information on substrate holder by means of heads provided on substrate holder and a scale provided on Y coarse movement stage; a second measurement system which acquires position information on Y coarse movement stage by means of heads provided on Y coarse movement stage and a scale; and a control system which controls the position of substrate holder based on position information acquired by first and second measurement systems. The first measurement system irradiates a measurement beam while moving heads in X-axis direction with respect to the scale, and second measurement system irradiates a measurement beam while moving heads in Y-axis direction with respect to the scale.

55 Claims, 49 Drawing Sheets

(56) References Cited

U.S. PATENT DOCUMENTS

| | | |
|---|---|---|
| 6,639,686 B1 | 10/2003 | Ohara |
| 7,561,280 B2 | 7/2009 | Schluchter et al. |
| 2005/0236558 A1* | 10/2005 | Nabeshima .......... G05B 19/402 |
| | | 250/221 |
| 2006/0227309 A1* | 10/2006 | Loopstra ............. G03F 7/70775 |
| | | 355/53 |
| 2008/0030702 A1 | 2/2008 | Kawamura |
| 2009/0284723 A1* | 11/2009 | Shibazaki ........... G03F 7/70775 |
| | | 355/53 |
| 2010/0018950 A1 | 1/2010 | Aoki et al. |
| 2010/0266961 A1 | 10/2010 | Kawamura et al. |
| 2012/0057140 A1 | 3/2012 | Aoki |
| 2017/0108716 A1* | 4/2017 | Shirato .................... G03F 7/20 |

OTHER PUBLICATIONS

Dec. 12, 2017 Written Opinion issued in International Patent Application No. PCT/JP2017/035507.

\* cited by examiner

… (1)

MOVABLE BODY APPARATUS, MOVING METHOD, EXPOSURE APPARATUS, EXPOSURE METHOD, FLAT-PANEL DISPLAY MANUFACTURING METHOD, AND DEVICE MANUFACTURING METHOD

TECHNICAL FIELD

The present invention relates to a movable body apparatus, a moving method, an exposure apparatus, an exposure method, a flat-panel display manufacturing method, and a device manufacturing method.

BACKGROUND ART

In a lithography process to manufacture electronic devices (micro-devices) such as a liquid crystal display device or a semiconductor device (such as an integrated circuit), an exposure apparatus is used, which, by exposing a photosensitive glass plate or a wafer (hereinafter collectively called a "substrate") to an illumination light (an energy beam) via a projection optical system (a lens), transfers a predetermined pattern that a mask (photo mask) or a reticle (hereinafter collectively called a "mask") has onto the substrate.

As an exposure apparatus of this kind, since position control of the substrate with respect to the projection optical system has to be performed with high precision, an apparatus is known that uses an encoder system as a position measurement system of the substrate (for example, refer to PTL 1).

Here, in the case of obtaining position information on the substrate using an optical interferometer system, since the optical path of the laser to the bar mirror becomes long, influence of air fluctuation cannot be ignored.

CITATION LIST

Patent Literature

[PTL 1] U.S. Patent Application Publication No. 2010/0266961

SUMMARY OF THE INVENTION

Means for Solving the Problems

According to a first aspect of the present invention, there is provided a movable body apparatus, comprising: a first movable body that holds an object and can move in a first direction and a second direction intersecting with each other; a second movable body that can move in the second direction; a reference member that serves as a reference on movement of the first movable body in the first direction and the second direction; a first measurement system that acquires position information on the first movable body with respect to the reference member with a plurality of first heads and a first grating member, the plurality of first heads being provided at one of the first movable body and the second movable body and the first grating member being provided at the other of the first movable body and the second movable body, the first grating member having measurement components in the first direction and the second direction that allow measurement of a moving range in the first direction of the first movable body by a plurality of grating areas arranged separately from one another in the first direction; a second measurement system that acquires position information on the second movable body with respect to the reference member with a second head and a second grating member, the second head being provided at one of the second movable body and the reference member, the second grating member being provided at the other of the second movable body and the reference member, and the second grating member having measurement components in the first direction and the second direction that allow measurement of a moving range in the second direction of the second movable body; and a control system that controls a position of the first movable body in the first direction and the second direction with respect to the reference member, based on measurement information on at least three heads irradiating at least one of the plurality of grating areas with measurement beams, of the plurality of first heads, and the position information acquired by the second measurement system, wherein the first measurement system acquires the position information on the first movable body by irradiating the first grating member with a measurement beam while the first head is moved in the first direction with respect to the first grating member, the second measurement system acquires the position information on the second movable body by irradiating the second grating member with a measurement beam while the second head is moved in the second direction with respect to the second grating member, during movement of the first movable body in the first direction, the measurement beam of each of the plurality of first heads moves off from one grating area of the plurality of grating areas and switches to another grating area adjacent to the one grating area, and the control system acquires correction information to control movement of the first movable body using another head of the plurality of first heads based on measurement information on the at least three heads, or position information on the first movable body measured using the at least three heads, the another head being different from the at least three heads, and the measurement beam of the another head that has moved off from the one grating area switching to the another grating area.

According to a second aspect of the present invention, there is provided a movable body apparatus, comprising: a first movable body that holds an object and can move in a first direction and a second direction intersecting with each other, a second movable body that can move in the second direction; a reference member that serves as a reference on movement of the first movable body in the first direction and the second direction; a first measurement system that acquires position information on the first movable body with respect to the reference member with a plurality of first heads and a first grating member, the plurality of first heads being provided at one of the first movable body and the second movable body, the first grating member being provided at the other of the first movable body and the second movable body, and the first grating member having measurement components in the first direction and the second direction, a plurality of first grating areas arranged separately from one another in the first direction and a plurality of second grating areas arranged separately in the first direction at a position different from the plurality of first grating areas in the second direction that allow measurement of a moving range in the first direction of the first movable body; a second measurement system that acquires position information on the second movable body with respect to the reference member with a second head and a second grating member, the second head being provided at one of the second movable body and the reference member, the second grating member being provided at the other of the second movable body and the reference member, and the second grating member having measurement components in the first direction and the second direction that allow measurement of a moving range in the second direction of the second movable body; and a control system that controls a position of the first movable body in the first direction and the second direction with respect to the reference member, based on measurement information on at least three heads irradiating at least two of the plurality of the first and the second grating areas with measurement beams, of the plurality of first heads, and the position information acquired by the second measurement system, wherein the first measurement system acquires the position information on the first movable body by irradiating the first grating member with a measurement beam while the first head is moved in the first direction with respect to the first grating member, the second measurement system acquires the position information on the second movable body by irradiating the second grating member with a measurement beam while the second head is moved in the second direction with respect to the second grating member, while the first movable body moves in the first direction, the measurement beam of each of the plurality of first heads moves off from one first or second grating area of the plurality of first grating areas and the plurality of second grating areas, and also switches to another first or second grating area adjacent to the one first or second grating area, and the control system acquires correction information to control movement of the first movable body using another head of the plurality of first heads based on measurement information on the at least three heads, or position information on the first movable body measured using the at least three heads, the another head being different from the at least three heads, and the measurement beam of the another head that has moved off from the one first or second grating area switching to the another first or second grating area.

According to a third aspect of the present invention, there is provided a movable body apparatus that moves an object with respect to a first member, the apparatus comprising: —a first movable body that holds the object and can move with respect to the first member in a first direction and a second direction intersecting each other a second movable body that can move in the second direction with respect to the first member; a drive system that moves the first movable body and the second movable body in the second direction; a first measurement system that acquires position information on the first movable body with respect to the second movable body, by a plurality of first heads provided at one of the first movable body and the second movable body and a first grating member provided at the other of the first movable body and the second movable body, the first grating member having a plurality of first grating areas arranged separately from one another in the first direction; a second measurement system that acquires position information on the second movable body with respect to the first member, by a second head proved provided at one of the second movable body and the first member and a second grating member provided at the other of the second movable body and the first member; and a control system that controls a position of the first movable body in the first direction and the second direction with respect to the first member, based on measurement information on a head irradiating at least one of the plurality of grating areas with the measurement beam, of the plurality of first heads, and the position information acquired by the second measurement system, wherein during movement of the first movable body in the first direction, the measurement beam of each of the plurality of first heads moves off from one grating area of the plurality of first grating areas and switches to another grating area adjacent to the one grating area, and the control system acquires correction information to control movement of the first movable body using another head different from a head whose measurement beam having moved off from the one grating area switches to the another grating area of the plurality of first heads, based on measurement information on the head.

According to a fourth aspect of the present invention, there is provided an exposure apparatus, comprising: the movable body apparatus according to any one of the first to third aspect; and an optical system that irradiates the object with an energy beam, and exposes the object.

According to a fifth aspect of the present invention, there is provided a flat panel display manufacturing method, comprising: exposing a substrate using the exposure apparatus according to the fourth aspect; and developing the substrate that has been exposed.

According to a sixth aspect of the present invention, there is provided a device manufacturing method, comprising: exposing a substrate using the exposure apparatus according to the fourth aspect; and developing the substrate that has been exposed.

According to a seventh aspect of the present invention, there is provided a moving method, comprising: moving a first movable body that holds an object with respect to a reference member in a first direction and a second direction intersecting each other; moving the first movable body in the second direction by a second movable body; acquiring position information on the first movable body with respect to the reference member by a first measurement system having a plurality of first heads and a first grating member, the plurality of first heads being provided at one of the first movable body and the second movable body, the first grating member being provided at the other of the first movable body and the second movable body, and the first grating member having measurement components in the first direction and the second direction that allow measurement of a moving range in the first direction of the first movable body by a plurality of grating areas arranged separately from one another in the first direction; acquiring position information on the second movable body with respect to the reference member by a second measurement system having a second head and a second grating member, the second head being provided at one of the second movable body and the reference member, the second grating member being provided at the other of the second movable body and the reference member, and the second grating member having measurement components in the first direction and the second direction that allow measurement of a moving range in the second direction of the second movable body; and controlling a position of the first movable body in the first direction and the second direction with respect to the reference member, based on measurement information on at least three heads irradiating at least one of the plurality of grating areas with the measurement beams, of the plurality of first heads, and the position information acquired by the second measurement system, wherein in the acquiring by the first measurement system, the position information on the first movable body is acquired by the first measurement system irradiating the first grating member with a measurement beam while the first head is moved in the first direction with respect to the first grating member, in the acquiring by the second measurement system, the position information on the second movable body is acquired by the second measurement system irradiating the second grating member with a measurement beam while the second head is moved in the second direction with respect to the second grating member, during movement of the first movable body in the first direction, the measurement beam of each of the plurality of first heads moves off from one grating area of the plurality of grating areas and switches to another grating area adjacent to the one grating area, and correction information to control movement of the first movable body using another head of the plurality of first heads is acquired based on measurement information on the at least three heads, or position information on the first movable body measured using the at least three heads, the another head being different from the at least three heads, and the measurement beam of the another head that has moved off from the one grating area switching to the another grating area.

According to an eighth aspect of the present invention, there is provided a moving method, comprising: moving a first movable body that holds an object in a first direction and a second direction intersecting each other; moving the first movable body in the second direction by a second movable body; acquiring position information on the first movable body with respect to a reference member serving as a reference on movement of the first movable body in the first direction and the second direction by a first measurement system having a plurality of first heads and a first grating member, the plurality of first heads being provided at one of the first movable body and the second movable body, the first grating member being provided at the other of the first movable body and the second movable body, and the first grating member having measurement components in the first direction and the second direction, a plurality of first grating areas arranged separately from one another in the first direction, and a plurality of second grating areas arranged separately in the first direction at a position different from the plurality of first grating areas in the second direction that allow measurement of a moving range in the first direction of the first movable body; acquiring position information on the second movable body with respect to the reference member by a second measurement system having a second head and a second grating member of, the second head being provided at one of the second movable body and the reference member, the second grating member being provided at the other of the second movable body and the reference member, and the second grating member having measurement components in the first direction and the second direction that allow measurement of a moving range in the second direction of the second movable body; and controlling a position of the first movable body in the first direction and the second direction with respect to the reference member, based on measurement information on at least three heads irradiating at least two of the plurality of first grating areas and the plurality of second grating areas, of the plurality of first heads, and the position information acquired by the second measurement system, wherein in the acquiring by the first measurement system, the position information on the first movable body is acquired by the first measurement system irradiating the first grating member with a measurement beam while moving the first head in the first direction with respect to the first grating member, by in the acquiring by the second measurement system, the position information on the second movable body is acquired by the second measurement system irradiating the second grating member with a measurement beam while moving the second head in the second direction with respect to the second grating member, while the first movable body moves in the first direction, the measurement beam of each of the plurality of first heads moves off from one first or second grating area of the plurality of first grating areas and the plurality of second grating areas, and also switches to another first or second grating area adjacent to the one first or second grating area, and in the controlling, correction information to control movement of the first movable body using another head of the plurality of first heads is acquired based on measurement information on the at least three heads, or position information on the first movable body measured using the at least three heads, the another head being different from the at least three heads and the measurement beam of the another head that has moved off from the one first or second grating area switching to the another first or second grating area.

According to a ninth aspect of the present invention, there is provided a moving method to move an object with respect to a first member, the method comprising: moving a first movable body holding the object with respect to the first member in a first direction and a second direction intersecting each other; moving the first movable body in the second direction with respect to the first member by a second movable body; acquiring position information on the first movable body with respect to the second movable body by a first measurement system having a plurality of first heads and a first grating member, the plurality of first heads being provided at one of the first movable body and the second movable body, the first grating member being provided at the other of the first movable body and the second movable body, and the first grating member having a plurality of first grating areas arranged separately from one another in the first direction; acquiring position information on the second movable body with respect to the first member, by a second measurement system having a second head provided at one of the second movable body and the first member and a second grating member provided at the other of the second movable body and the first member; and controlling a position of the first movable body in the first direction and the second direction with respect to the first member, based on measurement information on a head irradiating at least one of the plurality of grating areas with the measurement beam, of the plurality of first heads and the position information acquired by the second measurement system, wherein in the acquiring by the first measurement system, during movement of the first movable body in the first direction, the measurement beam of each of the plurality of first heads moves off from one grating area of the plurality of grating areas and switches to another grating area adjacent to the one grating area, and in the controlling, correction information to control movement of the first movable body using another head different from a head whose measurement beam having moved off from the one grating area switches to the another grating area of the plurality of heads, is acquired based on measurement information on the head.

According to a tenth aspect of the present invention, there is provided an exposure method, comprising: moving the object in the first direction by the moving method according to the seventh to the ninth aspect; and irradiating the object moved in the first direction with an energy beam, and exposing the object.

According to an eleventh aspect of the present invention, there is provided a flat-panel display manufacturing method, comprising: exposing a substrate, as the object, using the exposure method according to the tenth aspect; and developing the substrate that has been exposed.

According to a twelfth aspect of the present invention, there is provided a device manufacturing method, comprising: exposing a substrate, as the object, using the exposure method according to the tenth aspect; and developing the substrate that has been exposed.

MODE FOR CARRYING OUT THE INVENTION

First Embodiment

Hereinafter, a first embodiment will be described, using FIGS. 1 to 6.

Figure 1:
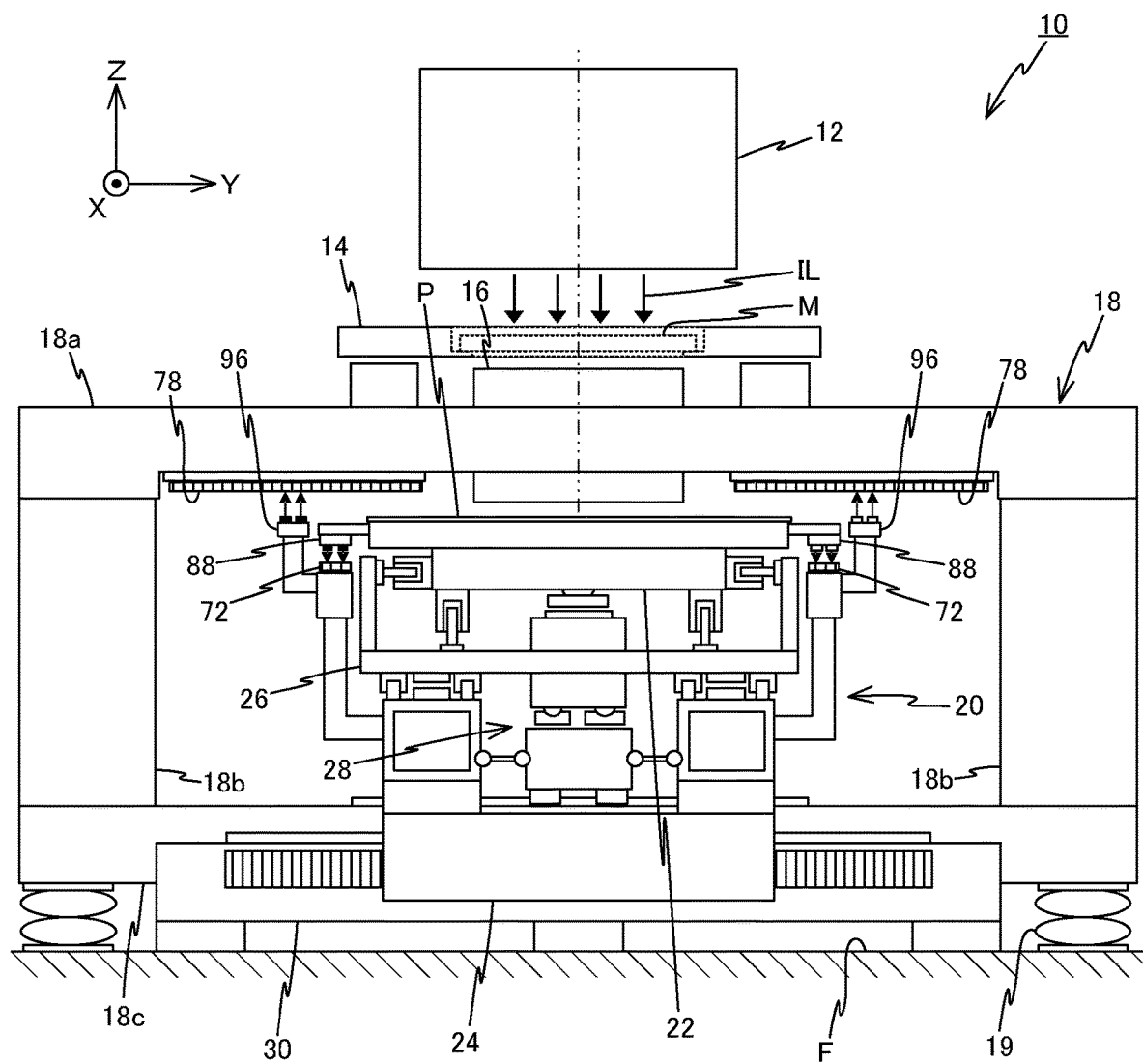
FIG. 1 is a view schematically showing a structure of a liquid crystal exposure apparatus according to a first embodiment.

FIG. 1 schematically shows a structure of an exposure apparatus (here, liquid crystal exposure apparatus 10) according to the first embodiment. Liquid crystal exposure apparatus 10 is a projection exposure apparatus of a step-and-scan method, or a so-called scanner, whose exposure target is an object (here, a glass substrate P). Glass substrate P (hereinafter, simply referred to as "substrate P") is formed in a rectangular shape (square shape) in a planar view, and is used in liquid crystal display devices (flat-panel displays) and the like.

Liquid crystal exposure apparatus 10 has an illumination system 12, a mask stage device 14 that holds a mask M on which a circuit pattern and the like is formed, a projection optical system 16, an apparatus main section 18, a substrate stage device 20 that holds substrate P whose surface (a surface facing a +Z side in FIG. 1) is coated with a resist (sensitive agent), a control system for these parts and the like.

Hereinafter, a direction in which mask M and substrate P are each relatively scanned with respect to projection optical system 16 at the time of exposure will be described as an X-axis direction, a direction orthogonal to the X-axis direction in a horizontal plane will be described as a Y-axis direction, a direction orthogonal to the X-axis and the Y-axis will be described as a Z-axis direction (a direction parallel to an optical axis direction of projection optical system 16), and rotation directions around the X-axis, the Y-axis, and the Z-axis will each be described as a θx direction, a θy direction, and a θz direction. Also, position in the X-axis, the Y-axis, and the Z-axis directions will each be described as an X position, a Y position, and a Z position.

Illumination system 12 is structured similarly to the illumination system disclosed in U.S. Pat. No. 5,729,331 and the like, and irradiates mask M with a light emitted from a light source not shown (such as a mercury lamp, or a laser diode) serving as an exposure illumination light (illumination light) IL, via a reflection mirror, a dichroic mirror, a shutter, a wavelength selection filter, various kinds of lenses and the like each of which are not shown. As illumination light IL, light such as an i-line (wavelength 365 nm), a g-line (wavelength 436 nm), or an h-line (wavelength 405 nm) (or, a synthetic light of the i-line, the g-line, and the h-line described above) is used.

As mask M that mask stage device 14 holds, a transmission type photomask is used. On the lower surface (a surface facing the −Z side in FIG. 1) of mask M, a predetermined circuit pattern is formed. Mask M is moved in predetermined long strokes in a scanning direction (the X-axis direction) and also is finely moved appropriately in the Y-axis direction and the θz direction by a main controller 100, via a mask drive system 102 including a linear motor, an actuator such as a ball screw device and the like (each of which are not shown in FIG. 1, refer to FIG. 6). Position information (including rotation amount information in the θz direction; the same applies hereinafter) of mask M within an XY plane is obtained by main controller 100 (each of which are not shown in FIG. 1, refer to FIG. 6), via a mask measurement system 104 including an encoder system or a measurement system such as an interferometer system.

Projection optical system 16 is arranged below mask stage device 14. Projection optical system 16 is a so-called multilens projection optical system having a structure similar to the projection optical system disclosed in U.S. Pat. No. 6,552,775 and the like, and is equipped with a plurality of lens modules that form an upright normal image with a double telecentric equal magnifying system.

In liquid crystal exposure apparatus 10, when illumination light IL illuminates an illumination area on mask M, illumination light IL having passed through (transmitted) mask M a projection image (partial upright image) of the circuit pattern of mask M within the illumination area is formed on an irradiation area (exposure area) of the illumination light on substrate P conjugate with the illumination area, via projection optical system 16. Then by mask M relatively moving in the scanning direction with respect to illumination area (illumination light IL) along with substrate P relatively moving in the scanning direction with respect to the exposure area (illumination light IL), scanning exposure of one shot area on substrate P is performed, and the pattern formed on mask M is transferred on the shot area.

Apparatus main section 18 supports mask stage device 14 and projection optical system 16, and is installed on a floor F in a clean room via a vibration isolation device 19. Apparatus main section 18 is structured similarly to the apparatus main section disclosed in U.S. Patent Application Publication No. 2008/0030702, and has an upper mount section 18a, a pair of middle mount section 18b, and a lower mount section 18c. Since upper mount section 18a is a member that supports projection optical system 16, hereinafter, in the embodiment, upper mount section 18a will be referred to and described as "optical surface plate 18a." Here, in the scanning exposure operation using liquid crystal exposure apparatus 10 in the embodiment, since position control of substrate P is performed with respect to illumination light IL irradiated via projection optical system 16, optical surface plate 18a that supports projection optical system 16 functions as a reference member when performing position control of substrate P.

Substrate stage device 20 is a device used to perform position control of substrate P with high precision with respect to projection optical system 16 (illumination light IL), that moves substrate P along a horizontal plane (the X-axis direction and the Y-axis direction) in predetermined long strokes and also finely moves substrate P in directions of six degrees of freedom. While the structure of the substrate stage device used in liquid crystal exposure apparatus 10 is not limited in particular, in the first embodiment, as an example, a substrate stage device 20 of a so-called coarse/fine movement structure is used that includes a gantry type two-dimensional coarse movement stage and a fine movement stage which is finely moved with respect to the two-dimensional coarse movement stage, as is disclosed in U.S. Patent Application Publication No. 2012/0057140 and the like.

Substrate stage device 20 is equipped with; a fine movement stage 22, a Y coarse movement stage 24, an X coarse movement stage 26, a support section (a weight canceling device 28 here) 22, a pair of base frames 30 (one of the pair is not shown in FIG. 1, refer to FIG. 4), a substrate drive system 60 (not shown in FIG. 1, refer to FIG. 6) used to move each component structuring substrate stage device 20, a substrate measurement system 70 (not shown in FIG. 1, refer to FIG. 6) used to measure position information on each component described above and the like.

Figure 2:
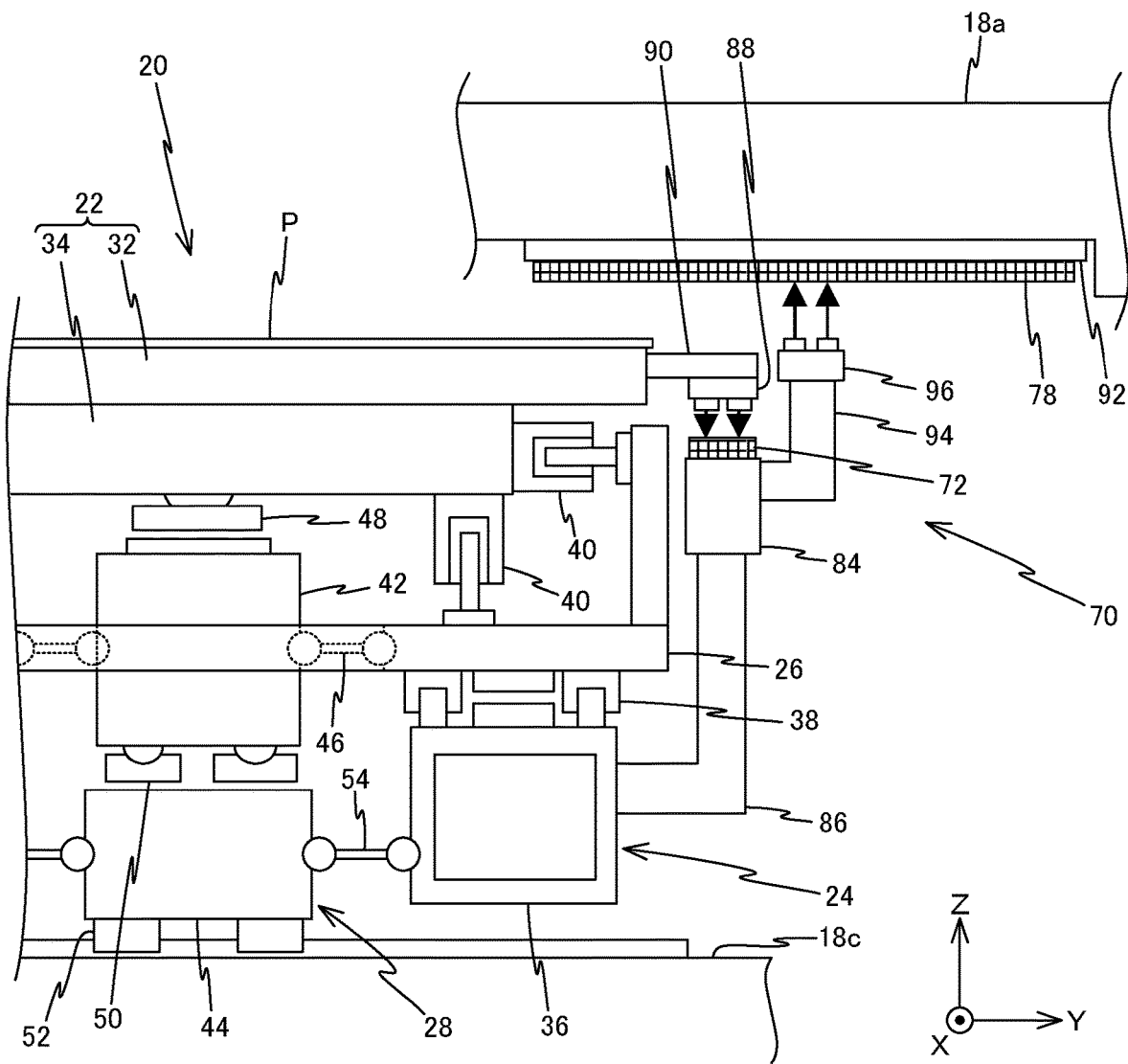
FIG. 2 is a view showing a substrate stage device that the liquid crystal exposure apparatus in FIG. 1 has.

As is shown in FIG. 2, fine movement stage 22 is equipped with a substrate holder 32 and a stage main section 34. Substrate holder 32 is formed in a plate shape (or in a box shape) having a rectangular shape in a planar view (refer to FIG. 4), substrate P is mounted on its upper surface (substrate mount surface). The size of the upper surface of substrate holder 32 in the X-axis and Y-axis directions is set to around the same size as (actually slightly shorter than) substrate P. Substrate P, by being held by vacuum suction by substrate holder 32 in a state mounted on the upper surface of substrate holder 32, has its flatness corrected almost entirely (the entire surface) along the upper surface of substrate holder 32. Stage main section 34 consists of a plate shape (or a box shape) member having a rectangular shape in a planar view whose size in the X-axis and Y-axis directions is shorter than substrate holder 32, and is connected integrally to the lower surface of substrate holder 32.

Figure 4:
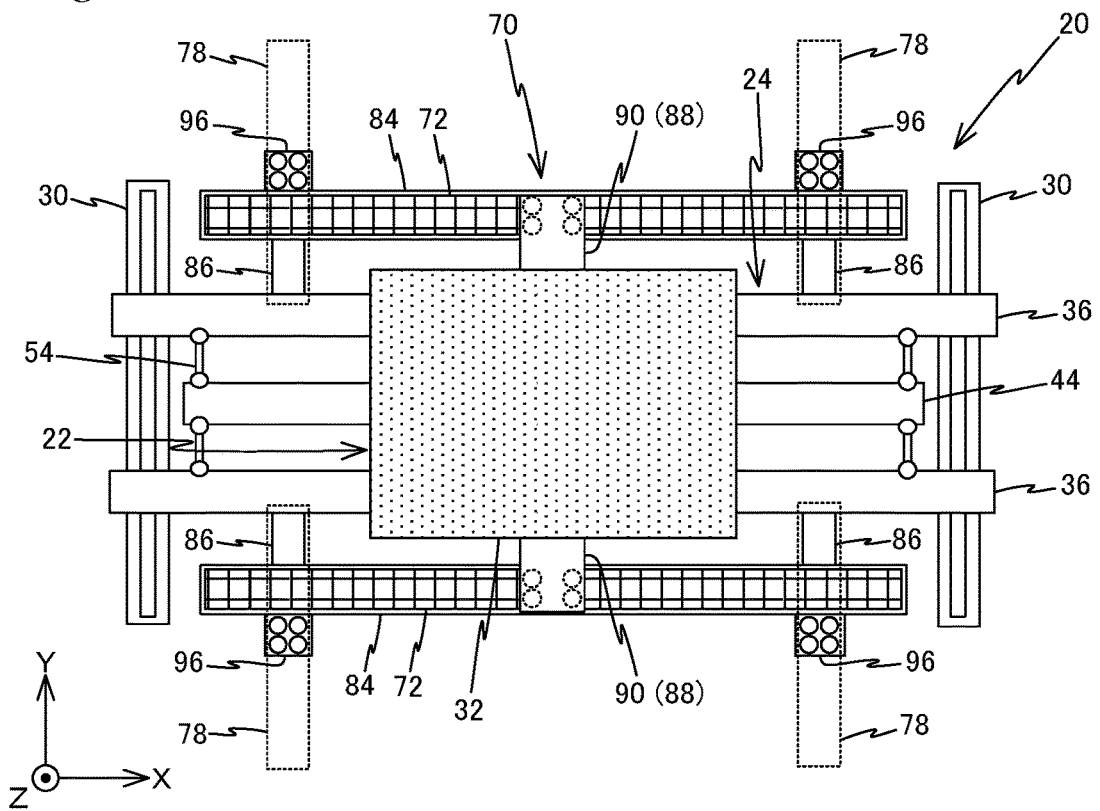
FIG. 4 is a view (No. 1) used to explain an operation of a substrate stage device.

Referring back to FIG. 1, Y coarse movement stage 24 is below (on the −Z side of) fine movement stage 22, and is arranged on the pair of base frames 30. Y coarse movement stage 24, as is shown in FIG. 4, has a pair of X beams 36. The pair of X beams 36 is arranged parallel to the Y-axis direction at a predetermined spacing. The pair of X beams 36 is mounted on the pair of base frames 30 via a mechanical linear guide device, and is freely movable in the Y-axis direction on the pair of base frames 30.

Referring back to FIG. 1, X coarse movement stage 26 is above (on the +Z side of) Y coarse movement stage 24, and is arranged below fine movement stage 22 (in between fine movement stage 22 and Y coarse movement stage 24). X coarse movement stage 26 is a plate shape member having a rectangular shape in a planar view, the stage being mounted on the pair of X beams 36 (refer to FIG. 4) that Y coarse movement stage 24 has via a plurality of mechanical linear guide devices 38 (refer to FIG. 2), and the stage is freely movable in the X-axis direction with respect to Y coarse movement stage 24, while being moved integrally with Y coarse movement stage 24 in the Y-axis direction.

Figure 6:
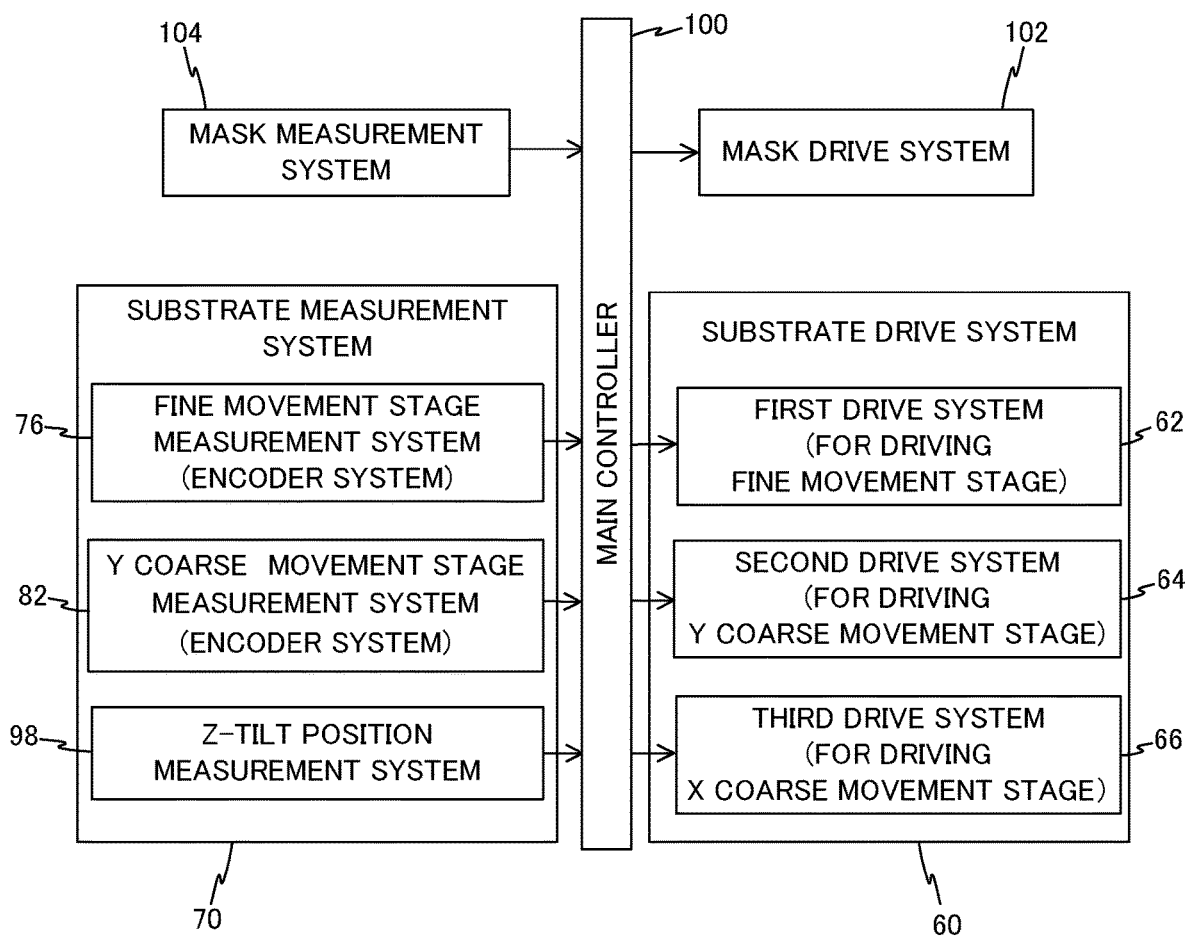
FIG. 6 is a block diagram showing an input/output relation of a main controller that mainly structures a control system of the liquid crystal exposure apparatus.

As is shown in FIG. 6, substrate drive system 60 is equipped with; a first drive system 62 for finely moving fine movement stage 22 in directions of six degrees of freedom (in each of the X-axis, the Y-axis, the Z-axis, the θx, the θy, and the θz directions) with respect to optical surface plate 18a, a second drive system 64 for moving Y coarse movement stage 24 in long strokes in the Y-axis direction on base frames 30 (each refer to FIG. 1), and a third drive system 66 for moving X coarse movement stage 26 in long strokes in the X-axis direction on Y coarse movement stage 24 (each refer to FIG. 1). While the type of actuators that structure the second drive system 64 and the third drive system 66 is not limited in particular, as an example, a linear motor, a ball screw driver or the like can be used (FIG. 1 and the like show a linear motor).

While the type of actuators that structure the first drive system 62 is also not limited in particular, in FIG. 2 and the like, as an example, a plurality of linear motors (voice coil motors) 40 is shown (X linear motors are not shown in FIGS. 1 and 2) that generates thrust in each of the X-axis, the Y-axis, and the Z-axis directions. Each linear motor 40 has a stator attached to X coarse movement stage 26, and also a mover attached to stage main section 34 of fine movement stage 22, and to fine movement stage 22, thrust is given in directions of six degrees of freedom via each linear motor 40 with respect to X coarse movement stage 26. A detailed structure of each of the first to third drive systems 62, 64, and 66, as an example, is disclosed in, U.S. Patent Application Publication No. 2010/0018950 and the like; therefore, the description thereabout will be omitted.

Main controller 100 gives thrust to fine movement stage 22 using the first drive system 62 so that relative position between fine movement stage 22 and X coarse movement stage 26 (each refer to FIG. 1) stays within a predetermined range in the X-axis and the Y-axis directions. Here, "position stays within a predetermined range," on moving fine movement stage 22 with long strokes in the X-axis or the Y-axis direction, is used merely to imply that X coarse movement stage 26 (in the case fine movement stage 22 is moved in the Y-axis direction, X coarse movement stage 26 and Y coarse movement stage 24) and fine movement stage 22 are moved almost at the same speed in the same direction, and that fine movement stage 22 and X coarse movement stage 26 do not necessarily have to move in strict synchronization and a predetermined relative movement (relative position displacement) is permissible.

Referring back to FIG. 2, weight canceling device 28 is equipped with a weight canceling device 42 that supports the weight of fine movement stage 22 from below, and a Y step guide 44 that supports weight canceling device 42 from below.

Weight canceling device 42 (also referred to as a central pillar) is inserted into an opening section formed in X coarse movement stage 26, and is mechanically connected at the height of the center-of-gravity position to X coarse movement stage 26, via a plurality of connecting members 46 (also referred to as a flexure device). X coarse movement stage 26 and weight canceling device 42 are connected by the plurality of connecting members 46, in a state of vibratory (physical) separation in the Z-axis direction, the θx direction, and the θy direction. Weight canceling device 42, by being pulled by X coarse movement stage 26, moves integrally with X coarse movement stage 26, in the X-axis and/or the Y-axis direction.

Weight canceling device 42 supports the weight of fine movement stage 22 from below in a non-contact manner via a pseudospherical bearing device called a leveling device 48. This allows relative movement of fine movement stage 22 in the X-axis, the Y-axis, and θz direction with respect to weight canceling device 42 and oscillation (relative movement in the θx and θy directions) with respect to the horizontal plane. As for the structure and function of weight canceling device 42 and leveling device 48, an example is disclosed in U.S. Patent Application Publication No. 2010/0018950 and the like; therefore, the description thereabout will be omitted.

Y step guide 44 consists of a member extending parallel to the X-axis, and is arranged in between the pair of X beams 36 that Y coarse movement stage 24 has (refer to FIG. 4). The upper surface of Y step guide 44 is set parallel to the XY plane (horizontal plane), and weight canceling device 42 is mounted on Y step guide 44 in a non-contact manner, via an air bearing 50. Y step guide 44 functions as a surface plate when weight canceling device 42 (that is, fine movement stage 22 and substrate P) moves in the X-axis direction (scanning direction). Y step guide 44 is mounted on lower mount section 18c via a mechanical linear guide device 52, and while being freely movable in the Y-axis direction with respect to lower mount section 18c, relative movement in the X-axis direction is restricted.

Y step guide 44 is mechanically connected (refer to FIG. 4) at the height of the center-of-gravity position to Y coarse movement stage 24 (the pair of X beams 36), via a plurality of connecting members 54. Connecting members 54 are flexure devices similarly to connecting members 46 described above that connect Y coarse movement stage 24 and Y step guide 44 in a state of vibratory (physical) directions of five degrees of freedom; excluding the Y-axis direction in directions of six degrees of freedom. Y step guide 44, by being pulled by Y coarse movement stage 24, moves integrally with Y coarse movement stage.

The pair of base frames 30, as is shown in FIG. 4, each consists of a member extending parallel to the Y-axis, and is installed parallel to each other on floor F (refer to FIG. 1). Base frames 30 are physically (or vibrationally) separate from apparatus main section 18.

Next, substrate measurement system 70 for obtaining position information on substrate P (actually, fine movement stage 22 holding substrate P) in directions of six degrees of freedom will be described.

Figure 3:
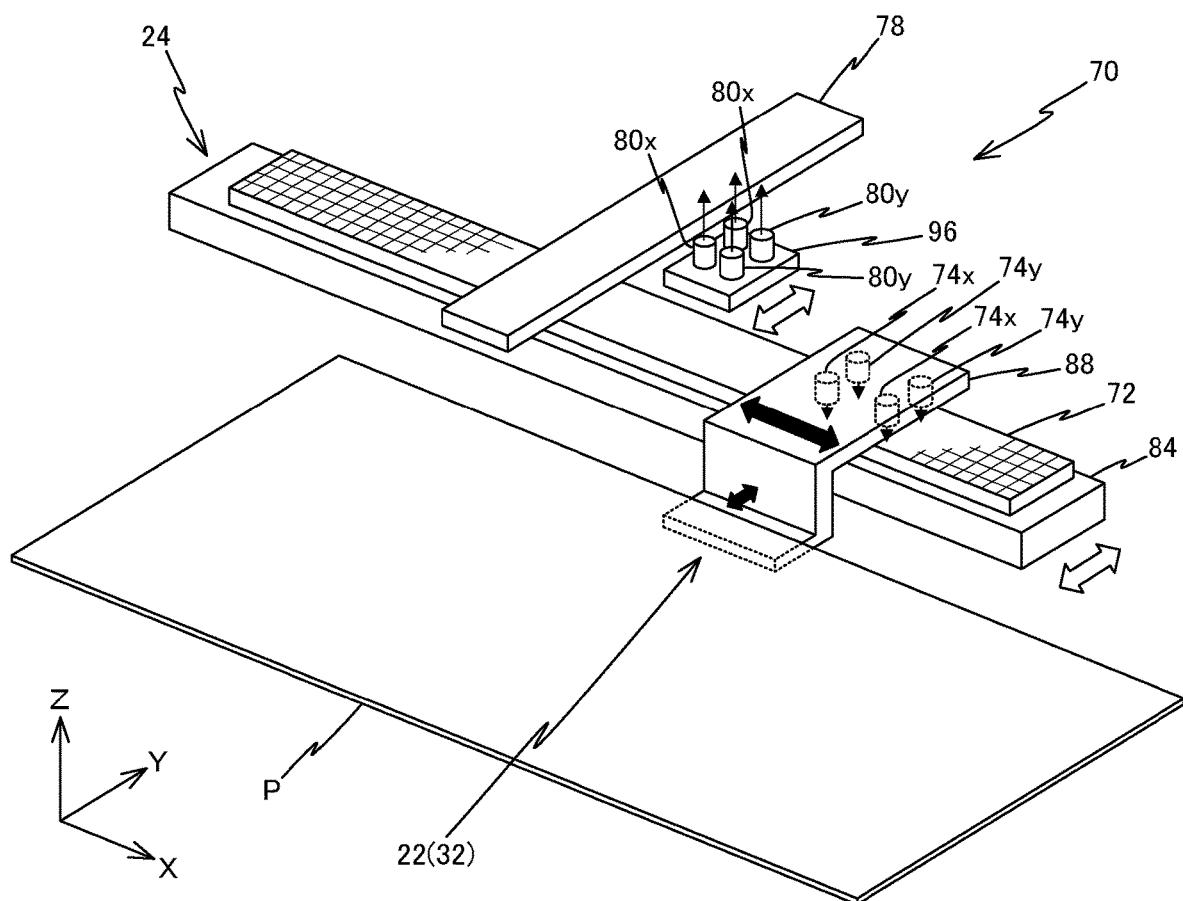
FIG. 3 is a schematic view of a substrate measurement system that the liquid crystal exposure apparatus in FIG. 1 has.

FIG. 3 shows a schematic view of substrate measurement system 70. Substrate measurement system 70 is equipped with; a first measurement system (here, a fine movement stage measurement system 76 (refer to FIG. 6)) including a first scale (here, an upward scale 72) that Y coarse movement stage 24 has (associated with Y coarse movement stage 24) and a first head (here, downward X heads 74x and downward Y heads 74y) that fine movement stage 22 has, and a second measurement system (here, a coarse movement stage measurement system 82 (refer to FIG. 6)) including a second scale (here, a downward scale 78) that optical surface plate 18a (refer to FIG. 2) has and a second head (here, upward X heads 80x and upward Y heads 80y) that Y coarse movement stage 24 has. Note that in FIG. 3, fine movement stage 22 is shown, modeled as a member holding substrate P. Also, spacing (pitch) between gratings in a diffraction grating that each of the scales 72 and 78 has is illustrated greatly wider than the actual spacing. The same applies to other drawings as well. Also, since the distance between each head and each scale is greatly shorter than the distance between a laser light source and a bar mirror of a conventional optical interferometer system, influence of air fluctuation is less than that of the optical interferometer system, which allows position control of substrate P with high precision so that the exposure accuracy can be improved.

Upward scale 72 is fixed to the upper surface of a scale base 84. Scale base 84 is arranged as is shown in FIG. 4, one on the +Y side and one on the −Y side of fine movement stage 22. Scale base 84, as is shown in FIG. 2, is fixed to X beams 36 of Y coarse movement stage 24, via an arm member 86 formed in an L-shape when viewed from the X-axis direction. Accordingly, scale base 84 (and upward scale 72) can be moved in predetermined long strokes in the Y-axis direction integrally with Y coarse movement stage 24. As for arm member 86, as is shown in FIG. 4, while two are arranged separately in the X-axis direction for one X beam 36, the number of arm member 86 is not limited to this, and can be appropriately increased or decreased.

Scale base 84 is a member extending parallel to the X-axis, and the length in the X-axis direction is set to around twice the length (about the same as Y step guide 44) in the X-axis direction of substrate holder 32 (that is, substrate P (not shown in FIG. 4)). Scale base 84 is preferably formed with a material such as ceramics and the like that hardly generates thermal deformation. The same applies to other members to be described later on; scale base 92, and head bases 88 and 96.

Upward scale 72 is a plate shaped (strip shaped) member extending in the X-axis direction, and on its upper surface (a surface facing the +Z side (upper side)), a reflection type two-dimensional grating (so-called grating) is formed whose periodic direction is in two-axis directions (in the embodiment, X-axis and Y-axis directions) orthogonal to each other.

To each of the center section of the side surface on the +Y side and −Y side of substrate holder 32, head base 88 is fixed (refer to FIG. 2) via an arm member 90 corresponding to scale base 84 described above. Each of the downward heads 74x and 74y (refer to FIG. 3) is fixed to the lower surface of head base 88.

In fine movement stage measurement system 76 (refer to FIG. 6) of the embodiment, as is shown in FIG. 3, to one head base 88, two downward X heads 74x are arranged separately in the X-axis direction, and two downward Y heads 74y are arranged separately in the X-axis direction. Each of the heads 74x and 74y irradiates the corresponding upward scale 72 with a measurement beam, and also receives light (here, a diffracted light) from upward scale 72. Light from upward scale 72 is supplied to a detector not shown, and the output of the detector is supplied to main controller 100 (refer to FIG. 6). Main controller 100 obtains relative movement amount of each of the heads 74x and 74y with respect to scale 72, based on the output of the detector. Note that in the description, "head" simply means a section that emits a measurement beam onto a diffraction grating as well as a section where light from the diffraction grating is incident on, and the head itself illustrated in each of the drawings does not have to have a light source and a detector.

As is described so far, in fine movement stage measurement system 76 of the embodiment (refer to FIG. 6), with the total of four (two each on the +Y side and the −Y side of substrate P) downward X heads 74x and the corresponding upward scale 72, four X linear encoder systems are structured, and with the total of four (two each on the +Y side and the −Y side of substrate P) downward Y heads 74y and the corresponding upward scale 72, four Y linear encoder systems are structured. Main controller 100 (refer to FIG. 6), by appropriately using the output of the four X linear encoder systems and the four Y linear encoder systems described above, obtains position information (hereinafter called "first information") on fine movement stage 22 (substrate P) in the X-axis direction, the Y-axis direction, and the θz direction.

Here, with upward scale 72, measurable distance in the X-axis direction is set longer than the measurable distance in the Y-axis direction. Specifically, as is shown in FIG. 4, the length in the X-axis direction of upward scale 72 is around the same length as scale base 84, and is set around to a length that can cover a movable range in the X-axis direction of fine movement stage 22. Meanwhile, the width direction (Y-axis direction) size (and spacing between a pair of heads 74x and 74y adjacent in the Y-axis direction) of upward scale 72 is set to about a length so that the measurement beam from each of the heads 74x and 74y does not move off from the grating surface (surface to be measured) of the corresponding upward scale 72, even when fine movement stage 22 is finely moved in the Y-axis direction with respect to upward scale 72.

Figure 5:
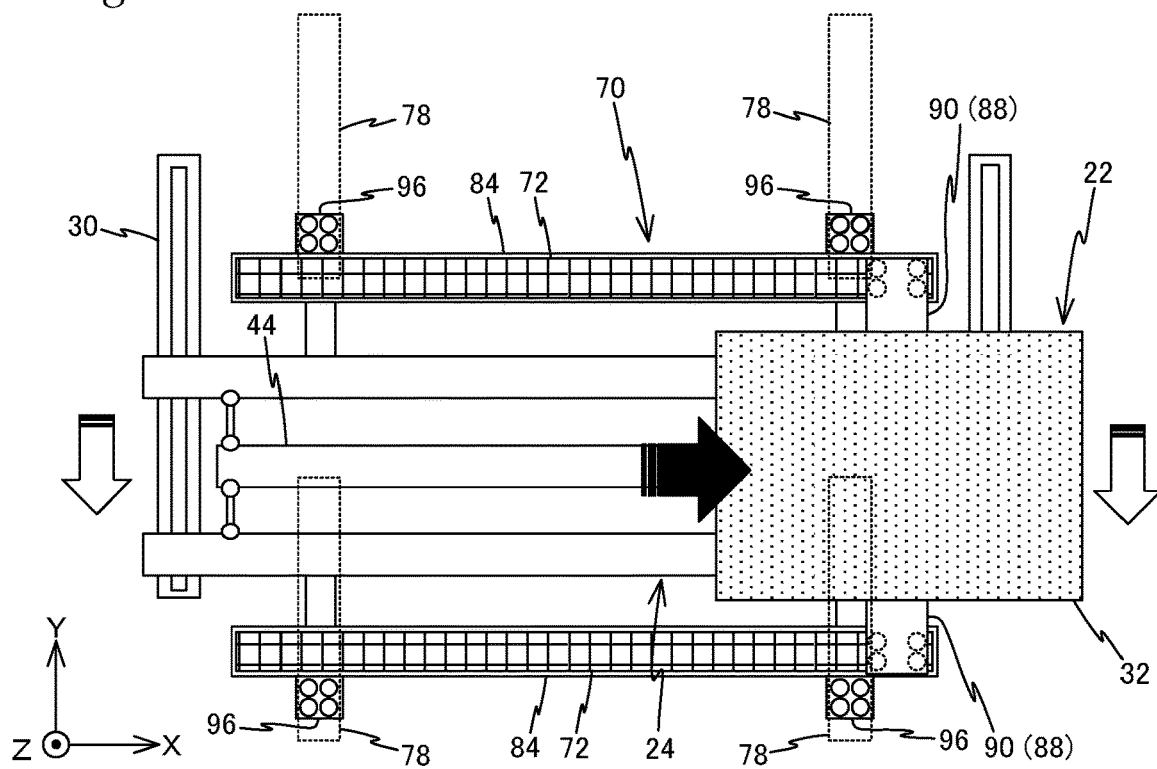
FIG. 5 is a view (No. 2) used to explain an operation of a substrate stage device.

Next, an operation of fine movement stage measurement system 76 (refer to FIG. 6) will be described, using FIGS. 4 and 5. FIGS. 4 and 5 show substrate stage device 20 before and after fine movement stage 22 moves in long strokes in the X-axis and the Y-axis directions. FIG. 4 shows fine movement stage 22 in a state positioned almost at the center of the movable range in the X-axis and the Y-axis directions, and FIG. 5 shows fine movement stage 22 in a state positioned at the +X side stroke end of the movable range in the X-axis direction and also at the −Y side stroke end in the Y-axis direction.

As it can be seen from FIGS. 4 and 5, regardless of the position in the Y-axis direction of fine movement stage 22, the measurement beam from each of the heads 74x and 74y attached to fine movement stage 22 does not move off from the grating surface of upward scale 72 including the case when fine movement stage 22 is finely moved in the Y-axis direction. Also, when fine movement stage 22 moves in long strokes in the X-axis direction as well, the measurement beam from each of the downward heads 74x and 74y does not move off from the grating surface of upward scale 72.

Next, coarse movement stage measurement system 82 (refer to FIG. 6) will be described. Coarse movement stage measurement system 82 of the embodiment, as it can be seen from FIGS. 1 and 4, has two downward scales 78 (that is, a total of four downward scales 78) arranged separately in the X-axis direction on the +Y side and the −Y side of projection optical system 16 (refer to FIG. 1). Downward scale 78 is fixed to the lower surface of optical surface plate 18a, via scale base 92 (refer to FIG. 2). Scale base 92 is a plate shaped member extending in the Y-axis direction, and the length in the Y-axis direction is set to around the same (actually slightly longer) as the movable distance of fine movement stage 22 (that is, substrate P (not shown in FIG. 4)) in the Y-axis direction.

Downward scale 78 is a plate shaped (strip shaped) member extending in the Y-axis direction, and on its lower surface (a surface facing the −Z side (lower side)), a reflection type two-dimensional grating (so-called grating) is formed whose periodic direction is in two-axis directions (in the embodiment, X-axis and Y-axis directions) orthogonal to each other, similarly to the upward scale 72 described above. Note that the grating pitch of the diffraction grating that downward scale 78 has may be the same as, or different from the grating pitch of the diffraction grating that upward scale 72 has.

To each of the pair of scale bases 84 that Y coarse movement stage 24 has, as is shown in FIG. 2, head base 96 is fixed via an arm member 94 formed in an L shape when viewed from the X-axis direction. Head bases 96, as is shown in FIG. 4, are arranged near the ends on the +X side and on the −X side of scale base 84. Each of the upward heads 80x and 80y, as is shown in FIG. 3, is fixed to the upper surface of head base 96. Accordingly, a total of four head bases 96 (and upward heads 80x and 80y) can be moved in the Y-axis direction integrally with Y coarse movement stage 24.

With coarse movement stage measurement system 82 (refer to FIG. 6) of the embodiment, as is shown in FIG. 3, two upward X heads 80x and two upward Y heads 80y are arranged separately in the Y-axis direction for one head base 96. Each of the heads 80x and 80y irradiates the corresponding downward scale 78 with a measurement beam, and also receives light (here, a diffracted light) from downward scale 78. Light from downward scale 78 is supplied to a detector not shown, and the output of the detector is supplied to main controller 100 (refer to FIG. 6). Main controller 100 obtains relative movement amount of each of the heads 80x and 80y with respect to scale 78, based on the output of the detector. As is described so far, in coarse movement stage measurement system 82 of the embodiment, with a total of eight upward X heads 80x and the corresponding downward scale 78, eight X linear encoder systems are structured, and also with a total of eight upward Y heads 80y and the corresponding downward scale 78, eight Y linear encoder systems are structured. Main controller 100 (refer to FIG. 6), by appropriately using the output of the eight X linear encoder systems and the eight Y linear encoder systems described above, obtains position information (hereinafter called "second information") on Y coarse movement stage 24 in the X-axis direction, the Y-axis direction, and the θz direction.

Also, upward scale 72 fixed on scale base 84 and each of the upward heads 80x and 80y integrally fixed to scale base 84 via head base 96 are arranged, so that their mutual positional relation is to be invariant and that the positional relation is to be known. Hereinafter, information related to relative positional relation between upward scale 72 and each of the upward heads 80x and 80y integrally fixed thereto will be called "third information." Note that while in the description, upward scale 72 and upward heads 80x and 80y were described to be arranged so that their the positional relation was to be invariant, liquid crystal exposure apparatus 10 may be equipped with a measurement system for measuring the positional relation between the two. The same applies to each embodiment that will be described below.

Main controller 100 (refer to FIG. 6) obtains position information on fine movement stage 22 (substrate P) within the XY plane with optical surface plate 18a (projection optical system 16) serving as a reference, based on the first to third information described above, and performs position control of substrate P with respect to projection optical system 16 (illumination light IL), using substrate drive system 60 (refer to FIG. 6) described above.

As is described, in substrate measurement system 70 of the embodiment, position information on Y coarse movement stage 24 which moves in long strokes in the Y-axis direction is obtained by coarse movement stage measurement system 82 including downward scale 78 whose measurable distance is longer in the Y-axis direction than that of the X-axis direction (the Y-axis direction serving as the main measurement direction), and position information on fine movement stage 22 which moves in long strokes in the X-axis direction is also obtained by fine movement stage measurement system 76 including upward scale 72 whose measurable distance is longer in the X-axis direction than that of the Y-axis direction (the X-axis direction serving as the main measurement direction). That is, in coarse movement stage measurement system 82 and fine movement stage measurement system 76, the moving direction of each encoder head (74x, 74y, 80x, and 80y) coincides with the main measurement direction of the corresponding scales (72 and 78).

Also, position information on fine movement stage 22 (substrate P) in each of the Z-axis, the θx, and the θy directions (hereinafter called "Z-tilt direction") obtained by main controller 100 using a Z-tilt position measurement system 98 (each refer to FIG. 6). While the structure of Z-tilt position measurement system 98 is not limited in particular, as an example, it is possible to use a measurement system using a displacement sensor attached to fine movement stage 22, as is disclosed in U.S. Patent Application Publication No. 2010/0018950 and the like.

Note that although it is not shown, substrate measurement system 70 also has a measurement system for obtaining position information on X coarse movement stage 26. In the embodiment, since position information on fine movement stage 22 (substrate P) in the X-axis direction is obtained via Y coarse movement stage 24 with optical surface plate 18a serving as a reference, measurement accuracy of the X coarse movement stage 26 itself does not have to be the same level as fine movement stage 22. Position measurement of X coarse movement stage 26 may be performed, based on the output of fine movement stage measurement system 76 described above and the output of the measurement system (not shown) which measures the relative position between X coarse movement stage 26 and fine movement stage 22, or may be performed using an independent measurement system.

In liquid crystal exposure apparatus 10 (refer to FIG. 1) structured in the manner described above, loading of mask M onto mask stage device 14 is performed by a mask loader (not shown), along with loading of substrate P onto substrate holder 32 by a substrate loader (not shown), under the control of main controller 100 (refer to FIG. 6). Then, alignment measurement is executed using an alignment detection system (not shown) by main controller 100, and after the alignment measurement has been completed, exposure operation of a step-and-scan method is sequentially performed on a plurality of shot areas set on substrate P. Since this exposure operation is similar to the exposure of a step-and-scan method conventionally performed, a detailed description thereabout is to be omitted. In the alignment measurement operation and the exposure operation of the step-and-scan method, position information on fine movement stage 22 is measured by substrate measurement system 70.

With liquid crystal exposure apparatus 10 of the embodiment described so far, since the position of fine movement stage 22 (substrate P) is measured using substrate measurement system 70 which includes an encoder system, influence of air fluctuation is less than that of the conventional measurement using an optical interferometer system, which allows position control of substrate P with high precision so that the exposure accuracy can be improved.

Also, since substrate measurement system 70 performs position measurement of substrate P with downward scale 78 fixed to optical surface plate 18a (apparatus main section 18) as a reference (via upward scale 72), position measurement of substrate P can be performed with projection optical system 16 substantially serving as a reference. This allows position control of substrate P to be performed with illumination light IL serving as a reference, which can improve exposure accuracy.

Note that the structure of substrate measurement system 70 described so far can be appropriately changed, as long as position information on fine movement stage 22 can be obtained at a desired accuracy in the movable range of fine movement stage 22 (substrate P).

That is, while a long scale having a length about the same as that of scale base 84 was used as upward scale 72 in the embodiment above, the scale is not limited to this, and scales having a shorter length in the X-axis direction may be arranged at a predetermined spacing in the X-axis direction, similarly to the encoder system disclosed in International Publication WO 2015/147319. In this case, since a gap is formed in between a pair of scales adjacent in the X-axis direction, by making the spacing in the X-axis direction of each of the pair of heads 74x and 74y adjacent in the X-axis direction wider than the gap described above, one of the heads 74x and one of the heads 74y should be made to constantly face the scale. The same applies for the relation between downward scale 78 and upward heads 80x and 80y.

Also, while upward scale 72 was arranged on the +Y side and the −Y side of fine movement stage 22, the arrangement is not limited to this, and the scale may be arranged only on one side (the +Y side, or the −Y side). In the case only one upward scale 72 is arranged, and a plurality of scales are arranged at a predetermined spacing (gap between scales) in the X-axis direction as is described above, the number and arrangement of each of the heads 74x and 74y should be set so that at least two downward X heads 74x (or downward Y heads 74y) constantly face the scale to allow position measurement of fine movement stage 22 in the θz direction to be performed at all times. The same applies for downward scale 78, and as long as position measurement of Y coarse movement stage 24 in the X-axis, the Y-axis, and the θz direction can be performed at all times, the number and arrangement of downward scale 78 and upward heads 80x and 80y can be appropriately changed.

Also, while a two-dimensional diffraction grating whose periodic direction is in the X-axis and the Y-axis directions were formed on upward scale 72 and downward scale 78, an X diffraction grating whose periodic direction is in the X-axis direction and a Y diffraction grating whose periodic direction is in the Y-axis direction may be formed separately on scales 72 and 78. Also, while the two-dimensional diffraction grating in the embodiment had periodic directions in the X-axis and the Y-axis directions, if position measurement of substrate P within the XY plane can be performed at a desired accuracy, the periodic direction of the diffraction grating is not limited to this, and can be appropriately changed.

Also, Z-tilt position information on substrate P may be measured by attaching a displacement sensor facing downward to head base 88, and also using the sensor with scale base 84 (or a reflection surface of upward scale 72) serving as a reference. Also, at least three heads of the plurality of downward heads 74x and 74y may serve as two-dimensional heads (so-called XZ heads or YZ heads) that can perform measurement in a vertical direction along with position measurement in a direction parallel to the horizontal plane, and Z-tilt position information on substrate P may be obtained by the two-dimensional heads using the grating surface of upward scale 72. Similarly, Z-tilt position information on Y coarse movement stage 24 may be measured with scale base 92 (or a downward scale 78) serving as a reference. As the XZ head or the YZ head, an encoder head of a structure similar to the displacement sensor head disclosed in, for example, U.S. Pat. No. 7,561,280, can be used.

Second Embodiment

Next, a liquid crystal exposure apparatus according to a second embodiment will be described, using FIGS. 7 to 10. Since the structure of the liquid crystal exposure apparatus according to the second embodiment is roughly the same as that of the first embodiment described above, except for the point that the structure of a substrate stage device 220 (including the measurement system) is different, only the different points will be described below, and for elements having the same structure or function as the first embodiment described above will have the same reference code as the first embodiment and the description thereabout will be omitted.

Figure 9:
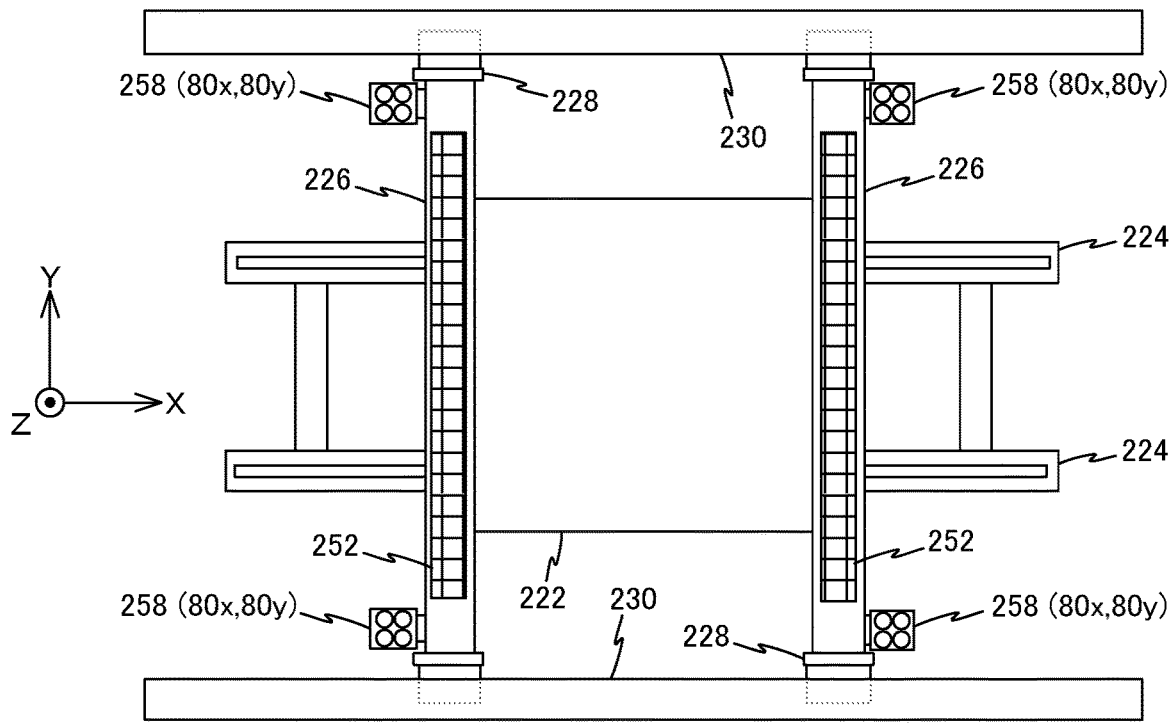
FIG. 9 is a view showing a second system of the substrate stage device in FIG. 7.
Figure 10:
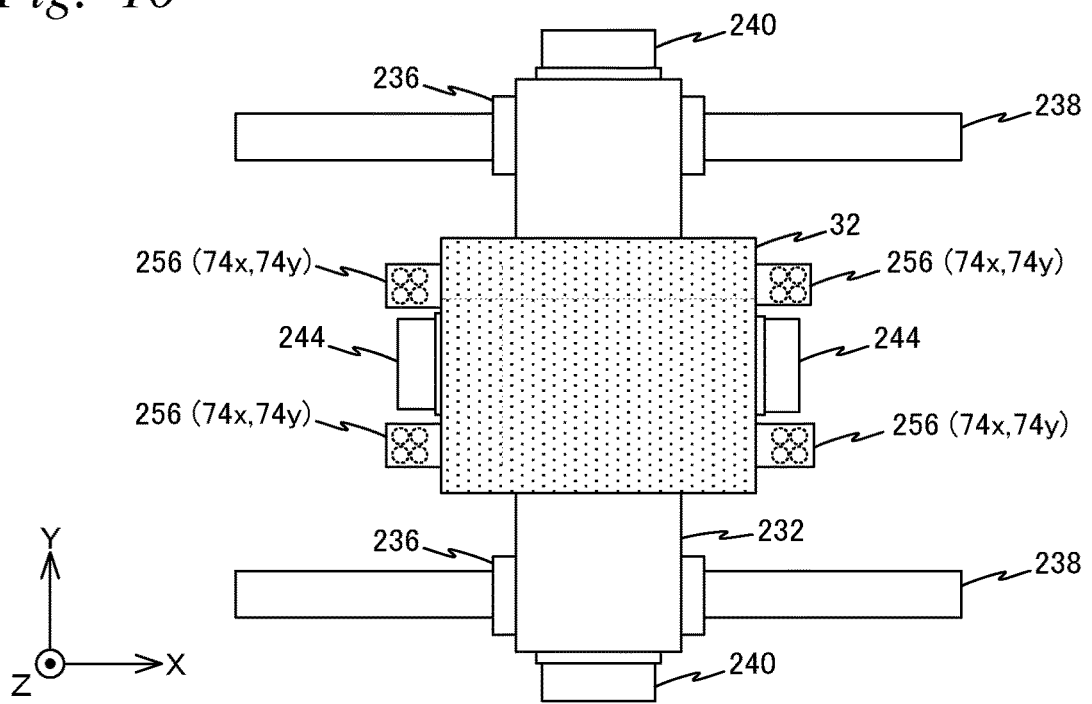
FIG. 10 is a view showing a first system of the substrate stage device in FIG. 7.
Figure 11:
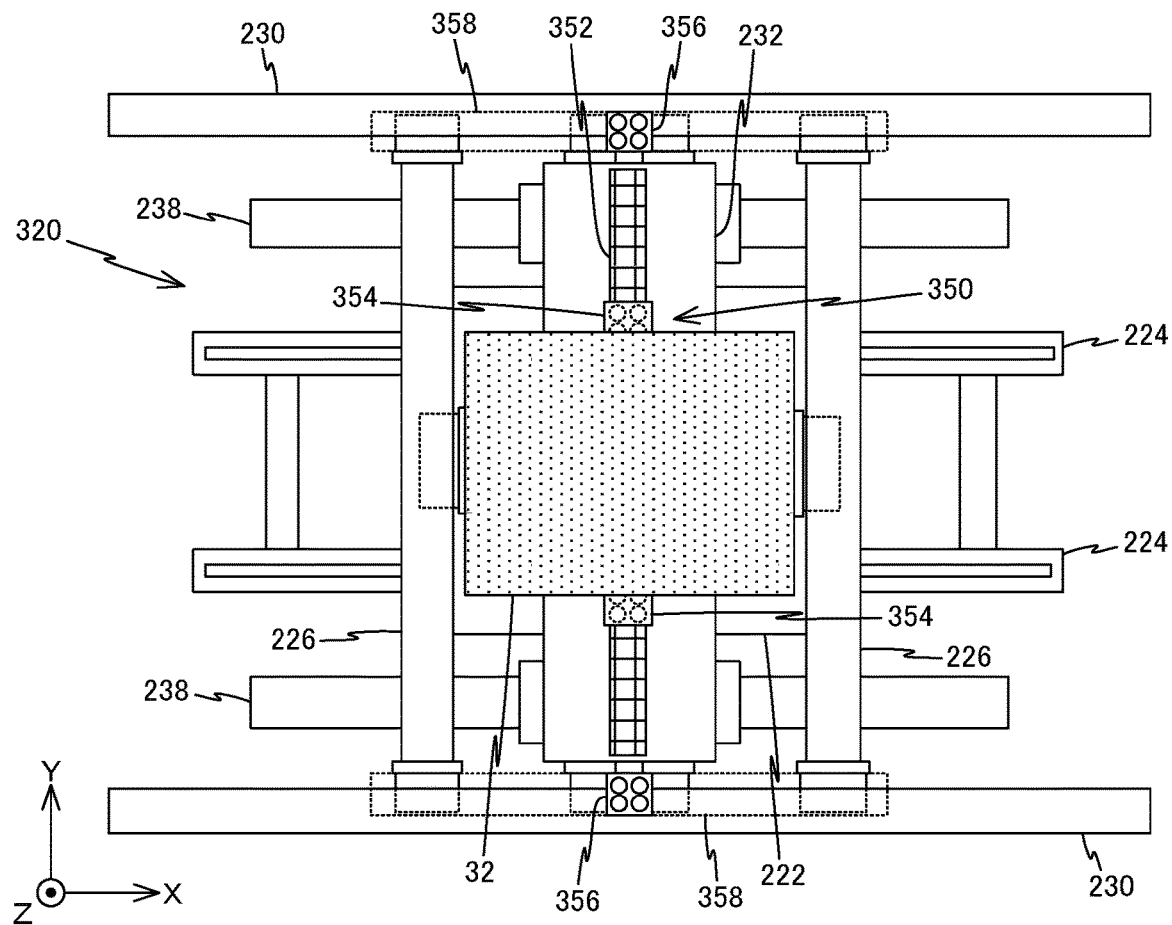
FIG. 11 is a planar view showing a substrate stage device according to a third embodiment.
Figure 12:
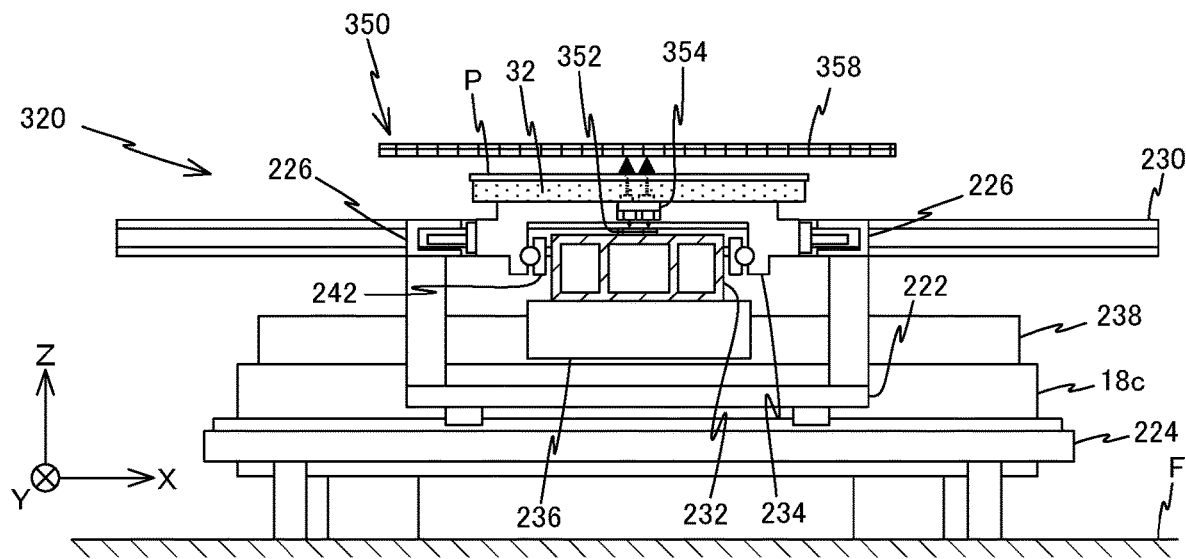
FIG. 12 is a cross-section view of the substrate stage device in FIG. 11.
Figure 13:
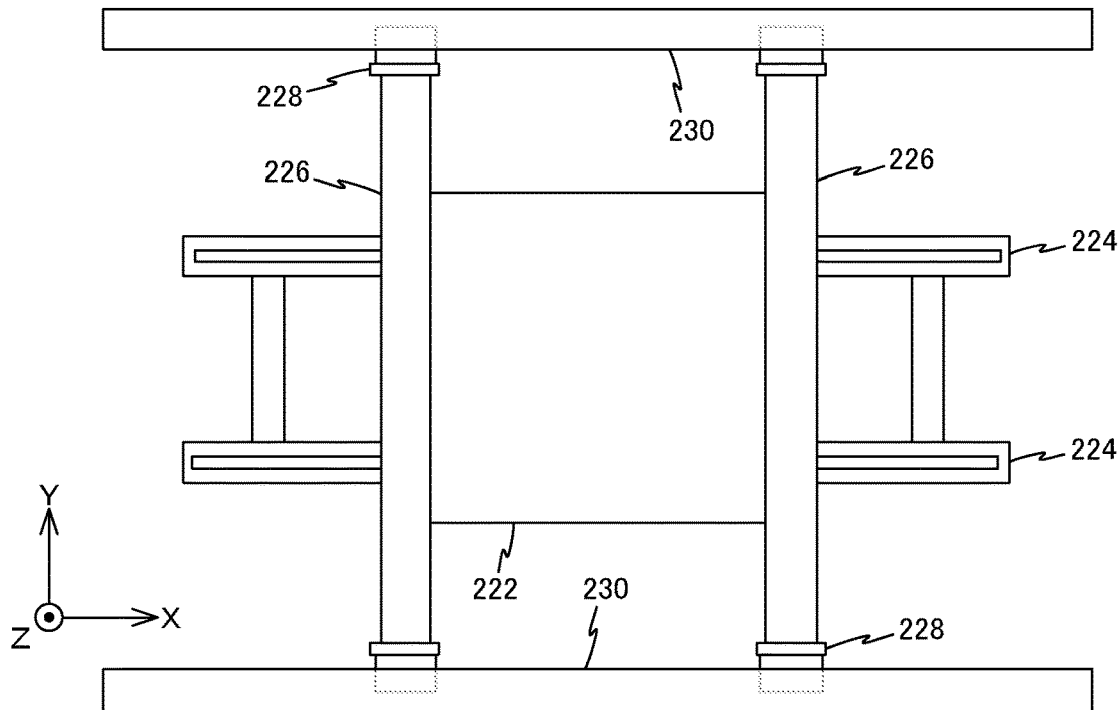
FIG. 13 is a view showing a second system of the substrate stage device in FIG. 11.

Substrate stage device 220 according to the second embodiment has a first system including a first movable body (here, substrate holder 32), and a second system including a second movable body (here, X coarse movement stage 222). FIGS. 9 and 10 are planar views showing only the second system and the first system.

As is shown in FIG. 9, X coarse movement stage 222 is mounted in a freely movable state in the X-axis direction on a pair of base frames 224 installed on floor F (refer to FIG. 8), via a mechanical linear guide device (refer to FIG. 8), similarly to Y coarse movement stage 24 (refer to FIG. 1) in the first embodiment described above. At both ends near the edge in the X-axis direction of X coarse movement stage 222, Y stators are attached. Y stator 226 consists of a member extending in the Y-axis direction, and at both ends near the edge in the longitudinal direction, X movers 228 are attached. Each X mover 228 works together with X stator 230 (not shown in FIG. 8) and structures an X linear motor, and X coarse movement stage 222 is moved in predetermined long strokes in the X-axis direction by a total of four X linear motors. X stators 230 are installed on floor F in a state physically separated from apparatus main section 18 (refer to FIG. 1).

Figure 8:
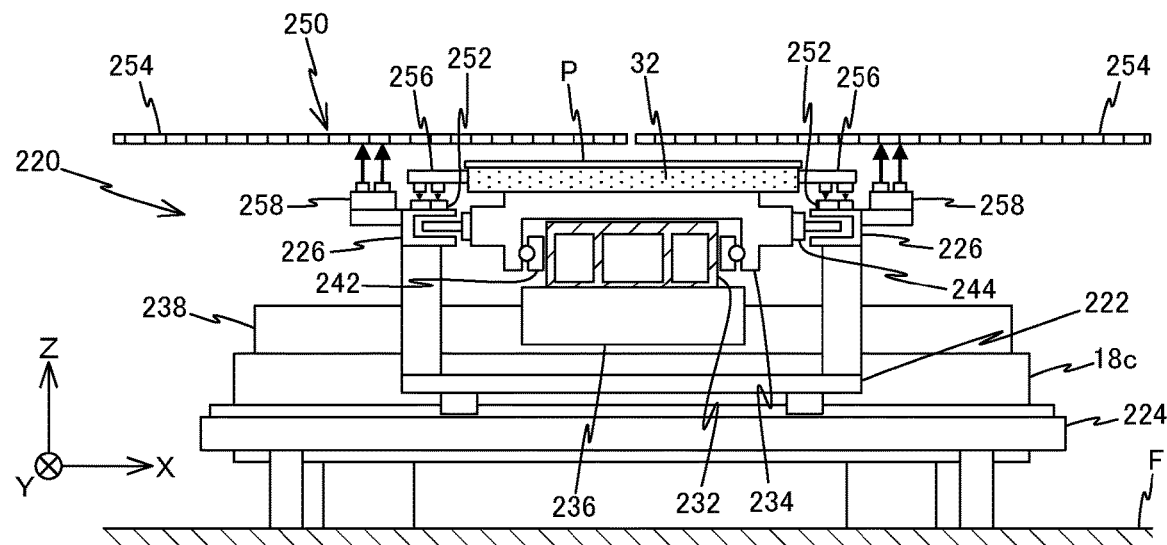
FIG. 8 is a cross-section view of the substrate stage device in FIG. 7.

As is shown in FIG. 8, substrate holder 32 is mounted on a Y beam guide 232 via a Y table 234. Y beam guide 232, as is shown in FIG. 10, consists of a member extending in the Y-axis direction, and on the lower surface at both ends near the edge in the longitudinal direction, X slide members 236 are attached. Each X slide member 236 engages in a freely movable state in the X-axis direction with an X guide member 238 fixed to lower mount section 18c (refer to FIG. 8). Also, at both ends near the edge in the longitudinal direction of Y beam guide 232, X movers 240 are attached. Each X mover 240 works together with X stator 230 (refer to FIG. 9) and structures an X linear motor, and Y beam guide 232 is moved in predetermined long strokes in the X-axis direction by a total of two X linear motors.

As is shown in FIG. 8, Y table 234 consists of a member with a cross sectional surface of an inverted U-shape, and Y beam guide 232 is inserted therein via air bearings 242 attached freely swingable to a pair of opposite surfaces. Also, Y table 234, by blowing out pressurized gas onto the upper surface of Y beam guide 232 from air bearings (not shown), is mounted on Y beam guide 232 via a slight gap. This allows Y table 234 to be freely movable with long strokes in the Y-axis direction and also to be freely rotatable at a fine angle in the θz direction, with respect to Y beam guide 232. Also, Y table 234, in the X-axis direction, moves integrally with Y beam guide 232 by rigidity of a gas film formed by air bearings 242 described above. At both ends near the edge in the X-axis direction of Y table 234, Y movers 244 are attached. Y movers 244 work with Y stators 226 and structure Y linear motors, and Y table 234 is moved in predetermined long strokes along Y beam guide 232 in the Y-axis direction by a total of two Y linear motors as well as being finely moved in the θz direction.

In substrate stage device 220, when X coarse movement stage 222 is moved in the X-axis direction by the four X linear motors (X movers 228 and X stators 230), the two Y stators 226 attached to X coarse movement stage 222 also move in the X-axis direction. The main controller (not shown) moves Y beam guide 232 in the X-axis direction by the two X linear motors (X movers 240 and X stators 230) so that a predetermined positional relation is maintained with X coarse movement stage 222. This moves Y table 234 (that is, substrate holder 32) in the X-axis direction integrally with Y beam guide 232. That is, X coarse movement stage 222 is a member that can move while a position in the X-axis direction with substrate holder 32 stays within a predetermined range. Also, concurrently with, or independently from the movement of substrate holder 32 described above in the X-axis direction, the main controller appropriately moves substrate holder 32 in the Y-axis direction and the θz direction, using the two Y linear motors (Y movers 244 and Y stators 226).

Next, a substrate measurement system 250 according to the second embodiment will be described. With substrate measurement system 250, while the extending direction (the direction wider in the measurement range) of each of an upward scale 252 and a downward scale 254 is different by 90 degrees around the Z-axis from the first embodiment, the concept of the measurement system is roughly the same as that of the first embodiment described above, on the point that position information on the first movable body (in this case, substrate holder 32) is obtained with optical surface plate 18a (refer to FIG. 1) serving as a reference, via the second movable body (in this case, X coarse movement stage 222).

Figure 7:
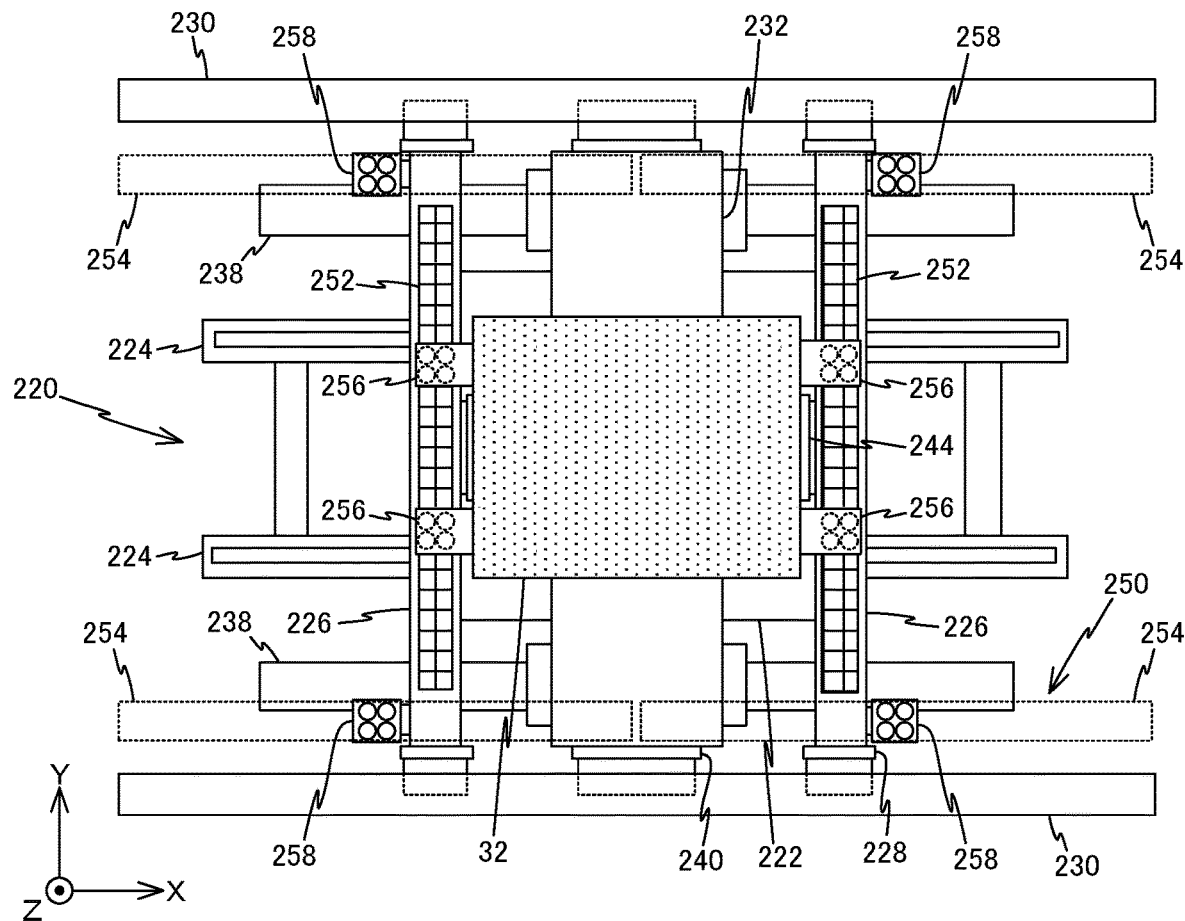
FIG. 7 is a planar view showing a substrate stage device according to a second embodiment.

That is, as is shown in FIG. 7, on the upper surface of each of the pair of Y stators 226, upward scale 252 extending in the Y-axis direction is fixed. Also, to both side surfaces in the X-axis direction of substrate holder 32, a pair of head bases 256 is fixed, arranged apart in the Y-axis direction. To head bases 256, similarly to the first embodiment described above, two downward X heads 74x and two downward Y heads 74y (refer to FIG. 10) are attached so that the heads face the corresponding upward scales 252. Position information on substrate holder 32 within the XY plane with respect to X coarse movement stage 222 is obtained by the main controller (not shown), using a total of eight X linear encoders and a total of eight Y linear encoders.

Also, at both ends near the edge in the Y-axis direction of Y stator 226, a head base 258 is fixed. To head base 258, similarly to the first embodiment described above, two upward X heads 80x and two upward Y heads 80y (refer to FIG. 9) are attached to face the corresponding downward scale 254 fixed to the lower surface of optical surface plate 18a (refer to FIG. 1). The relative positional relation between upward scale 252 and each of the heads 80x and 80y is known. Position information on X coarse movement stage 222 within the XY plane with respect to optical surface plate 18a is obtained by the main controller (not shown), using a total of eight X linear encoders and a total of eight Y linear encoders.

Note that with substrate measurement system 250 of the second embodiment, while two upward scales 252 are attached to X coarse movement stage 222 and four downward scales 254 are attached to optical surface plate 18a (refer to FIG. 1), the number and arrangement of each of the scales 252 and 254 are not limited to this, and can be appropriately increased or decreased. Similarly, the number and arrangement of each of the heads 74x, 74y, 80x, and 80y facing each of the scales 252 and 254 are not limited to this, and can be appropriately increased or decreased. The same also applies to the third to seventeenth embodiments that will be described below.

Third Embodiment

Next, a liquid crystal exposure apparatus according to a third embodiment will be described, using FIGS. 11 to 14. Since the structure of the liquid crystal exposure apparatus according to the third embodiment is roughly the same as that of the second embodiment described above, except for the point that the structure of a substrate stage device 320 (including the measurement system) is different, only the different points will be described below, and for elements having the same structure or function as the second embodiment described above will have the same reference code as the second embodiment and the description thereabout will be omitted.

Substrate stage device 320 according to the third embodiment has a first system including substrate holder 32 (refer to FIG. 14), and a second system including X coarse movement stage 222 (refer to FIG. 13), similarly to the second embodiment described above. Since the structure of substrate holder 32 and X coarse movement stage 222 (including the drive systems) is the same as that of the second embodiment described above, the description thereabout will be omitted.

A substrate measurement system 350 of the third embodiment is also conceptually similar to the first and the second embodiments described above, and position information on the first movable body (in this case, substrate holder 32) is obtained with optical surface plate 18a (refer to FIG. 1) serving as a reference, via the second movable body (in this case, Y beam guide 232). Y beam guide 232 is a member that can move while a position in the X-axis direction with substrate holder 32 stays within a predetermined range. Next, the details of substrate measurement system 350 will be described.

Figure 14:
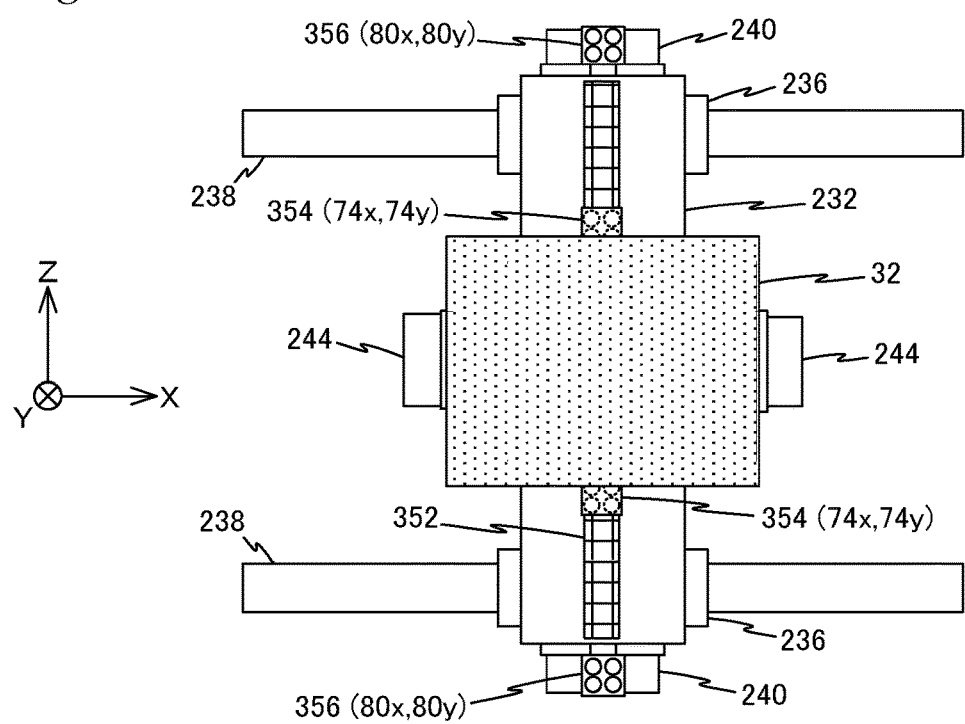
FIG. 14 is a view showing a first system of the substrate stage device in FIG. 11.

As is shown in FIG. 14, an upward scale 352 is fixed to the upper surface of Y beam guide 232. Also, to both side surfaces in the Y-axis direction of Y table 234 (not shown in FIG. 14, refer to FIG. 12) head bases 354 are fixed. To each head base 354, similarly to the first and the second embodiments described above, two downward X heads 74x and two downward Y heads 74y are attached so that the heads face the corresponding upward scale 352. Position information on substrate holder 32 within the XY plane with respect to Y beam guide 232 is obtained by the main controller (not shown), using a total of four X linear encoders and a total of four Y linear encoders.

Also, at both ends near the edge in the Y-axis direction of Y beam guide 232, a head base 356 is fixed. To head base 356, similarly to the first embodiment described above, two upward X heads 80x and two upward Y heads 80y are attached to face the corresponding downward scale 358 fixed to the lower surface of optical surface plate 18a (refer to FIG. 1). The relative positional relation between upward scale 352 and each of the heads 80x and 80y attached to head base 356 is known. Position information on Y beam guide 232 within the XY plane with respect to optical surface plate 18a is obtained by the main controller (not shown), using a total of four X linear encoders and a total of four Y linear encoders. The number of upward scales 352 and downward scales 358 in the third embodiment is less than and the structure more simple than that of the second embodiment.

Fourth Embodiment

Next, a liquid crystal exposure apparatus according to a fourth embodiment will be described, using FIGS. 15 to 18. Since the structure of the liquid crystal exposure apparatus according to the fourth embodiment is roughly the same as that of the second embodiment described above, except for the point that the structure of a substrate stage device 420 (including the measurement system) is different, only the different points will be described below, and for elements having the same structure or function as the second embodiment described above will have the same reference code as the second embodiment and the description thereabout will be omitted.

Substrate stage device 420 according to the fourth embodiment has a first system including substrate holder 32 (refer to FIG. 18), and a second system including X coarse movement stage 222 (refer to FIG. 17), similarly to the second embodiment described above.

Figure 16:
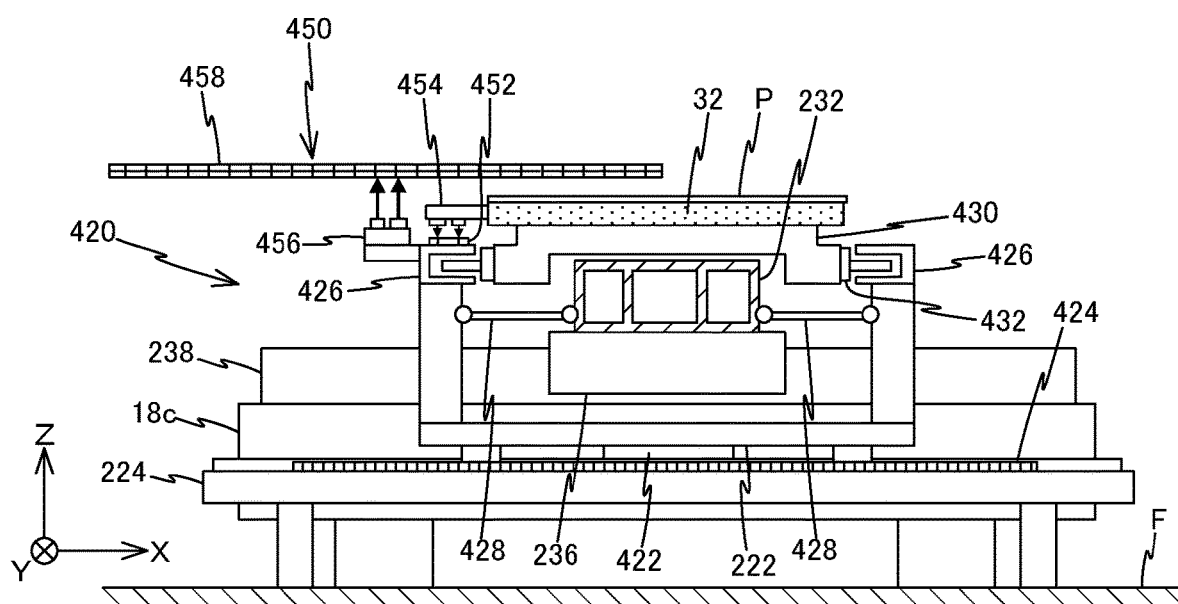
FIG. 16 is a cross-section view of the substrate stage device in FIG. 15.

As is shown in FIG. 16, to the lower surface of X coarse movement stage 222, an X mover 422 is fixed. X mover 422 structures an X linear motor; working together with an X stator 424 integrally attached to the pair of base frames 224 to move X coarse movement stage 222 in predetermined long strokes in the X-axis direction. At both ends near the edge in the X-axis direction of X coarse movement stage 222, XY stators 426 are attached.

Figure 15:
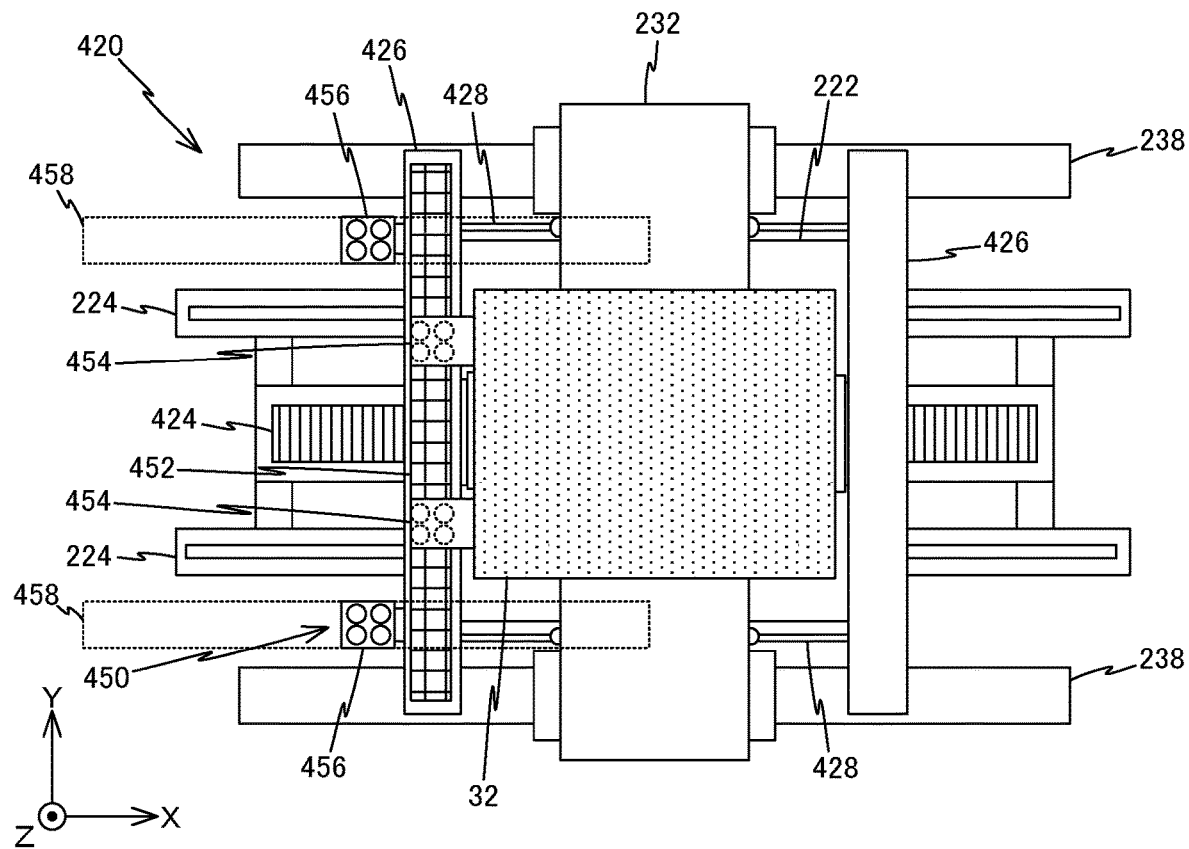
FIG. 15 is a planar view showing a substrate stage device according to a fourth embodiment.

Y beam guide 232 is mechanically connected to X coarse movement stage 222 by four connecting members 428 (refer to FIG. 15). The structure of connecting members 428 is similar to that of connecting members 46 and 54 (refer to FIG. 2). With this structure, when X coarse movement stage 222 is moved in the X-axis direction by the X linear motor, Y beam guide 232 is pulled by X coarse movement stage 222, and moves in the X-axis direction integrally with X coarse movement stage 222.

On Y beam guide 232, a Y table 430 is mounted in a non-contact manner. On Y table 430, substrate holder 32 is fixed. At both ends near the edge in the X-axis direction of Y table 430, XY movers 432 are attached. XY movers 432 work together with XY stators 426 to structure an XY 2-DOF motor, and Y table 430 is moved in predetermined long strokes in the Y-axis direction by a total of two XY 2-DOF motors, and is also finely moved in the X direction and the θz direction. Also, when X coarse movement stage 222 (and Y beam guide 232) moves in long strokes in the X-axis direction, the main controller (not shown), using the total of two XY 2-DOF motors, makes thrust act in the X-axis direction so that Y table 430 (that is, substrate holder 32) maintains a predetermined positional relation in the X-axis direction with Y beam guide 232. That is, X coarse movement stage 222 is a member that can be moved so that the position in the X-axis direction with substrate holder 32 stays within a predetermined range. Note that different from the second embodiment described above, Y table 430 does not have air bearings 242 (refer to FIG. 8) that are swingable, and Y beam guide 232 of the embodiment, and Y beam guide 232 in the embodiment actually does not guide Y table 430 moving in the Y-axis direction.

A substrate measurement system 450 of the fourth embodiment is also conceptually similar to the first to the third embodiments described above, and position information on the first movable body (in this case, substrate holder 32) is obtained with optical surface plate 18a (refer to FIG. 1) serving as a reference, via the second movable body (in this case, X coarse movement stage 222). Next, the details of substrate measurement system 450 will be described.

Figure 17:
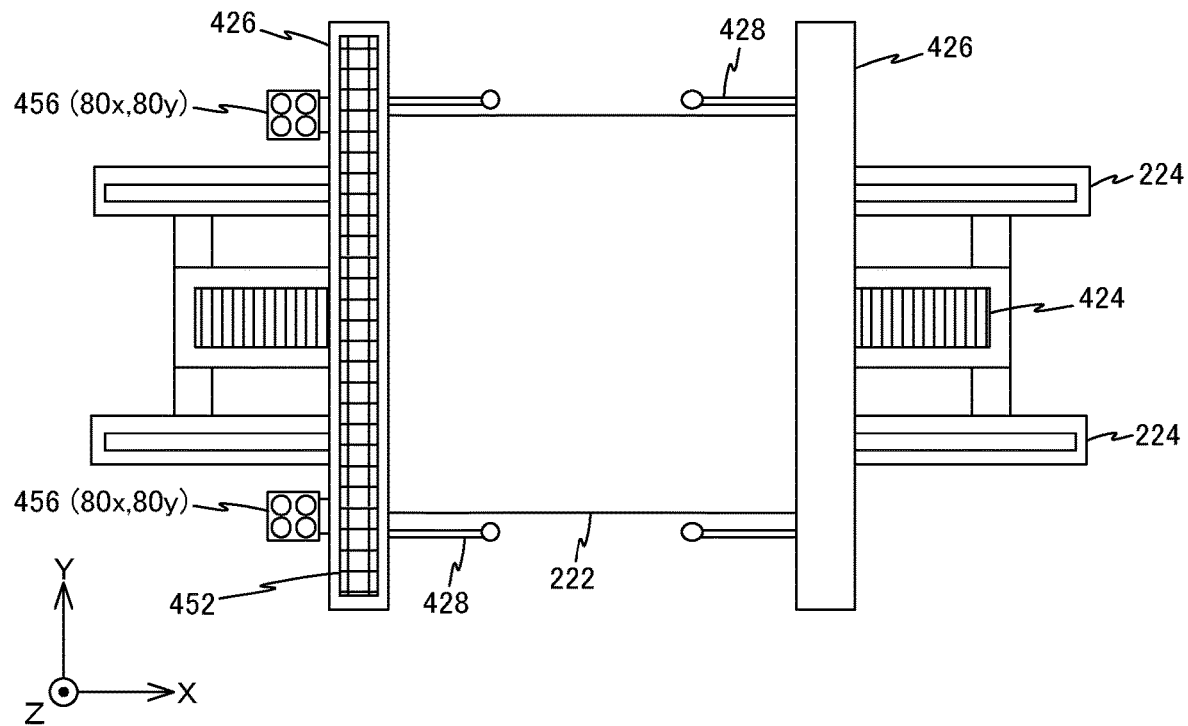
FIG. 17 is a view showing a second system of the substrate stage device in FIG. 15.
Figure 18:
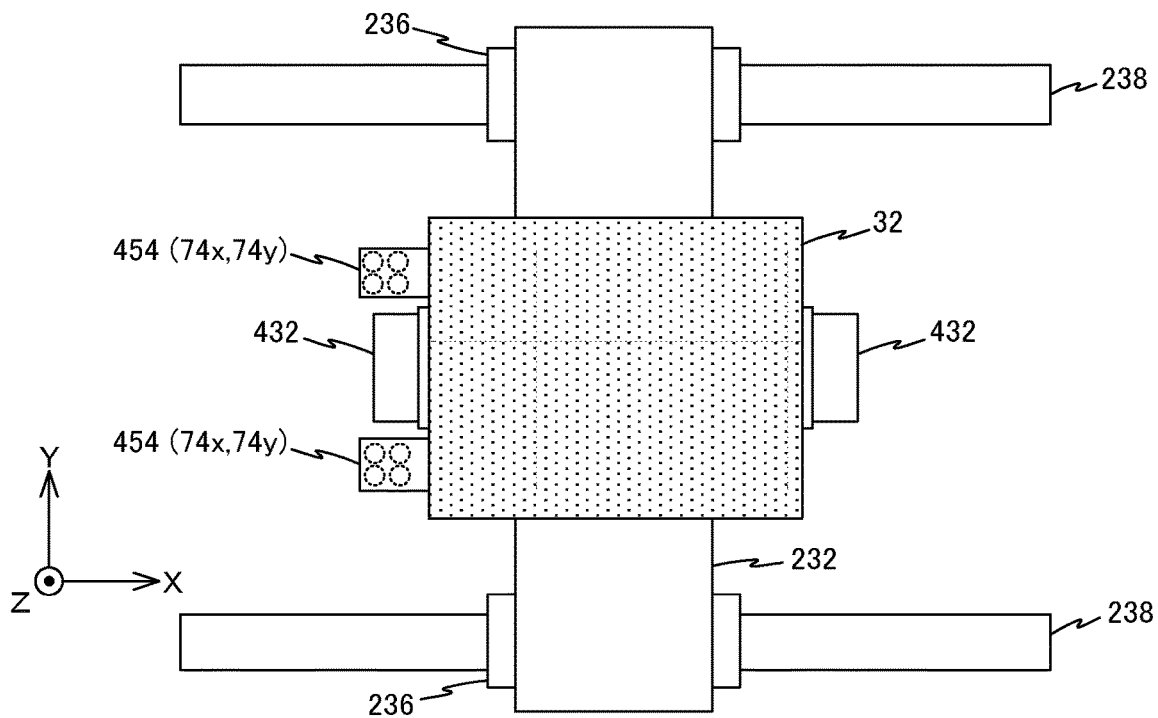
FIG. 18 is a view showing a first system of the substrate stage device in FIG. 15.
Figure 19:
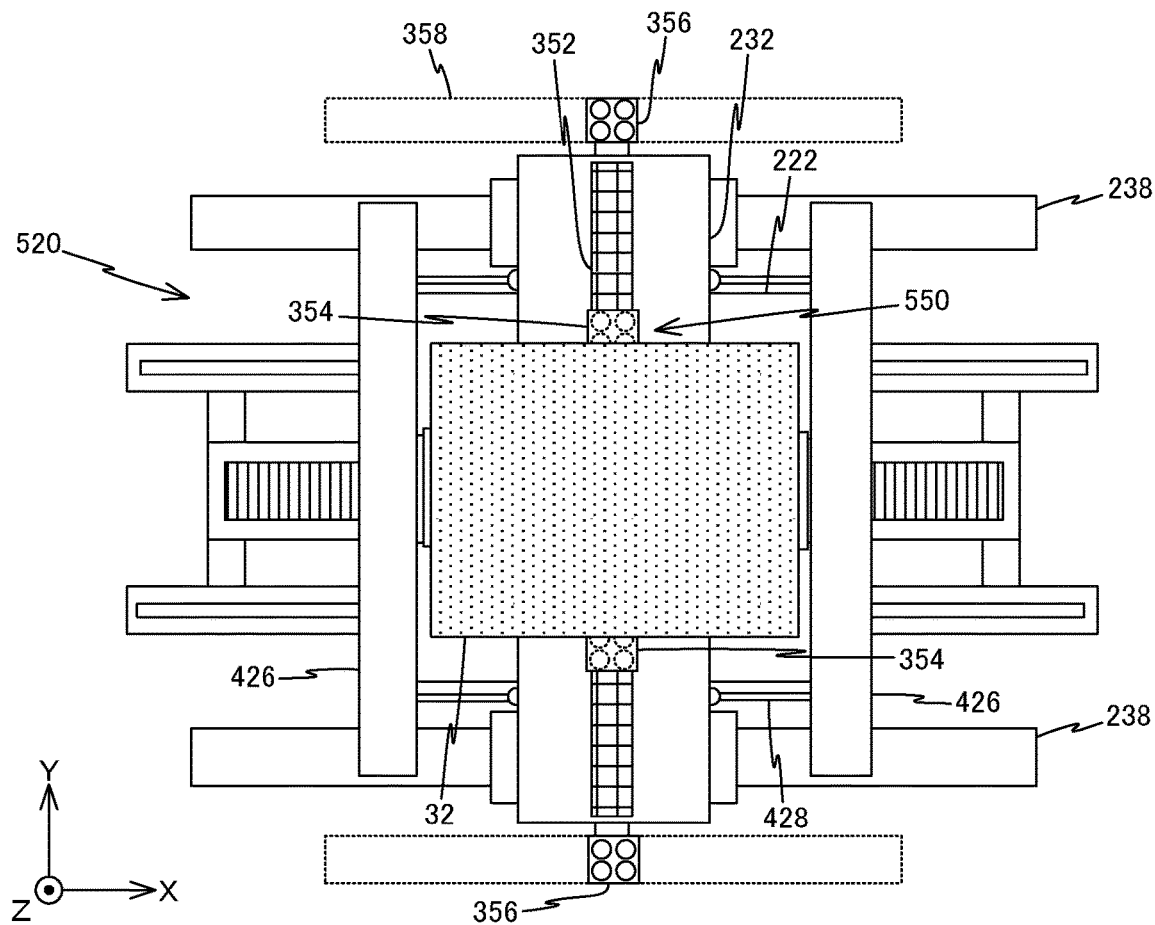
FIG. 19 is a planar view showing a substrate stage device according to a fifth embodiment.
Figure 20:
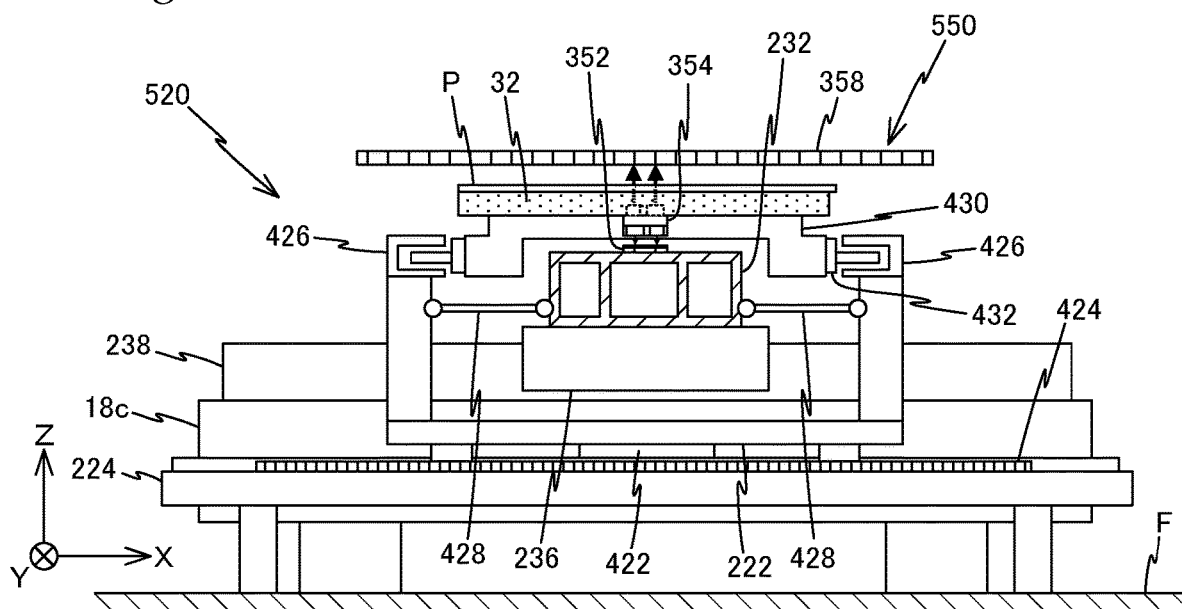
FIG. 20 is a cross-section view of the substrate stage device in FIG. 19.

As is shown in FIG. 17, of the pair of XY stators 426, an upward scale 452 is fixed to the upper surface of one of the XY stators 426 (here, the −X side). Also, as is shown in FIG. 18, a pair of head bases 454 is fixed to the side surface n the −X side of substrate holder 32, in a state arranged apart in the Y-axis direction. To each head base 454, similarly to the first to the third embodiments described above, two downward X heads 74x and two downward Y heads 74y are attached so that the heads face the corresponding upward scale 452 (refer to FIG. 16). Position information on substrate holder 32 within the XY plane with respect to X coarse movement stage 222 is obtained by the main controller (not shown), using a total of four X linear encoders and a total of four Y linear encoders.

Also, to XY stator 426 on the −X side, a pair of head bases 456 is fixed, arranged apart in the Y-axis direction. To head base 456, similarly to the first embodiment described above, two upward X heads 80x and two upward Y heads 80y are attached (refer to FIG. 15) to face the corresponding downward scale 458 fixed to the lower surface of optical surface plate 18a (refer to FIG. 1). The relative positional relation between upward scale 452 and each of the heads 80x and 80y attached to head base 456 is known. Position information on X coarse movement stage 222 within the XY plane with respect to optical surface plate 18a is obtained by the main controller (not shown), using a total of four X linear encoders and a total of four Y linear encoders. Note that upward scale 452 may be attached only to one of, or to both of the pair of XY stators 426. In the case of attaching upward scale 452 to XY stator 426 on the +X side, head bases 454 and 456, and downward scale 254 may be arranged additionally, corresponding to upward scale 452.

Fifth Embodiment

Next, a liquid crystal exposure apparatus according to a fifth embodiment will be described, using FIGS. 19 to 22. The structure of the liquid crystal exposure apparatus according to the fifth embodiment is roughly the same as that of the fourth embodiment, except for the point that the structure of a substrate measurement system 550 is different. Also, the structure of substrate measurement system 550 is roughly the same as substrate measurement system 350 (refer to FIG. 11 and the like) of the third embodiment described above. Hereinafter, only the different points will be described, and for elements having the same structure or function as the third or the fourth embodiment described above will have the same reference code as the third or the fourth embodiments, and the description thereabout will be omitted.

The structure of substrate stage device 520 (excluding the measurement system) according to the fifth embodiment is substantially the same as substrate stage device 420 (refer to FIG. 15) according to the fourth embodiment described above. That is, substrate stage device 520 has a first system including substrate holder 32 (refer to FIG. 22), and a second system including X coarse movement stage 222 (refer to FIG. 21), and X coarse movement stage 222 moves integrally with Y beam guide 232 in the X-axis direction. Y table 430, to which substrate holder 32 is fixed, is moved in long strokes in the Y-axis direction with respect to X coarse movement stage 222 by two 2-DOF motors, and is also finely moved in the X direction and the θz direction. While the conventional coarse movement stage was moved based on measurement results of an encoder with low measurement accuracy, in the embodiment, it is possible to move and control X coarse movement stage 222 based on measurement results of a two-dimensional encoder with high accuracy. Accordingly, while positioning with higher precision than that of the conventional fine movement stage becomes possible, X coarse movement stage 222 does not necessarily have the responsiveness that the fine movement stage (in the embodiment, substrate holder 32) has. Therefore, the X position of substrate holder 32 should be controlled to move while performing an accurate positioning at a constant speed, regardless of the position of X coarse movement stage 222 during scanning operation. Therefore, substrate holder 32 is to be finely moved relatively in the X-axis direction with respect to X coarse movement stage 222 which moves while performing rough positioning control with low responsiveness. On this operation, when X coarse movement stage 222 accelerates, a reading error may occur of the encoder with respect to upward scale 452. Accordingly, X coarse movement stage 222 should be controlled rather to perform loose positioning (low responsiveness). Of each of the embodiments that will be described below, the coarse movement stage should be controlled similarly in an embodiment where coarse movement stage moves on scanning operation.

Also, the structure of substrate measurement system 550 according to the fifth embodiment is substantially the same as that of substrate measurement system 350 (refer to FIG. 11) according to the third embodiment, and position information on the first movable body (in this case, substrate holder 32) is obtained with optical surface plate 18a (refer to FIG. 1) serving as a reference, via the second movable body (in this case, Y beam guide 232). Specifically, to the pair of head bases 354 fixed to Y table 430 (refer to FIG. 20), two downward X heads 74x and two downward Y heads 74y are attached (each refer to FIG. 22) to face upward scale 352 fixed to the upper surface of Y beam guide 232, and position information on substrate holder 32 within the XY plane with respect to Y beam guide 232 is obtained by the main controller (not shown), using a total of four X linear encoders and a total of four Y linear encoders. Also, a pair of head bases 356 fixed to Y beam guide 232, two upward X heads 80x and two upward Y heads 80y are attached (refer to FIG. 19) to face the corresponding downward scale 358 fixed to the lower surface of optical surface plate 18a (refer to FIG. 1). Position information on Y beam guide 232 within the XY plane with respect to optical surface plate 18a is obtained by the main controller (not shown), using a total of four X linear encoders and a total of four Y linear encoders.

Sixth Embodiment

Next, a liquid crystal exposure apparatus according to a sixth embodiment will be described, using FIGS. 23 to 27. Since the structure of the liquid crystal exposure apparatus according to the sixth embodiment is roughly the same as that of the first embodiment described above, except for the point that the structure of a substrate stage device 620 and its measurement system is different, only the different points will be described below, and for elements having the same structure or function as the first embodiment described above will have the same reference code as the first embodiment and the description thereabout will be omitted.

Figure 23:
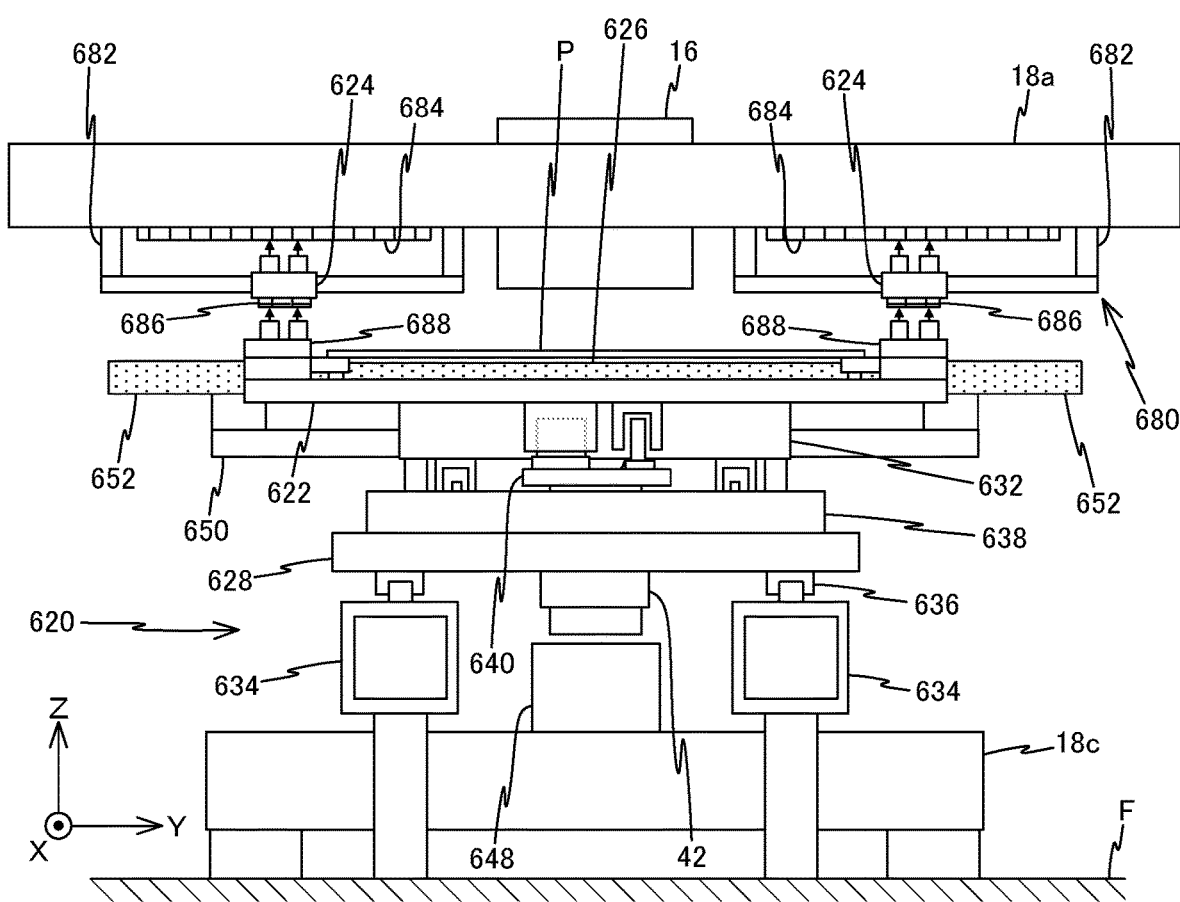
FIG. 23 is a view showing a substrate stage device according to a sixth embodiment.

As is shown in FIG. 23, substrate stage device 620 is equipped with; a substrate measurement system 680 including a first movable body (here, substrate holder 622) and a second movable body (here, measurement table 624), a substrate table 626, an X coarse movement stage 628 and the like.

Figure 24:
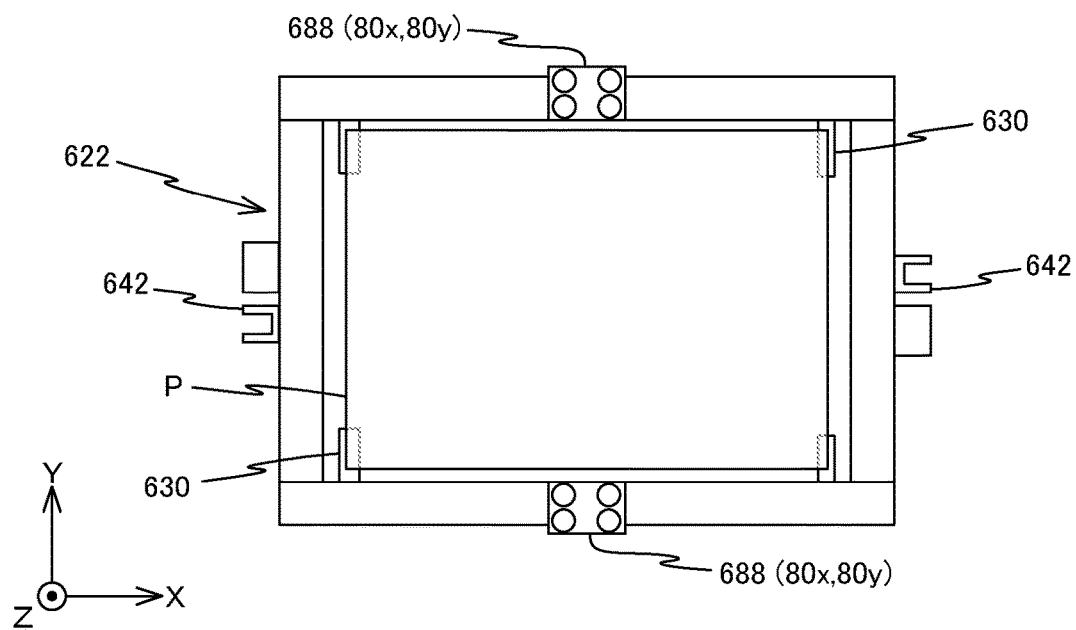
FIG. 24 is a view showing a substrate holder which is a part of the substrate stage device in FIG. 23.

As is shown in FIG. 24, substrate holder 622 is a frame shaped (picture frame shape) member with a rectangular shape in a planar view that is a combination of a pair of members extending in the Y-axis direction and a pair of members extending in the X-axis direction, and substrate P is arranged in an opening of substrate holder 622. Four suction pads 630 protrude from the inner walls of substrate holder 622, and substrate P is mounted on these suction pads 630. Each suction pad 630 holds by suction a non-exposure area (in the embodiment, an area near the four corners) set at an outer periphery section on the lower surface of substrate P.

Of substrate P, an exposure area (an area other than the outer periphery section) including the center is supported from below in a non-contact manner by substrate table 626. While substrate holder 32 (refer to FIG. 2 and the like) in the first to fifth embodiments performed flatness correction by holding substrate P by suction, with substrate table 626 according to the sixth embodiment, flatness correction of substrate P is performed in a non-contact manner by concurrently performing blow out of pressurized gas to the lower surface of substrate P and suction of gas between substrate P and the upper surface of substrate table 626. Also, substrate holder 622 and substrate table 626 are arranged physically separate. Accordingly, substrate P held by substrate holder 622 is in a state relatively movable within the XY plane with respect to substrate table 626, integrally with substrate holder 622. To the lower surface of substrate table 626, as is shown in FIG. 23, a stage main section 632 is fixed, similarly to that of the first embodiment described above.

X coarse movement stage 628, which is a member used to move substrate table 626 in the X-axis direction with long strokes, is mounted in a state freely movable in the X-axis direction on a pair of base frames 634 installed on floor F in a state physically separate from lower mount section 18c, via a mechanical linear guide device 636. X coarse movement stage 628 is moved in long strokes in the X-axis direction on the pair of base frames 634 by an actuator (such as a linear motor, a ball screw device or the like).

At both ends near the edge in the X-axis direction of X coarse movement stage 628, Y stators 638 are fixed (one of the stators not shown in FIG. 23). Y stators 638 work together with Y movers 640 to structure a Y linear motor. Y movers 640 are mechanically restricted to move in the X-axis direction integrally when Y stators 638 move in the X-axis direction. To Y movers 640, stators 644 are attached that structure XY 2-DOF motors together with movers 642 (refer to FIG. 24) attached to substrate holder 622.

Figure 25:
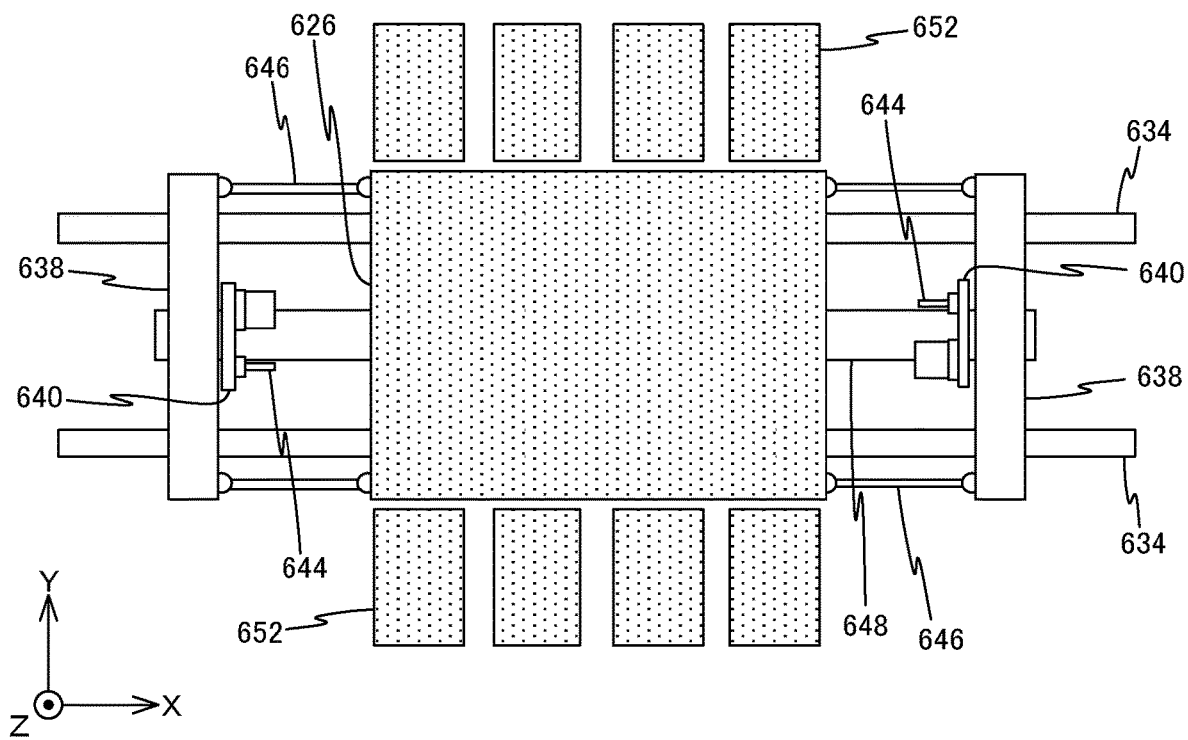
FIG. 25 is a view showing a system including a substrate table which is a part of the substrate stage device in FIG. 23.

As is shown in FIG. 25, substrate table 626 is mechanically connected to X coarse movement stage 628 (not shown in FIG. 25) (to Y stators 638 in FIG. 25) via a plurality of connecting members 646, via stage main section 632 (not shown in FIG. 25, refer to FIG. 23). The structure of connecting members 646 is similar to that of connecting members 46 and 54 (refer to FIG. 2). With this structure, when X coarse movement stage 628 moves in long strokes in the X-axis direction, substrate table 626 is pulled by X coarse movement stage 628, and is moved in the X-axis direction integrally with X coarse movement stage 628. In the first to the fifth embodiments described above, while substrate holder 32 moves in long strokes in the X-axis and the Y-axis directions with respect to projection optical system 16 (refer to FIG. 5 and the like), substrate table 626 in the sixth embodiment is structured movable in long strokes in only the X-axis direction, and is to be immovable in the Y-axis direction. Note that in FIG. 25, to facilitate understanding, while Y stators 638, Y movers 640, and stators 644 are arranged planar (the same height position) different from those of FIG. 23, by making the height of Y stators 638 equal to the height position of substrate holder 622, an arrangement like the one shown in FIG. 25 is actually possible.

Referring back to FIG. 23, stage main section 632 is supported from below by weight canceling device 42 arranged in an opening (not shown) formed in the center of X coarse movement stage 628, via a pseudospherical bearing device (not shown in FIG. 23 being arranged in the depth of the page surface, such as behind Y mover 640) similar to that of the first embodiment described above. The structure of weight canceling device 42, which is similar to that of the device in the first embodiment described above, is connected to X coarse movement stage 628 via a connecting member (not shown), and moves in long strokes in only the X-axis direction integrally with X coarse movement stage 628. Weight canceling device 42 is mounted on an X guide 648. Since weight canceling device 42 in the embodiment is structured to move only in the X-axis direction, X guide 648 is fixed to lower mount section 18c, different from Y step guide 44 (refer to FIG. 2) in the first embodiment described above. The point that stage main section 632 is finely moved in each of the Z-axis, the θx, and the θy directions by a plurality of linear coil motors (hidden in the depth side of the page surface of Y stators 638 in FIG. 23) is similar to that of the first embodiment described above.

Also, to both side surfaces in the Y-axis direction of stage main section 632, a plurality of air guides 652 is attached via support member 650. Air guides 652, as is shown in FIG. 25, is a member having a rectangular shape in a planar view, and in the embodiment, four each of the air guides are arranged on the +Y side and the −Y side of substrate table 626. The length in the Y-axis direction of a guide surface formed by the four air guides 652 is set equal to that of substrate table 626, and the height position of the guide surface is set equivalent to (or slightly lower than) the upper surface of substrate table 626.

With substrate stage device 620 (refer to FIG. 23), when X coarse movement stage 628 moves in long strokes in the X-axis direction at the time of scanning exposure and the like, substrate table 626 (and the plurality of air guides 652) is pulled by X coarse movement stage 628, and moves integrally in long strokes in the X-axis direction. Also, by Y stators 638 fixed to X coarse movement stage 628 moving in the X-axis direction, stators 644 (refer to FIG. 25) of the 2-DOF motors attached to Y mover 640 also move in the X-axis direction. The main controller (not shown) controls the 2-DOF motors so that position in the X-axis direction of substrate table 626 and substrate holder 622 is within a predetermined range, and gives substrate holder 622 thrust in the X-axis direction. Also, the main controller controls the 2-DOF motors and finely moves substrate holder 622 appropriately in the X-axis, the Y-axis, and the θz directions with respect to substrate table 626. As is described, in the embodiment, substrate holder 622 has a function as a so-called fine movement stage.

Figure 27:
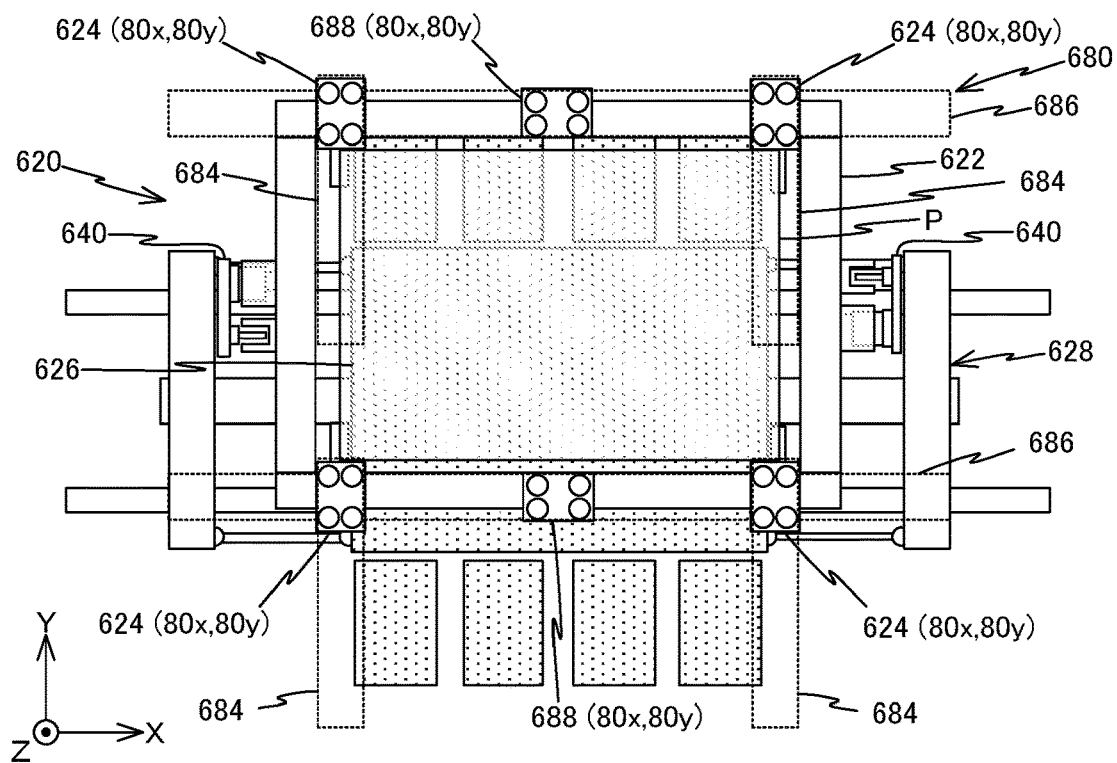
FIG. 27 is a view used to explain an operation of a substrate measurement system in FIG. 26.

Meanwhile, in the case substrate P has to be moved in the Y-axis direction at the time of movement between shot areas (exposure areas), as is shown in FIG. 27, the main controller moves substrate holder 622 in the Y-axis direction with respect to substrate table 626, by making Y mover 640 move in the Y-axis direction by the Y linear motor and also making thrust in the Y-axis direction act on substrate holder 622 using the 2-DOF motors. Of substrate P, in the area (exposure area) where the mask pattern is projected via projection optical system 16 (refer to FIG. 23), size in the Y-axis direction of substrate table 626 is set so that flatness correction is performed by substrate table 626 at all times. Each air guide 652 is arranged so that relative movement in the Y-axis direction of substrate holder 622 and substrate table 626 is not disturbed (does not come into contact with substrate holder 622). Each air guide 652, by blowing out pressurized gas to the lower surface of substrate P, works together with substrate table 626 to support from below portions of substrate P that protrude from substrate table 626. Note that each air guide 652 is different from substrate table 626 and does not perform flatness correction on substrate P. In substrate stage device 620, as is shown in FIG. 27, scanning exposure is performed by substrate table 626 and substrate holder 622 being moved in the X-axis direction with respect to projection optical system 16 (refer to FIG. 23), in a state where substrate P is supported by substrate table 626 and air guides 652. Note that air guides 652 may, or may not be moved in the X-axis direction integrally with stage main section 632. In the case air guides 652 are not moved in the X-axis direction, the size in the X-axis direction should be about the same as the moving range of substrate P in the X-axis direction. This can prevent a part of an area of the substrate that is not supported by substrate table 626 from being unsupported.

Next, a structure and operation of substrate measurement system 680 according to the sixth embodiment will be described. In the first embodiment (refer to FIG. 2) described above, while position information on the first movable body (fine movement stage 22 in the first embodiment) was obtained via Y coarse movement stage 24 which is a member for moving fine movement stage 22 with optical surface plate 18a serving as a reference, in the sixth embodiment (refer to FIG. 23), position information on the first movable body (in this case, substrate holder 622) is obtained via a second movable body (in this case, measurement table 624) arranged independently from substrate holder 622 with optical surface plate 18a serving as a reference. In the sixth embodiment, while measurement table 624 is arranged; two on the +Y side, and two on the −Y side (a total of four) of projection optical system 16 placed apart in the X-axis direction (refer to FIGS. 23, 26 and the like), the number and arrangement of measurement table 624 can be appropriately changed, and is not limited to this.

Measurement table 624, as is shown in FIG. 23, is moved in predetermined (equivalent to the movable distance of substrate holder 622 in the Y-axis direction) strokes in the Y-axis direction by a Y linear actuator 682 fixed in a state suspended from the lower surface of optical surface plate 18a. The type of Y linear actuator 682 is not limited in particular, and a linear motor, a ball screw device, or the like can be used.

Figure 26:
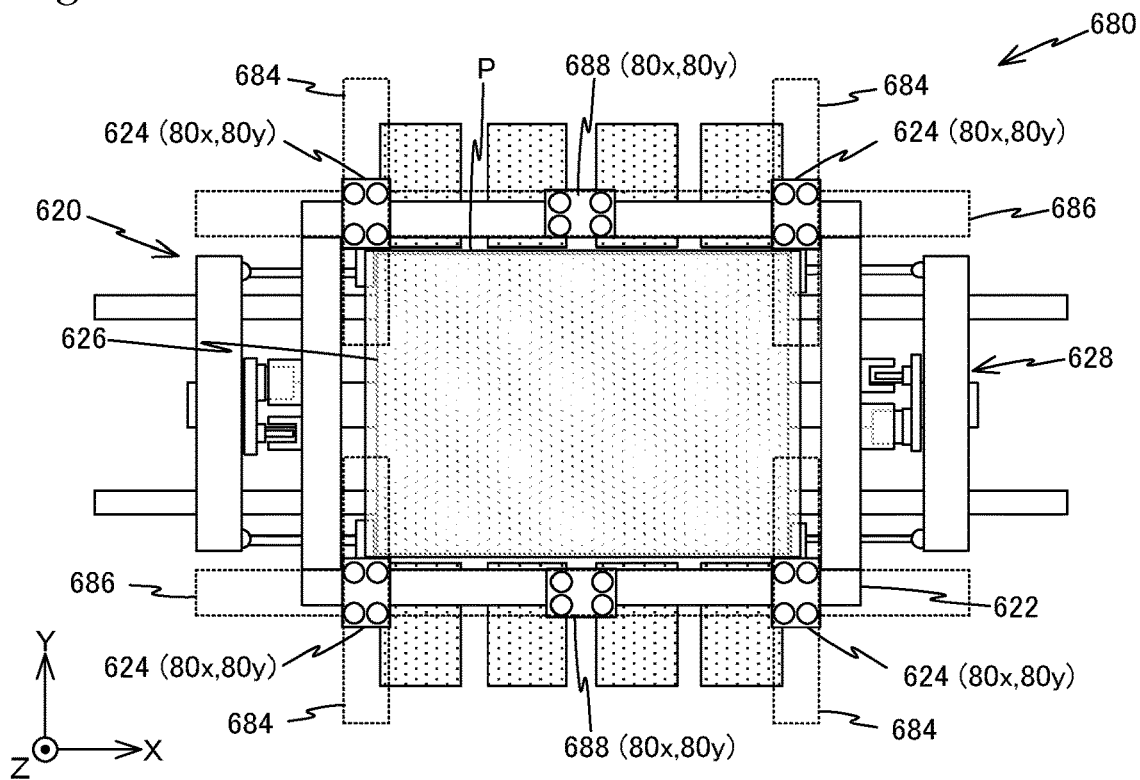
FIG. 26 is a view used to explain a structure of a substrate measurement system according to the sixth embodiment.

Similarly to head base 96 (refer to FIGS. 2, 3 and the like) of the first embodiment, on the upper surface of each measurement table 624, two upward X heads 80x and two upward Y heads 80y are attached, as is shown in FIG. 26.

Also, as is shown in FIG. 23, to the lower surface of optical surface plate 18a, downward scales 684 extending in the Y-axis direction corresponding to each measurement table 624 (that is, four) are fixed (refer to FIG. 26), similarly to downward scales 78 (refer to FIGS. 2, 3 and the like) in the first embodiment described above. Downward scales 684 have two-dimensional diffraction gratings on their lower surfaces so that the measurement range in the Y-axis direction of measurement table 624 becomes wider (longer) than the measurement range in the X-axis direction. In the embodiment, the two upward X heads 80x that each measurement table 624 has and the corresponding downward scales 684 (fixed scales) structure two X linear encoder systems, and the two upward Y heads 80y that each measurement table 624 has and the corresponding downward scales 684 (fixed scales) structure two Y linear encoder systems.

The main controller (not shown), as is shown in FIG. 27, controls position of each measurement table 624 in the Y-axis direction, so that the position in the Y-axis direction with respect to substrate holder 622 stays within a predetermined range on moving substrate holder 622 in long strokes in the Y-axis direction. Accordingly, the total of four measurement tables 624 substantially performs the same operation. Note that the four measurement tables 624 do not necessarily have to move strictly in synchronization with one another, and also does not necessarily have to move strictly in synchronization with substrate holder 622. The main controller obtains position information on each measurement table 624 in the X-axis direction, the Y-axis direction, and the θz direction independently, appropriately using the output of the two X linear encoder systems and the two Y linear encoder systems.

Referring back to FIG. 26, to the lower surface of the two measurement tables 624 on the +Y side, downward scales 686 extending in the X-axis direction are attached (refer to FIG. 23). That is, the two measurement tables 624 work together to suspend and support downward scales 686. Also to the lower surface of the two measurement tables 624 on the −Y side, downward scales 686 extending in the X-axis direction are similarly attached. Downward scales 686 have two-dimensional diffraction gratings on their lower surfaces so that the measurement range in the X-axis direction of substrate holder 622 becomes wider (longer) than the measurement range in the Y-axis direction. The relative positional relation between upward heads 80x and 80y and downward scales 686 fixed to measurement table 624 is known.

As is shown in FIG. 24, to the upper surface of substrate holder 622, two head bases 688 are fixed, corresponding to a total of two downward scales 684 (refer to FIG. 26). Head bases 688 are arranged on the +Y side and the −Y side of substrate P sandwiching the center part of substrate P, in a state where substrate P is held on substrate holder 622. To the upper surface of head bases 688, two upward X heads 80x and two upward Y heads 80y are attached.

As is described above, substrate holder 622 and each measurement table 624 (that is, the two downward scales 686) are controlled so that the positions in the Y-axis direction stays within a predetermined range. Specifically, with each measurement table 624, the position in the Y-axis direction is controlled so that measurement beams from each of the heads 80x and 80y attached to substrate holder 622 do not move off from the grating surfaces of downward scales 686. That is, substrate holder 622 and each measurement table 624 move in the same direction roughly at the same speed so that the state of head bases 688 facing downward scales 686 is maintained at all times.

As is described, in the sixth embodiment, the four upward X heads 80x that substrate holder 622 has and the corresponding downward scales 686 (movable scales) structure four X linear encoder systems, and the four upward Y heads 80y that substrate holder 622 has and the corresponding downward scales 686 (movable scales) structure four Y linear encoder systems. The main controller (not shown) obtains position information on substrate holder 622 within the XY plane with respect to the total of four measurement tables 624, based on the output of the four X linear encoder systems and the four Y linear encoder systems described above. The main controller obtains position information on substrate holder 622 (substrate P) with optical surface plate 18a serving as a reference, based on position information (first information) on substrate holder 622 with respect to each measurement table 624, position information (second information) on each measurement table 624 with respect to optical surface plate 18a, and position information (third information) on upward heads 80x and 80y and downward scales 686 in each measurement table 624.

Seventh Embodiment

Next, a liquid crystal exposure apparatus according to a seventh embodiment will be described, using FIGS. 28 to 31. Since the structure of the liquid crystal exposure apparatus according to the seventh embodiment is roughly the same as that of the sixth embodiment described above, except for the point that the structure of a substrate stage device 720 and its measurement system is different, only the different points will be described below, and for elements having the same structure or function as the sixth embodiment described above will have the same reference code as the sixth embodiment and the description thereabout will be omitted.

Also in the seventh embodiment, substrate stage device 720 is equipped with a substrate measurement system 780 and the like; including a first movable body (here, a pair of substrate holders 722), and a second movable body (here, measurement table 624).

In the sixth embodiment (refer to FIG. 26 and the like), while substrate holder 622 was formed in a rectangular frame shape that surrounds the entire outer periphery of substrate P, the pair of substrate holders 722 according to the seventh embodiment is physically separated and differs on the point that one of the substrate holders 722 holds the end near the +X side of substrate P by suction, and the other substrate holder 722 holds the end near the −X side of substrate P by suction. Since the structure and function of substrate table 626, and the drive system for moving substrate table 626 is the same as those of the sixth embodiment described above, the description thereabout will be omitted.

Figure 29:
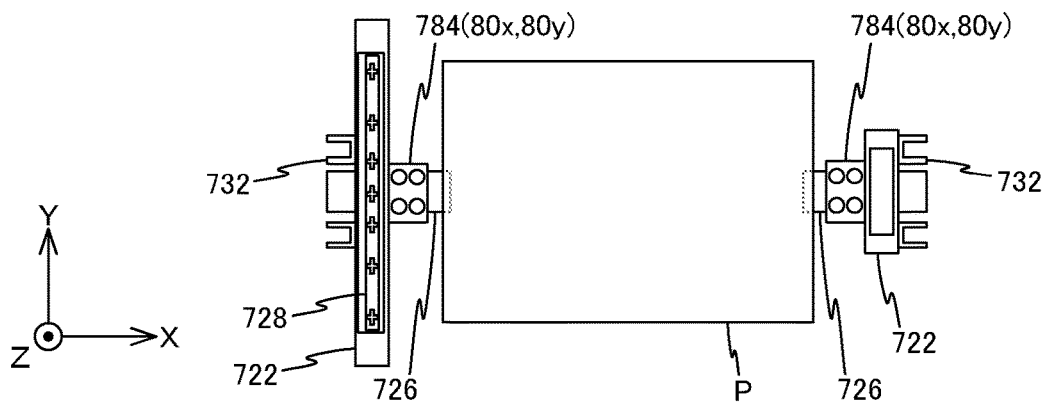
FIG. 29 is a view showing a substrate holder which is a part of the substrate stage device in FIG. 28.
Figure 30:
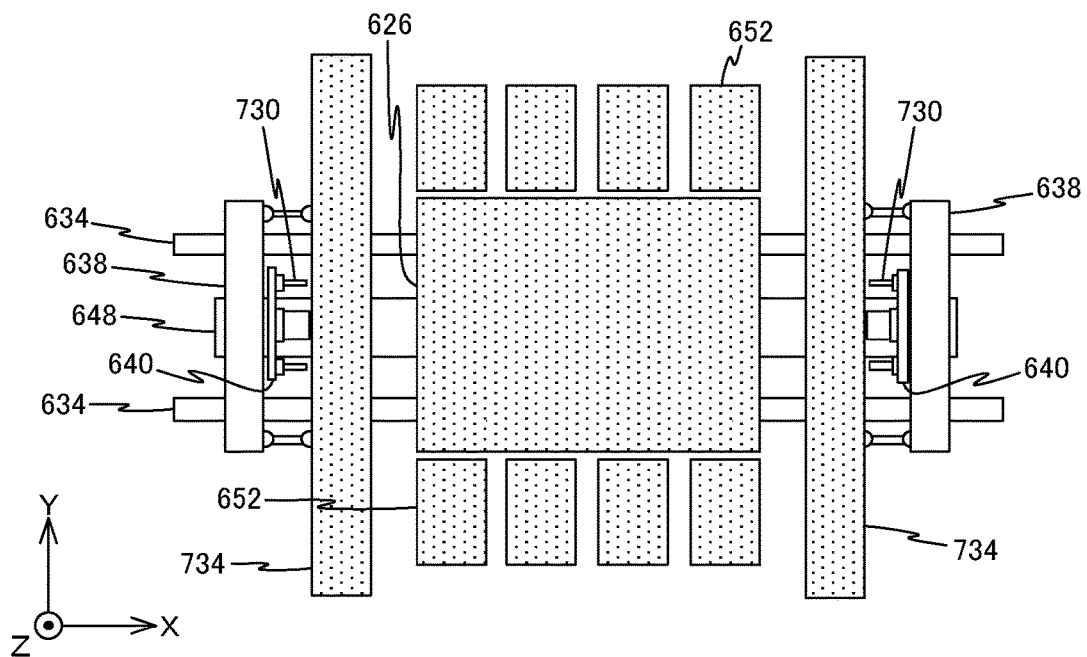
FIG. 30 is a view showing a system including a substrate table which is a part of the substrate stage device in FIG. 28.

As is shown in FIG. 29, each substrate holders 722 has a suction pad 726 that holds the center in the Y-axis direction of substrate P from below. Note that since a measurement plate 728 is attached to the upper surface of substrate holder 722 on the −X side, the length in the Y-axis direction is set longer than substrate holder 722 on the +X side, however, the function to hold substrate P, position control operation and the like of substrate P is common in the pair of substrate holders 722, therefore, in the embodiment, for convenience, the pair of substrate holders 722 will be described having a common reference code. On measurement plate 728, an index is formed that is used for calibration and the like relating to optical properties (scaling, shift, rotation and the like) of projection optical system 16 (refer to FIG. 1).

Each substrate holder 722 is finely moved by 3-DOF motors structured by stators 730 that Y mover 640 has (each refer to FIG. 30) and movers 732 that each substrate holder 722 has (each refer to FIG. 29), in the X, the Y, and the θz directions with respect to the corresponding Y mover 640. In the embodiment, as the 3-DOF motor, while a combination of two X linear motors and one Y linear motor is used, the structure of the 3-DOF motor is not limited in particular, and may be appropriately changed. In the seventh embodiment, while each substrate holder 722 is moved independently with each other by the 3-DOF motor, the movement itself of substrate P is similar to the sixth embodiment described above.

Referring back to FIG. 28, each substrate holder 722 is supported from below in a non-contact manner by an air guide 734 extending in the Y-axis direction (refer to FIG. 31 for substrate holder 722 on the −X side). The height position of the upper surface of air guide 734 is set lower than the height position of the upper surface of substrate table 626 and air guides 652. The length of air guide 734 is set to around the same (or slightly longer than) the movable distance of substrate holders 722 in the Y-axis direction. Air guide 734 is also fixed to stage main section 632 similarly to air guides 652, and moves in long strokes in the X-axis direction integrally with stage main section 632. Note that air guide 734 may be applied to substrate stage device 620 in the sixth embodiment described above.

Next, substrate measurement system 780 according to the seventh embodiment will be described. Substrate measurement system 780 according to the seventh embodiment is roughly the same conceptually as substrate measurement system 680 (refer to FIG. 26) according to the sixth embodiment described above, except for the point that the arrangement of heads on the substrate P side, the number and arrangement of measurement table 624 and the like are different. That is, in substrate measurement system 780, position information on the first movable body (in this case, each substrate holder 722) is obtained via measurement table 624 with optical surface plate 18a serving as a reference. The details will be described below.

Figure 28:
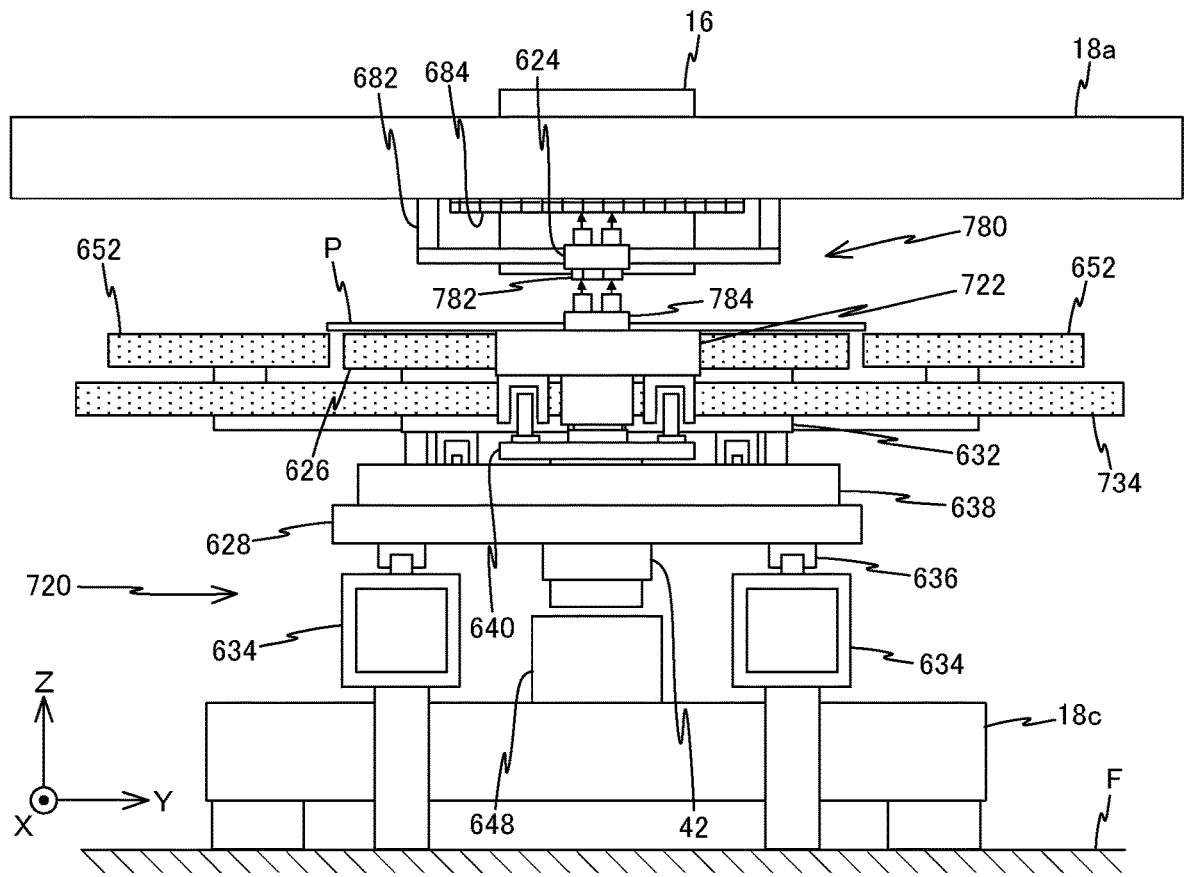
FIG. 28 is a view showing a substrate stage device according to a seventh embodiment.

The structure of measurement table 624 that substrate measurement system 780 has is the same as that of the sixth embodiment described above except for the arrangement. In the sixth embodiment, as is shown in FIG. 23, while measurement tables 624 were arranged on the +Y side and the −Y side of projection optical system 16, with measurement tables 624 according to the seventh embodiment, as is shown in FIG. 28, the position in the Y-axis direction overlaps with projection optical system 16, and one measurement table 624 (refer to FIG. 28) is arranged on the +X side of projection optical system 16, and the other measurement table 624 (not shown in FIG. 28) is arranged on the −X side of projection optical system 16 (refer to FIG. 31). Also in the seventh embodiment, similarly to the sixth embodiment described above, measurement tables 624 are moved in predetermined strokes in the Y-axis direction by Y linear actuators 682. Also, position information on each measurement table 624 within the XY plane is obtained independently by the main controller (not shown), using an encoder system structured by upward heads 80x and 80y (refer to FIG. 31) attached to measurement table 624 and the corresponding downward scale 684 fixed to the lower surface of optical surface plate 18a.

Figure 31:
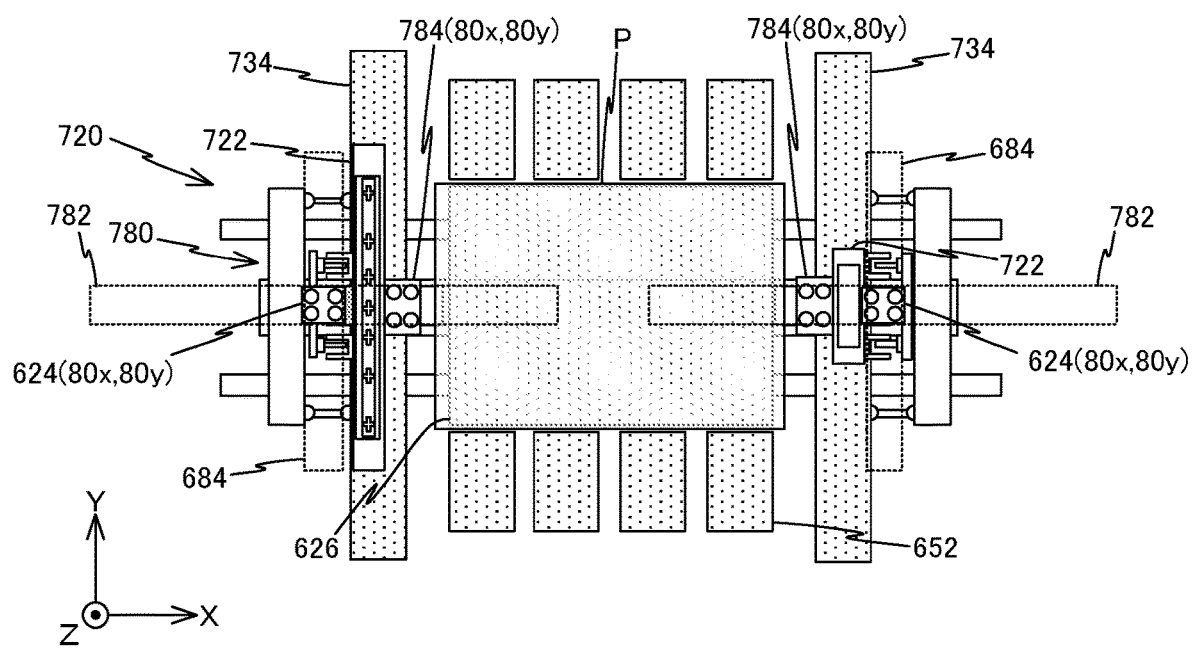
FIG. 31 is a view used to explain a structure of a substrate measurement system according to the seventh embodiment.
Figure 32:
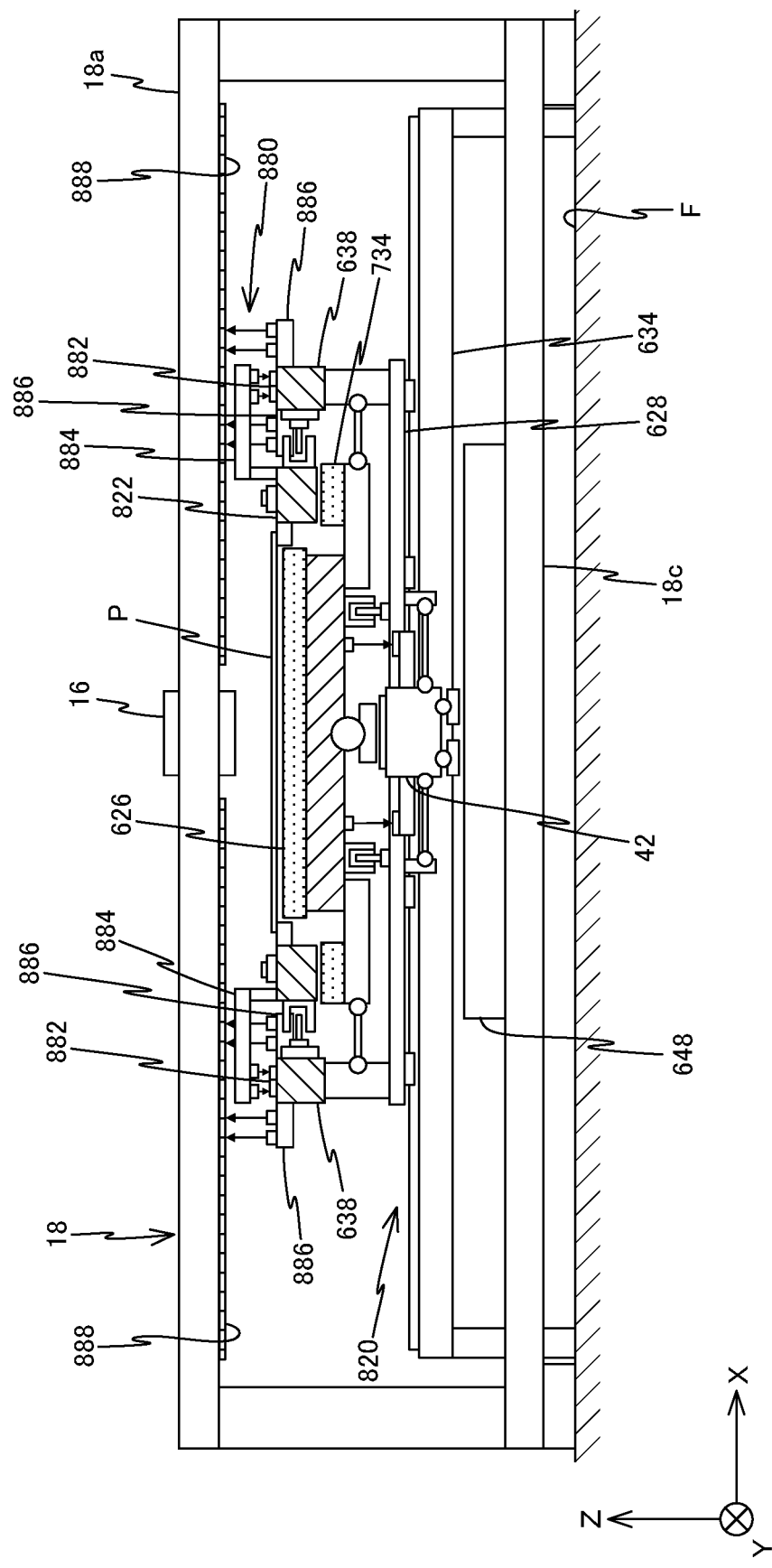
FIG. 32 is a view showing a substrate stage device according to an eighth embodiment.

To each of the lower surfaces of the two measurement tables 624, a downward scale 782 is fixed (refer to FIG. 31).

That is, in the sixth embodiment described above (refer to FIG. 27), while one downward scale 686 was suspended and supported by two measurement tables 624, in the seventh embodiment, one downward scale 782 is suspended and supported by one measurement table 624. Downward scale 782 has a two-dimensional diffraction grating on its lower surface so that the measurement range in the X-axis direction of each substrate holder 722 becomes wider (longer) than the measurement range in the Y-axis direction. The relative positional relation between each upward head 80$x$ and 80$y$ and downward scale 782 fixed to measurement table 624 is known.

Also, to each substrate holder 722, a head base 784 is fixed. On the upper surface of each head base 784, two upward X heads 80$x$ and two upward Y heads 80$y$ (each refer to FIG. 29) are attached facing the corresponding downward scale 782 (refer to FIG. 31). As for position measurement operation of substrate P at the time of position control of substrate P in the seventh embodiment, since the operation is roughly the same as that of the sixth embodiment, the description thereabout will be omitted.

Eighth Embodiment

Next, a liquid crystal exposure apparatus according to an eighth embodiment will be described, using FIGS. 32 to 35. Since the structure of the liquid crystal exposure apparatus according to the eighth embodiment is roughly the same as that of the sixth embodiment described above, except for the point that the structure of a substrate stage device 820 and its measurement system is different, only the different points will be described below, and for elements having the same structure or function as the sixth embodiment described above will have the same reference code as the sixth embodiment and the description thereabout will be omitted.

Substrate stage device 820 of the eighth embodiment is equipped with a first movable body (here, a substrate holder 822), a second movable body (here, X coarse movement stage 628), and a substrate measurement system 880 and the like.

In the eighth embodiment, substrate holder 822 that holds substrate P is formed in a rectangular frame shape that surrounds the entire outer periphery of substrate P, similarly to that of the sixth embodiment described above (refer to FIG. 26 and the like). As for the drive system to drive substrate holder 822 and substrate table 626, since the drive system is the same as that of the sixth embodiment described above, the description thereabout will be omitted. Note that substrate stage device 820 of the eighth embodiment also has air guide 734 that supports substrate holder 822 from below in a non-contact manner, similarly to the seventh embodiment described above (refer to FIG. 30).

Next, substrate measurement system 880 will be described. In the sixth embodiment described above (refer to FIGS. 23, 26 and the like), while position information on substrate holder 622 was obtained via measurement table 624 with optical surface plate 18*a* serving as a reference, in the eighth embodiment, position information on substrate holder 822 is obtained via X coarse movement stage 628 for moving substrate table 626 in the X-axis direction with optical surface plate 18*a* serving as a reference. As for this point, substrate measurement system 880 is conceptually common with substrate measurement system 250 (refer to FIG. 8 and the like) according to the second embodiment described above. Note that while X coarse movement stage 628 in the eighth embodiment consists of a pair of plate shaped (strip shaped) members (refer to FIG. 34) extending in the X-axis direction that is arranged corresponding to the pair of base frames 634, since the function is the same, the stage will be described having the same reference code as X coarse movement stage 628 of the sixth embodiment for convenience.

Figure 34:
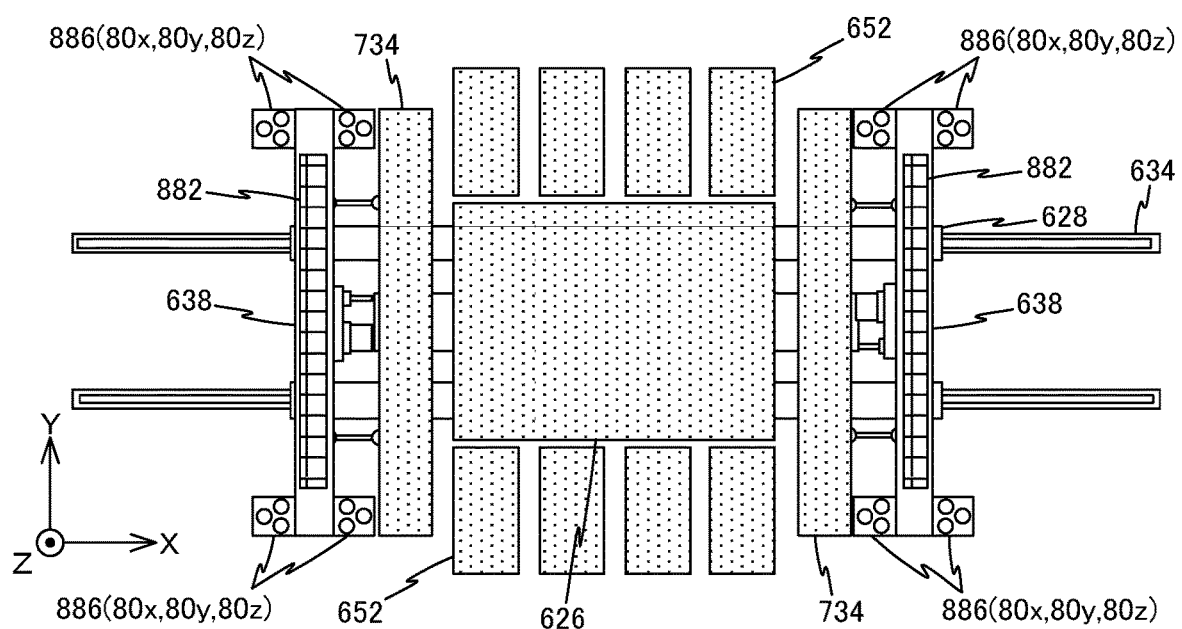
FIG. 34 is a view showing a system including a substrate table which is a part of the substrate stage device in FIG. 32.

As is shown in FIG. 34, to each of the upper surface the pair of Y stators 638 fixed to X coarse movement stage 628, an upward scale 882 is fixed, similarly to the second embodiment described above (refer to FIG. 9). Since the structure and function of upward scale 882 are the same as those of upward scale 252 (refer to FIG. 9) of the second embodiment described above, the description thereabout will be omitted here.

Figure 33:
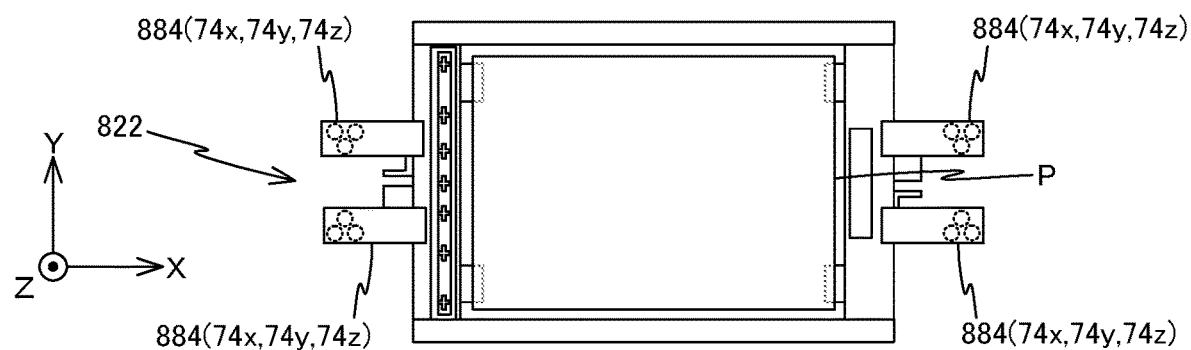
FIG. 33 is a view showing a substrate holder which is a part of the substrate stage device in FIG. 32.

As is shown in FIG. 33, to each of the end near the +X side and the end near the −X side of substrate holder 822, a pair of head bases 884 is fixed arranged apart in the Y-axis direction. To each of the total of four head bases 884, one each of downward X head 74$x$, downward Y head 74$y$, and a downward Z head 74$z$ are attached (refer to FIG. 33) to face upward scale 882 (refer to FIG. 34). Since the structure and function of X head 74$x$ and Y head 74$y$ are the same as those of X head 74$x$ and Y head 74$y$ (each refer to FIG. 3 and the like) of the first embodiment described above, the description thereabout will be omitted here. In the eighth embodiment, the total of four downward X heads 74$x$ and the corresponding upward scales 882 structure four X linear encoder systems (refer to FIG. 35), and the total of four downward Y heads 74$y$ and the corresponding upward scales 882 also structure four Y linear encoder systems (refer to FIG. 35). The main controller (not shown) obtains position information (first information) on substrate holder 822 in the X-axis direction, the Y-axis direction, and the θz direction with X coarse movement stage 628 serving as a reference, appropriately using the output of the four X linear encoder systems and the four Y linear encoder systems.

While the structure of downward Z head 74$z$ is not limited in particular, it is possible to use a known laser displacement sensor. Z head 74$z$ uses a grating surface (reflection surface) of the opposing upward scale 882 (refer to FIG. 35), so as to measures displacement amount in the Z-axis direction of head base 884. The main controller (not shown) obtains displacement amount information on substrate holder 822 (that is, substrate P) in the Z tilt direction with respect to X coarse movement stage 628, based on the output of the total of four Z heads 74$z$.

Referring back to FIG. 34, to each of the end near the +Y side and the end near the −Y side of Y stators 638, a pair of head bases 886 is fixed arranged apart in the X-axis direction. To each of the total of eight head bases 886, one each of upward X head 80$x$, upward Y head 80$y$, and an upward Z head 80$z$ is attached. Since the structure and function of X head 80$x$ and Y head 80$y$ are the same as those of X head 80$x$ and Y head 80$y$ (each refer to FIG. 3 and the like) of the first embodiment described above, the description thereabout will be omitted here. Information (third information) on relative positional relation between each of the heads 80$x$, 80$y$, and 80$z$ and upward scales 882 described above is known.

Figure 35:
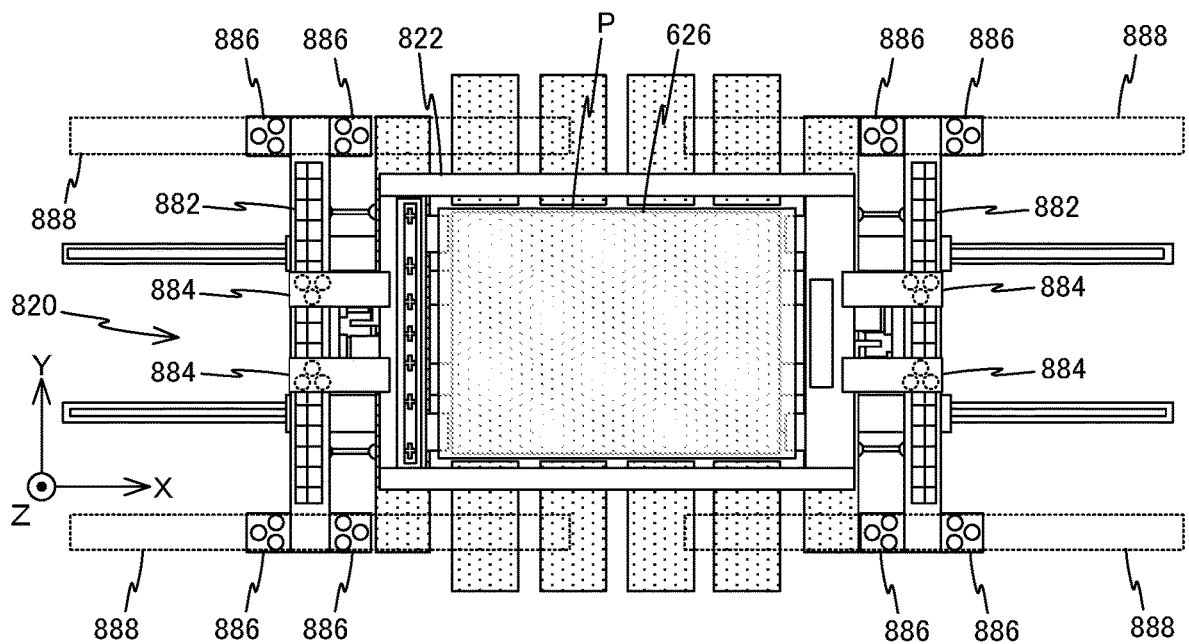
FIG. 35 is a view used to explain a structure of a substrate measurement system according to the eighth embodiment.

To the lower surface of optical surface plate 18*a* (refer to FIG. 32), one downward scale 888 is fixed, corresponding to the pair of head bases 884 described above. That is, as is shown in FIG. 35, to the lower surface of optical surface plate 18*a*, a total of four downward scales 888 are fixed. Since the structure and function of downward scale 888 are the same as those of downward scale 254 (refer to FIG. 8) of the second embodiment described above, the description thereabout will be omitted here. In the eighth embodiment, the total of eight upward X heads 80x and the corresponding downward scales 888 structure eight X linear encoder systems (refer to FIG. 35), and the total of eight upward Y heads 80y and the corresponding downward scales 888 also structure eight Y linear encoder systems (refer to FIG. 35). The main controller (not shown) obtains position information (second information) on X coarse movement stage 628 in the X-axis direction, the Y-axis direction, and the θz direction with optical surface plate 18a serving as a reference, appropriately using the output of the eight X linear encoder systems and the eight Y linear encoder systems.

As upward Z head 80z, a displacement sensor similar to downward Z head 74z described above is used. The main controller (not shown) obtains displacement amount information on X coarse movement stage 628 in the Z tilt direction with respect to optical surface plate 18a, based on the output of the total of eight Z heads 74z.

In the eighth embodiment, in addition to position information on substrate P (substrate holder 822) being obtained via X coarse movement stage 628 with optical surface plate 18a serving as a reference (based on the first to third information described above), position information on substrate P (substrate holder 822) in the Z-tilt direction is also obtained via X coarse movement stage 628 with optical surface plate 18a serving as a reference.

Ninth Embodiment

Figure 36:
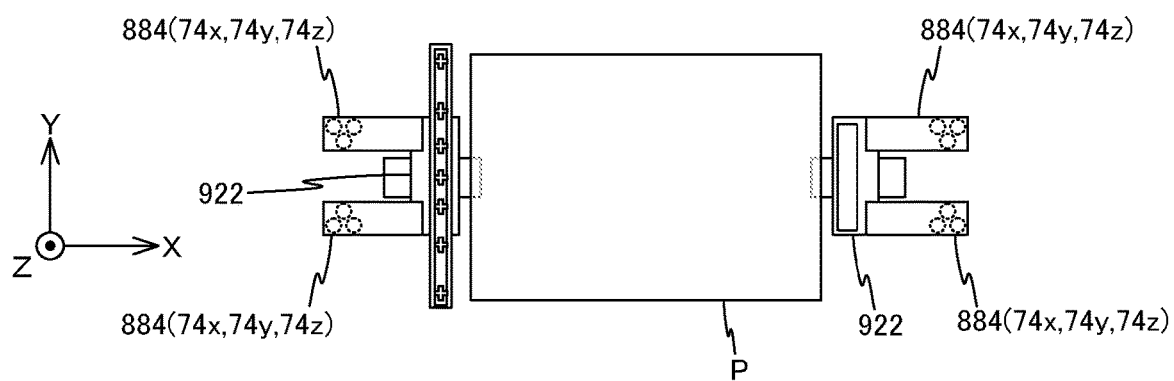
FIG. 36 is a view showing a substrate holder which is a part of the substrate stage device in-according to a ninth embodiment.
Figure 37:
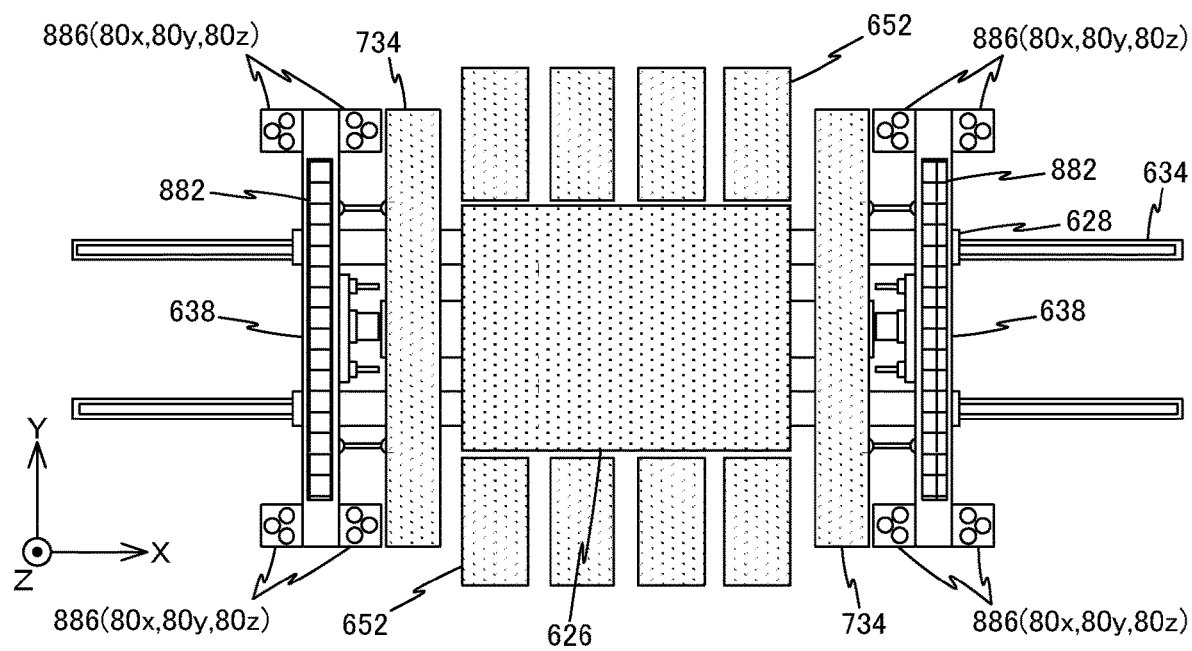
FIG. 37 is a view showing a system including a substrate table which is a part of a substrate stage device in-according to the ninth embodiment.

Next, a liquid crystal exposure apparatus according to a ninth embodiment will be described, using FIGS. 36 to 38. Since the structure of the liquid crystal exposure apparatus according to the ninth embodiment is roughly the same as that of the eighth embodiment described above, except for the point that the structure of a substrate stage device 920 (refer to FIG. 38) and its measurement system is different, only the different points will be described below, and for elements having the same structure or function as the eighth embodiment described above will have the same reference code as the eighth embodiment and the description thereabout will be omitted.

Figure 38:
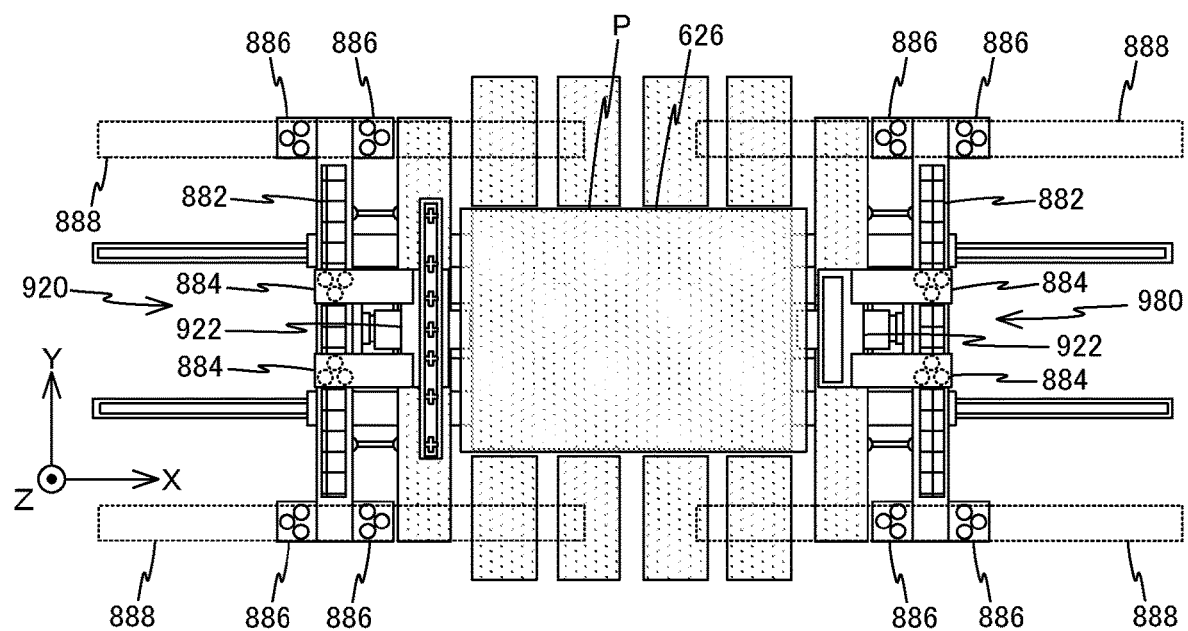
FIG. 38 is a view used to explain a structure of a substrate measurement system according to the ninth embodiment.

As is shown in FIG. 38, substrate stage device 920 according to the ninth embodiment is equipped with a pair of substrate holders 922 which is arranged physically separated, similarly to the seventh embodiment (refer to FIG. 29) described above. The point that one of the substrate holders 922 holds the end near the +X side of substrate P, and the other substrate holder 922 holds the end near the −X side of substrate P, and the point that the pair of substrate holders 922 is moved independently with respect to X coarse movement stage 628 by 3-DOF motors are also similar to those of the seventh embodiment described above.

The structure and operation of a substrate measurement system 980 (refer to FIG. 38) according to the ninth embodiment is the same as those of the eighth embodiment, except for the point that position information on each of the pair of substrate holders 922 can be obtained independently. That is, as is shown in FIG. 36, to each substrate holder 922, a pair of head bases 884 is fixed arranged apart in the Y-axis direction. To head bases 884, downward heads 74x, 74y, and 74z are attached to face (refer to FIG. 38) upward scales 882 (each refer to FIG. 37) fixed on the upper surface of Y stators 638. Since the structure and the operation of the position measurement system of X coarse movement stage 628, with optical surface plate 18a serving as a reference, are the same as those of the seventh embodiment described above, the description thereabout will be omitted.

Tenth Embodiment

Next, a liquid crystal exposure apparatus according to a tenth embodiment will be described, using FIGS. 39 to 43. Since the structure of the liquid crystal exposure apparatus according to the tenth embodiment is roughly the same as that of the ninth embodiment described above, except for the point that the structure of a substrate stage device 1020 (refer to FIG. 41 and the like) and its measurement system are different, only the different points will be described below, and for elements having the same structure or function as the ninth embodiment described above will have the same reference code as the ninth embodiment and the description thereabout will be omitted.

Figure 39:
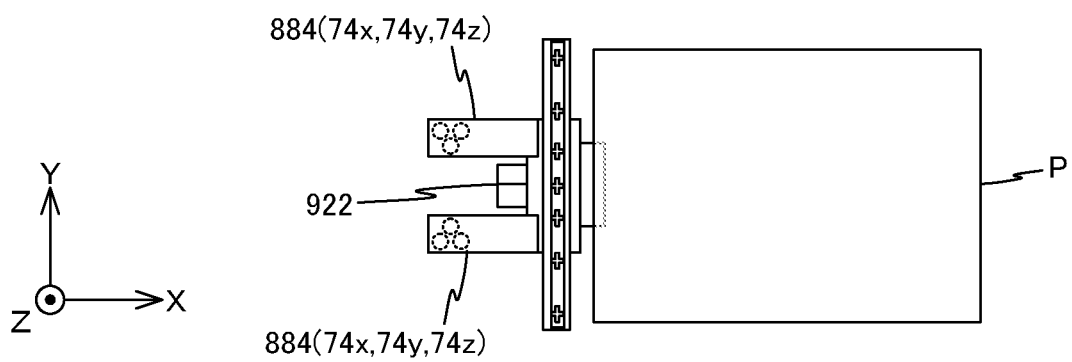
FIG. 39 is a view showing a substrate holder which is a part of a substrate stage device according to a tenth embodiment.

In the ninth embodiment (refer to FIG. 38) described above, while substrate P was held by substrate holders 922 near both ends in the X-axis direction, as is shown in FIG. 39, in the tenth embodiment, the point different is that substrate P is held by suction only near an end on one side in the X-axis direction (in the embodiment, the −X side) by substrate holder 922. As for substrate holder 922, since the holder is the same as that of the ninth embodiment described above, the description thereabout will be omitted here. Also, as for the structure and operation of a substrate measurement system 1080 (refer to FIG. 41) according to the tenth embodiment, since they are also the same as those of the ninth embodiment, the description thereabout will be omitted here.

Figure 40:
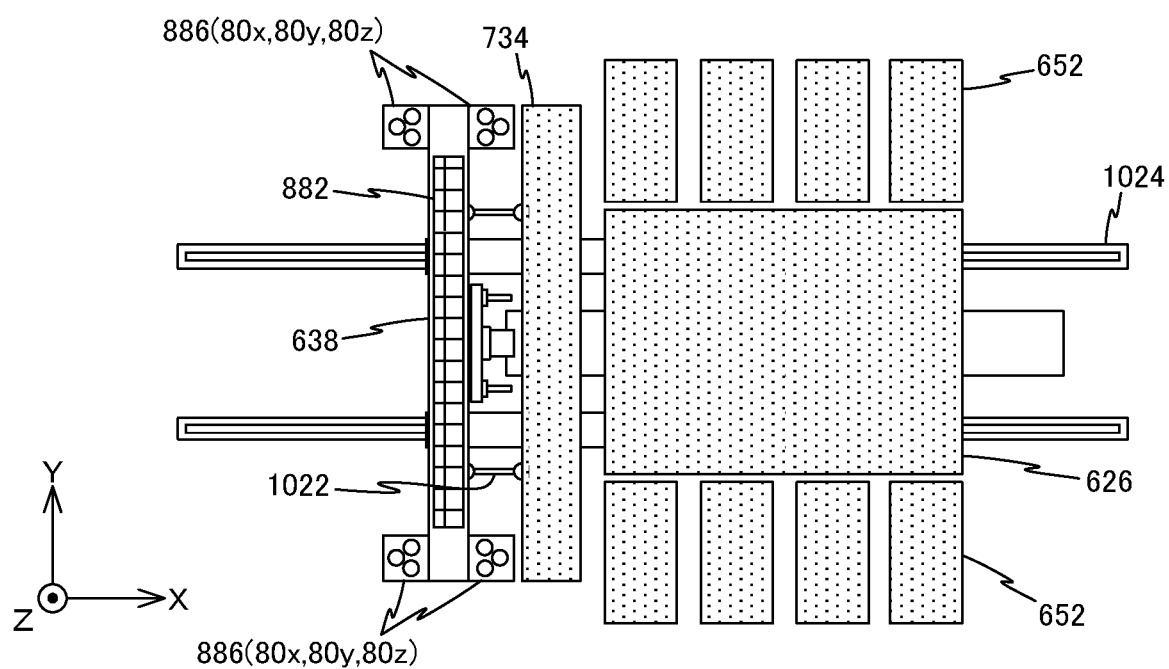
FIG. 40 is a view showing a system including a substrate table which is a part of a substrate stage device according to the tenth embodiment.
Figure 41:
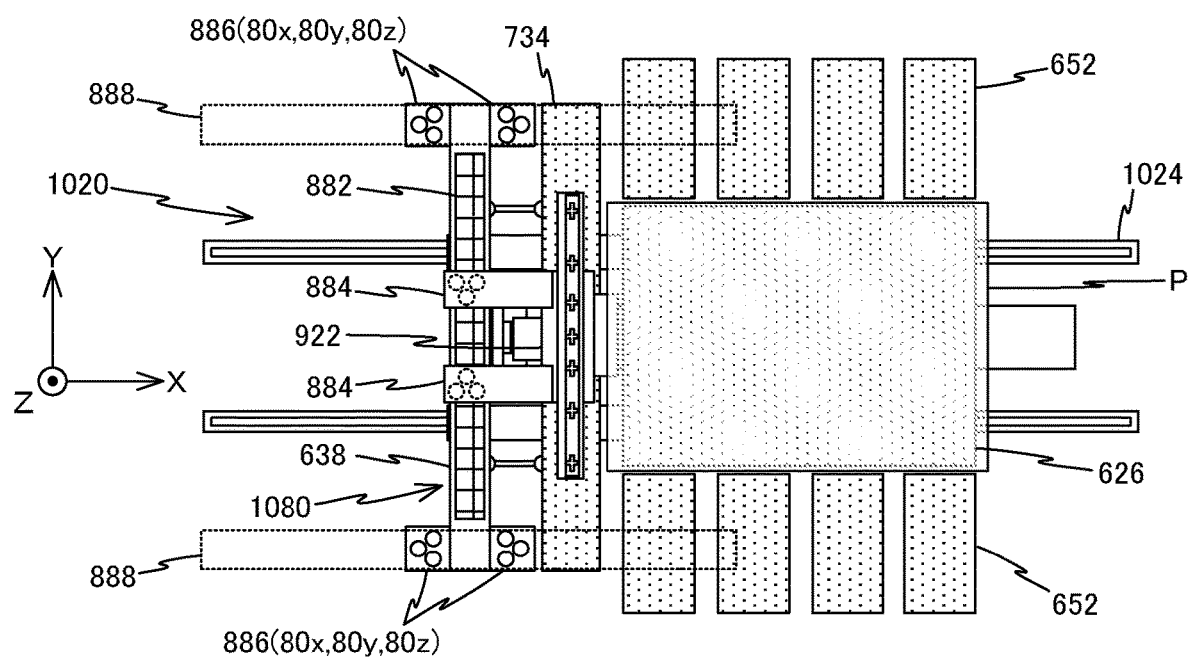
FIG. 41 is a view used to explain a structure of a substrate measurement system according to the tenth embodiment.
Figure 42:
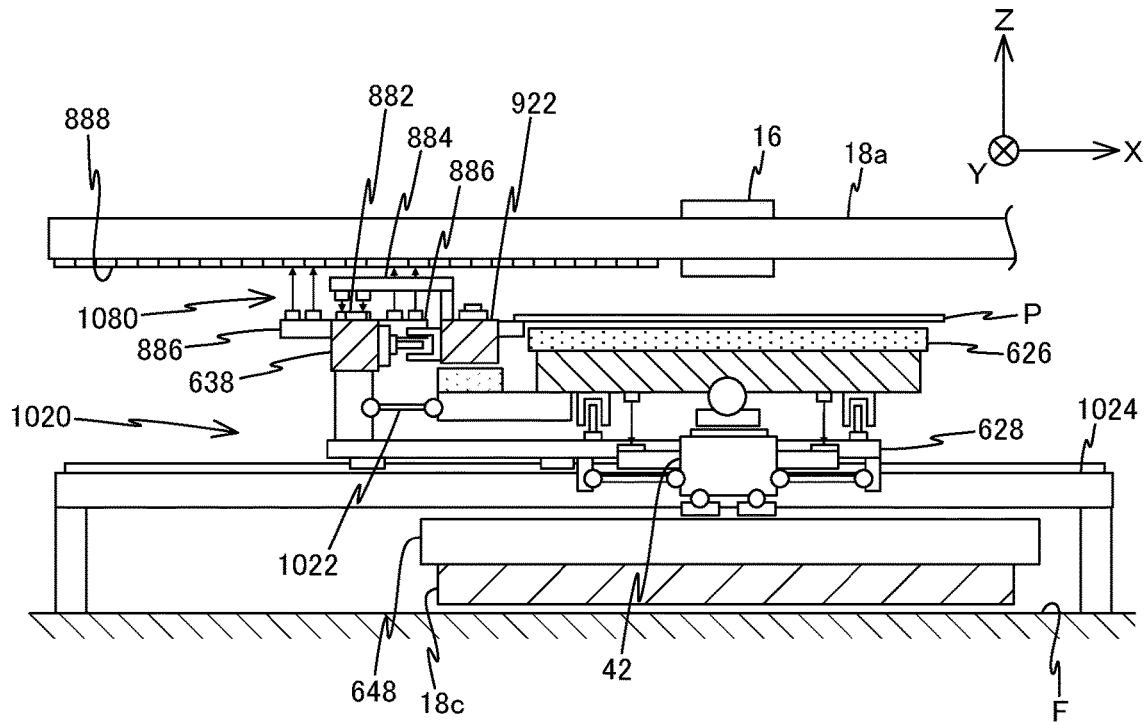
FIG. 42 is a cross-section view (No. 1) of the substrate stage device according to the tenth embodiment.
Figure 43:
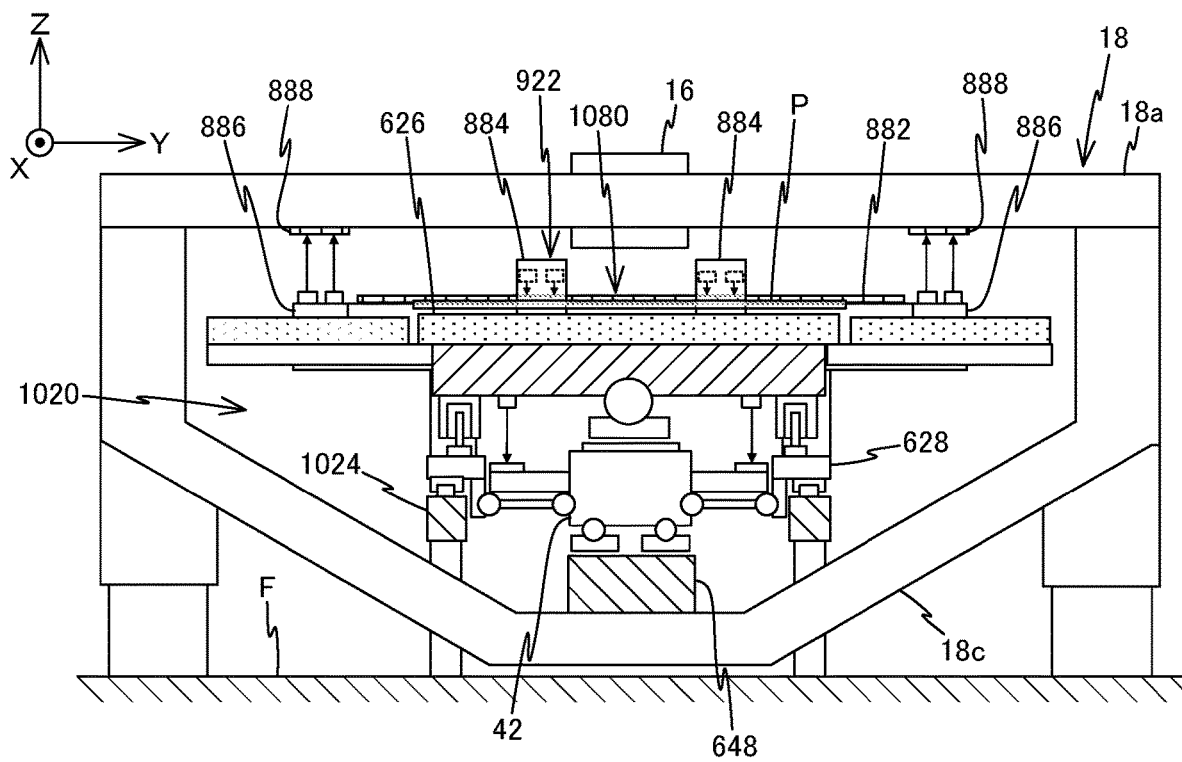
FIG. 43 is a cross-section view (No. 2) of the substrate stage device according to the tenth embodiment.

In the tenth embodiment, since there is no member (a member corresponding to substrate holder 922 on the +X side in the ninth embodiment described above) to hold the end near the +X side of substrate P, as is shown in FIG. 40, Y stator 638 is arranged only on the −X side of substrate table 626. Therefore, in substrate stage device 1020, a base frame 1024 is shorter than that of substrate stage device 920 (refer to FIG. 38) according to the ninth embodiment described above and is compact as a whole. Note that connecting members 1022 which connects Y stator 638 to air guide 734 in the embodiment has rigidity also in the X-axis direction, which allows Y stator 638 to push or pull (push/pull) substrate table 626. Also, since there is no member to hold the end near the +X side of substrate P, an exchange operation of substrate P can be performed easily. Note that while X guide 648 that supports weight canceling device 42 is fixed on lower mount section 18c as is shown in FIGS. 42 and 43, the structure is not limited to this, and the X guide 648 may be installed on floor F in a state physically separated from apparatus main section 18.

Eleventh Embodiment

Next, a liquid crystal exposure apparatus according to an eleventh embodiment will be described, using FIGS. 44 to 47. Since the structure of the liquid crystal exposure apparatus according to the eleventh embodiment is roughly the same as that of the tenth embodiment described above, except for the point that the structure of a substrate stage device 1120 and its measurement system is different, only the different points will be described below, and for elements having the same structure or function as the tenth embodiment described above will have the same reference code as the tenth embodiment and the description thereabout will be omitted.

In substrate stage device 1120 according to the eleventh embodiment, substrate P is held by a substrate holder 1122 (refer to FIG. 47) only near an end on one side in the X-axis direction (in the embodiment, the −X side), as in the tenth embodiment described above (refer to FIG. 41 and the like).

Figure 44:
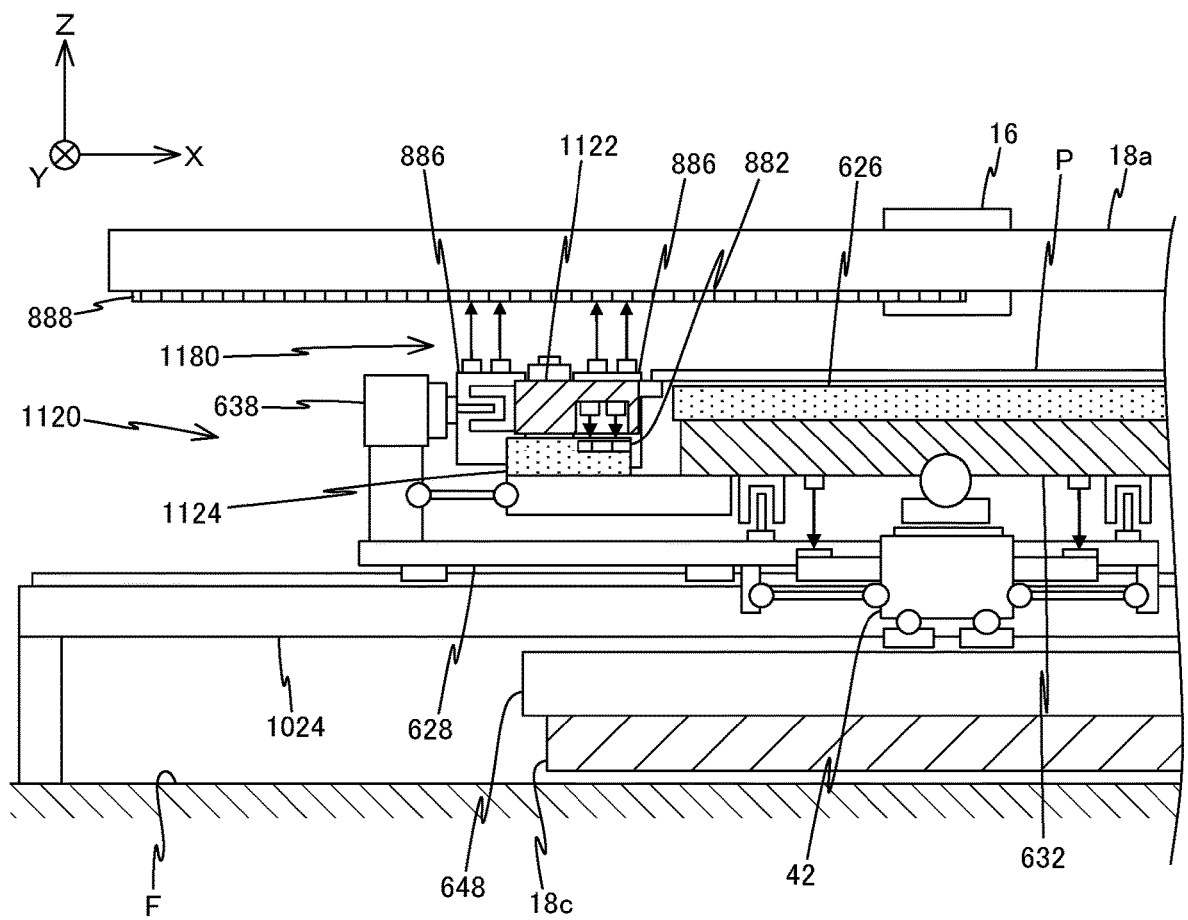
FIG. 44 is a view showing a substrate stage device according to an eleventh embodiment.
Figure 45:
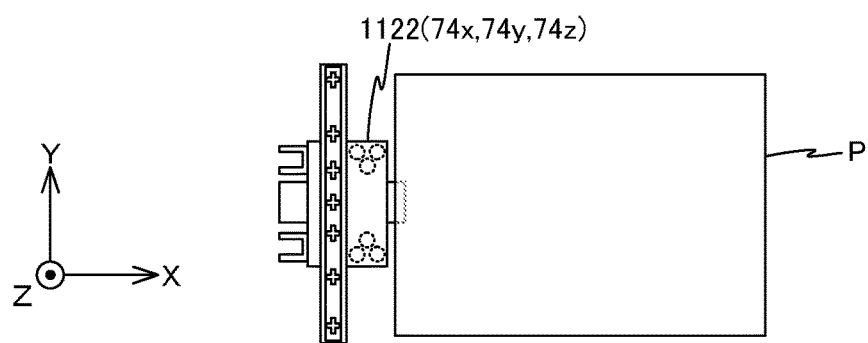
FIG. 45 is a view showing a substrate holder which is a part of the substrate stage device in FIG. 44.

Substrate holder 1122, as is shown in FIG. 45, has a size in the width direction (X-axis direction) which is set slightly longer than that of substrate holder 922 (refer to FIG. 39) according to the tenth embodiment described. Substrate holder 1122, as is shown in FIG. 44, is supported from below in a non-contact manner by an air guide 1124. While the structure and function of air guide 1124 are roughly the same as those of air guide 734 (refer to FIG. 30 and the like) of each of the seventh to tenth embodiment described above, the air guide is different on the point that the size in the X-axis direction is set slightly longer, corresponding to substrate holder 1122.

Next, a substrate measurement system 1180 will be described. Substrate measurement system 1180, as is shown in FIG. 44, is similar to that of the tenth embodiment (refer to FIG. 41) described above on the point that position information on substrate holder 1122 is obtained via X coarse movement stage 628 with optical surface plate 18a serving as a reference, however, the arrangement of upward scale 882 and downward heads 74x and 74y (refer to FIG. 45) is different.

Upward scale 882, as is shown in FIG. 44, is fixed to air guide 1124 that supports substrate holder 1122 by levitation. The height position of the upper surface (guide surface) of air guide 1124 and the height position of the grating surface (surface subject to measurement) of upward scale 882 is set about the same. Air guide 1124 is fixed to stage main section 632, therefore, upward scale 882 moves so that its position in the XY plane with respect to substrate P stays within a predetermined range. In substrate holder 1122, a recess section is formed that opens downward, and in the recess section, one pair each of downward heads 74x, 74y, and 74z (each refer to FIG. 45) are attached facing upward scale 882. As for the position measurement operation of substrate holder 1122, since the operation is the same as that of the tenth embodiment described above, the description thereabout will be omitted.

Figure 46:
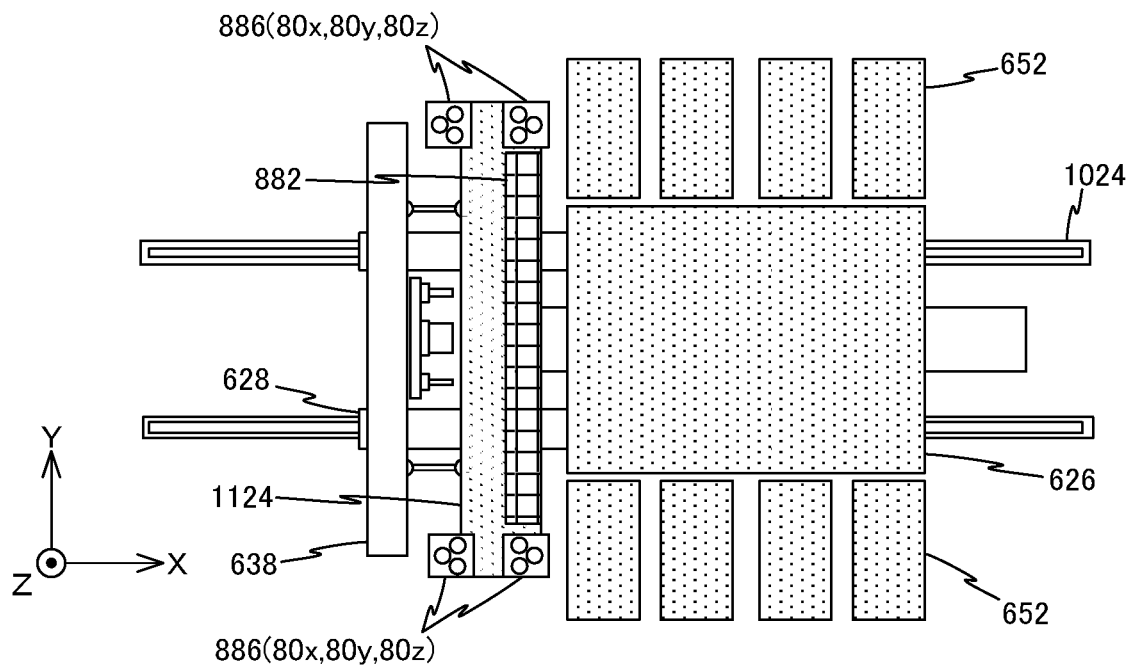
FIG. 46 is a view showing a system including a substrate table which is a part of the substrate stage device in FIG. 44.
Figure 47:
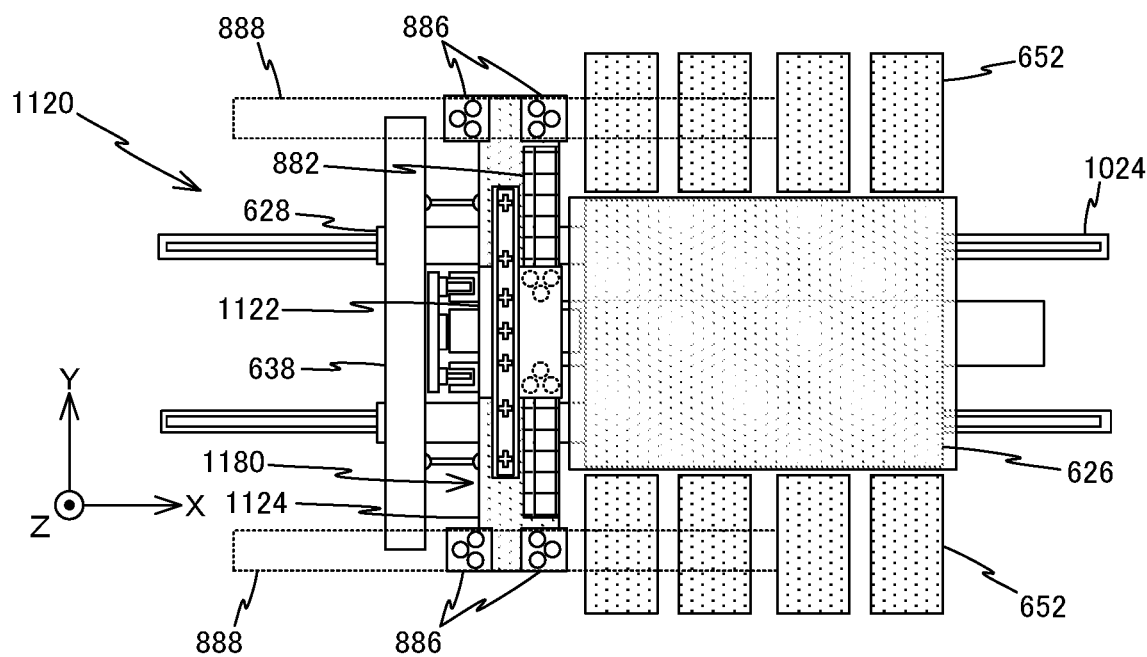
FIG. 47 is a view used to explain a structure of a substrate measurement system according to the eleventh embodiment.
Figure 48:
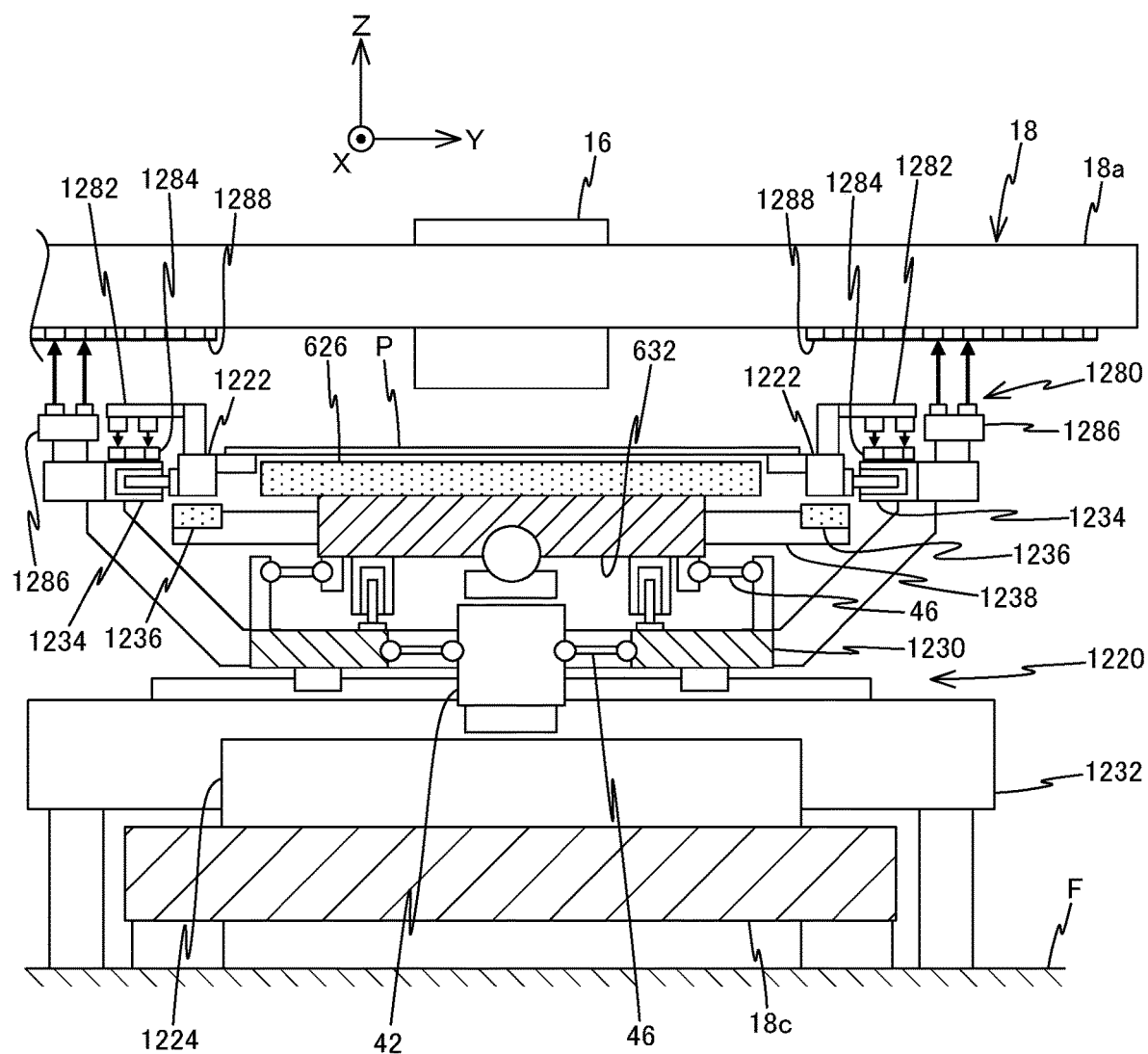
FIG. 48 is a view showing a substrate stage device according to a twelfth embodiment.

Also, in the tenth embodiment described above, while head bases 886 (each refer to FIG. 41 and the like) were fixed to Y stator 638, in the eleventh embodiment, as is shown in FIG. 46, head bases 886 are fixed to air guide 1124. One pair each of head bases 886 are fixed to both ends near the edge in the longitudinal direction of air guide 1124. As for position measurement operation of X coarse movement stage 628 that uses downward scale 888 fixed to optical surface plate 18a (refer to FIG. 44), since the operation is the same as that of the tenth embodiment described above, the description thereabout will be omitted.

In the eleventh embodiment, position information on substrate holder 1122 is obtained via air guide 1124 with optical surface plate 18a serving as a reference. Since air guide 1124 is fixed to stage main section 632, it is hardly affected by disturbance, which can improve exposure accuracy. Also, compared to the tenth embodiment and the like described above, since the position of upward scale 882 and downward scale 888 becomes closer to the center position of projection optical system 16, errors become smaller, which can improve exposure accuracy.

Twelfth Embodiment

Next, a liquid crystal exposure apparatus according to a twelfth embodiment will be described, using FIGS. 48 to 54.

Since the structure of the liquid crystal exposure apparatus according to the twelfth embodiment is roughly the same as that of the seventh embodiment described above, except for the point that the structure of a substrate stage device 1220 and its measurement system is different, only the different points will be described below, and for elements having the same structure or function as the seventh embodiment described above will have the same reference code as the seventh embodiment and the description thereabout will be omitted.

Figure 53:
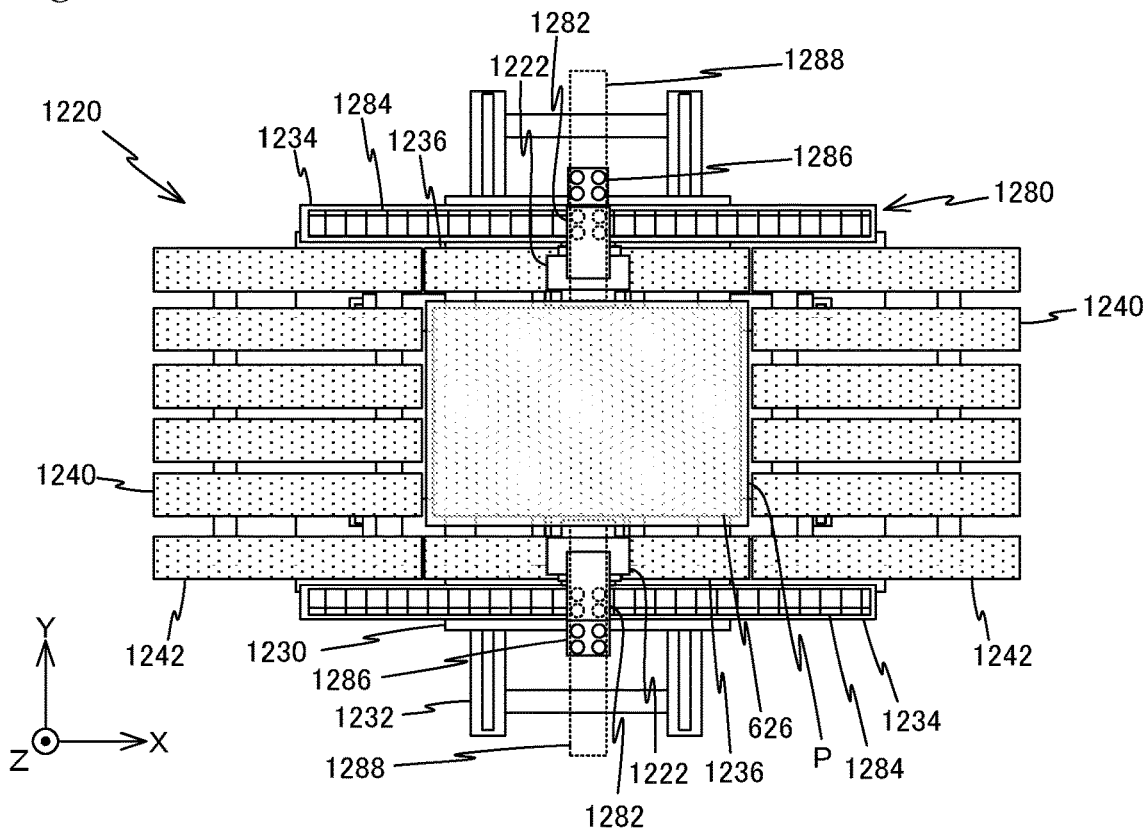
FIG. 53 is a view used to explain a structure of a substrate measurement system according to the twelfth embodiment.

As is shown in FIG. 31 and the like, in the seventh embodiment described above, while substrate P was held near both ends in the X-axis direction by the pair of substrate holders 722 which moves in long strokes in the Y-axis direction, in the twelfth embodiment, as is shown in FIG. 53, the point differs in which substrate P is held near both ends in the Y-axis direction by a pair of substrate holders 1222 which moves in long strokes in the X-axis direction. In substrate stage device 1220, at the time of scanning exposure operation, by only one pair of substrate holders 1222 being moved in the X-axis direction with respect to projection optical system 16 (refer to FIG. 48), scanning exposure operation on substrate P is performed. Also, at the time of movement between exposure areas, the pair of substrate holders 1222 moves integrally with a system including substrate table 626 in the Y-axis direction. That is, substrate stage device 1220 has a structure of substrate stage device 720 (refer to FIG. 31 and the like) according to the seventh embodiment described above being rotated around the Z-axis by 90 degrees with respect to projection optical system 16. Next, the structure of substrate stage device 1220 will be described.

Figure 50:
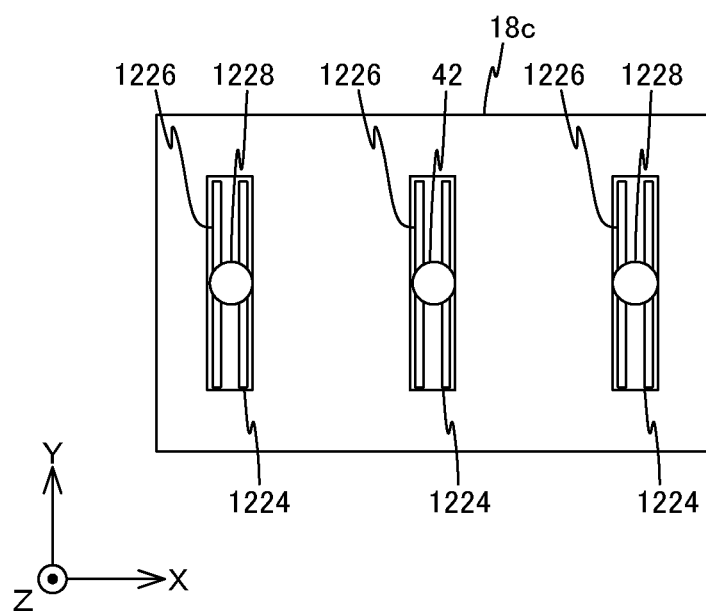
FIG. 50 is a view showing a system including a weight canceling device which is a part of the substrate stage device in FIG. 48.

As is shown in FIG. 50, on lower mount section 18c, three surface plates 1224 extending in the Y-axis direction are arranged, set apart in the X-axis direction at a predetermined spacing. On surface plate 1224 in the center, weight canceling device 42 is mounted via linear guide device 1226. Also, on surface plates 1224 on the +X side and −X side, Z actuators 1228 are mounted via linear guide devices 1226. The point that weight canceling device 42 supports substrate table 626 (each refer to FIG. 48) from below via stage main section 632 is the same as the sixth embodiment (refer to FIG. 23 and the like) and the like described above.

Figure 51:
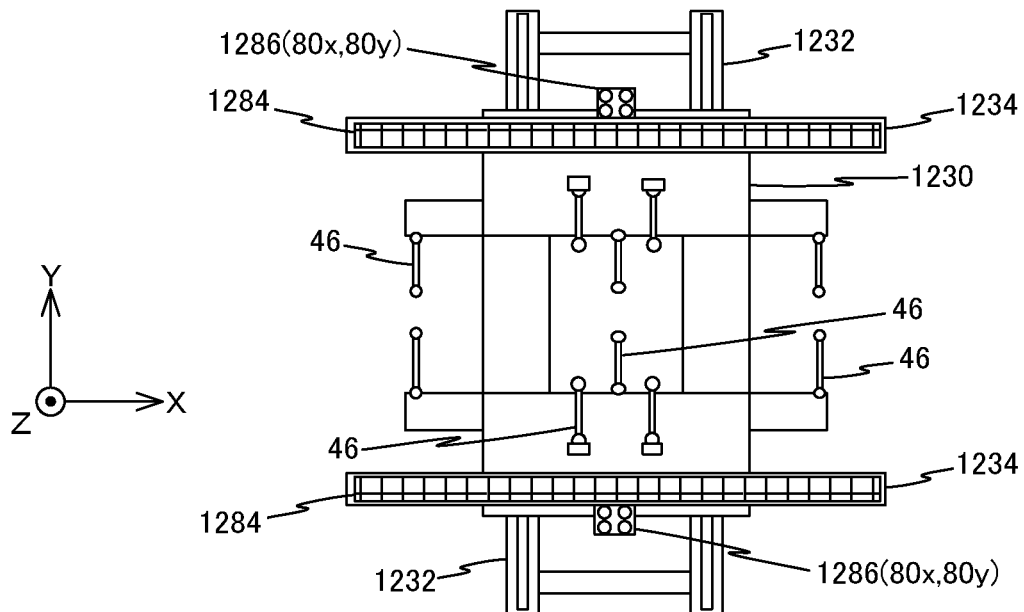
FIG. 51 is a view showing a system including a Y coarse movement stage which is a part of the substrate stage device in FIG. 48.

As is shown in FIG. 51, a Y coarse movement stage 1230 is mounted on a pair of base frames 1232 extending in the Y-axis direction, and is moved in long strokes in the Y-axis direction by Y linear actuators (not shown). Weight canceling device 42 and the two Z actuators 1228 described above (each refer to FIG. 50) are each connected to Y coarse movement stage 1230 by connecting members 46 (refer to FIG. 48), and move in the Y-axis direction integrally with Y coarse movement stage 1230. Stage main section 632 is also connected to Y coarse movement stage 1230 by connecting members 46 (refer to FIG. 48), and moves in the Y-axis direction integrally with Y coarse movement stage 1230. At both ends near the edge in the Y-axis direction of Y coarse movement stage 1230, stators 1234 are attached extending in the X-axis direction.

Figure 52:
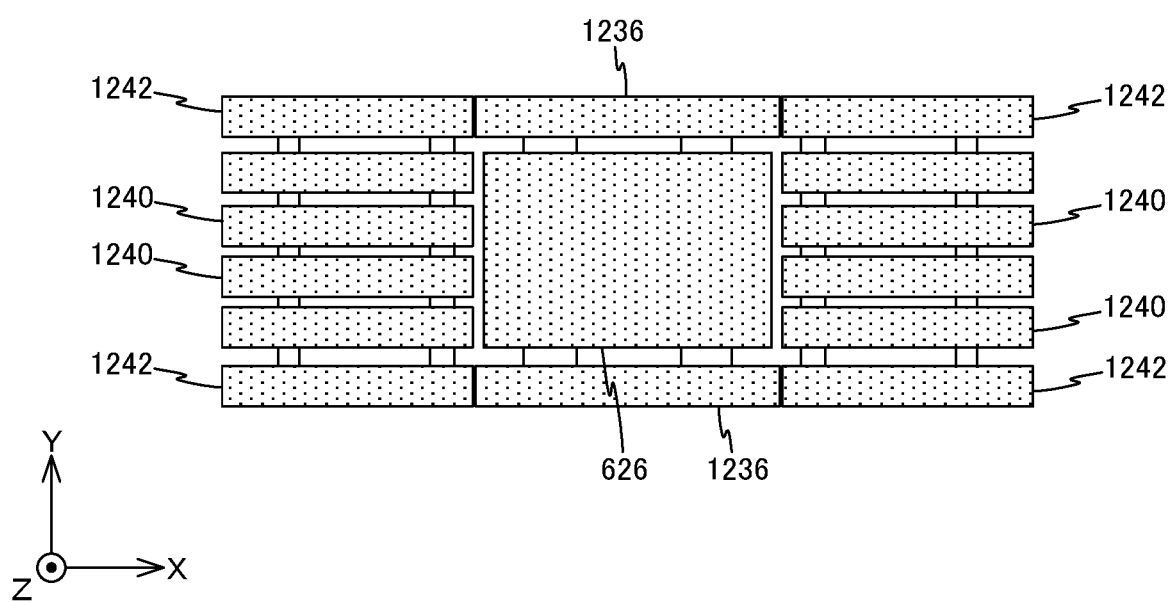
FIG. 52 is a view showing a system including a substrate table which is a part of the substrate stage device in FIG. 48.

As is shown in FIG. 52, on the +Y side and the −Y side of substrate table 626, air guides 1236 are arranged each corresponding to the pair of substrate holders 1222 (refer to FIG. 53). Air guides 1236 are fixed to stage main section 632 via support members 1238 (refer to FIG. 48). The Z position of the upper surface of air guides 1236 is set to a position lower than the Z position of the upper surface of substrate table 626.

On the +X side and the −X side of substrate table 626, a plurality of (four each, in the embodiment) air guides 1240 is arranged to support substrate P from below. The Z position of the upper surface of air guides 1240 is set roughly the same as the Z position of the upper surface of substrate table 626. Air guides 1240, when substrate P moves relatively in the X-axis direction with respect to substrate table 626 such as at the time of scanning exposure and the like, work together with substrate table 626 and supports substrate P from below (refer to FIG. 54).

On each of the +Y side and the −Y side of the four air guides 1240, air guides 1242 are arranged corresponding to the pair of substrate holders 1222. Air guides 1242 are members similar to air guides 1236 described above, and the Z position of the upper surface is set roughly the same as air guides 1236. Air guides 1242, together with air guides 1236, support substrate holders 1222 from below (refer to FIG. 54) when substrate holders 1222 move relatively in the X-axis direction with respect to substrate table 626. Air guides 1240 and 1242 are mounted on Z actuators 1228 (refer to FIG. 50) described above, via a common base member. Since Z actuators 1228 and weight canceling device 42 (refer to FIG. 50) move integrally in the Y-axis direction, air guides 1240, 1242, 1236, and substrate table 626 move integrally in the Y-axis direction.

Figure 49:
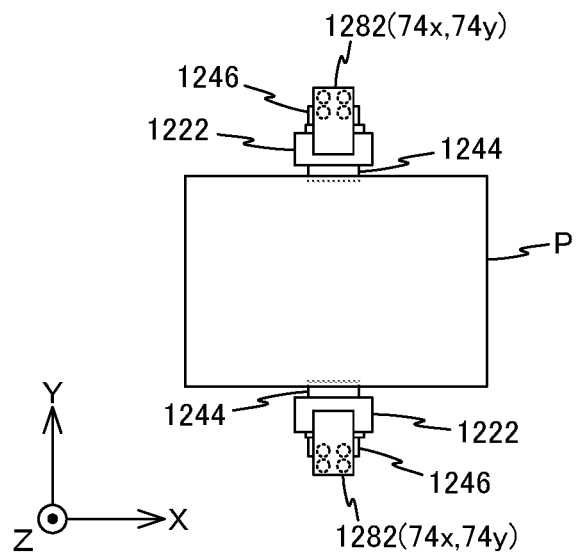
FIG. 49 is a view showing a substrate holder which is a part of the substrate stage device in FIG. 48.

As is shown in FIG. 49, the pair of substrate holders 1222 are arranged sandwiching the center (center of gravity position) of substrate P, and holds the lower surface of substrate P by suction, using suction pads 1244. Also, to each substrate holder 1222, a mover 1246 is attached which structures a 2-DOF motor together with stator 1234 (refer to FIG. 51) described above. The main controller (not shown) moves each substrate holder 1222 with long strokes in the X-axis direction with respect to substrate table 626 (refer to FIG. 52) via the corresponding 2-DOF motor, and also gives thrust in the Y-axis direction to substrate holders 1222 so that positional relation in the Y-axis direction with substrate table 626, Y coarse movement stage 1230 (refer to FIG. 51) and the like stays within a predetermined range.

Figure 54:
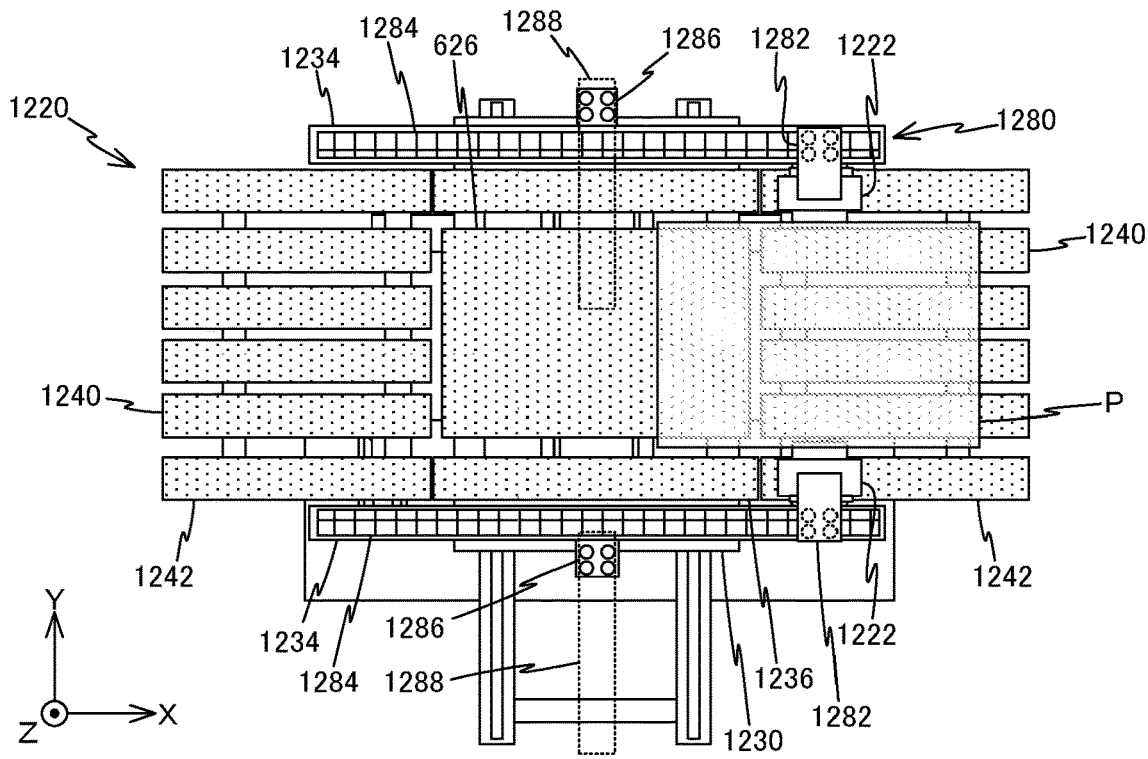
FIG. 54 is a view used to explain an operation of the substrate measurement system in FIG. 53.

As is described above, in substrate stage device 1220, as is shown in FIG. 54, by the pair of substrate holders 1222 being moved in the X-axis direction by 2-DOF motors on air guides 1236 and 1242 at the time of scanning exposure operation and the like, scanning exposure operation is performed on substrate P. Also, at the time of movement between exposure areas, the pair of substrate holders 1222 and a system including substrate table 626 (substrate table 626, Y coarse movement stage 1230, stators 1234, air guides 1236, 1240, 1242 and the like) move integrally in the Y-axis direction.

Next, a substrate measurement system 1280 (refer to FIG. 53) according to the twelfth embodiment will be described. Substrate measurement system 1280 conceptually resembles substrate measurement system 70 (refer to FIG. 4) according to the first embodiment. That is, downward heads 74x and 74y are attached in pairs (each refer to FIG. 49) via head bases 1282 to a member (each of the pair of substrate holders 1222) holding substrate P, and downward heads 74x and 74y face the corresponding upward scale 1284 attached to the upper surface of stators 1234. The main controller (not shown) obtains position information (first information) on each substrate holder 1222 in the X-axis direction, the Y-axis direction, and the θz direction independently, appropriately using the output of two X linear encoder systems and two Y linear encoder systems.

Also, as is shown in FIG. 51, in the center in the longitudinal direction of stator 1234, head base 1286 is fixed. To head base 1286, upward heads 80x and 80y are attached in pairs, and upward heads 80x and 80y structure X linear encoder systems and Y linear encoder systems with the corresponding downward scale 1288 fixed to the lower surface of optical surface plate 18a (refer to FIG. 48). Positional relation (third information) between upward scale 1284 and each upward head 80x and 80y is known. The main controller (not shown) obtains position information (second information) on Y coarse movement stage 1230 within a horizontal plane, appropriately using the output of four X linear encoder systems and four Y linear encoder systems.

Thirteenth Embodiment

Next, a liquid crystal exposure apparatus according to a thirteenth embodiment will be described, using FIGS. 55 to 58. Since the structure of the liquid crystal exposure apparatus according to the thirteenth embodiment is roughly the same as that of the twelfth embodiment described above, except for the point that the structure of a substrate stage device 1320 and its measurement system is different, only the different points will be described below, and for elements having the same structure or function as the twelfth embodiment described above will have the same reference code as the twelfth embodiment and the description thereabout will be omitted.

Figure 58:
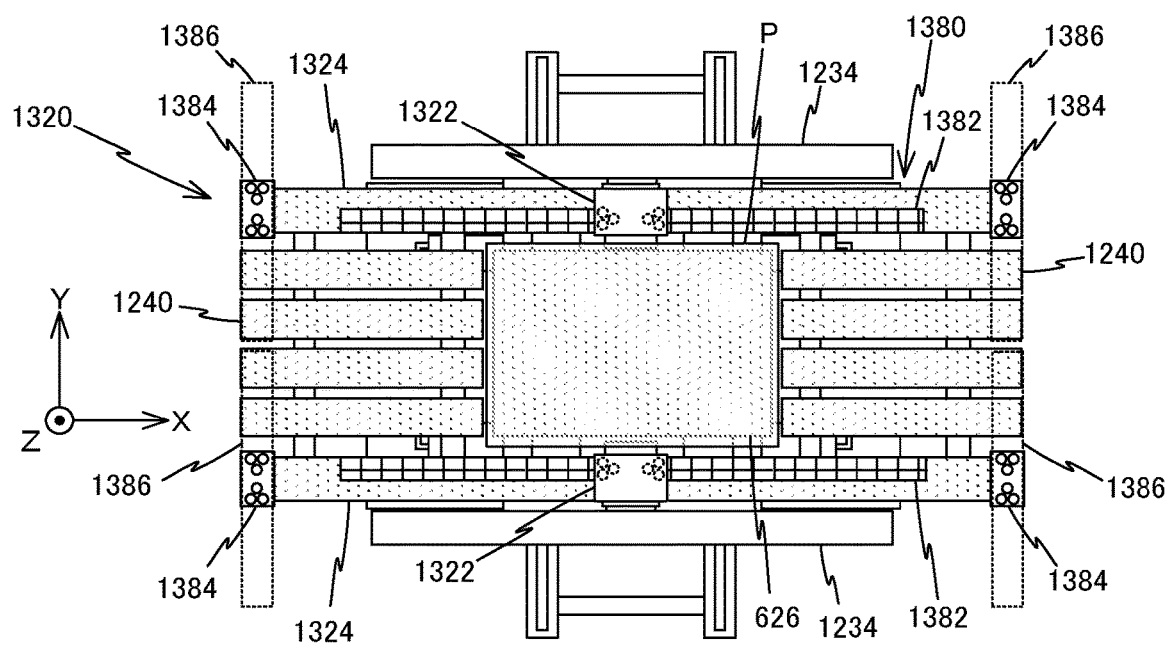
FIG. 58 is a view used to explain a structure of a substrate measurement system according to the thirteenth embodiment.

Similar to substrate stage device 1220 (refer to FIG. 53 and the like) according to the twelfth embodiment, in substrate stage device 1320, substrate P, as is shown in FIG. 58, is held near both ends in the Y-axis direction by a pair of substrate holders 1322. The point that the pair of substrate holders 1322 is moved in long strokes in the X-axis direction by 2-DOF motors and is finely moved in the Y-axis direction and the θz direction is similar to the twelfth embodiment described above. Here, in the twelfth embodiment described above, while substrate holders 1222 (refer to FIG. 53 and the like) were supported from below by either air guides 1236 or the pair of air guides 1242 depending on the position in the X-axis direction, substrate holders 1322 in the thirteenth embodiment is supported from below, by a single air guide 1324 set to a length that can cover the whole range of the movable area in the X-axis direction. Air guide 1324, as is shown in FIG. 55, is connected to stage main section 632, and is movable in the Y-axis direction integrally with substrate table 626.

Figure 57:
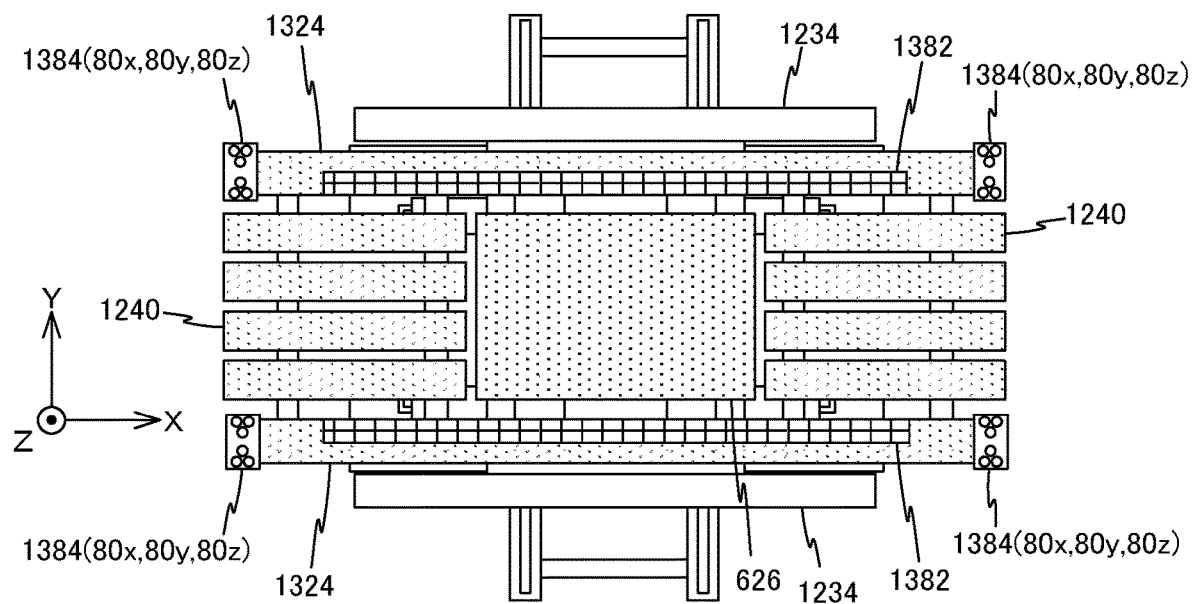
FIG. 57 is a view showing a system including a substrate table which is a part of the substrate stage device in FIG. 55.

Next, a structure and operation of a substrate measurement system 1380 according to the thirteenth embodiment will be described. Substrate measurement system 1380 conceptually has a structure of substrate measurement system 1180 (refer to FIG. 44 and the like) according to the eleventh embodiment described above being rotated at an angle of 90 degrees around the Z-axis. That is, in the thirteenth embodiment, to the upper surface of air guide 1324, an upward scale 1382 is fixed, as is shown in FIG. 57. In the eleventh embodiment described above, while upward scale 882 (refer to FIG. 46 and the like) was arranged so that the measurement range of position information in the Y-axis direction was wider than that of the X-axis direction (the Y-axis direction was to be the longitudinal direction), with upward scale 1382 in the embodiment, the scale is arranged so that the measurement range of position information in the X-axis direction is wider than that of the Y-axis direction (the X-axis direction is to be the longitudinal direction).

Figure 55:
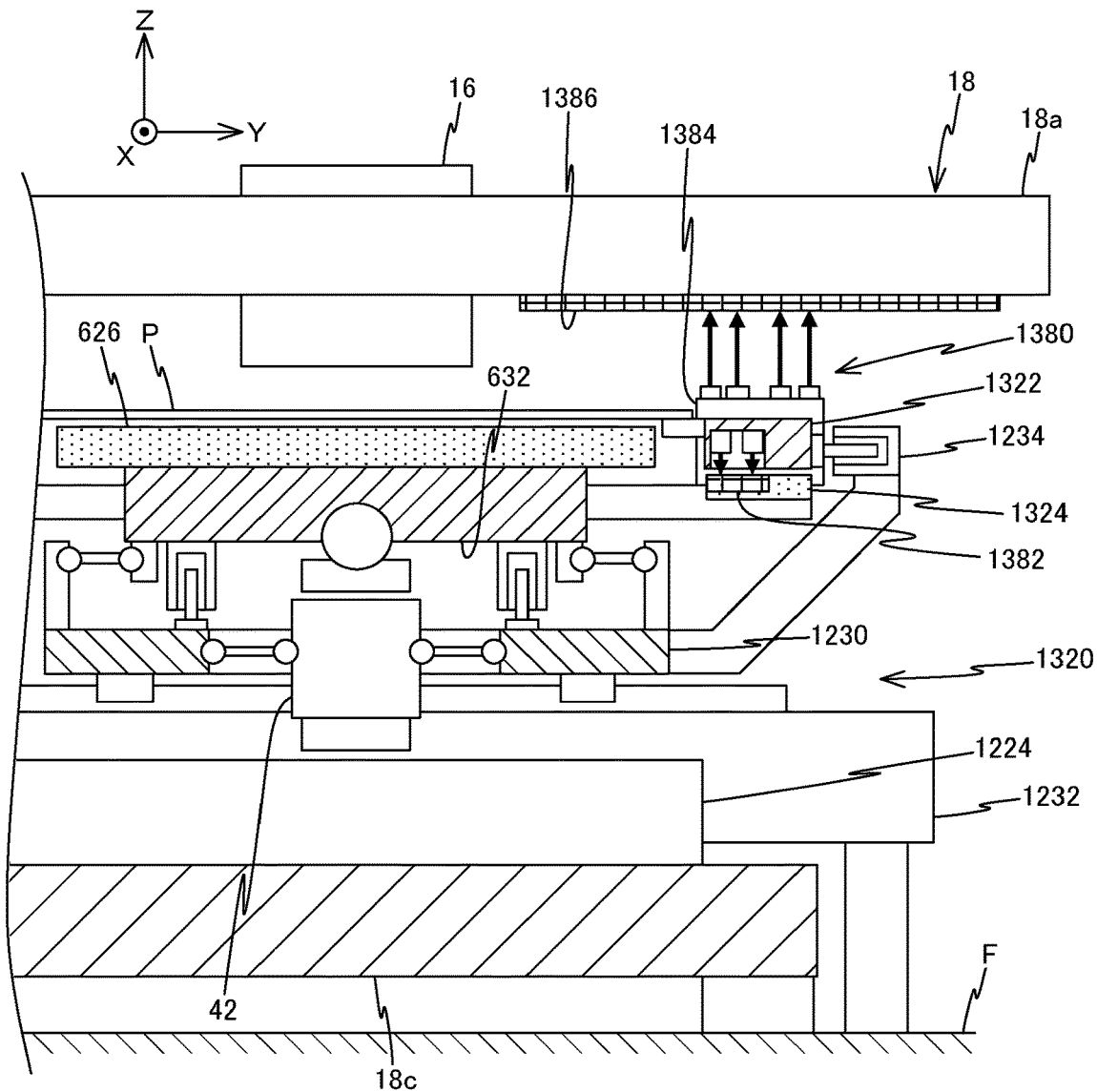
FIG. 55 is a view showing a substrate stage device according to a thirteenth embodiment.
Figure 56:
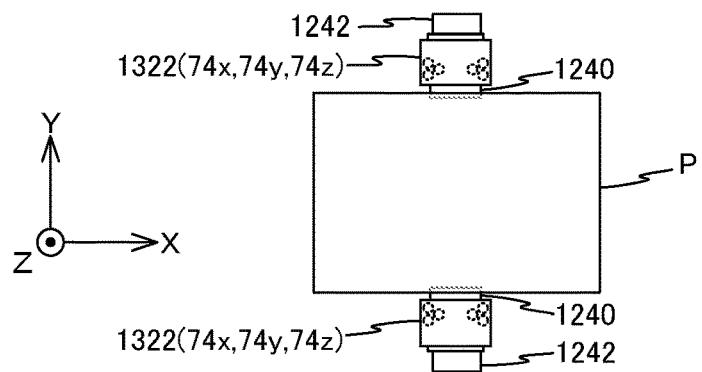
FIG. 56 is a view showing a substrate holder which is a part of the substrate stage device in FIG. 55.

Substrate holders 1322, as is shown in FIG. 55, has a recess section formed that opens downward, similarly to substrate holder 1122 (refer to FIG. 44 and the like) according to the eleventh embodiment described above, and in the recess section, downward heads 74x, 74y, and 74z (each refer to FIG. 56) are formed in pairs, attached to face upward scale 1382 (refer to FIG. 58).

As is shown in FIG. 57, at both ends near the edge in the longitudinal direction of air guide 1324, head bases 1384 are fixed, and to each head base 1384, two each of upward heads 80x, 80y, and 80z are attached facing the corresponding downward scale 1386 fixed to the lower surface of optical surface plate 18a (refer to FIG. 55). With substrate measurement system 1380 according to the thirteenth embodiment as well, similarly to substrate measurement system 1280 (refer to FIG. 53 and the like) of the twelfth embodiment described above, position information on substrate P (the pair of substrate holders 1322) is obtained via Y coarse movement stage 1230 with optical surface plate 18a serving as a reference.

Fourteenth Embodiment

Next, a liquid crystal exposure apparatus according to a fourteenth embodiment will be described, using FIG. 59. Since the structure of the liquid crystal exposure apparatus according to the fourteenth embodiment is roughly the same as that of the thirteenth embodiment described above, except for the point that the structure of a substrate stage device 1420 and its measurement system is different, only the different points will be described below, and for elements having the same structure or function as the thirteenth embodiment described above will have the same reference code as the thirteenth embodiment and the description thereabout will be omitted.

Figure 59:
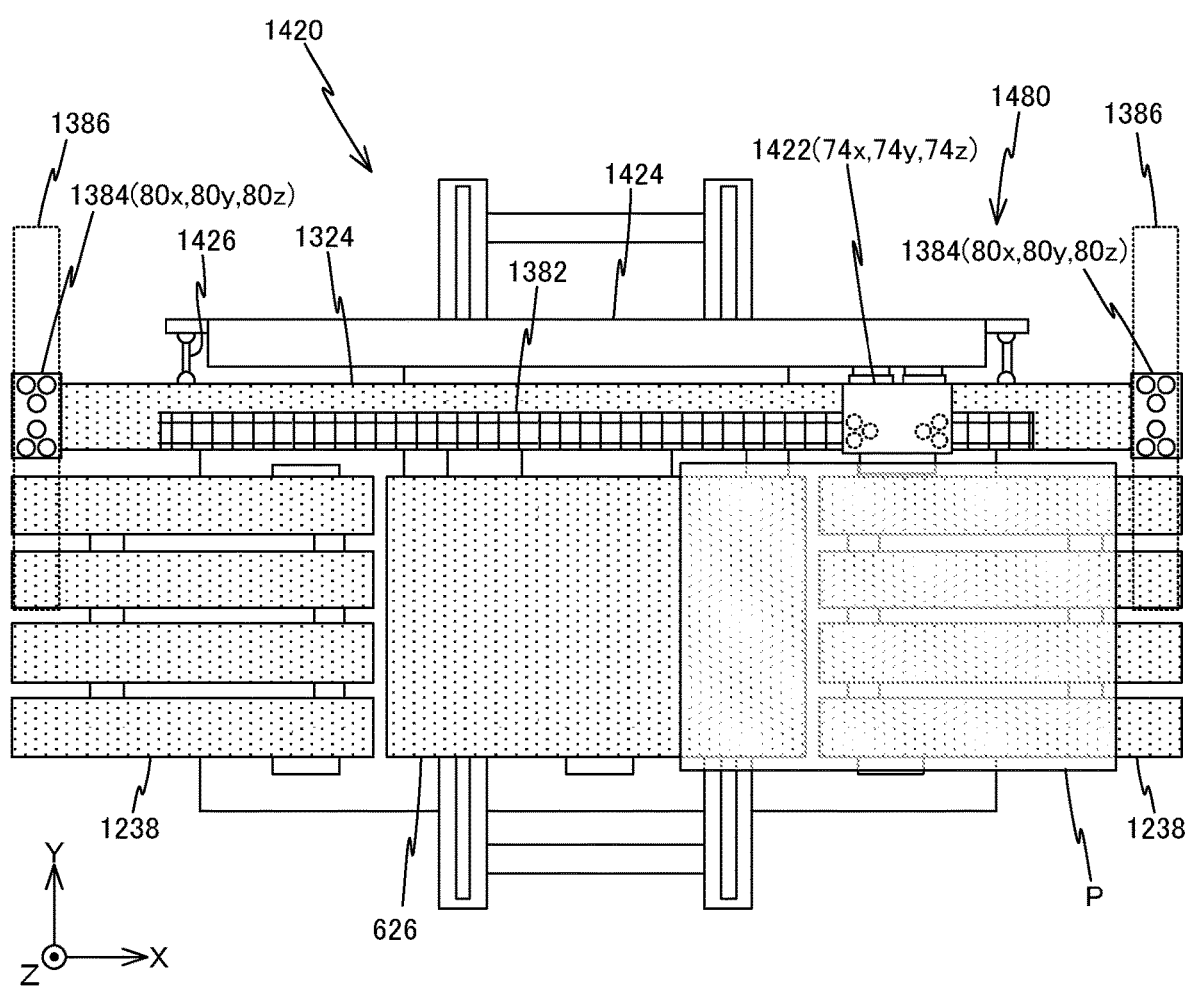
FIG. 59 is a view showing a substrate stage device according to a fourteenth embodiment.

In the thirteenth embodiment (refer to FIG. 58) described above, while substrate P was held near both ends in the Y-axis direction by substrate holders 1322, as is shown in FIG. 59, in the fourteenth embodiment, the point in which substrate P is held by suction by a substrate holder 1422 at only one side near the edge in the Y-axis direction (in the embodiment, the +Y side) is different. As for substrate holder 1422, since the holder is the same as that of the twelfth embodiment described above except for the point that the holder is moved by a 3-DOF motor with respect to a stator 1424, the description thereabout will be omitted. Connecting members 1426 that connect stator 1424 and air guide 1324 also has rigidity in the Y-axis direction, which makes it possible for stator 1424 to push or pull (push/pull) substrate table 626. Also, as for the structure and operation of a substrate measurement system 1480 according to the fourteenth embodiment, since they are also the same as those of the thirteenth embodiment, the description thereabout will be omitted here.

Fifteenth Embodiment

Next, a liquid crystal exposure apparatus according to a fifteenth embodiment will be described, using FIGS. 60 to 63. Since the structure of the liquid crystal exposure apparatus according to the fifteenth embodiment is roughly the same as that of the first or the sixth embodiment described above, except for the point that the structure of a substrate stage device 1520 and its measurement system is different, only the different points will be described below, and for elements having the same structure or function as the first or the sixth embodiment described above will have the same reference code as the first or the sixth embodiment and the description thereabout will be omitted.

Figure 60:
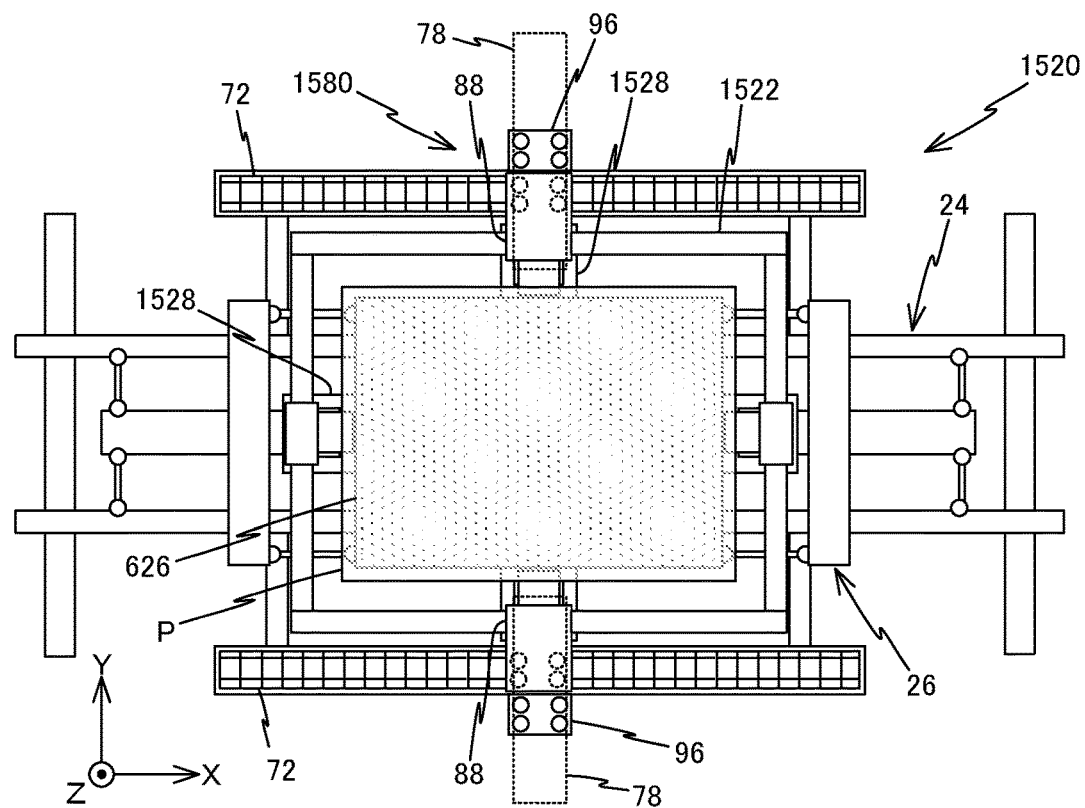
FIG. 60 is a view showing a substrate stage device according to a fifteenth embodiment.

As is shown in FIG. 60, substrate stage device 1520 is equipped with a first movable body (here, a substrate holder 1522) and a second movable body (here, Y coarse movement stage 24).

Figure 62:
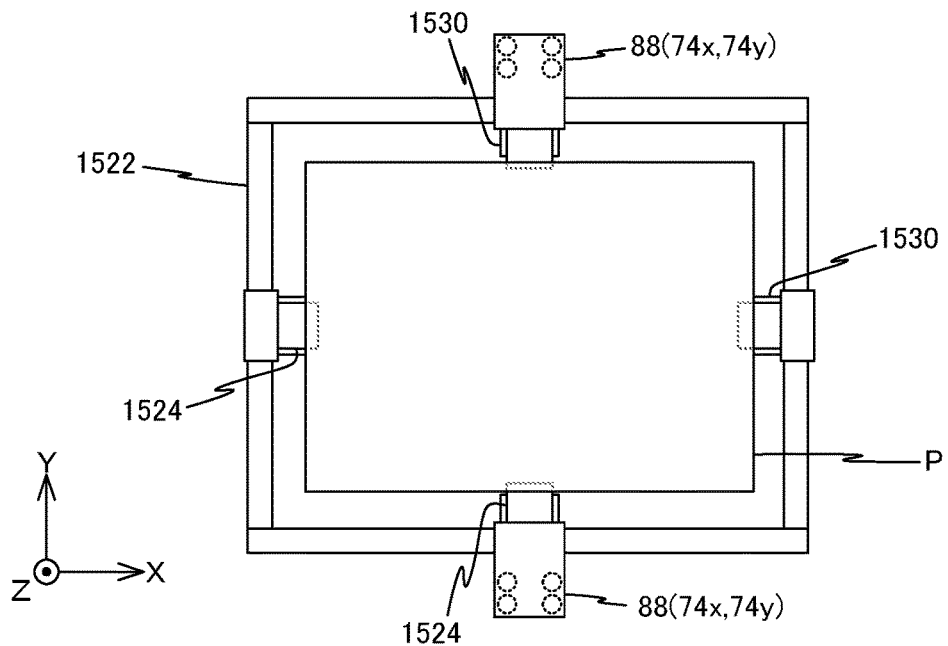
FIG. 62 is a view showing a substrate holder which is a part of the substrate stage device in FIG. 60.

As is shown in FIG. 62, substrate holder 1522 is formed in a frame shape (picture frame shape) which is rectangular in a planar view, similarly to substrate holder 622 in the sixth embodiment (refer to FIG. 26 and the like) described above, and substrate P is arranged within an opening of substrate holder 1522. Substrate holder 1522 has four suction pads 1524, and holds substrate P from below by suction near the center at each of the four sides.

Figure 63:
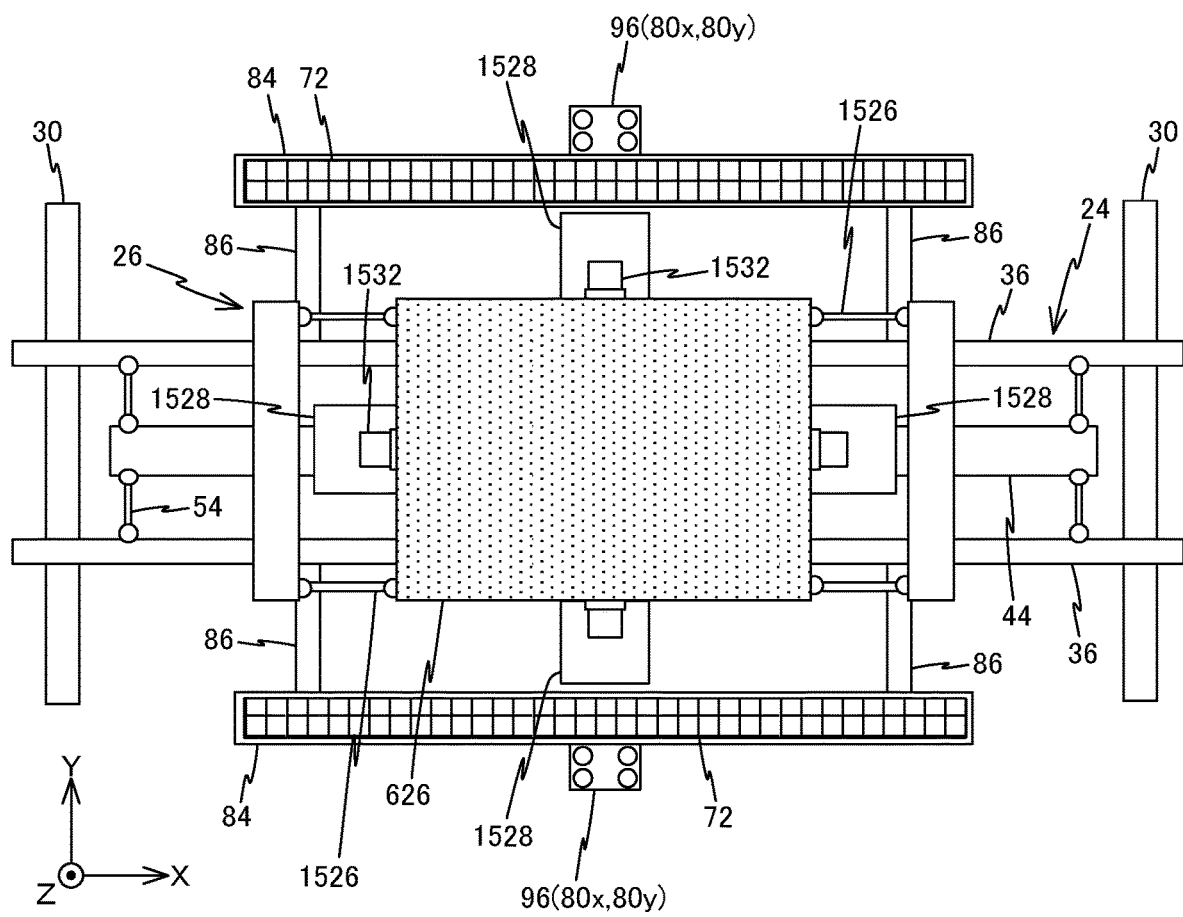
FIG. 63 is a view showing a system including a substrate table which is a part of the substrate stage device in FIG. 60.

Of substrate P, the exposure area including the center is supported from below in a non-contact manner by substrate table 626, as is shown in FIG. 60. Substrate table 626, similarly to that of the sixth embodiment (refer to FIG. 26 and the like) described above, performs flatness correction substrate P in a non-contact state. Also, although it is not shown in FIG. 60 and the like, to the lower surface of substrate table 626, stage main section 632 (refer to FIG. 23) is fixed, similarly to that of the sixth embodiment described above. Stage main section 632 (not shown), as is shown in FIG. 63, is connected to X coarse movement stage 26 via a plurality of connecting members 1526, in a state where relative movement in the Z-tilt direction is allowed; accordingly, substrate table 626 moves in long strokes in the X-axis and the Y-axis directions, integrally with X coarse movement stage 26. Since the structure and operation of X coarse movement stage 26, Y coarse movement stage 24 and the like are the same as those of the first embodiment (refer to FIG. 4 and the like) described above, the description thereabout will be omitted.

Also, as is shown in FIG. 63, from stage main section 632 (not shown in FIG. 63, refer to FIG. 23), table members 1528 are protruding outward in a total of four directions; in the ±Y directions and the ±X directions. As is shown in FIG. 60, substrate holder 1522 is mounted on the four table members 1528 via an air bearing (not shown) in a non-contact state. Also, substrate holder 1522 is moved in fine strokes in the X-axis, the Y-axis, and the θz directions with respect to substrate table 626 by a plurality of linear motors structured by a plurality of movers 1530 (refer to FIG. 62) attached to substrate holder 1522 and a plurality of stators 1532 (refer to FIG. 63) attached to stage main section 632.

Figure 61:
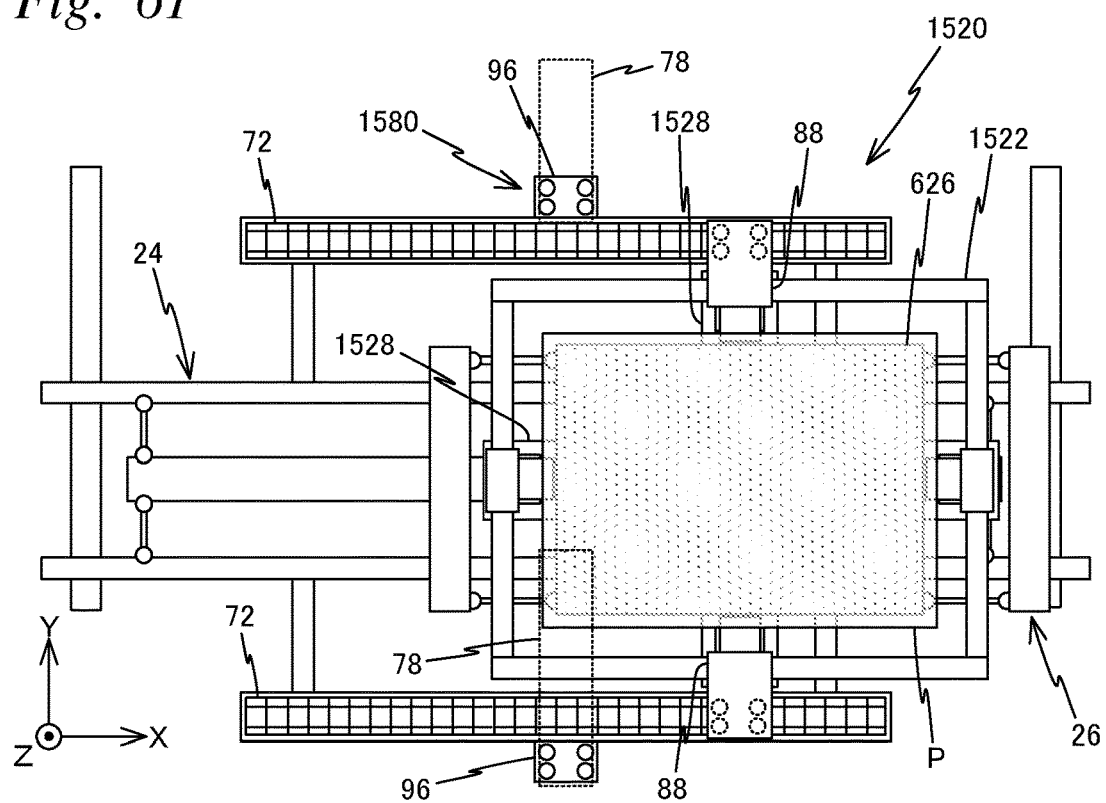
FIG. 61 is a view used to explain an operation of the substrate stage device in FIG. 60.

While substrate holder 622 of the sixth embodiment described above was relatively movable (refer to FIG. 27) in long strokes in the Y-axis direction separate from substrate table 626, in the fifteenth embodiment, the main controller (not shown) gives thrust to substrate holder 1522 using the plurality of linear motors described above, so that the position between substrate holder 1522 and substrate table 626 stays within a predetermined range, as is shown in FIG. 61. Accordingly, the entire exposure area of substrate P is supported from below at all times by substrate table 626.

Next, a substrate measurement system 1580 according to the fifteenth embodiment will be described. Substrate measurement system 1580 is conceptually roughly the same as substrate measurement system 70 according to the first embodiment described above, and position information on substrate holder 1522 within the horizontal plane is obtained via Y coarse movement stage 24, with optical surface plate 18a (refer to FIG. 1 and the like) serving as a reference.

That is, to substrate holder 1522, as is shown in FIG. 62, a pair of head bases 88 is fixed, and to each head base 88, two each of downward X heads 74x and downward Y heads 74y are attached (refer to FIG. 62). Also, as is shown in FIG. 63, to Y coarse movement stage 24, a pair of scale bases 84 is attached via arm member 86, and on the upper surface of each scale base 84, upward scale 72 extending in the X-axis direction (measurable range in the X-axis direction is longer than measurable range in the Y-axis direction) is fixed. Position information on substrate holder 1522 with respect to Y coarse movement stage 24 is obtained by an encoder system structured by each of the heads 74x and 74y described above and the corresponding scale 72.

Also, to each of the pair of scale bases 84 attached to Y coarse movement stage 24, head base 96 is fixed, and to each head base 96, two each of upward X heads 80x and upward Y heads 80y are attached (refer to FIG. 63). To the lower surface of optical surface plate 18a (refer to FIG. 1 and the like), downward scale 78 (refer to FIG. 60) is fixed, corresponding to each head base 96 and extending in the Y-axis direction (measurable range in the Y-axis direction is longer than measurable range in the X-axis direction). Position information on Y coarse movement stage 24 with respect to optical surface plate 18a is obtained by an encoder system structured by each of the heads 80x and 80y described above and the corresponding scale 78.

Sixteenth Embodiment

Figure 64:
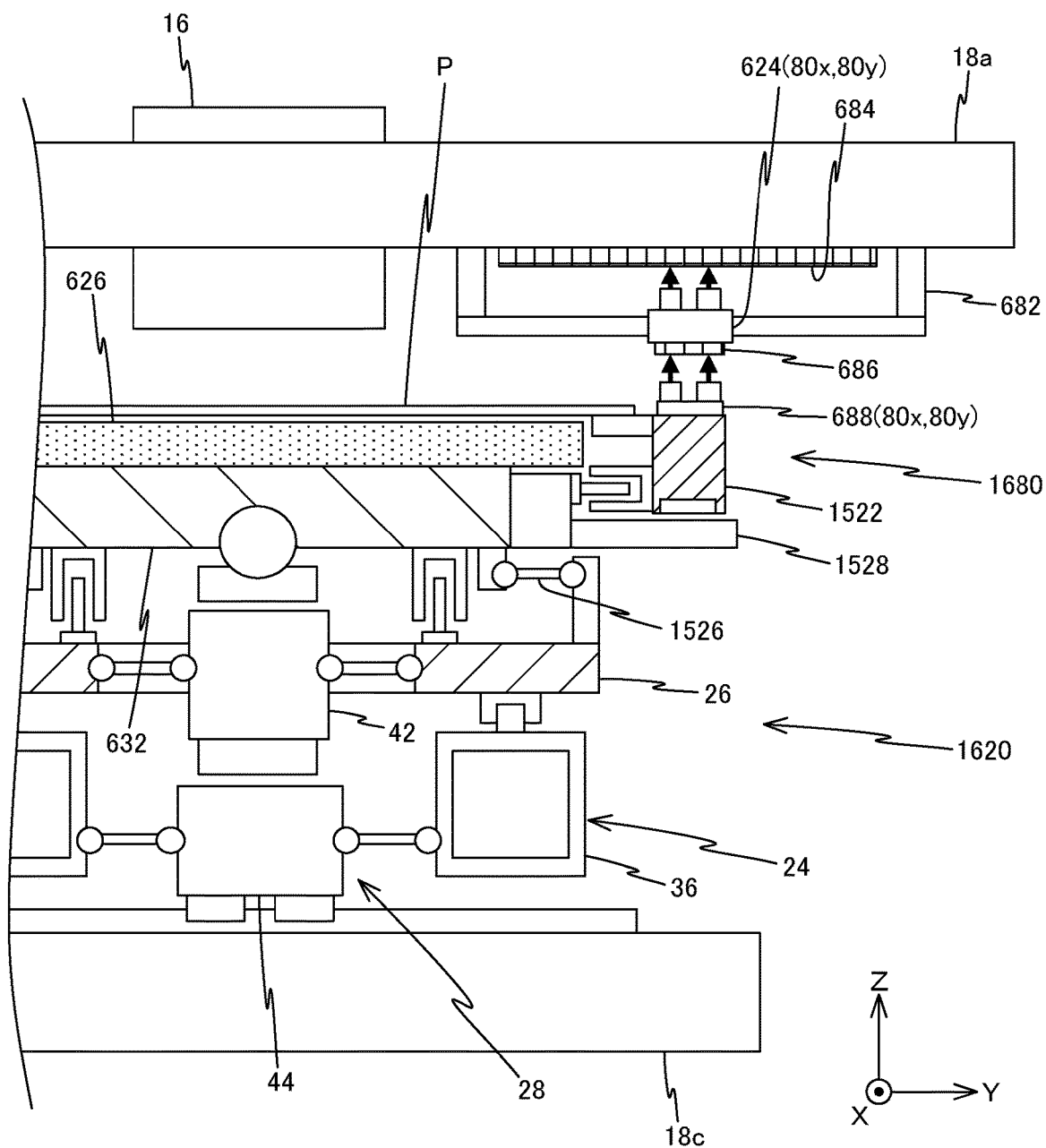
FIG. 64 is a view showing a substrate stage device according to a sixteenth embodiment.

Next, a liquid crystal exposure apparatus according to a sixteenth embodiment will be described, using FIG. 64. Since the structure of the liquid crystal exposure apparatus according to the sixteenth embodiment is roughly the same as that of the sixth or the fifteenth embodiment described above, except for the point that the structure of a substrate stage device 1620 and its measurement system is different, only the different points will be described below, and for elements having the same structure or function as the sixth or the fifteenth embodiment described above will have the same reference code as the sixth or the fifteenth embodiment and the description thereabout will be omitted.

The structure (including the drive system) of substrate holder 1522, substrate table 626 and the like that substrate stage device 1620 according to the sixteenth embodiment has is roughly the same as the fifteenth embodiment (refer to FIG. 60 and the like) described above. While substrate measurement system 1580 (refer to FIG. 60 and the like) of the fifteenth embodiment described above obtained position information on substrate holder 1522 via Y coarse movement stage 24 with optical surface plate 18a serving as a reference (that is, the structure was similar to that of substrate measurement system 70 of the first embodiment), a substrate measurement system 1680 according to the sixteenth embodiment is different on the point that position information on substrate holder 1522 is obtained via measurement table 624 with optical surface plate 18a serving as a reference, similarly to that of the sixth embodiment described above.

That is, to substrate holder 1522 according to the sixteenth embodiment, a pair of head bases 688 is fixed similarly to that of the sixth embodiment (refer to FIG. 24) described above, and to each head base 688, two each of upward X heads 80x and upward Y heads 80y are attached. Also, to the lower surface of optical surface plate 18a, measurement table 624 is attached that can be moved so that the position in the Y-axis direction with respect to substrate holder 1522 stays within a predetermined range, corresponding to the pair of head bases 688. Position information on substrate holder 1522 is obtained by a linear encoder system structured by each of the heads 80x and 80y and downward scale 686 extending in the X-axis direction fixed to the lower surface of the corresponding measurement table 624. Also, position information on measurement table 624 is obtained by a linear encoder system, structured by upward X heads 80x and upward Y heads 80y attached to measurement table 624 and downward scale 684 extending in the Y-axis direction fixed to the lower surface of optical surface plate 18a.

Seventeenth Embodiment

Figure 65:
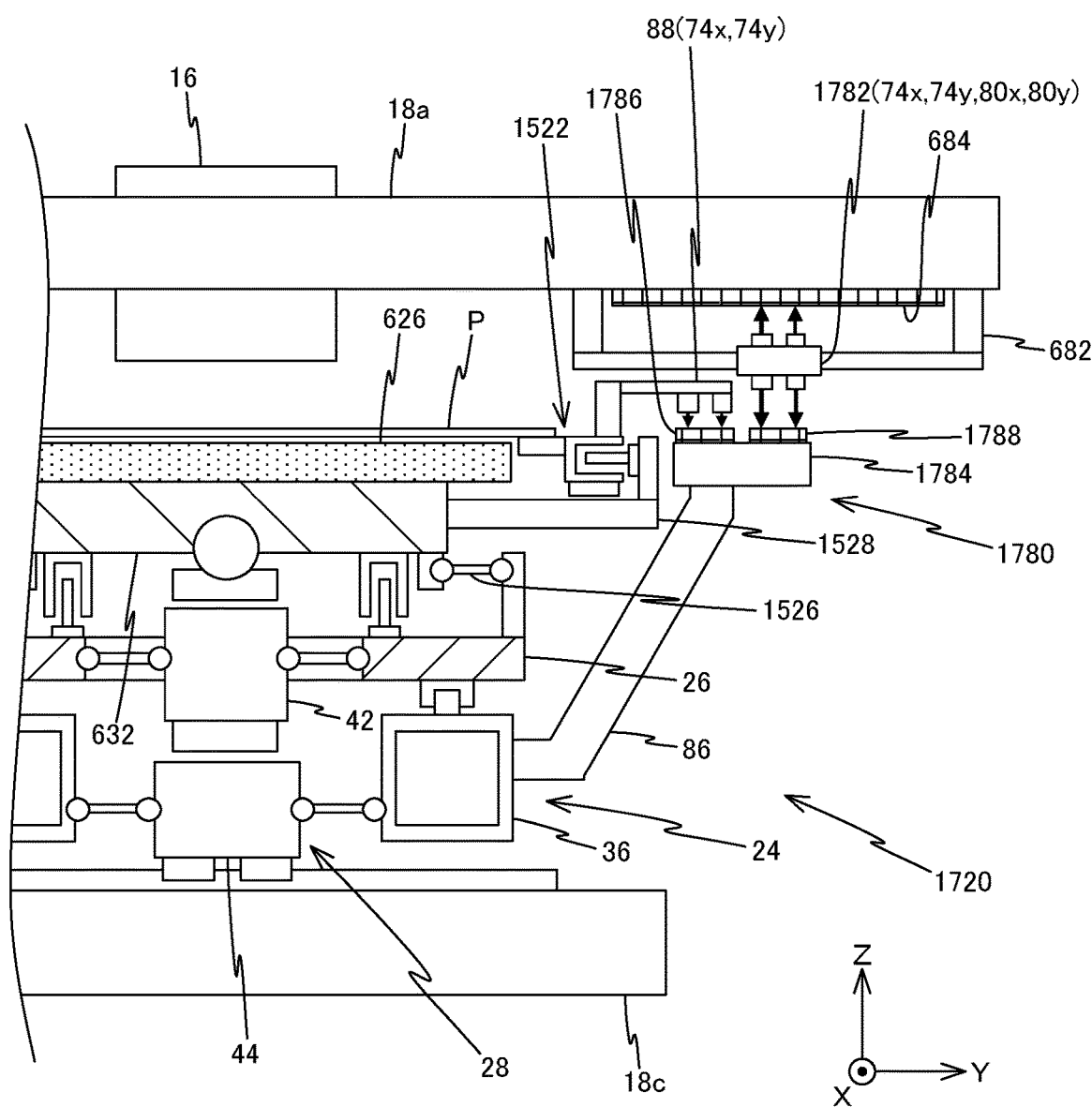
FIG. 65 is a view showing a substrate stage device according to a seventeenth embodiment.

Next, a liquid crystal exposure apparatus according to a seventeenth embodiment will be described, using FIG. 65. Since the structure of the liquid crystal exposure apparatus according to the seventeenth embodiment is roughly the same as that of the fifteenth or the sixteenth embodiment described above, except for the point that the structure of a substrate stage device 1720 and its measurement system is different, only the different points will be described below, and for elements having the same structure or function as the fifteenth or the sixteenth embodiment described above will have the same reference code as the fifteenth or the sixteenth embodiment and the description thereabout will be omitted.

The structure (including the drive system) of substrate holder 1522, substrate table 626 and the like that substrate stage device 1720 according to the seventeenth embodiment has is roughly the same as the fifteenth embodiment (refer to FIG. 60 and the like) described above. While substrate measurement system 1580 (refer to FIG. 60 and the like) of the fifteenth embodiment described above obtained position information on substrate holder 1522 via Y coarse movement stage 24 with optical surface plate 18a serving as a reference (that is, the structure was similar to that of substrate measurement system 70 of the first embodiment), a substrate measurement system 1780 according to the seventeenth embodiment is different on the point that position information on substrate holder 1522 is obtained via Y coarse movement stage 24 and a measurement table 1782 with optical surface plate 18a serving as a reference.

In substrate stage device 1720 according to the seventeenth embodiment, to Y coarse movement stage 24, a scale base 1784 is fixed via arm member 86, similarly to that of the fifteenth embodiment (refer to FIG. 63 and the like) described above. Note that although it is not shown in FIG. 65, scale base 1784 is arranged one each on the +Y side and on the −Y side of substrate holder 1522, similarly to that of the fifteenth embodiment described above. While measurement table 1782 is also not shown, the measurement table is similarly arranged one each on the +Y side and on the −Y side of projection optical system 16, corresponding to scale base 1784.

To the upper surface of scale base 1784, an upward scale 1786 used for measuring the position of substrate holder 1522 and an upward scale 1788 used for measuring the position of measurement table 1782 are attached at a predetermined spacing in the Y-axis direction. Upward scales 1786 and 1788 have two-dimensional diffraction gratings on their upper surface, formed so that the measurement range of position information in the X-axis direction becomes wider than that of the Y-axis direction (the X-axis direction is to be the longitudinal direction). Positional relation (third information) between upward scale 1786 and upward scale 1788 is to be known. Note that the pitch of the two-dimensional diffraction gratings formed on upward scales 1786 and 1788 may be the same, or may be different. Also, instead of the two upward scales 1786 and 1788, scale base 1784 may have one wide upward scale that can be used for measuring the position of both substrate holder 1522 and measurement table 1782.

To substrate holder 1522, similarly to that of the fifteenth embodiment (refer to FIG. 63 and the like) described above, two each of downward heads 74$x$ and 74$y$ are attached, via head base 88. Since the point that position information on substrate holder 1522 within the XY plane with respect to Y coarse movement stage 24 is obtained by an encoder system structured by downward heads 74$x$ and 74$y$ and the corresponding upward scale 1786 is similar to that of the fifteenth embodiment (that is, the first embodiment) described above, the description thereabout will be omitted.

Measurement table 1782 is moved in predetermined strokes in the Y-axis direction by Y linear actuator 682, similarly to measurement table 624 in the sixteenth embodiment (refer to FIG. 64) described above. Similarly to the sixteenth embodiment described above, to measurement table 1782, two each of upward heads 80$x$ and 80$y$ are attached. Since the point that position information on measurement table 1782 within the XY plane with respect to optical surface plate 18$a$ is obtained by an encoder system structured by upward heads 80$x$ and 80$y$ and a corresponding downward scale 984 is similar to that of the sixteenth embodiment (that is, the sixth embodiment) described above, the description thereabout will be omitted.

Position information on Y coarse movement stage 24 within the XY plane is obtained via measurement table 1782 with optical surface plate 18$a$ serving as a reference. The measurement system for obtaining the position information on Y coarse movement stage 24 is conceptually same as the measurement system (encoder system) for obtaining position information on substrate holder 1522 with respect to Y coarse movement stage 24. That is, two each of downward X heads 74$x$ and downward Y heads 74$y$ are attached to measurement table 1782, and position information on Y coarse movement stage 24 within the XY plane with respect to measurement table 1782 is obtained by an encoder system structured by the downward heads 74$x$ and 74$y$ and upward scale 1788. The main controller obtains position information on substrate holder 1522 with optical surface plate 18$a$ serving as a reference, based on position information on measurement table 1782 with respect to optical surface plate 18$a$, position information on Y coarse movement stage 24 with respect to measurement table 1782, and position information on substrate holder 1522 with respect to Y coarse movement stage 24 described above.

Eighteenth Embodiment

Figure 66:
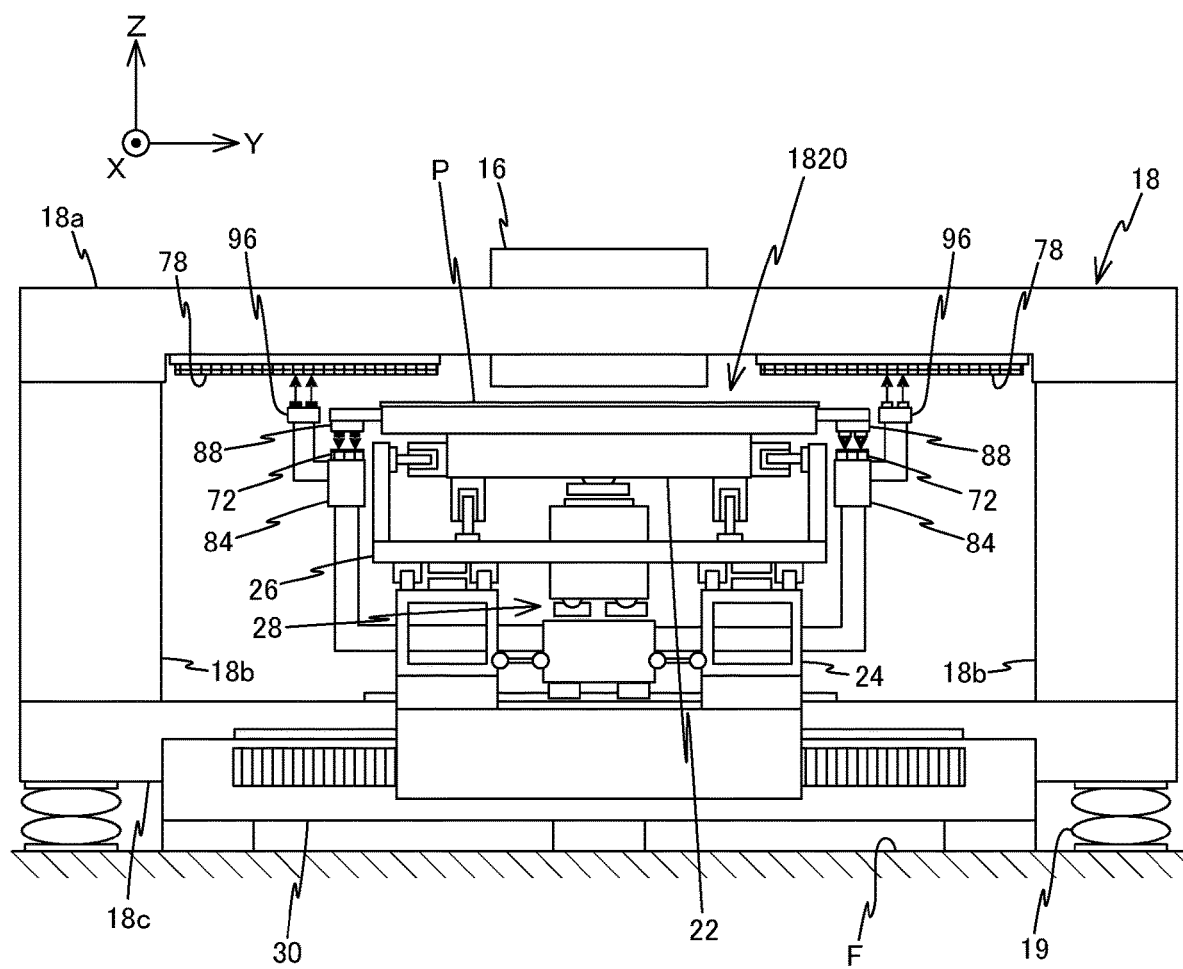
FIG. 66 is a view showing a substrate stage device according to an eighteenth embodiment.

Next, a liquid crystal exposure apparatus according to an eighteenth embodiment will be described, using FIGS. 66 to 68. Since the structure of the liquid crystal exposure apparatus according to the eighteenth embodiment is roughly the same as that of the first embodiment described above, except for the point that the structure of a substrate stage device 1820 and its measurement system is different, only the different points will be described below, and for elements having the same structure or function as the first embodiment described above will have the same reference code as the first embodiment and the description thereabout will be omitted.

Figure 67:
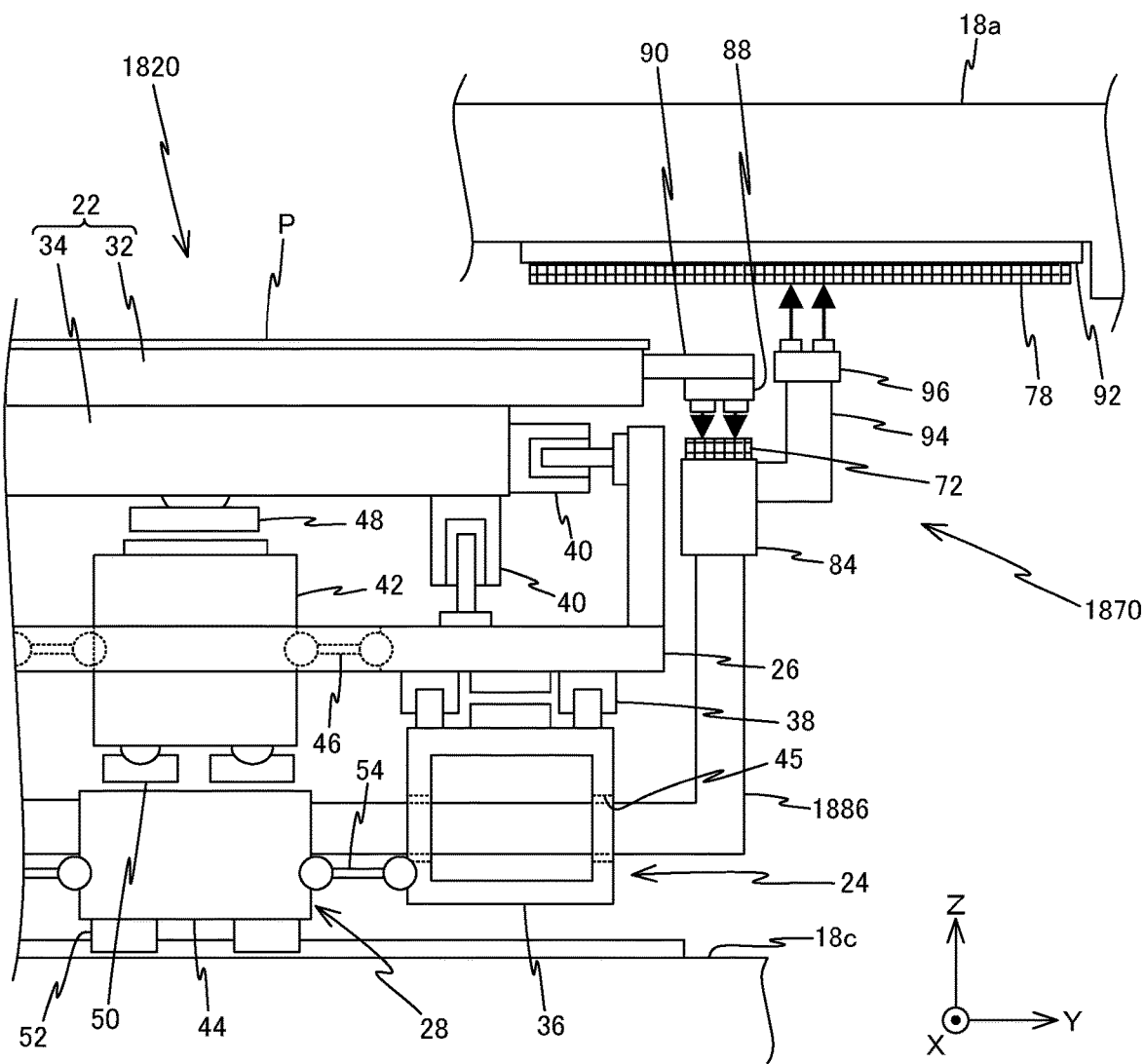
FIG. 67 is a view used to explain a structure of a substrate measurement system according to the eighteenth embodiment.
Figure 68:
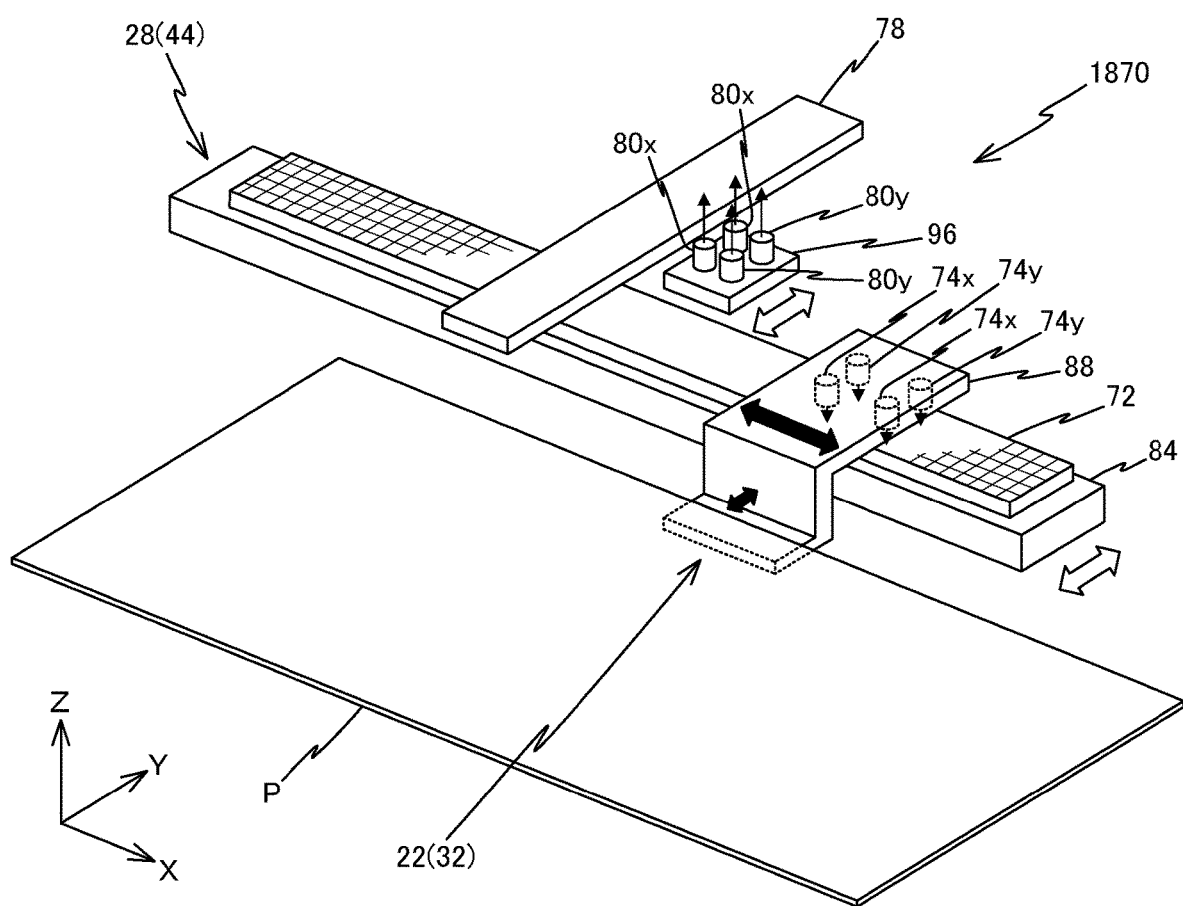
FIG. 68 shows a schematic view of a substrate measurement system according to the eighteenth embodiment.

In the first embodiment (refer to FIG. 2 and the like), while upward scale 72 for obtaining position information on fine movement stage 22, and upward heads 80$x$ and 80$y$ for obtaining position information on upward scale 72 were each fixed to Y coarse movement stage 24, the eighteenth embodiment is different on the point that upward scale 72 and upward heads 80$x$ and 80$y$ are fixed to Y step guide 44 that weight canceling device 28 is equipped with, as is shown in FIG. 67.

Upward scale 72 is fixed to the upper surface of scale base 84. Scale base 84, as is shown in FIG. 66, is arranged one each on the +Y side and the −Y side of fine movement stage 22. Scale base 84, as is shown in FIG. 67, is fixed to Y step guide 44 via an arm member 1886 formed in an L-shape when viewed from the X-axis direction. Accordingly, scale base 84 (and upward scale 72) is movable in predetermined long strokes in the Y-axis direction integrally with Y step guide 44 and Y coarse movement stage 24. As is described above, because Y step guide 44 is arranged in between the pair of X beams 36 that Y coarse movement stage 24 has (the Z position of X beams 36 partly overlaps the Z position of Y step guide 44), through holes 45 are formed in X beams 36 that allow arm member 1886 to penetrate (to prevent arm member 86 from coming into contact with X beams 36).

The structure and operation of fine movement stage measurement system 76 (refer to FIG. 6) including downward heads 74$x$ and 74$y$, and upward scale 72 are the same as those of the first embodiment described above, therefore, the description thereabout will be omitted Also, since the structure and operation of coarse movement stage measurement system 82 (refer to FIG. 6) including downward scale 78, and upward heads 80$x$ and 80$y$ are also the same as those of the first embodiment described above, the description thereabout will be omitted However, in the embodiment, the point in which coarse movement stage measurement system 82 actually measures position information on Y step guide 44 is different from the first embodiment described above. As is described so far, a substrate measurement system 1870 of the embodiment obtains position information on fine movement stage 22 (substrate P) via Y step guide 44 with optical surface plate 18$a$ serving as a reference.

According to the eighteenth embodiment, since upward scale 72 is fixed to Y step guide 44 which supports fine movement stage 22 (is included in the same system as fine movement stage 22), influence of operation of coarse movement stages 24 and 26 can be suppressed compared to the first embodiment described above, which can improve position measurement accuracy of fine movement stage 22.

Nineteenth Embodiment

Next, a liquid crystal exposure apparatus according to a nineteenth embodiment will be described, using FIGS. 69 and 70. Since the structure of the liquid crystal exposure apparatus according to the nineteenth embodiment is roughly the same as that of the eighteenth embodiment described above, except for the point that the structure of an apparatus main section 1918 and a substrate measurement system 1970 is different, only the different points will be described below, and for elements having the same structure or function as the eighteenth embodiment described above will have the same reference code as the eighteenth embodiment and the description thereabout will be omitted.

Figure 69:
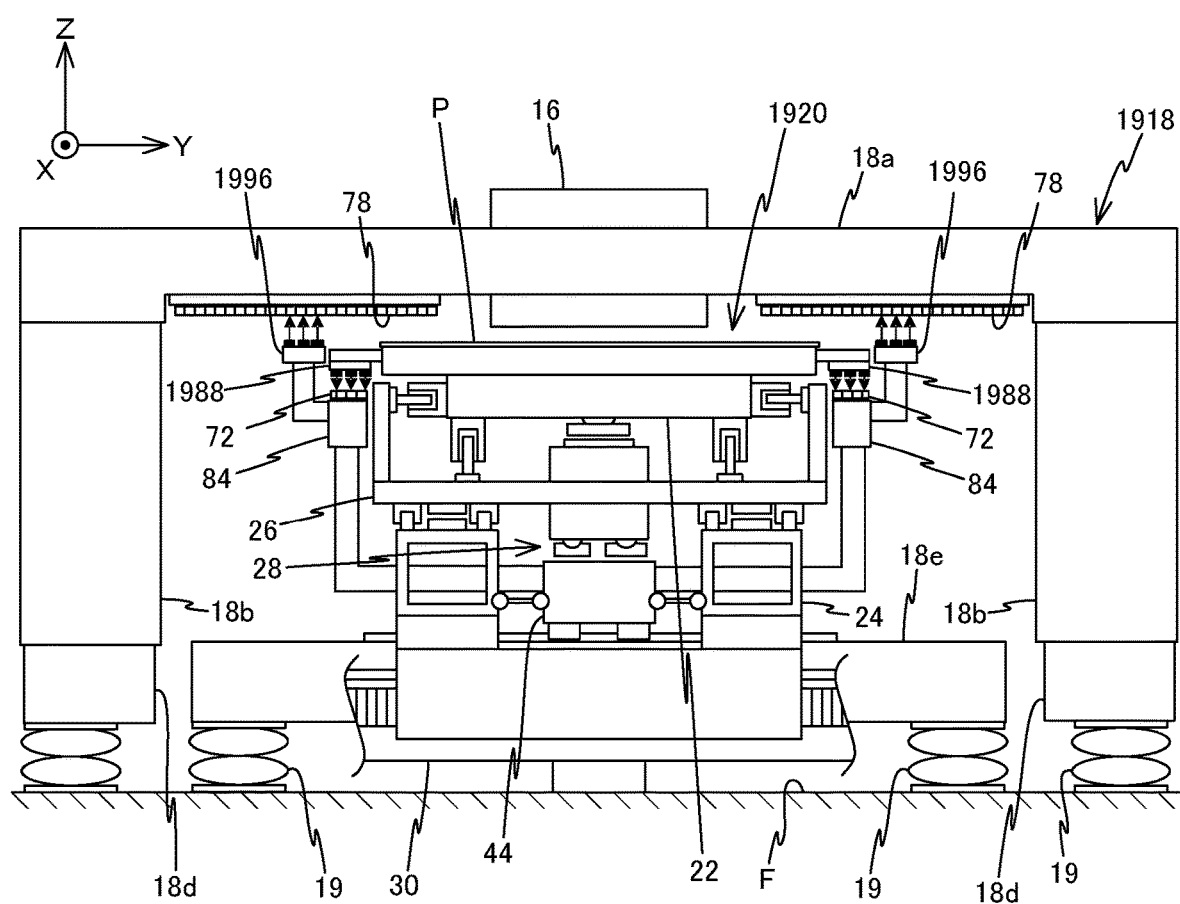
FIG. 69 is a view showing a substrate stage device according to a nineteenth embodiment.

In the eighteenth embodiment (refer to FIG. 66) described above, while apparatus main section 18 was installed on floor F via a vibration isolation device 19 in a state where optical surface plate 18$a$, middle mount section 18$b$, and lower mount section 18$c$ were integrally assembled, in the nineteenth embodiment, apparatus main section 1918, as is shown in FIG. 69, is different on the point that a part supporting projection optical system 16 (hereinafter called a "first part") and a part supporting Y step guide 44 (hereinafter called a "second part") are installed on floor F in a state physically separated from each other.

Of apparatus main section 1918, the first part supporting projection optical system 16 is equipped with optical surface plate 18*a*, a pair of middle mount sections 18*b*, and a pair of a first lower mount section 18*d*, and has a gate form (inverted U-shape) in a front view (when viewed from the X-axis direction). The first part is installed on floor F via a plurality of vibration isolation devices 19. Meanwhile, of apparatus main section 1918, the second part supporting Y step guide 44 is equipped with a second lower mount section 18*e*. The second lower mount section 18*e* consists of a plate shaped member, and is inserted in between the pair of the first lower mount sections 18*d*. The second lower mount section 18*e* is installed on floor F via a plurality of vibration isolation devices 19 different from the plurality of vibration isolation devices 19 that support the first part described above. A gap is formed between the pair of first lower mount sections 18*d* and the second lower mount section 18*e*, and the first part and the second part are separated (isolated) in a vibrational manner. The point in which Y step guide 44 is mounted on the second lower mount section 18*e* via mechanical linear guide device 52 is the same as the eighteenth embodiment described above.

While it is partly omitted in FIG. 69, the structure of the pair of base frames 30 is similar to that of the eighteenth (first) embodiment described above. The pair of base frames 30 includes the second lower mount section 18*e*, and is installed on floor F in a state vibrationally isolated with an apparatus main section 218. The point in which Y coarse movement stage 24 and X coarse movement stage 26 are mounted on the pair of base frames 30 and fine movement stage 22 is mounted on Y step guide 44 via weight canceling device 28 are the same as the eighteenth embodiment described above.

Next, a structure and operation of a substrate measurement system 1970 according to the nineteenth embodiment will be described. Note that the structure and operation of a substrate stage device 1920 except for the measurement system are the same as those of the eighteenth embodiment, the description thereabout will be omitted.

Figure 70:
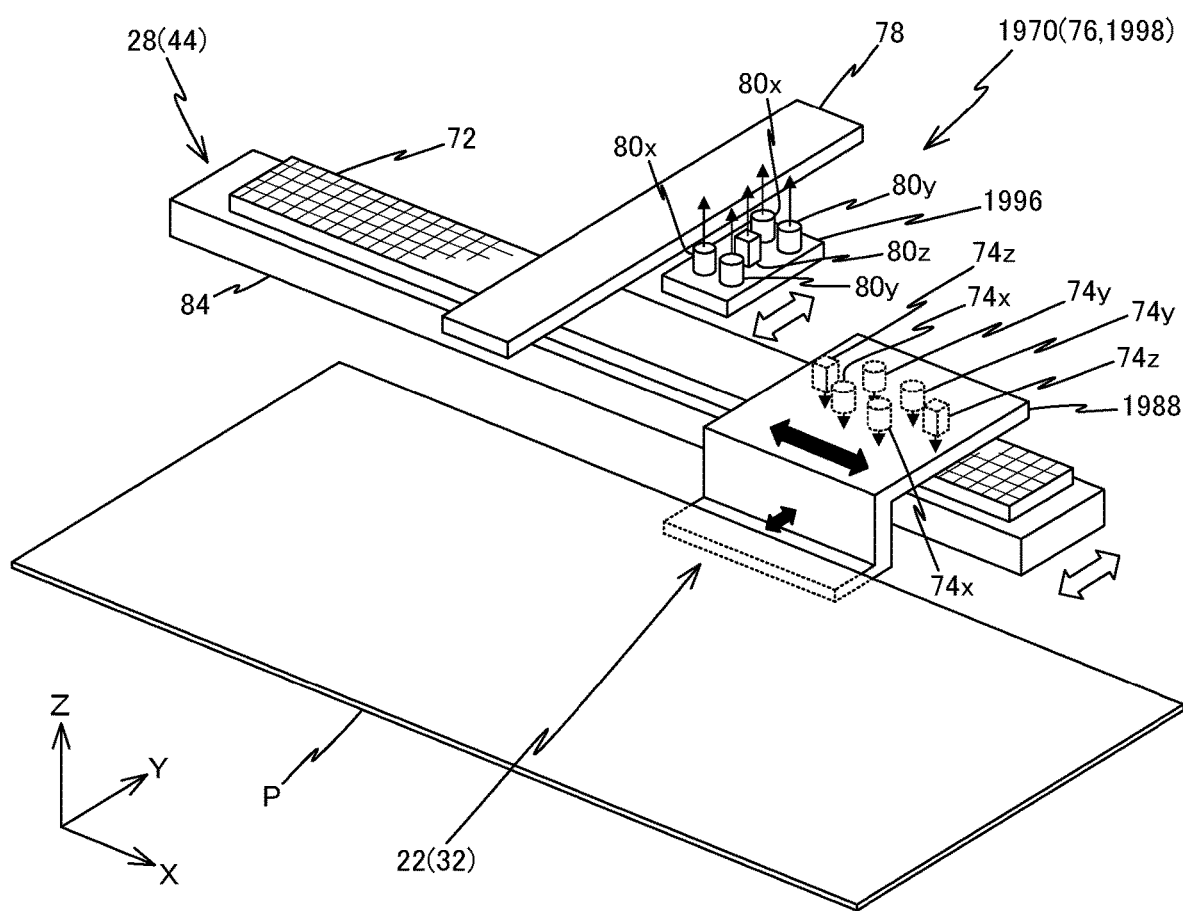
FIG. 70 shows a schematic view of a substrate measurement system according to the nineteenth embodiment.

FIG. 70 shows a schematic view of substrate measurement system 1970 according to the nineteenth embodiment. Of substrate measurement system 1970, since the structure of fine movement stage measurement system 76 (refer to FIG. 6) for obtaining position information on fine movement stage 22 (substrate holder 32 in actual) within the XY plane is the same as that of the eighteenth (first) embodiment described above, the description thereabout will be omitted. With substrate measurement system 1970 according to the nineteenth embodiment, the structure of a Z-tilt position measurement system 1998 for obtaining position information on substrate holder 32 in a direction intersecting with the horizontal plane is different from that of the eighteenth (first) embodiment described above.

Z-tilt position measurement system 1998, as is shown in FIG. 70, obtains position information on substrate holder 32 in the Z-tilt direction via Y coarse movement stage 24 with optical surface plate 18*a* (refer to FIG. 69) serving as a reference, similarly to fine movement stage measurement system 76.

As is shown in FIG. 69, to each head bases 1988 fixed to the side surfaces on the +Y side and the −Y side of substrate holder 32, along with two downward X heads 74*x* and two downward Y heads 74*y*, two downward Z head 74*z* are attached arranged apart in the X-axis direction (refer to FIG. 70). As downward Z head 74*z*, a known displacement sensor is used that irradiates a measurement beam on upward scale 72. The main controller (not shown) obtains displacement amount information on fine movement stage 22 in the Z tilt direction with respect to Y coarse movement stage 24, based on the output of the total of four Z heads 74*z* (refer to FIG. 9).

Also, to each of the pair of scale bases 84 fixed to the side surfaces on the +Y side and the −Y side of Y step guide 44, two head bases 1996 are fixed, similarly to head bases 96 in the first embodiment described above (refer to FIG. 4). Also, as is shown in FIG. 70, to head bases 1996, along with two upward X heads 84*x* and two upward Y heads 80*y*, one upward Z head 80*z* is attached. While a laser displacement meter similar to that of downward Z head 74*z* is used for upward Z head 80*z*, different kinds may be used in each of the Z head 74*z* and 80*z*. The main controller (not shown) obtains displacement amount information on Y coarse movement stage 24 in the Z tilt direction with respect to optical surface plate 18*a* (refer to FIG. 69), based on the output of the total of four upward Z heads 80*z* (refer to FIG. 70).

In the nineteenth embodiment described so far, since position information in the Z-tilt direction of substrate P can be obtained with optical surface plate 18*a* (that is, projection optical system 16) serving as a reference, position information in the Z-tilt direction of substrate P can be acquired with high precision, along with position information on substrate P within the XY plane. That is, as is disclosed in International Publication WO2015/147319 as an example, in the case of obtaining position information on substrate P in the Z-tilt direction with weight canceling device 42 serving as a reference, because weight canceling device 42 is mounted on Y step guide 44, an error may occur in position measurement of substrate P due to vibration and the like at the time of movement of Y step guide 44. Meanwhile, in the embodiment, even if vibration and the like occurs at the time of movement of Y step guide 44, because position information on Y step guide 44 is measured at all times with optical surface plate 18*a* serving as a reference, even if position information on substrate P is measured via Y step guide 44, position shift of Y step guide 44 is not reflected in the measurement results of substrate P. Accordingly, position information on substrate P can be measured with high accuracy.

Also, of an apparatus main section 1980, since the second part (second lower mount section 18*e*) supporting Y step guide 44 is isolated vibrationally from the first part supporting projection optical system 16, when Y step guide 44 moves in the Y-axis direction with the movement of substrate P in the Y-axis direction, influence on projection optical system 16 of vibration, deformation and the like caused by the movement can be suppressed, which can improve the exposure accuracy.

Note that in the first embodiment described above, while the case has been described in which the pair of head bases 88 each has four heads (one pair each of downward X heads 74*x* and downward Y heads 74*y*) for measuring the position of fine movement stage 22 (substrate holder 32) and a total of eight heads for measuring the portion of the substrate holder was provided, the number of heads for measuring the position of the substrate holder may be less than eight. Hereinafter, such an embodiment will be described.

Twentieth Embodiment

Next, a twentieth embodiment will be described, based on FIGS. 71 to 74C. Since the structure of the liquid crystal exposure apparatus according to the twentieth embodiment is the same as the first embodiment previously described except for the structure of a part of a substrate measurement system 2070, only the different points will be described below, and for elements having the same structure and function as the first embodiment will have the same reference code as the first embodiment and the description thereabout will be omitted.

Figure 71:
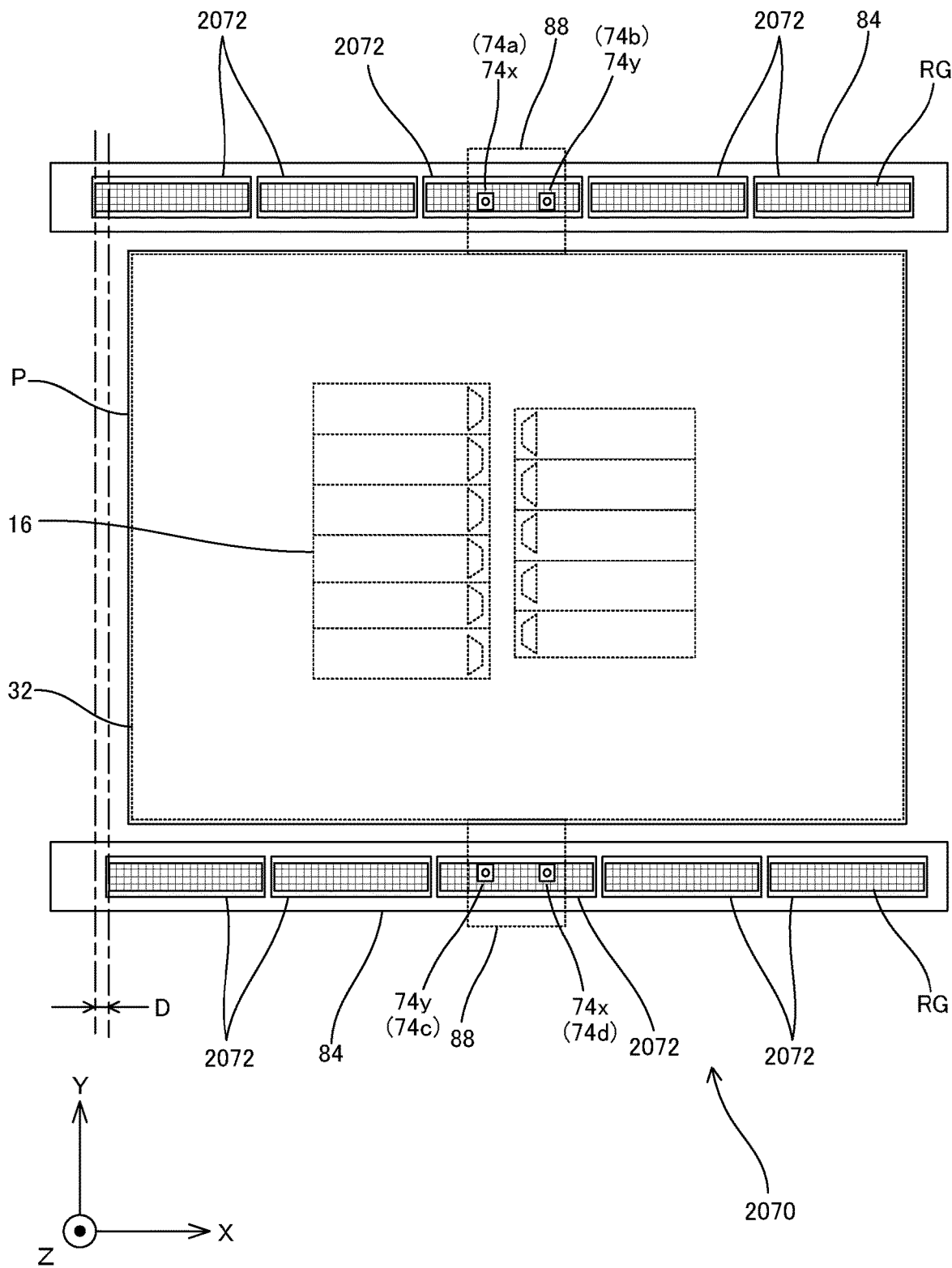
FIG. 71 is a planar view showing a substrate holder and a pair of head units of a substrate measurement system that a liquid crystal exposure apparatus according to a twentieth embodiment has, along with a projection optical system.

FIG. 71 shows substrate holder 32 and the pair of head bases 88 of substrate measurement system 2070 according to the twentieth embodiment in a planar view, along with projection optical system 16. In FIG. 71, to make the description comprehensive, illustration of Y coarse movement stage 24 and the like is omitted. Also, in FIG. 71, head bases 88 are illustrated in a dotted line.

With the liquid crystal exposure apparatus according to the twentieth embodiment, as is shown in FIG. 71, in each of the areas on the +Y side and the −Y side of substrate holder 32 with the substrate mounting area in between, scale bases 84 are arranged. On the upper surface of each scale base 84, encoder scales 2072 (hereinafter simply referred to as scales 2072), such as for example, five scales, are arranged at a predetermined spacing in the X-axis direction so that the grating areas are arranged separately in the X-axis direction.

Each of the plurality of scales 2072 has a grating area (grating section) where a reflective two-dimensional grating is formed. Note that while the grating may be formed to cover the entire area of scales 2072, since it is difficult to form the grating with good precision at the edge of scales 2072, in the embodiment, the grating is to be formed so that the periphery of the grating area in scales 2072 becomes a margin part. Therefore, spacing between the grating areas is larger than the spacing between the pair of scales 2072 adjacent in the X-axis direction, and the period while an area other than the grating areas is irradiated with the measurement beam is to be a non-measurement period (also called a non-measurement section; however, hereinafter referred to collectively as non-measurement period) in which position measurement cannot be performed.

With the five scales 2072 arranged on the +Y side of substrate holder 32 and the five scales 2072 arranged on the −Y side, while the spacing between adjacent scales 2072 (grating area) is the same, the arrangement position of the five scales 2072 on the −Y side is, as a whole arranged shifted to the +X side by a predetermined distance D (a distance slightly larger than the spacing between adjacent scales 2072 (grating area)) with respect to the five scales 2072 on the +Y side. This is to prevent a state from occurring in which two or more heads of the total of four heads; two X heads 74*x* and two Y heads 74*y* to be described later on that measure position information on substrate holder 32, do not face any of the scales (that is, to avoid a non-measurement period in which the measurement beam moves off from the scale from overlapping among the four heads).

On the upper surface of each scale 2072, a reflective two-dimensional diffraction grating (two-dimensional grating) RG is formed, having a predetermined pitch (e.g. 1 μm) whose periodic direction is in the X-axis direction and the Y-axis direction. In the description below, the grating area described earlier will also be simply called two-dimensional grating RG. Note that in FIG. 71, for convenience of illustration, the spacing (pitch) between the grid lines of the two-dimensional grating RG is illustrated much wider than the actual spacing. The same also applies to other drawings that will be described below. In the description below, the five scales 2072 arranged in the area on the +Y side of substrate holder 32 is to be referred to as a first grating group, and the five scales 2072 arranged in the area on the −Y side of substrate holder 32 is to be referred to as a second grating group To the lower surface (surface on the −Z side) of one of head bases 88 positioned on the +Y side, X head 74*x* and Y head 74 *y* are fixed apart by a predetermined spacing (a distance larger than the spacing between adjacent scales 2072) in the X-axis direction, in a state each facing scales 2072.

Similarly, to the lower surface (surface on the −Z side) of the other head base 88 positioned on the −Y side, Y head 74*y* and X head 74*x* are fixed apart by a predetermined spacing in the X-axis direction, in a state each facing scales 2072. That is, X head 74*x* and Y head 74*y* facing the first grating group and X head 74*x* and Y head 74*y* facing the second grating group each irradiates scales 2072 with a measurement beam at a spacing larger than the spacing between adjacent grating areas of scales 2072. In the description below, for convenience of explanation, X head 74*x* and Y head 74*y* that one of the head bases 88 has will be referred to as head 74*a* and head 74*b*, and Y head 74*y* and X head 74*x* that the other head base 88 has will be referred to as head 74*c* and head 74*d*, respectively.

In this case, head 74*a* and head 74*c* are arranged at the same X position (on the same straight line parallel to the Y-axis direction), and head 74*b* and head 74*d* are arranged at the same X position (on the same straight line parallel to the Y-axis direction) different from the X position of head 74*a* and head 74*c*. Heads 74*a*, 74*d* and the two-dimensional gratings RG that face each head structure a pair of X linear encoders, and heads 74*b*, 74*c* and the two-dimensional gratings RG that face each head structure a pair of Y linear encoders.

With the liquid crystal exposure apparatus according to the twentieth embodiment, the structure of other parts including the remaining part of head base 88 is similar to liquid crystal exposure apparatus 10 according to the first embodiment described earlier, except for the drive control (position control) of substrate holder 32 using substrate measurement system 2070 by main controller 100.

Figure 72A:
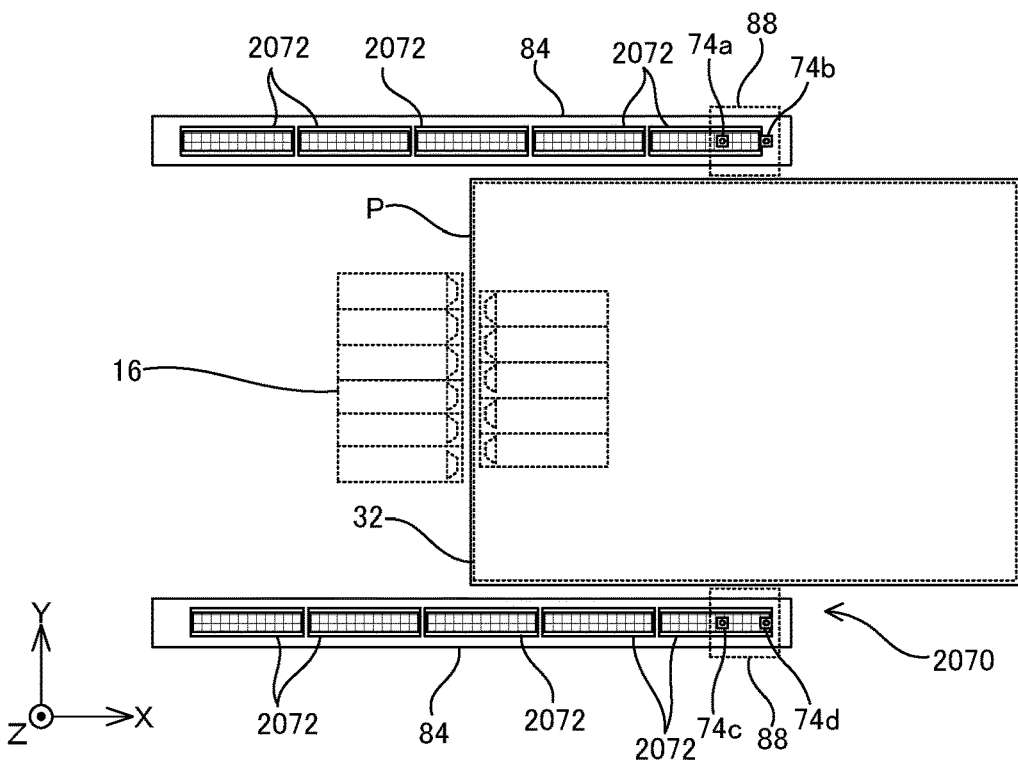
FIGS. 72A and 72B are views used to explain a movement range in an X-axis direction of a substrate holder when position measurement of the substrate holder is performed.
Figure 72B:
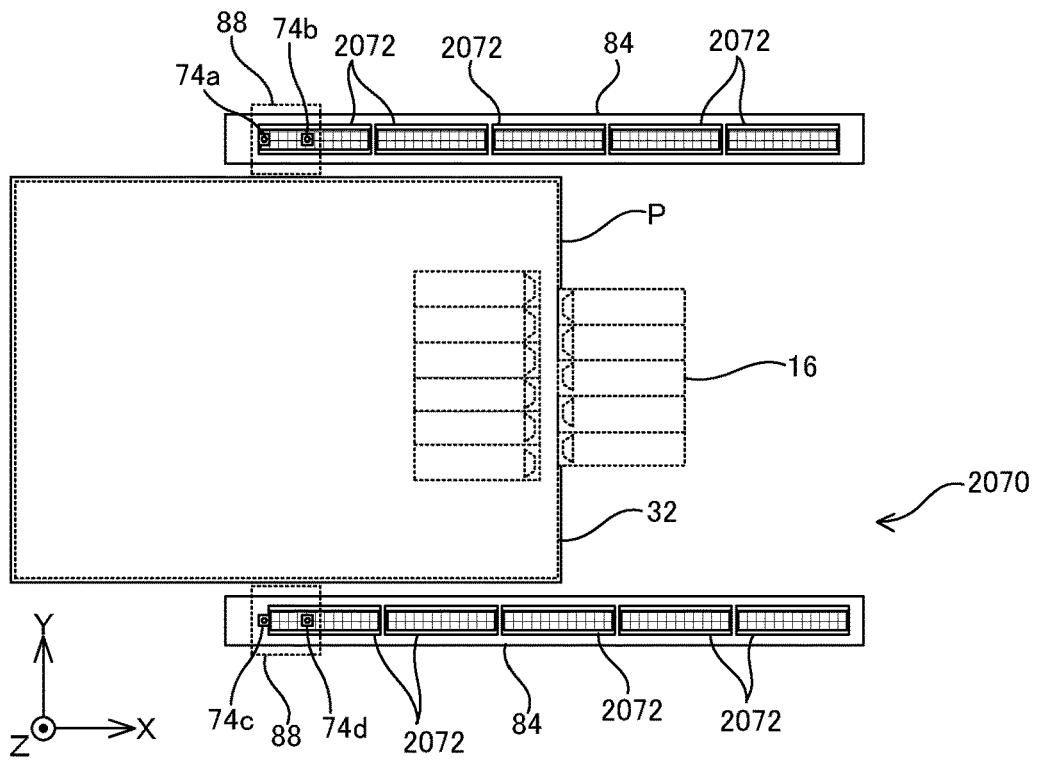

With the liquid crystal exposure apparatus according to the twentieth embodiment, position measurement of substrate holder 32 can be performed by heads 74*a* to 74*d* of the pair of head bases 88, that is, by the pair of X linear encoders and the pair of Y linear encoders, between a first position where the pair of head bases 88 faces the +X edge of scale base 84 as is shown in FIG. 72A, and a second position where the pair of head bases 88 faces the −X edge of scale base 84 as is shown in FIG. 72B, within a range where substrate holder 32 moves in the X-axis direction. FIG. 72A shows a state in which only head 74*b* faces none of the scales 2072, and FIG. 72B shows a state in which only head 74*c* faces none of the scales 2072.

In the process of substrate holder 32 moving in the X-axis direction between the first position shown in FIG. 72A and the second position shown in FIG. 72B, positional relation between the pair of head bases 88 and scales 2072 changes between five states; a first to fourth state shown respectively in FIGS. 73A to 73D and a fifth state in which four heads 74*a* to 74*d* all face the two-dimensional grating RG of either one of the scales 2072 (that is, all four heads 74*a* to 74*d* irradiate two-dimensional grating RG with measurement beams). In the description below, instead of saying that the head faces two-dimensional grating RG of scales 2072 or two-dimensional grating RG of scales 2072 is irradiated with the measurement beam, the expression, the head faces the scale, will simply be used.

Here, for convenience of explanation, six scales 2072 will be picked, and to identify each scale, reference codes a to f will be used and the scales will be described as scales 2072a to 2072f (refer to FIG. 73A).

Figure 73A:
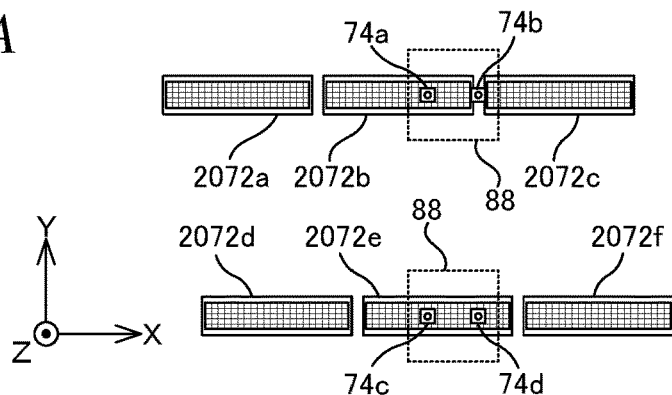
FIGS. 73A to 73D are views used to explain a first state to a fourth state in a state change of positional relation between a pair of head bases and a scale in the process when a substrate holder moves in the X-axis direction in the twentieth embodiment.
Figure 73B:
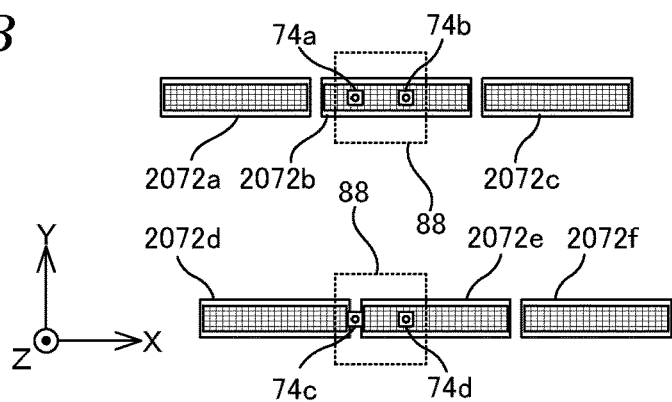

The first state in FIG. 73A shows a state in which head 74a faces scale 2072b, heads 74c and 74d face scale 2072e, and only head 74b faces neither of the scales, and the second state in FIG. 73B shows a state in which substrate holder 32 moves by a predetermined distance in the −X direction from the state shown in FIG. 73A so that heads 74a and 74b face scale 2072b, head 74d faces scale 2072e, and only head 74c no longer faces any of the scales. In the process of the state changing from the state shown in FIG. 73A to the state shown in FIG. 73B, the change goes through the fifth state in which heads 74a and 74b face scale 2072b and heads 74c and 74d face scale 2072e.

Figure 73C:
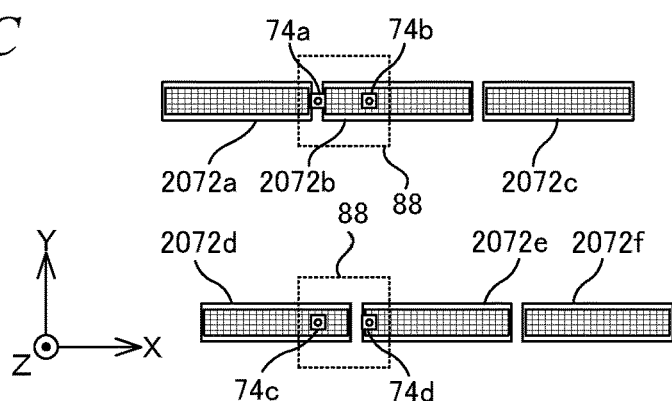

The third state in FIG. 73C shows a state in which substrate holder 32 moves by a predetermined distance in the −X direction from the state shown in FIG. 73B so that only head 74a no longer faces any of the scales. In the process of the state changing from the state shown in FIG. 73B to the state shown in FIG. 73C, the change goes through the fifth state in which heads 74a and 74b face scale 2072b, head 74c faces scale 2072d, and head 74d faces scale 2072e.

Figure 73D:
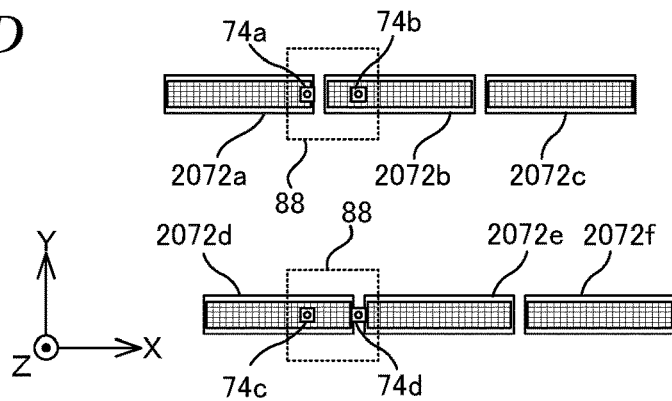

The fourth state in FIG. 73D shows a state in which substrate holder 32 moves by a predetermined distance in the −X direction from the state shown in FIG. 73C so that only head 74d no longer faces any of the scales. In the process of the state changing from the state shown in FIG. 73C to the state shown in FIG. 73D, the change goes through the fifth state in which head 74a faces scale 2072a, head 74b faces scale 2072b, head 74c faces scale 2072d, and head 74d faces scales 2072e.

When substrate holder 32 moves by a predetermined distance in the −X direction from the state shown in FIG. 73D, after the process goes through the fifth state in which head 74a faces scale 2072a, head 74b faces scale 2072b, and heads 74c and 74d face scale 2072d, then, the state moves into the first state in which head 74a faces scale 2072a, heads 74c and 74d face scale 2072d, and only head 74b faces neither of the scales.

While the description so far is about the change of state (positional relation) between each of the three scales 2072 of the five scales 2072 arranged on both the +Y side and the −Y side of substrate holder 32 and the pair of head bases 88, also between 10 scales 2072 and the pair of head bases 88, regarding each of the adjacent three scales 2072 of the five scales 2072 arranged on both the +Y side and the −Y side of substrate holder 32, the positional relation with the pair of head bases 88 changes in a similar order as is described above.

As is described so far, in the twentieth embodiment, even if substrate holder 32 is moved in the X-axis direction, at least three out of the total of four heads; the two X heads 74x, namely heads 74a and 74d, and two Y heads 74y, namely heads 74b and 74c, constantly face any one of scales 2072 (two-dimensional grating RG). Moreover, even if substrate holder 32 is moved in the Y-axis direction, since the width of the grating area of scales 2072 is set so that for all four heads, the measurement beams in the Y-axis direction do not move off from scales 2072 (two-dimensional grating RG), at least three of the four heads face any one of scales 2072 at all times. Accordingly, main controller 100 can control position information on substrate holder 32 in the X-axis direction, the Y-axis direction, and the θz direction, at all times, using three heads of heads 74a to 74d. This point will be described further below.

When measurement values of X head 74x and Y head 74y are to be CX and CY, measurement values $C_X$ and $C_Y$ can each be expressed by the following formulas, (1a) and (1b).

$$C_X=(p_i-X)\cos\theta z+(q_i-Y)\sin\theta z \quad (1a)$$

$$C_Y=-(p_i-X)\sin\theta z+(q_i-Y)\cos\theta z \quad (1b)$$

Here, X, Y, and θx show the position of substrate holder 32 in the X-axis direction, the Y-axis direction, and the θz direction, respectively. Also, $p_i$ and $q_i$ are the X position (X coordinate value) and the Y position (Y coordinate value) of each of the heads 74a to 74d. In the embodiment, the X coordinate values $p_i$ and the Y coordinate values $q_i$ (i=1, 2, 3, 4) of each of the heads 74a, 74b, 74c, and 74d is calculated from measurement results output from each pair of X heads 80x and Y heads 80y and the corresponding scale 78, and from relative positional relation between head base 1996 and scale 72.

Accordingly, when substrate holder 32 and the pair of head bases 88 have a positional relation as is shown in FIG. 72A and the position of substrate holder 32 at this time within the XY plane in directions of three degrees of freedom is (X, Y, θz), then measurement values of the three heads 74a, 74c, and 74d can theoretically be expressed by the following formulas, (2a) to (2c) (also called an affine transformation relation).

$$C_1=(p_1-X)\cos\theta z+(q_1-Y)\sin\theta z \quad (2a)$$

$$C_3=-(p_3-X)\sin\theta z+(q_3-Y)\cos\theta z \quad (2b)$$

$$C_4=(p_4-X)\cos\theta z+(q_4-Y)\sin\theta z \quad (2c)$$

In a reference state where substrate holder 32 is at a coordinate origin (X, Y, θz)=(0, 0, 0), by simultaneous equations (2a) to (2c), $C_1=p_1$, $C_3=q_3$, and $C_4=p_4$. The reference state, for example, is a state in which the center of substrate holder 32 (almost coincides with the center of substrate P) coincides with the center of the projection area by projection optical system 16 and the θz rotation is zero. Accordingly, in the reference state, the Y position of substrate holder 32 can also be measured by head 74b, and measurement value $C_2$ by head 74b, according to formula (1b), is $C_2=q_2$.

Accordingly, when the measurement values of the three heads 74a, 74c, and 74d are to be initially set to $p_1$, $q_3$, and $p_4$ in the reference state, hereinafter, the three heads 74a, 74c, and 74d are to present theoretical values given by the formulas (2a) to (2c) with respect to displacements (X, Y, θz) of substrate holder 32.

Note that in the reference state, instead of one of the heads 74a, 74c, and 74d, such as for example, instead of 74c, measurement value $C_2$ of head 74b may be initially set as $q_2$.

In this case, hereinafter, the three heads 74a, 74b, and 74d are to present theoretical values given by the formulas (2a), (2c), and (2d) with respect to displacements (X, Y, θz) of substrate holder 32.

$$C_1=(p_1-X)\cos\theta z+(q_1-Y)\sin\theta z \quad (2a)$$

$$C_4=(p_4-X)\cos\theta z+(q_4-Y)\sin\theta z \quad (2c)$$

$$C_2=-(p_2-X)\sin\theta z+(q_2-Y)\cos\theta z \quad (2d)$$

In simultaneous equations (2a) to (2c) and simultaneous equations (2a), (2c), and (2d), three formulas are given with respect to three variables (X, Y, θz). Therefore, conversely, if dependent variables $C_1$, $C_3$, and $C_4$ in simultaneous equations (2a) to (2c), or dependent variables $C_1$, $C_4$, and $C_2$ in simultaneous equations (2a), (2c), and (2d) are given, variables X, Y, and θz can be obtained. Here, the equations can be solved easily when an approximate sin θz≈θz is applied, or when a higher approximate is applied. Accordingly, positions (X, Y, θz) of substrate holder 32 can be calculated from measurement values $C_1$, $C_3$, and $C_4$ (or $C_1$, $C_2$, and $C_4$) of heads 74a, 74c, and 74d (or heads 74a, 74b, and 74d).

Next, a linkage process, namely, initial setting of measurement values, at the time when switching heads of substrate measurement system 2070 that measures position information on substrate holder 32 performed in the liquid crystal exposure apparatus according to the twentieth embodiment, will be described centering on the operation of main controller 100.

Figure 74A:
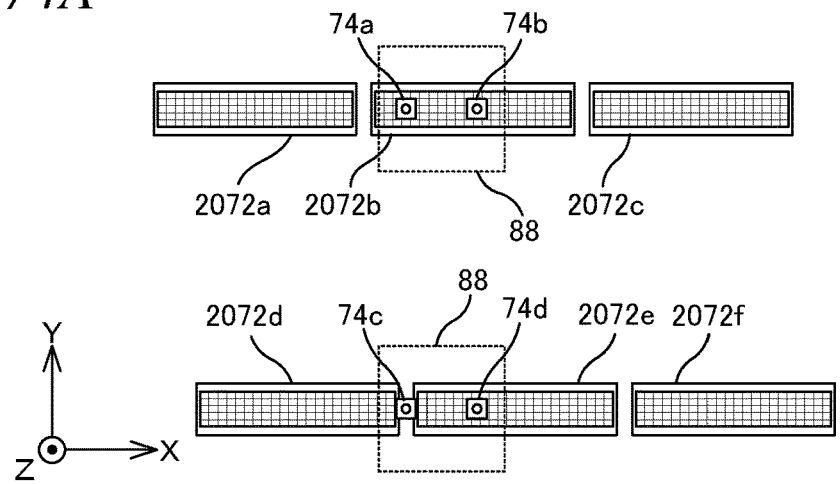
FIGS. 74A to 74C are views used to explain a linkage process at the time of switching heads of an encoder system that measures position information on a substrate holder performed in the liquid crystal exposure apparatus according to the twentieth embodiment.
Figure 74B:
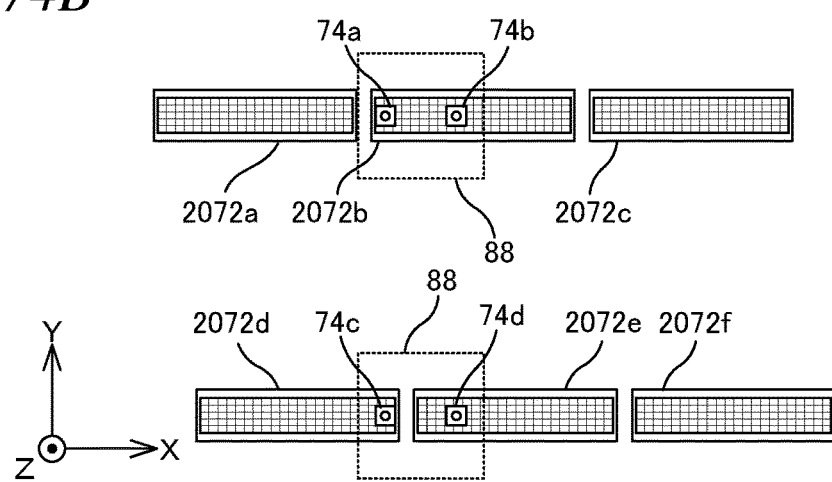
Figure 74C:
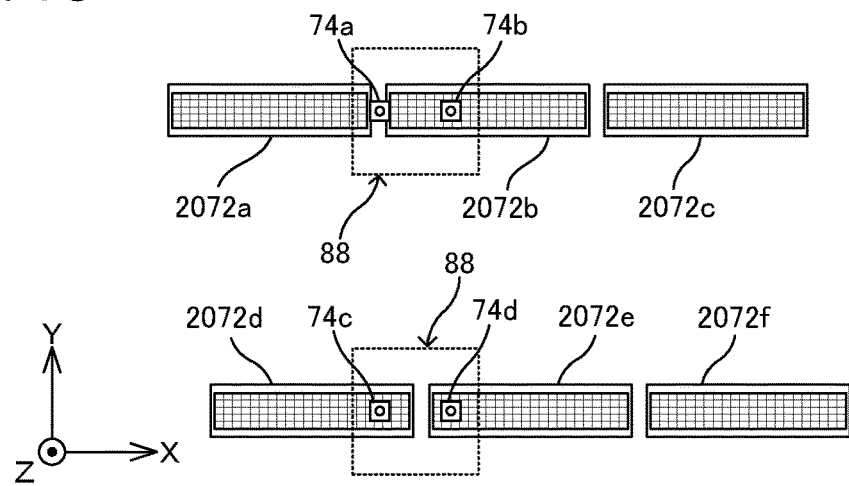

In the twentieth embodiment, three encoders (X heads and Y heads) are constantly measuring the position information on substrate holder 32 as is previously described in an effective stroke range of substrate holder 32, and on performing the switching process of the encoders (X head or Y head), for example, as is shown in FIG. 74B, each of the four heads 74a to 74d face any of the scales 2072 and moves into a state (the fifth state described earlier) so that the position of substrate holder 32 can be measured. FIG. 74B shows an example of the fifth state that appears during the change of state from the state shown in FIG. 74A in which from measuring the position of substrate holder 32 with heads 74a, 74b, and 74d, substrate holder 32 moves in the −X direction, and then as is shown in FIG. 74C, moves to a state in which the position of substrate holder 32 is measured with heads 74b, 74c, and 74d. That is, FIG. 74B shows a state in which the three heads used for measuring position information on substrate holder 32 are being switched, from heads 74a, 74b, and 74d to heads 74b, 74c, and 74d.

At the moment when the switching process (linkage) of heads (encoders) used for position control (measurement of position information) of substrate holder 32 within the XY plane is to be performed, heads 74a, 74b, 74c, and 74d are facing scales 2072b, 2072b, 2072d, and 2072e, respectively, as is shown in FIG. 74B. When taking a look at FIGS. 74A to 74C, it may appear that head 74a is about to be switched to head 74c in FIG. 74B, however, as it is obvious from the point that the measurement direction is different in head 74a and head 74c, it is meaningless to give the measurement value (count value) of head 74a without any changes to head 74c as an initial value of the measurement value at the timing when linkage is performed.

Therefore, in the embodiment, main controller 100 is to perform switching from the measurement of position information (and position control) on substrate holder 32 using the three heads 74a, 74b, and 74d to the measurement of position information (and position control) on substrate holder 32 using the three heads 74b, 74c, and 74d. That is, this method is different from the concept of a normal encoder linkage and does not link one head to another head, but is a method of linking a combination of three heads (encoders) to another combination of three heads (encoders).

Main controller 100, first of all, solves simultaneous equations (2a), (2c), and (2d) based on measurement values $C_1$, $C_4$, and $C_2$ of heads 74a, 74d, and 74b, and calculates position information (X, Y, θz) on the substrate holder within the XY plane.

Next, main controller 100 substitutes X and θz calculated above into the following affine transformation formula (formula (3) below), and obtains the initial value (the value that should be measured by head 74c) of the measurement value of head 74c.

$$C_3 = -(p_3-X)\sin \theta z + (q_3-Y)\cos \theta z \quad (3)$$

In formula (3) above, $p_3$ is the X coordinate value and $q_3$ is the Y coordinate value of head 74c. In the embodiment, X coordinate value $p_3$ and Y coordinate value $q_3$, as is described earlier, are calculated from measurement results output from each pair of X heads 80x and Y heads 80y and the corresponding scale 78, and from relative positional relation between head base 1996 and scale 72.

By giving initial value $C_3$ described above as the initial value of head 74c, linkage is to be completed without contradictions while maintaining the positions (X, Y, θz) of substrate holder 32 in directions of three degrees of freedom. Thereinafter, position coordinates (X, Y, θz) of substrate holder 32 is calculated by solving the following simultaneous equations (2b) to (2d), using the measurement values $C_2$, $C_3$, and $C_4$ of heads 74b, 74c, and 74d which are to be used after the switching.

$$C_3 = -(p_3-X)\sin \theta z + (q_3-Y)\cos \theta z \quad (2b)$$

$$C_4 = (p_4-X)\cos \theta z + (q_4-Y)\sin \theta z \quad (2c)$$

$$C_2 = -(p_2-X)\sin \theta z + (q_2-Y)\cos \theta z \quad (2d)$$

Note that while the case has been described above when the switching is from three heads to another three heads including one head different from the three heads, it was described in this way because the value to be measured using the another head after switching is calculated based on the principle of affine transformation using the position (X, Y, θz) of substrate holder 32 obtained from the measurement values of the three heads used before switching, and the value that has been calculated is to be set as an initial value of the another head used after switching. However, when focusing only on the two heads serving as direct targets of switching and linkage process without referring to the procedure of calculation and the like of the values to be measured using the another heads used after switching, it may also be said that one head of the three heads used before switching is switched to a different head. In any case, the switching of the heads is performed in a state where both of the head used for measuring position information and position control of the substrate holder before switching and the head to be used after switching simultaneously face any of the scales 2072.

Note that while the description above is an example of switching of heads 74a to 74d, in switching from any three heads to another three heads, or switching from one of the heads to another head, switching of heads is performed in a procedure similarly to the procedure described above.

The liquid crystal exposure apparatus according to the twentieth embodiment described so far has a working effect equivalent to the first embodiment described earlier. Adding to this, with the liquid crystal exposure apparatus according to the twentieth embodiment, while substrate holder 32 is moved, position information (including θz rotation) on substrate holder 32 within the XY plane is measured by three heads (encoders) including at least one each of X head 74x (X linear encoder) and Y head 74y (Y linear encoder) of substrate measurement system 2070. Then, by main controller 100, the head (encoder) used for measuring position information on substrate holder 32 within the XY plane is switched from one of the heads (encoders) of the three heads used for measuring the position and position control of substrate holder 32 before switching to another head (encoder), so that the position of substrate holder 32 within the XY plane is maintained before and after the switching. Therefore, the position of substrate holder 32 within the XY plane is maintained before and after the switching and an accurate linkage becomes possible, even though switching of the encoders used for controlling the position of substrate holder 32 has been performed. Accordingly, it becomes possible to move substrate holder 32 (substrate P) along the XY plane accurately along a predetermined moving route, while performing switching and linkage (linkage process of measurement values) of heads among a plurality of heads (encoders).

Also, with the liquid crystal exposure apparatus according to the twentieth embodiment, for example, during exposure of the substrate, substrate holder 32 is moved within the XY plane by main controller 100, based on measurement results of position information on substrate holder 32 and position information ((X, Y) coordinate values) within the XY plane of the three heads used for measuring the position information. In this case, main controller 100 moves substrate holder 32 within the XY plane while calculating the position information on substrate holder 32 within the XY plane using the affine transformation relation. This allows the movement of substrate holder 32 (substrate P) to be controlled with good accuracy, while switching the heads (encoders) used for control during the movement of substrate holder 32 using encoder systems having each of a plurality of Y heads 74y or a plurality of X heads 74x.

Note that in the twentieth embodiment described above, while the correction information (initial value of the another head previously described) for controlling the movement of the substrate holder was acquired using the head (corresponding to the another head described above) whose measurement beam moves off from one of the adjacent pair of scales and switches to the other scale, based on the position information measured by the three heads facing at least one scale 2072, this correction information should be acquired after the measurement beam of the another head is switched to the other scale, by the time one of the three heads facing at least one scale 2072 moves off from two-dimensional grating RG. Also, in the case of performing position measurement or position control of the substrate holder by switching the three heads facing at least one scale 2072 to three different heads including the another head described above, this switching should be performed after the correction information described above has been acquired, by the time one of the three heads facing at least one scale 2072 moves off from two-dimensional grating RG. Note that acquiring the correction information and the switching may substantially be performed at the same time.

Note that in the twentieth embodiment described above, each of the five scales 2052 of the first grating group and the second grating group is arranged on substrate holder 32 so that the area that has no two-dimensional grating RG of the first grating group (non-grating area) does not overlap the area that has no two-dimensional grating RG of the second grating group (non-grating area) in the X-axis direction (first direction), or in other words, so that the non-measurement period in which the measurement beam moves off from two-dimensional grating RG does not overlap in the four heads. In this case, heads 74a and 74b that head base 88 on the +Y side has, are arranged at a spacing wider than the width of the area that has no two-dimensional grating RG of the first group in the X-axis direction, and heads 74c and 74d that head base 88 on the −Y side has, are arranged at a spacing wider than the width of the area that has no two-dimensional grating RG of the second group in the X-axis direction. However, the combination of the grating section including the plurality of two-dimensional gratings and the plurality of heads that can face the grating section is not limited to this. The point is, spacing between heads 74a and 74b and spacing between heads 74c and 74d, position, position and length of the grating section of the first and second grating groups or spacing between the grating sections and their position should be set, so that the (non-measurable) non-measurement period in which the measurement beam moves off from two-dimensional grating RG does not overlap in the four heads 74a, 74b, 74c, and 74d during the movement of the movable body in the X-axis direction. For example, even if the position and the width of the non-grating area in the X-axis direction is the same in the first grating group and the second grating group, two heads facing at least one scale 2072 (two-dimensional grating RG) of the first grating group and two heads facing at least one scale 2072 (two-dimensional grating RG) of the second grating group may be arranged shifted only by a distance wider than the width of the non-grating area in the X-axis direction. In this case, the spacing between the head arranged on the +X side of the two heads facing the first grating group and the head arranged on the −X side of the two heads facing the second grating group may be set wider than the width of the non-grating area, or the two heads facing the first grating and the two heads facing the second grating may be arranged alternately in the X-axis direction with the spacing between adjacent pair of heads may be set wider than the width of the non-grating area.

Also, in the twentieth embodiment described above, while the case has been described in which the first grating group is arranged in an area on the +Y side of substrate holder 32, and the second grating group is arranged in an area on the −Y side of substrate holder 32, instead of one of the first grating group and the second grating group, such as instead of the first grating group, a single scale member on which a two-dimensional grating extending in the X-axis direction is formed may be used. In this case, one head may be made to constantly face the single scale member. In this case, a structure may be employed in which three heads may be provided to face the second grating group, and by making the spacing (spacing between irradiation positions of the measurement beams) in the X-axis direction of the three heads wider than the spacing between two-dimensional grating RG on adjacent scales 2072, at least two of the three heads facing the second grating group can face at least one two-dimensional grating RG of the second grating group regardless of the position of substrate holder 32 in the X-axis direction. Or, a structure may be employed in which at least two heads constantly face the single scale member described above regardless of the position of substrate holder 32 in the X-axis direction, together with at least two heads facing at least one two-dimensional grating RG of the second grating group. In this case, each of the measurement beams of the at least two heads moves off from one of the plurality of scales 2072 (two-dimensional grating RG) during the movement of substrate holder 32 in the X-axis direction, and is switched to another scale 2072 (two-dimensional grating RG) adjacent to the one scale 2072 (two-dimensional grating RG). However, by making the spacing between the at least two heads in the X-axis direction wider than the spacing of two-dimensional grating RG of adjacent scales 2072, the non-measurement period does not overlap in the at least two heads, that is, the measurement beam of at least one head constantly irradiates scale 2072. In these structures, at least three heads constantly face at least one scale 2072, allowing position information to be measured in directions of three degrees of freedom.

Note that the number of scales, spacing between adjacent scales and the like may be different in the first grating group and the second grating group. In this case, in at least two heads facing the first grating group and at least two heads facing the second grating group, spacing between the heads (measurement beams), position and the like may be different.

Note that in the second embodiment described above, while the plurality of scales 2072 having a single two-dimensional grating RG (grating area) formed on each scale was used, the present invention is not limited to this, and at least one of the first grating group or the second grating group may include a scale 2072 that has two or more grating areas formed apart in the X-axis direction.

Note that in the twentieth embodiment described above, while the case has been described in which to measure and control the positions (X, Y, θz) of substrate holder 32 constantly by three heads, the first grating group and the second grating group including five scales 2072 each having the same structure are arranged shifted by a predetermined distance in the X-axis direction, the embodiment is not limited to this, and the heads (heads 74x, 74y) for position measurement of substrate holder 32 may be arranged differently in the X-axis direction in one of the head bases 88 and the other of the head bases 88, without the first grating group and the second grating group being shifted in the X-axis direction (arrange rows of scales 2072 to almost completely face each other). Also in this case, the position (X, Y, θz) of substrate holder 32 can constantly be measured and controlled by the three heads.

Note that in the twentieth embodiment described above, while the case of using a total of four heads, heads 74a and 74b and heads 74c and 74d has been described, the embodiment is not limited to this, and five or more heads may also be used. That is, to one of the two heads each facing the first grating group and the second grating group, at least one of redundant head may be added. This structure will be described in a twenty-first embodiment below.

Twenty-First Embodiment

Next, a twenty-first embodiment will be described, based on FIG. 75. Since the structure of the liquid crystal exposure apparatus according to the twenty-first embodiment is the same as the first and the twentieth embodiments previously described except for the structure of a part of a substrate measurement system 2170, only the different points will be described below, and for elements having the same structure and function as the first and the twentieth embodiments will have the same reference code as the first and the twentieth embodiments, and the description thereabout will be omitted.

Figure 21:
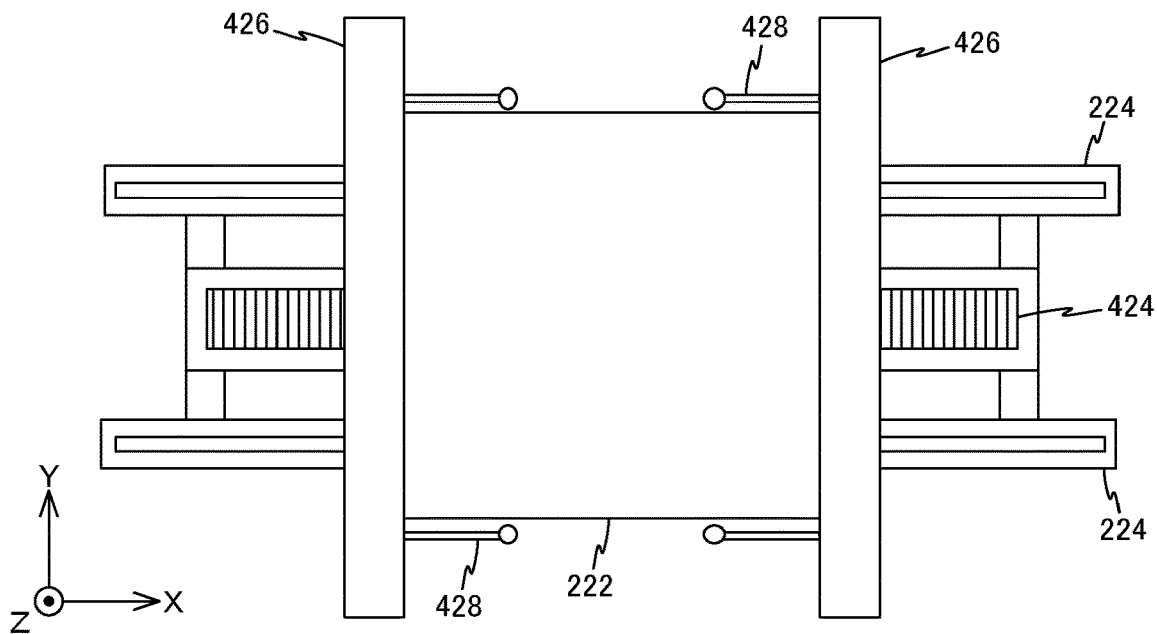
FIG. 21 is a view showing a second system of the substrate stage device in FIG. 19.
Figure 22:
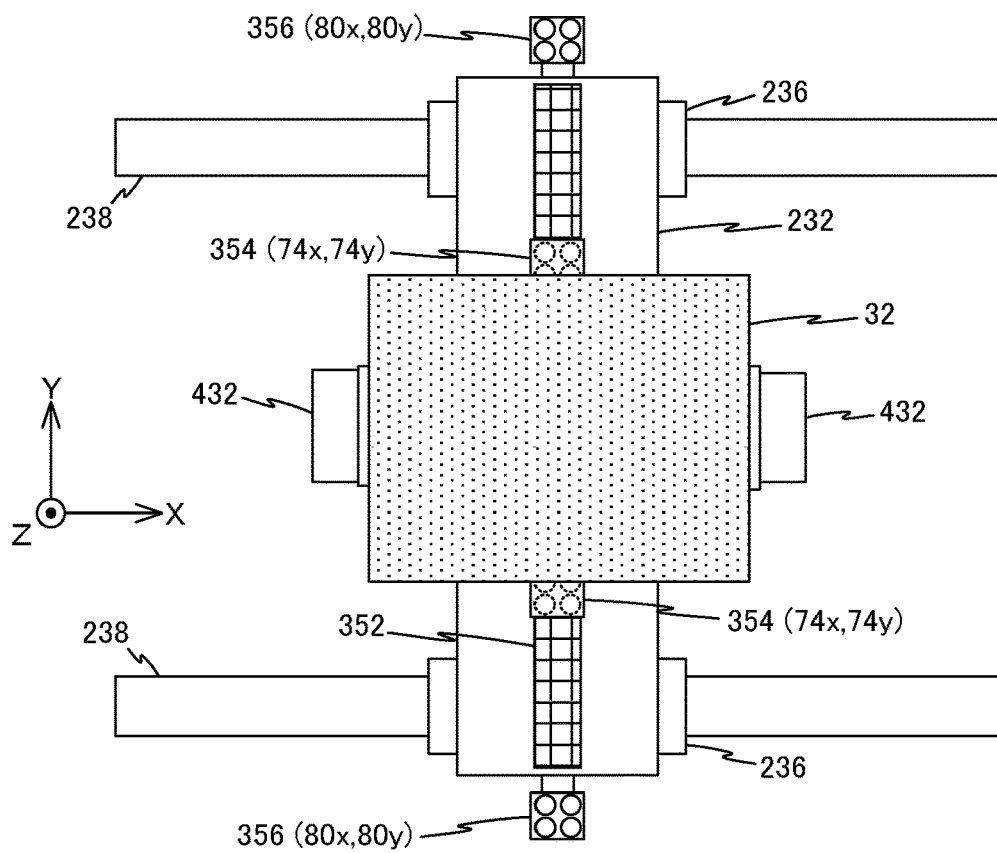
FIG. 22 is a view showing a first system of the substrate stage device in FIG. 19.

FIG. 21 shows substrate holder 32 and the pair of head bases 88 of substrate measurement system 2170 according to the twentieth embodiment in a planar view, along with projection optical system 16. In FIG. 75, to make the description comprehensive, illustration of Y coarse movement stage 24 and the like is omitted. Also, in FIG. 75 head bases 88 are illustrated in a dotted line.

Figure 75:
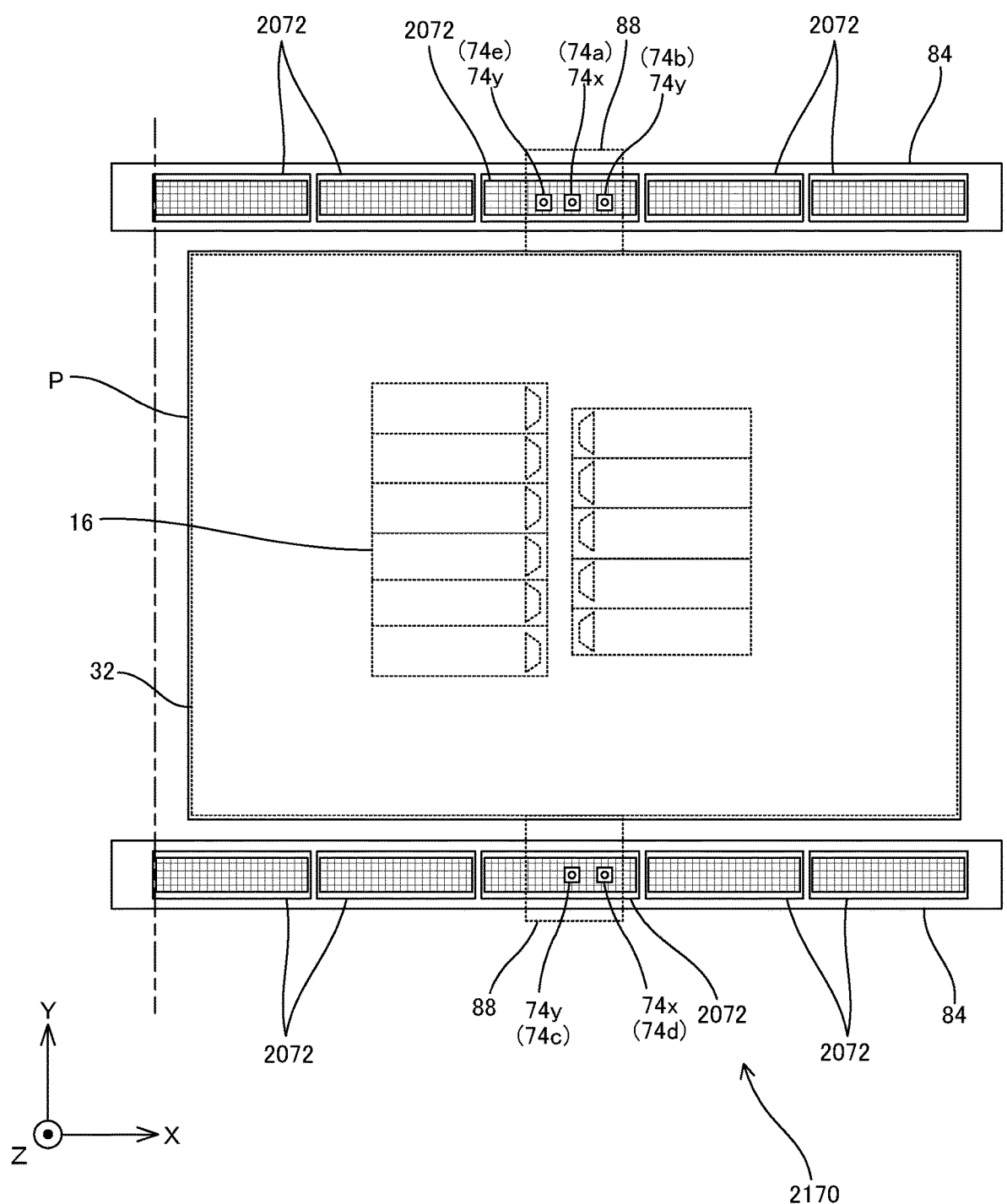
FIG. 75 is a planar view showing a substrate holder and a pair of head bases of a substrate encoder system that a liquid crystal exposure apparatus according to a twenty-first embodiment has, along with a projection optical system.

With the liquid crystal exposure apparatus according to the twenty-first embodiment, as is shown in FIG. 75, in each of the areas on the +Y side and the −Y side of substrate holder 32 with the substrate mounting area in between, for example, five scales 2072 are arranged at a predetermined spacing in the X-axis direction. With the five scales 2072 arranged on the +Y side of the substrate mounting area and the five scales 2072 arranged on the −Y side, the spacing between adjacent scales 2072 is the same, and the five scales 2072 on the +Y side of the substrate mounting area and the five scales 2072 on the −Y side are arranged at the same X position, facing each other. Accordingly, the position of the spacing between adjacent scales 2072 is located on almost the same straight line in the Y-axis direction that has a predetermined width.

To the lower surface (surface on the −Z side) of one of the head bases 88 positioned on the +Y side, a total of three heads, Y head 74y, X head 74x, and Y head 77y are fixed apart by a predetermined spacing (a distance larger than the spacing between adjacent scales 2072) in the X-axis direction from the −X side, in a state each facing scale 2072. To the lower surface (surface on the −Z side) of the other head base 88 positioned on the −Y side, Y head 74y and X head 74x are fixed set apart by a predetermined spacing in the X-axis direction, in a state each facing scale 2072. In the description below, for convenience of explanation, three heads that one of the head bases 88 has will be referred to as head 74e, head 74a, and head 74b from the −X side, and Y head 74y and X head 74x that the other head base 88 has will be referred to as head 74c and head 74d, respectively.

In this case, head 74a and head 74c are arranged at the same X position (on the same straight line in the Y-axis direction), and head 74b and head 74d are arranged at the same X position (on the same straight line in the Y-axis direction). Heads 74a and 74d and the two-dimensional gratings RG that face each head structure a pair of X linear encoders, and heads 74b, 74c, and 74e and the two-dimensional gratings RG that face each head structure three Y linear encoders.

With the liquid crystal exposure apparatus according to the twenty-first embodiment, the structure of other parts is similar to the liquid crystal exposure apparatus according to the twentieth embodiment described earlier.

In the twenty-first embodiment, although the arrangement of the row of scales 2072 on the +Y side and the −Y side is not shifted in the X-axis direction, as long as the pair of head bases 88 moves (or the Y position of substrate holder 32 is maintained at a position where the pair of head bases 88 faces the row of scales 2072) in the Y-axis direction synchronously with substrate holder 32, three heads of heads 74a to 74e constantly faces scale 2072 (two-dimensional grating RG) regardless of the X position of substrate holder 32.

The liquid crystal exposure apparatus according to the twenty-first embodiment described so far has a working effect equivalent to the twentieth embodiment described earlier.

Note that in the twenty-first embodiment described above, it can be regarded that in addition the four heads necessary for switching of heads, e.g., heads 74e, 74b, 74c, and 74d, the plurality of heads for measuring position information on substrate holder 32 includes one head 74a whose non-measurement period partly overlaps one head 74c of the four heads. And, in the twenty-first embodiment, on measuring position information (X, Y, θz) of substrate holder 32, of the five heads including the four heads 74e, 74b, 74c, and 74d and the one head 74c, measurement information on at least three heads is used that irradiate at least one of the plurality of grating areas (two-dimensional gratings RG) with a measurement beam.

Note that the twenty-first embodiment described above is an example of a case when the non-measurement period overlaps in at least two heads of a plurality of heads, such as, for example, when two heads move off from scale 2072 (grating area, e.g. two-dimensional grating RG) at the same time, and simultaneously switch to an adjacent scale 2072 (grating area, e.g. two-dimensional grating RG). In this case, to continue measurement even if the measurement is cut off for the at least two heads, at least three heads need to face the grating area (two-dimensional grating) of the grating section. Moreover, as a premise, the measurement should not be cut off for the at least three heads until one or more of the at least two heads whose measurement has been cut off switches to an adjacent grating area. That is, even if there is at least two heads whose non-measurement period overlaps, if there is at least three heads adding to the at least two heads, measurement can be continued even if the grating areas are arranged spaced apart.

Twenty-Second Embodiment

Figure 76:
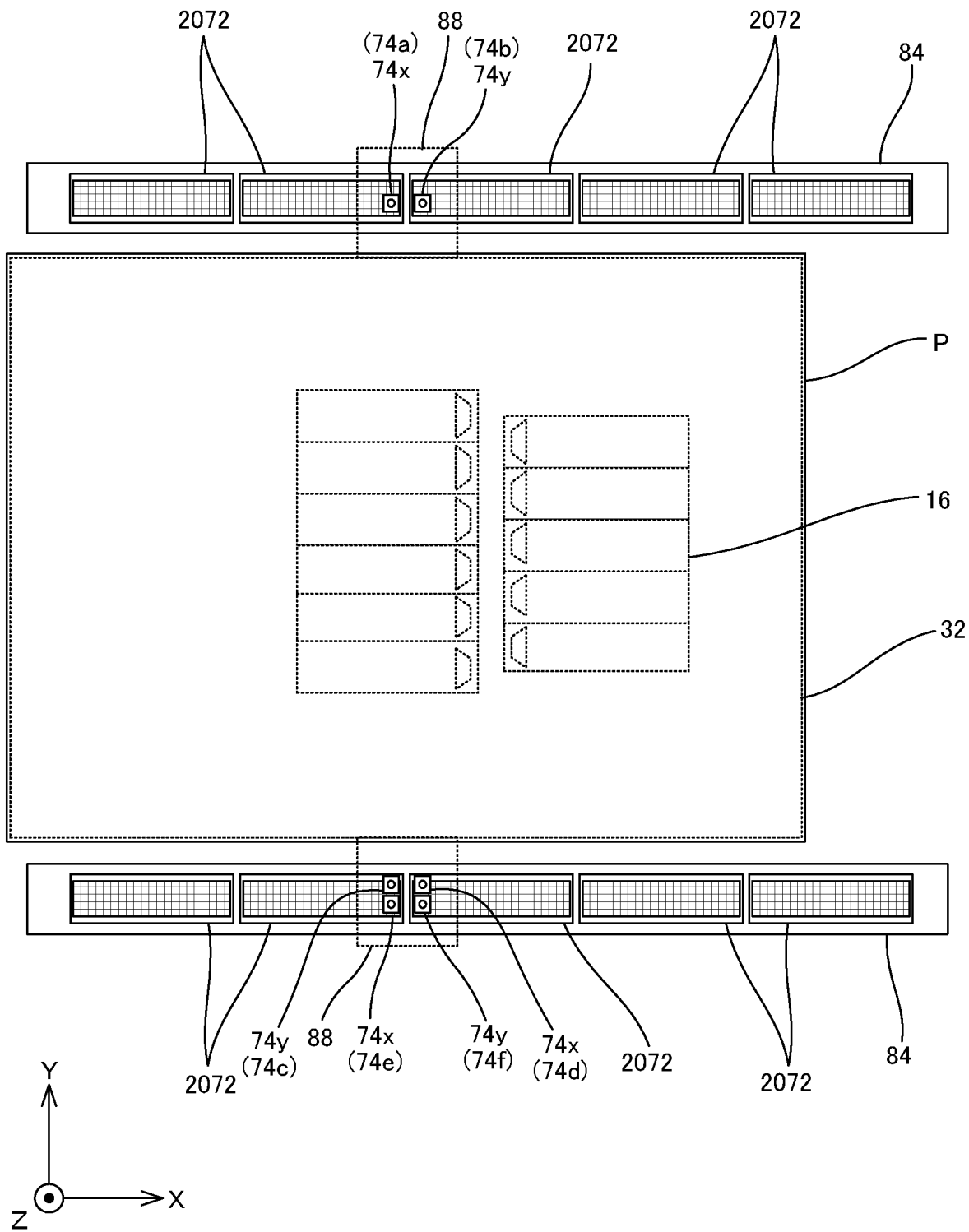
FIG. 76 is a view used to explain a characteristic structure of a liquid crystal exposure apparatus according to a twenty-second embodiment.

Next, a twenty-second embodiment will be described, based on FIG. 76. While the structure of the liquid crystal exposure apparatus according to the twenty-second embodiment is different from the structure of the liquid crystal exposure apparatus according to the twenty-first embodiment described earlier on the points that the row of scales 2072 arranged at both the +Y side and the −Y side of the substrate mounting area of substrate holder 32 are arranged facing each other similarly as in the twenty-first embodiment, and that one of the head bases 88 positioned on the −Y side has two each of X heads 74x and Y heads 74y similarly to the first embodiment, as is shown in FIG. 76, the structure of other parts is similar to the liquid crystal exposure apparatus according to the twenty-first embodiment.

To the lower surface (surface on the −Z side) of Y one of the head bases 88, X head 74x (hereinafter appropriately called head 74e) is provided arranged adjacent to Y head 74y (head 74c) on the −Y side, along with Y head 74y (hereinafter appropriately called head 74f) provided arranged adjacent to X head 74x (head 74d) on the −Y side.

With the liquid crystal exposure apparatus according to the embodiment, in a state when the pair of head bases 88 is moving in the Y-axis direction (or when the Y position of substrate holder 32 is maintained at a position where the pair of head bases 88 face the row of scales 2072), a case may occur when one of three heads 74a, 74c, and 74e (to be referred to as heads of a first group) and three heads 74b, 74d, and 74f (to be referred to as heads of a second group) do not face any of the scales due to substrate holder 32 moving in the X-axis direction, and when this occurs, the other of the heads of the first group and the heads of the second group face scale 2072 (two-dimensional grating RG) without fail. That is, in the liquid crystal exposure apparatus according to the twenty-second embodiment, although the arrangement of scales 2072 lined on the +Y side and the −Y side is not shifted in the X-axis direction, as long as the pair of head bases 88 moves (or the Y position of substrate holder 32 is maintained at a position where the pair of head bases 88 faces the row of scales 2072) in the Y-axis direction, the positions (X, Y, θz) of substrate holder 32 can be measured regardless of the X position of substrate holder 32, by the three heads included in at least one of the heads of the first group and the heads of the second group.

Here, a case will be considered, for example, of restoring (re-start measurement of) the heads of the first group (heads 74a, 74c, and 74e) when the heads face scale 2072 again, after heads 74a, 74c, and 74e no longer face any of the scales and have become non-measurable. In this case, at the point before measurement is re-started by the heads of the first group (heads 74a, 74c, and 74e), the positions (X, Y, θz) of substrate holder 32 is being continuously measured and controlled by the heads of the second group (heads 74b, 74d, and 74f). Therefore, main controller 100, as is shown in FIG. 76, at the point when the pair of head bases 88 crosses over adjacent two scales 2072 arranged on each of the +Y side and the −Y side and the heads of the first group and the heads of the second group face one and the other of the adjacent two scales 2072, respectively, calculates the positions (X, Y, θz) of substrate holder 32 by the method described in detail in the twenty-first embodiment based on measurement values of the heads of the second group (heads 74b, 74d, and 74f), and by substituting the positions (X, Y, θz) of the substrate holder into the formula of affine transformation described earlier, initial values of the heads of the first group (heads 74a, 74c, and 74e) are calculated and set at the same time. This allows the heads of the first group to be restored and to re-start measurement and control of the position of substrate holder 32 with these heads easily.

With the liquid crystal exposure apparatus according to the twenty-second embodiment described so far, the apparatus exhibits a working effect equivalent to the twenty-first embodiment described earlier.

Modified Example of the Twenty-Second Embodiment

This modified example describes a case when a head unit having an identical structure (or a structure symmetrical in the vertical direction of the page surface) as one of the head bases 88 is used as the other head base 88 positioned on the +Y side, in the liquid crystal exposure apparatus according to the twenty-second embodiment.

In this case, similarly to the description above, eight heads are grouped into four heads each being arranged on the same straight line in the Y-axis direction; heads of a first group, and heads of a second group.

A case will be considered of restoring the heads of a first group and re-start measurement with these heads when the heads face scales 2072 again, after the heads of the first group no longer face any of the scales and can no longer perform measurement.

In this case, at the point before measurement is re-started by the heads of the first group, the positions (X, Y, θz) of substrate holder 32 is being continuously measured and controlled by three heads of the heads of the second group. Therefore, main controller 100, as is described earlier, at the point when the pair of head bases 88 crosses over adjacent two scales 2072 arranged on each of the +Y side and the −Y side and the heads of the first group and the heads of the second group face one and the other of the adjacent two scales 2072, respectively, calculates initial values of each of the heads of the first group; however, in this case, the main controller cannot calculate the initial values of all four heads of the first group at the same time. This is because if the heads to be restored for measurement were three (the number of X heads and Y heads added), when the initial values of the measurement values of the three heads are set in the procedure described earlier, by solving the simultaneous equations described earlier using the initial values as measurement values $C_1$, $C_2$, $C_3$ and the like, the positions (X, Y, θz) of the substrate holder is uniquely decided, which causes no problems in particular. However, simultaneous equations using the affine transformation relation that can uniquely decide the positions (X, Y, θz) of the substrate holder using measurement values of four heads cannot be conceived.

Therefore, in the modified example, the first group to be restored is to be grouped into two groups; each having three heads including different heads, and the initial values are calculated and set simultaneously for the three heads for each group in the method described earlier. After the initial values have been set, the measurement values of either of the groups may be used for position control of substrate holder 32. Position measurement of substrate holder 32 by the heads of the group not used for position control may be executed in parallel with position control of substrate holder 32. Note that the initial values of each head of the first group to be restored can be sequentially calculated individually, by the method described earlier.

Switching process of encoders (linkage of encoder output) according to the twentieth to the twenty-second embodiments described above can also be applied to the encoder systems in the second to nineteenth embodiments which perform position measurement of a substrate holder with the coarse movement stage or the measurement table serving as a reference. Also, the switching process of encoders (linkage of encoder output) according to the twentieth to the twenty-second embodiments described above can also be applied to the encoder system in each of the first to the fifth, the eighth to the fifteenth, the eighteenth, and the nineteenth embodiments which performs position measurement of the coarse movement stage with optical surface plate 18a serving as a reference, or also to the encoder system in each of the sixth, the seventh, the sixteenth, and the seventeenth embodiments which performs position measurement of the measurement table with optical surface plate 18a serving as a reference.

Note that the structures described so far in the first to the twenty-second embodiments can be changed as appropriate. As an example, the substrate measurement system (substrate measurement system 70, 270 and the like) in each of the embodiments described above can be used for position measurement of a movable body holding an object (substrate P in each of the embodiments described above), regardless of the structure of the substrate stage device. That is, to a substrate stage device equipped with a substrate holder which is a type that holds almost the entire surface of substrate P by suction such as substrate holder 32 according to the first to fifth embodiments described above, it is possible to apply a measurement system like substrate measurement system 670 according to the sixth embodiment described above which is a type of system that obtains position information on the substrate holder via measurement table 624 with optical surface plate 18a serving as a reference.

Also, a measurement system similar to the measurement system according to each of the embodiments described above may be used for measurement targets other than substrate P, and as an example, a measurement system having a structure similar to substrate measurement system 70 or the like described above may be used for measurement the position of mask M in mask stage device 14. Especially to a measurement system of a mask stage device that steps the mask in long strokes in a direction orthogonal to the scanning direction of the mask as is described in, International Publication WO2010/131485, the measurement system according to each of the embodiments described above may be suitably applied.

Also, in the substrate measurement system of the first to the twenty-second embodiments, the arrangement of encoder heads and scales may be reversed. That is, X linear encoders and Y linear encoders for obtaining position information on the substrate holder may have scales attached to the substrate holder, and encoder heads attached to the coarse movement stage or to the measurement table. In this case, the scale attached to the coarse movement stage or the measurement table may be arranged, for example, along the X-axis direction in a plurality of numbers, and are preferably structured switchable with one another. Similarly, X linear encoders and Y linear encoders for obtaining position information on the coarse movement stage or the measurement table may have scales attached to the measurement table and encoder heads attached to optical surface plate 18a. In this case, the encoder head attached to optical surface plate 18a may be arranged, for example, along the Y-axis direction in a plurality of numbers, and are preferably structured switchable with one another. In the case the encoder heads are fixed to the substrate holder and optical surface plate 18, the scales fixed to the coarse movement stage or the measurement table may be shared.

Also, in the substrate measurement system, while the case has been described where one or a plurality of scales are fixed extending in the X-axis direction on the substrate stage device side and one or a plurality of scales are fixed extending in the Y-axis direction on the apparatus main section 18 side, the substrate measurement system is not limited to this, and one or a plurality of scales extending in the Y-axis direction may be fixed on the substrate stage device side and one or a plurality of scales extending in the X-axis direction may be fixed on the apparatus main section 18 side. In this case, the coarse movement stage or the measurement table is moved in the X-axis direction while the substrate holder is being moved in exposure operation and the like of substrate P.

Also, in the case a plurality of scales is arranged separately, the number of scales is not limited in particular and can be appropriately changed, for example, according to the size of substrate P or the movement strokes of substrate P. Also, a plurality of scales having different lengths may be used, and the number of scales structuring the grating section does not matter, as long as each of the grating sections includes a plurality of grating areas arranged side by side in the X-axis direction or the Y-axis direction.

Also, although the structure is employed in which the measurement table and its driver are provided at the lower surface of upper mount section 18a of apparatus main section 18, the measurement table and its driver may be provided at lower mount section 18b or at middle mount section 18c.

Also, in each of the embodiments described above, while the case has been described where a scale on which a two-dimensional grating is formed is used, however, the embodiments are not limited to this, and an X scale and a Y scale may be formed independently on the surface of each scale. In this case, within the scale, the length of the X scale and the Y scale may be made different. Also, the X scale and the Y scale may be arranged relatively shifted in the X-axis direction. Also, while the case of using a diffraction interference encoder system has been described, the encoder is not limited to this, and other encoders such as the so-called pick-up system or a magnetic system may also be used, and the so-called scan encoder whose details are disclosed in, for example, U.S. Pat. No. 6,639,686 may also be used.

Note that in the twentieth to the twenty-second embodiments and the modified example (hereinafter shortly referred to as the twenty-second embodiment) described above, while the case has been described in which at least four heads are provided, in such a case, the number of scales 2072 structuring the grating section does not matter, as long as the grating section includes a plurality of grating areas arranged side by side in the first direction. The plurality of grating areas does not necessarily have to be arranged on both one side and the other side in the Y-axis direction with substrate P of substrate holder 32 in between, and may be arranged only on one side. However, to continuously control the position (X, Y, θz) of substrate holder 32 at least during the exposure operation of substrate P, the following conditions need to be satisfied.

That is, while a measurement beam of one head of the at least four heads move off from the plurality of grating areas (e.g., two-dimensional grating RG described earlier), along with at least the three heads remaining irradiate at least one of the plurality of grating areas with the measurement beams, by movement of substrate holder 32 in the X-axis direction (the first direction), the one head described above whose measurement beam moves off from the plurality of grating areas is switched in the at least four heads described above. In this case, the at least four heads include; two heads whose positions (irradiation positions) of the measurement beams in the X-axis direction (the first direction) are different from each other, and two heads whose positions of the measurement beams in the Y-axis direction (the second direction) are different from at least one of the two heads along with positions (irradiation positions) of the measurement beams in the X-axis direction (the first direction) being different from each other, and the two heads irradiate measurement beams in the X-axis direction at a spacing wider than the spacing of a pair of adjacent grating areas of the plurality of grating areas.

Note that the grating areas (e.g. two-dimensional grating RG) arranged side by side in the X-axis direction may be arranged in the Y-axis direction in three or more rows. For example, in the twenty-second embodiment described above, instead of the five scales 2072 on the −Y side, a structure may be employed in which two rows of grating areas (e.g. two-dimensional gratings RG) adjacent in the Y-axis direction are provided, consisting of 10 grating areas (e.g. two-dimensional gratings RG) having an area which is half of each of the five scales 2072 in the Y-axis direction, and heads 74e and 74f can be made to face two-dimensional grating RG, at one of the rows and heads 74c and 74d can be made to face two-dimensional grating RG at the other of the rows. Also, in the modified example of the twenty-second embodiment described above, also for the five scales 2072 on the +Y side, a structure may be employed in which two rows of grating areas (e.g. two-dimensional gratings RG) adjacent in the Y-axis direction are provided, consisting of 10 grating areas similar to the description above, and a pair of heads can be made to face two-dimensional grating RG at one of the rows, and the remaining pair of heads can be made to face two-dimensional grating RG at the other of the rows.

Note that in the twentieth to the twenty-second embodiments described above, it is important to set position or spacing, or position and spacing and the like of at least one of scales and heads, so that at least among the mutual four heads, measurement beams not being irradiated on (move off from the grating areas of) any of the two-dimensional gratings RG, that is, measurement with the heads being non-measurable (non-measurement section) does not overlap for any two heads, when substrate holder 32 moves in the X-axis direction (the first direction).

Note that from the twentieth to the twenty-second embodiment described above, instead of each X head 74x measuring position information on substrate holder 32, an encoder head (XZ head) whose measurement direction is in the X-axis direction and the Z-axis direction may be used, together with an encoder head (YZ head) whose measurement direction is in the Y-axis direction and the Z-axis direction instead of each Y head 74y. As these heads, a sensor head having a structure similar to the displacement measurement sensor head disclosed in, for example, U.S. Pat. No. 7,561,280, can be used. In such a case, on switching and linkage process of the heads described earlier, adding to the linkage process performed to secure continuity of measurement results of the position of substrate holder 32 in directions of three degrees of freedom (X, Y, θz) in the XY plane by performing a predetermined calculation using measurement values of three heads used for position control of substrate holder 32 before switching, main controller 100 may also perform the linkage process to secure continuity of measurement results of the position of substrate holder 32 in the remaining directions of three degrees of freedom (Z, θx, θy) by a similar method described earlier. Specifically, taking the twentieth embodiment representatively as an example, main controller 100 may acquire correction information for controlling the movement of substrate holder 32 in the remaining directions of three degrees of freedom (Z, θx, θy) using one head whose measurement beam moves off from one two-dimensional grating RG (grating area) and switches to another two-dimensional grating RG (grating area) of the four heads 74a, 74b, 74c, and 74d, based on measurement information in the Z-axis direction (a third direction) by the remaining three heads or position information on substrate holder 32 in the remaining directions of three degrees of freedom (Z, θx, θy) measured by the remaining three heads.

Note that from the twentieth to the twenty-second embodiment described above, while initial values of another head are to be set when a measurement beam moves off from one scale and switches to another scale, the embodiments are not limited to this, and correction information to control the movement of substrate holder may be acquired using another head, such as correction information on measurement values of another head. While the correction information to control the movement of the substrate holder using another head naturally includes initial values, the embodiments are not limited to this, and as long as the information can be used for the another head to re-start measurement, the information may be offset values from the values that should be measured after the measurement is re-started.

Note that in the first to twenty-second embodiments, while the substrate measurement system was structured by the Z-tilt position measurement system and the encoder system, for example, by using XZ and YZ heads instead of X and Y heads, the substrate measurement may be structured only by the encoder system.

Also, in the seventeenth embodiment described above, other than the pair of measurement tables 1782, at least one head may be provided which is arranged away from measurement table 1782 in the X-axis direction. For example, movable head units which are the same as measurement tables 1782 may be provided with respect to the +Y side and −Y side of a mark detection system (alignment system) which is arranged away from projection optical system 16 in the X-axis direction and detects alignment marks on substrate P, and on detection operation of substrate marks, position information on Y coarse movement stage 24 may be measured using the pair of head units arranged on the +Y side and the −Y side of the mark detection system. In this case, on the mark detection operation, even if all measurement beams move off from scales 1788 (or 684) at the pair of measurement tables 1782, measurement of position information on Y coarse movement stage 24 by the substrate measurement system (another pair of head units) can be continued, which increases the degree of freedom in design of the exposure apparatus such as the position of the mark detection system. Note that by arranging the substrate measurement system for measuring position information on substrate P in the Z-axis direction near the mark detection system, the substrate measurement system can measure position information on Y coarse movement stage 24 also on detection operation of the Z position of the substrate. Alternately, the substrate measurement system may be arranged near projection optical system 16 so that the pair of measurement tables 1782 may be used to measure the position information on Y coarse movement stage 24 on detection operation of the Z position of the substrate. Also, in the embodiment, when Y coarse movement stage 24 is arranged at a substrate exchange position set apart from projection optical system 16, measurement beams of all heads of the pair of measurement tables 1782 move off from scales 1788 (or 684). Therefore, at least one head (which may either be a movable head or a fixed head) may be provided facing at least one of the plurality of scales 1788 (or 684) of Y coarse movement stage 24 arranged at the substrate exchange position, so that the substrate measurement system can measure the position information on Y coarse movement stage 24 also on the substrate exchange operation. Here, in the case the measurement beams move off from scales 1788 (or 684) in all heads of the pair of measurement tables 1782 before Y coarse movement stage 24 arrives at the substrate exchange position, or in other words, before the at least one head arranged at the substrate exchange position faces scale 1788 (or 684), at least one head is to be added arranged during the moving route of Y coarse movement stage 24 so that the substrate measurement system can continue to measure the position information on substrate holder 32. Note that in the case of using the at least one head provided separately from the pair of measurement tables 1782, the linkage process described earlier may be performed using the measurement information on the pair of measurement tables 1782.

Similarly, in the first to the twenty-second embodiments described above, the XZ head described earlier may be used instead of each X head 74x, along with using the YZ head described earlier instead of each Y head 74y. In such a case, with a pair of XZ heads and a pair of YZ heads and an encoder system including a scale that these heads can face, position information on at least one of rotation (θz) and tilt (at least one of θx and θy) of a plurality of heads 74x and 74y may be measured.

Note that while a grating was formed (the surface is a grating surface) on the surface of scales 72, 78, 2072 and the like, for example, a cover member (such as glass or a thin film) that covers the grating may be provided so that the grating surface is formed inside the scale.

Note that in the seventeenth embodiment described above, while the case has been described in which one pair each of X head 80x and Y head 80y are provided at measurement table 1782, along with the heads for measuring the position of Y coarse movement stage 24, one pair each of X head 80x and Y head 80y may be provided at the heads used for measuring the position of Y coarse movement stage 24 without being provided at measurement table 1782.

Note that in the description so far, while the case has been described in which the measurement directions within the XY plane of each head that the substrate encoder system is equipped with is the X-axis direction or the Y-axis direction, the embodiments are not limited to this, and for example, instead of the two-dimensional grating, a two-dimensional grating may be used that has periodic direction in two directions (called α direction and β direction for convennience) intersecting with the X-axis direction and the Y-axis direction and also being orthogonal to each other within the XY plane, and corresponding to this, as each head described earlier, heads with measurement directions in the α direction (and the Z-axis direction) or the β direction (and the Z-axis direction) may be used. Also, in the first embodiment described earlier, instead of each X scale and Y scale, for example, a one-dimensional grating whose periodic direction is in the α direction or β direction may be used, and corresponding to this, as each head described earlier, heads with measurement directions in the α direction (and the Z-axis direction) or the β direction (and the Z-axis direction) may be used.

Note that in the twentieth to the twenty-second embodiments described above, the first grating group may be structured by the row of X scales described earlier and the second grating group may be structured by the row of Y scales described earlier, and corresponding to this, a plurality of X heads (or XZ heads) that can face the X scales may be arranged at a predetermined spacing (spacing wider than the spacing between adjacent X scales) along with a plurality of Y heads (or YZ heads) that can face the Y scales being arranged at a predetermined spacing (spacing wider than the spacing between adjacent Y scales).

Note that in the twentieth to the twenty-second embodiments described above, as each scale arranged side by side in the X-axis direction or the Y-axis direction, a plurality of scales of different lengths may naturally be used. In this case, when two or more rows of scales having the same or orthogonal periodic directions are provided side by side, scales may be chosen with lengths that can be set so that the spacing between the scales do not overlap one another. That is, the arrangement spacing of the space between the scales structuring one row of scales does not have to be an equal spacing. Also, for example, in the row of scales on the coarse movement stage, the scales arranged in the center may have a length in the X-axis direction physically longer than that of the scales (scales arranged at each edge in the row of scales) arranged at both ends in the X-axis direction.

Note that in each of the sixth, the seventh, the sixteenth, and the seventeenth embodiments described above, while measurement table encoders only have to measure position information on at least the measurement table in the movement direction (the Y-axis direction in the embodiments described above), position information in at least one direction (at least one of X, Z, θx, θy, and θz) different from the movement direction may also be measured. For example, position information in the X-axis direction of a head (X head) whose measurement direction is in the X-axis direction may also be measured, and position information in the X-axis direction may be obtained with this X information and measurement information on the X head. However, with the head (Y head) whose measurement direction is in the Y-axis direction, position information in the X-axis direction orthogonal to the measurement direction does not have to be used. Similarly, with the X head, position information in the Y-axis direction orthogonal to the measurement direction does not have to be used. In short, position information on substrate holder 622 and the like in the measurement direction may be obtained, by measuring position information in at least one direction different from the measurement direction of the heads, and using this measurement information and measurement information on the heads. Also, for example, position information (rotation information) of the movable head in the θz direction may be measured using two measurement beams having different positions in the X-axis direction, and by using this rotation information with measurement information on the X head and the Y head, position information on substrate holder 622 in the X-axis and the Y-axis directions may be obtained. In this case, by arranging two of one of the X heads and Y heads and one of the other of the X heads and Y heads so that the two heads having the same measurement direction are not arranged at the same position in the direction orthogonal to the measurement direction, position information in the X direction, the Y direction, and the θz direction can be measured. The other head preferably irradiates a position different from the two heads with the measurement beam. Moreover, if the heads of encoders for movable heads is an XZ head or a YZ head, by arranging, for example, two of one of the XZ heads and the YZ heads and one of the other so that the heads are not located on the same straight line, not only Z information but also position information (tilt information) in the θx direction and the θy direction can be measured. Position information in the X-axis direction and the Y-axis direction may be obtained by at least one of the position information in the θx direction and the θy direction and the measurement information on the X heads and Y heads. Similarly, position information on the movable heads in a direction different from the Z-axis direction may also be measured with XZ heads or YZ heads, and with this measurement information and measurement information on the movable heads, position information in the Z-axis direction may be obtained. Note that if the scales of the encoders measuring the position information on the movable heads is a single scale (grating area), then XYθz and Zθxθy can be measured by three heads, however, in the case a plurality of scales (grating areas) are arranged separately, two each of X heads and Y heads, or two each of XZ heads and YZ heads should be arranged, and the spacing in the X-axis direction should be set so that the non-measurement period among the four heads do not overlap one another. While this explanation was made on the premise of the grating area being arranged parallel to the XY plane, this also can be applied similarly to a scale having a grating area parallel to the YZ plane.

Also, in each of the sixth, the seventh, the sixteenth, and the seventeenth embodiments described above, while the encoder was used as the measurement device for measuring position information on the measurement table, devices other than the encoder, such as, for example, an interferometer may also be used. In this case, for example, a reflection surface may be provided at the movable head (or its holding section) and a measurement beam parallel to the Y-axis direction should be irradiated on the reflection surface. Especially when the movable head is moved only in the Y-axis direction, the reflection surface does not have to be large, which makes it easy to locally air-condition the optical path of the interferometer beam to reduce air fluctuation.

Also, in the seventeenth embodiment described above, while the movable heads that irradiate the scales of Y coarse movement stage 24 with measurement beams are arranged one each in the Y-axis direction on both sides of the projection system, the movable head may each be arranged in a plurality of numbers. For example, if adjacent movable heads (measurement beams) are arranged so that the measurement period of a plurality of movable heads partly overlaps in the Y-axis direction, the plurality of movable heads can continue to measure position information even if Y coarse movement stage 24 moves in the Y-axis direction. In this case, linkage process becomes necessary among the plurality of movable heads. Therefore, measurement information on a plurality of heads arranged only on one side of the +Y side and the −Y side of the projection system irradiating measurement beams on at least one scale may be used to acquire correction information related to another head whose measurement beam is within the scale, or measurement information on not only the heads arranged on the +Y side but at least one head arranged on the other side may also be used. In short, of the plurality of heads each arranged on the +Y side and the −Y side, measurement information on at least three heads irradiating measurement beams on the scale may preferably be used.

Also, with the substrate measurement system of the twentieth to the twenty-second embodiments described above, while a plurality of scales (grating areas) is arranged separately in the scanning direction (the X-axis direction) in which substrate P is moved on scanning exposure, along with a plurality of heads being movable in the stepping direction (the Y-axis direction), conversely, the plurality of scales may be arranged in the step direction (the Y-axis direction) along with the plurality of heads being movable in the scanning direction (the X-axis direction).

Also, in the first to the twenty-second embodiments described above, the heads of the encoder system do not necessarily have to have the entire optical system that irradiates a scale with a beam from the light source, and may have only a part of the optical system, such as for example, the light-emitting section.

Also, in the twentieth to the twenty-second embodiments described above, the heads of the pair of head bases 88 are not limited to the arrangement in FIG. 71 (X heads and Y heads are arranged on the +Y side and the −Y side, and on the +Y side and the −Y side, the arrangement of the X head and Y head on one side is opposite to the other side in the X-axis direction), and for example, X heads and Y heads may be arranged on the +Y side and the −Y side, and on the +Y side and the −Y side, the arrangement of the X head and Y head on one side may be the same as that of the other side in the X-axis direction. However, in the case the X position of two Y heads is the same, when measurement of one of the two X heads is cut off, then the θz information can no longer be measured, therefore, the X position of the two Y heads should preferably be different.

Also, in the first to the twenty-second embodiments described above, in the case the scales (scale members, grating section) irradiated with the measurement beams from the heads of the encoder system are provided at the projection optical system 16 side, the scales provided are not limited to only a part of apparatus main section 18 (frame member) supporting projection optical system 16, and may be provided at the barrel part of projection optical system 16.

Also, in the first to the twenty-second embodiments described above, while the case has been described in which the movement direction (scanning direction) of mask M and substrate P at the time of scanning exposure is in the X-axis direction, the scanning direction may be in the Y-axis direction. In this case, long stroke direction of the mask stage has to be set in a direction rotated by 90 degrees around the Z-axis, along with having to rotate the direction of projection optical system 16 by 90 degrees around the Z-axis.

Note that in the twentieth to the twenty-second embodiments described above, in the case a scale group (row of scales) in which a plurality of scales is continuously arranged in the X-axis direction with gaps of a predetermined spacing in between is arranged on Y coarse movement stage 24, in a plurality of rows at different positions separate in the Y-axis direction (e.g. a position on one side (+Y side) and a position on the other side (−Y side) with respect to projection optical system 16), a structure may be employed so that the plurality of scale groups (plurality of rows of scales) can be used differently, depending on the arrangement of shots (shot map) on the substrate. For example, by making the whole length of the plurality of rows of scales different from one another between the rows of scales, the scales are applicable to different shot maps, and are also applicable to changes in the number of shot areas formed on the substrate, as in the case of a four piece setting and the case of a six piece setting. Also, along with this arrangement, if position of gaps of each row of scales are made to be at different positions in the X-axis direction, the heads corresponding to each of the plurality of rows of scales do not move off away from the measurement range simultaneously, which allows the number of sensors considered as an undefined value in linkage process to be reduced and the linkage process to be performed with high precision.

Also, in a scale group (row of scales) in which a plurality of scales arranged in the X-axis direction is continuously arranged with gaps of a predetermined spacing in between on Y coarse movement stage 24, the length in the X-axis direction of one scale (pattern for X-axis measurement) may be a length that can be continuously measured only by a length of one shot area (the length in which a device pattern is irradiated and formed on a substrate when exposure is performed while moving the substrate on the substrate holder in the X-axis direction). This makes position measurement (position control) of substrate P (substrate holder) during scanning exposure easy, since relay control of heads with respect to the plurality of scales does not have to be performed during the scanning exposure of one shot area.

Also, in the first to the twenty-second embodiments described above, to acquire position information during the movement of the substrate stage device which moves to the substrate exchange position with the substrate loader, a scale for substrate exchange may be provided at the substrate stage device or at another stage device, and the substrate measurement system may use downward heads to acquire the position information on the substrate stage device. Or, a head for substrate exchange may be provided at the substrate stage device or another stage device, and position information on the substrate stage device may be acquired by measuring the scale or the scale for substrate exchange.

Also a position measurement system (e.g., a mark on a stage and an observation system for observing the mark) separate from the encoder system may be provided to perform exchange position control (management) of the stage.

Note that the substrate stage device only has to be able to at least move substrate P along the horizontal plane in long strokes, and in some cases does not have to be able to perform fine position setting in directions of six degrees of freedom. The substrate encoder system according to the first to twenty-second embodiments described above can also be suitably applied to such a two-dimensional stage device.

Also, the illumination light may be an ultraviolet light such as an ArF excimer laser beam (wavelength 193 nm) or a KrF excimer laser beam (wavelength 248 nm), or a vacuum ultraviolet light such as an $F_2$ laser beam (wavelength 157 nm). Also, as the illumination light, a harmonic wave may be used, which is a single-wavelength laser beam in the infrared or visual region oscillated from a DFB semiconductor laser or a fiber laser as vacuum ultraviolet light that is amplified by a fiber amplifier doped by, e.g. erbium (or both erbium and ytterbium), and then is subject to wavelength conversion into ultraviolet light using a nonlinear crystal. Also, a fixed laser (wavelength: 355 nm, 266 nm) may also be used.

Also, while the case has been described where projection optical system 16 is a projection optical system of a multiple lens method equipped with a plurality of optical systems, the number of projection optical systems is not limited to this, and one or more will be fine. Also, the projection optical system is not limited to the projection optical system of a multiple lens method, and may also be an Offner type projection optical system which uses a large mirror. Also, as projection optical system 16, a magnifying system or a reduction system may also be used.

Also, the exposure apparatus is not limited to the exposure apparatus for liquid crystals which transfers the liquid crystal display device pattern onto a square-shaped glass plate, and may also be widely applied to an exposure apparatus for manufacturing organic EL (Electro-Luminescence) panels, an exposure apparatus for manufacturing semiconductors, or to an exposure apparatus for manufacturing thin film magnetic heads, micro-machines, and DNA chips and the like. Also, the above embodiments can be applied not only to an exposure apparatus for manufacturing micro-devices such as semiconductors, but also to an exposure apparatus that transfers a circuit pattern onto a glass substrate or a silicon wafer to manufacture a reticle or a mask used in an optical exposure apparatus, an EUV exposure apparatus, an X-ray exposure apparatus, and an electron-beam exposure apparatus.

Also, the object subject to exposure is not limited to a glass plate, and may also be other objects, such as, for example, a wafer, a ceramic substrate, a film member, or a mask blank. Also, in the case the exposure object is a substrate for a flat panel display, the thickness of the substrate is not limited in particular, and includes a film-like substrate (a sheet-like member having flexibility). Note that the exposure apparatus of the embodiments is especially effective in the case when the exposure object is a substrate whose length of a side or diagonal length is 500 mm or more.

Electronic devices such as liquid crystal display devices (or semiconductor devices) are manufactured through the steps such as; a step for performing function/performance design of a device, a step for making a mask (or a reticle) on the basis of this design step, a step for making a glass substrate (or a wafer), a lithography step for transferring a pattern of a mask (reticle) onto the glass substrate by the exposure apparatus and the exposure method described in each of the above embodiments, a development step for developing the glass substrate which has been exposed, an etching step for removing by etching an exposed member of an area other than the area where the resist remains, a resist removing step for removing the resist that is no longer necessary since etching has been completed, a device assembly step, and an inspection step. In this case, in the lithography step, because the device pattern is formed on the glass substrate by carrying out the exposure method previously described using the exposure apparatus of the embodiments described above, a highly integrated device can be manufactured with good productivity.

Note that the plurality of requirements in each of the embodiment described above can be appropriately combined. Accordingly, a part of the plurality of requirements in each of the embodiments described above does not have to be used.

Note that the disclosures of all publications, International Publications, U.S. Patent Application Publications and U.S. Patents related to the exposure apparatus and the like quoted in each of the embodiments above, in their entirety, are incorporated herein by reference as a part of the present specification.

INDUSTRIAL APPLICABILITY

As is described so far, the movable body apparatus and the moving method of the present invention are suitable for moving an object. Also, the exposure apparatus and the exposure method of the present invention are suitable for performing exposure on an object. Also, the manufacturing method of a flat-panel display of the present invention is suitable for manufacturing flat panel displays. Also, the device manufacturing method of the present invention is suitable for manufacturing micro-devices.

REFERENCE SIGNS LIST

10 . . . liquid crystal exposure apparatus,
20 . . . substrate stage device,
24 . . . Y coarse movement stage,
32 . . . substrate holder,
70 . . . substrate measurement system,
72 . . . upward scale,
74x . . . downward X head
74y . . . downward Y head,
78 . . . downward scale,
80x . . . upward X head,
80y . . . upward Y head,
100 . . . main controller,
P . . . substrate.

The invention claimed is:

1. A movable body apparatus, comprising:
a first movable body that holds an object and can move in a first direction and a second direction intersecting with each other;
a second movable body that can move in the second direction;
a reference member that serves as a reference on movement of the first movable body in the first direction and the second direction;
a first measurement system that acquires position information on the first movable body with respect to the reference member with a plurality of first heads and a first grating member, the plurality of first heads being provided at one of the first movable body and the second movable body and the first grating member being provided at the other of the first movable body and the second movable body, the first grating member having measurement components in the first direction and the second direction that allow measurement of a moving range in the first direction of the first movable body by a plurality of grating areas arranged separately from one another in the first direction;
a second measurement system that acquires position information on the second movable body with respect to the reference member with a second head and a second grating member, the second head being provided at one of the second movable body and the reference member, the second grating member being provided at the other of the second movable body and the reference member, and the second grating member having measurement components in the first direction and the second direction that allow measurement of a moving range in the second direction of the second movable body; and a control system that controls a position of the first movable body in the first direction and the second direction with respect to the reference member, based on measurement information on at least three heads irradiating at least one of the plurality of grating areas with measurement beams, of the plurality of first heads, and the position information acquired by the second measurement system, wherein
the first measurement system acquires the position information on the first movable body by irradiating the first grating member with a measurement beam while the first head is moved in the first direction with respect to the first grating member,
the second measurement system acquires the position information on the second movable body by irradiating the second grating member with a measurement beam while the second head is moved in the second direction with respect to the second grating member,
during movement of the first movable body in the first direction, the measurement beam of each of the plurality of first heads moves off from one grating area of the plurality of grating areas and switches to another grating area adjacent to the one grating area, and
the control system acquires correction information to control movement of the first movable body using another head of the plurality of first heads based on measurement information on the at least three heads, or position information on the first movable body measured using the at least three heads, the another head being different from the at least three heads, and the measurement beam of the another head that has moved off from the one grating area switching to the another grating area.

2. The movable body apparatus according to claim 1, wherein
the correction information is acquired, while each of the measurement beams of at least four heads including the at least three heads and the another head is irradiated on at least one of the plurality of grating areas including the another grating area.

3. The movable body apparatus according to claim 1, wherein
the correction information is acquired before the measurement beam of one of the at least three heads moves off from at least one of the plurality of grating areas including the another grating area.

4. The movable body apparatus according to claim 1, wherein
before the measurement beam of one of the at least three heads moves off from at least one of the plurality of grating areas including the another grating area, the first measurement system measures position information on the first movable body using at least three heads including the another head for which the correction information has been acquired, instead of the one of the at least three heads.

5. The movable body apparatus according to claim 1, wherein
before the measurement beam of one of the at least three heads moves off from at least one of the plurality of grating areas including the another grating area, the control system switches movement control of the first movable body using the at least three heads to movement control of the first movable body using at least three heads including the another head for which the correction information has been acquired, instead of the one of the at least three heads.

6. The movable body apparatus according to claim 1, wherein
the first grating member has another plurality of grating areas different from the plurality of grating areas, the another plurality of grating areas being different in position in the second direction from the plurality of grating areas, and being arranged separately from each other in the first direction, and
at least one of the plurality of heads irradiates at least one of the another plurality of grating areas with the measurement beam, and also the at least one of the plurality of heads is used in measurement of position information on the first movable body instead of the at least one of the at least three heads whose measurement beams are irradiated on at least one of the plurality of grating areas.

7. The movable body apparatus according to claim 1, wherein
each of the plurality of first heads has a measurement direction in two directions that are one of two directions intersecting each other within a predetermined plane and a third direction orthogonal to the predetermined plane, the predetermined plane including the first direction and the second direction, and
the first measurement system can measure position information on the first movable body using the at least three heads in directions of three degrees of freedom including the third direction, different from directions of three degrees of freedom within the predetermined plane.

8. The movable body apparatus according to claim 7, wherein
the correction information includes correction information to control movement of the first movable body in the third direction using the another head.

9. An exposure apparatus, comprising:
the movable body apparatus according to claim 1; and
an optical system that irradiates the object with an energy beam, and exposes the object.

10. The exposure apparatus according to claim 9, wherein the first direction is a direction in which the object is relatively moved with respect to the optical system by the first movable body at a time of the exposure.

11. The exposure apparatus according to claim 9, wherein the second direction is a direction in which the object having a plurality of divided areas is moved to change a target area of the exposure.

12. The exposure apparatus according to claim 9, wherein the object is a substrate used in a flat-panel display.

13. The exposure apparatus according to claim 12, wherein
the substrate has at least one of a length of a side and a diagonal length that is 500 mm or more, and is used in a flat panel display.

14. A flat panel display manufacturing method, comprising:
exposing a substrate using the exposure apparatus according to claim 9; and
developing the substrate that has been exposed.

15. A device manufacturing method, comprising:
exposing a substrate using the exposure apparatus according to claim 9; and
developing the substrate that has been exposed.

16. A movable body apparatus, comprising:
a first movable body that holds an object and can move in a first direction and
a second direction intersecting with each other,
a second movable body that can move in the second direction;
a reference member that serves as a reference on movement of the first movable body in the first direction and the second direction;
a first measurement system that acquires position information on the first movable body with respect to the reference member with a plurality of first heads and a first grating member, the plurality of first heads being provided at one of the first movable body and the second movable body, the first grating member being provided at the other of the first movable body and the second movable body, and the first grating member having measurement components in the first direction and the second direction, a plurality of first grating areas arranged separately from one another in the first direction and a plurality of second grating areas arranged separately in the first direction at a position different from the plurality of first grating areas in the second direction that allow measurement of a moving range in the first direction of the first movable body;
a second measurement system that acquires position information on the second movable body with respect to the reference member with a second head and a second grating member, the second head being provided at one of the second movable body and the reference member, the second grating member being provided at the other of the second movable body and the reference member, and the second grating member having measurement components in the first direction and the second direction that allow measurement of a moving range in the second direction of the second movable body; and
a control system that controls a position of the first movable body in the first direction and the second direction with respect to the reference member, based on measurement information on at least three heads irradiating at least two of the plurality of the first and the second grating areas with measurement beams, of the plurality of first heads, and the position information acquired by the second measurement system, wherein
the first measurement system acquires the position information on the first movable body by irradiating the first grating member with a measurement beam while the first head is moved in the first direction with respect to the first grating member,
the second measurement system acquires the position information on the second movable body by irradiating the second grating member with a measurement beam while the second head is moved in the second direction with respect to the second grating member,
while the first movable body moves in the first direction, the measurement beam of each of the plurality of first heads moves off from one first or second grating area of the plurality of first grating areas and the plurality of second grating areas, and also switches to another first or second grating area adjacent to the one first or second grating area, and
the control system acquires correction information to control movement of the first movable body using another head of the plurality of first heads based on measurement information on the at least three heads, or position information on the first movable body measured using the at least three heads, the another head being different from the at least three heads, and the measurement beam of the another head that has moved off from the one first or second grating area switching to the another first or second grating area.

17. The movable body apparatus according to claim 16, wherein
the correction information is acquired, while each of the measurement beams of at least four heads including the at least three heads and the another head is irradiated on at least two of the plurality of first grating areas and the plurality of second grating areas including the another first or second grating area.

18. The movable body apparatus according to claim 16, wherein
the correction information is acquired before the measurement beam of one of the at least three heads moves off from at least two of the plurality of the first grating areas and the plurality of second grating areas including the another first or second grating area.

19. The movable body apparatus according to claim 16, wherein
before the measurement beam of one of the at least three heads moves off from at least two of the plurality of the first grating areas and the plurality of second grating areas including the another first or second grating area, the first measurement system measures position information on the first movable body using at least three heads including the another head for which the correction information has been acquired, instead of the one of the at least three heads.

20. The movable body apparatus according to claim 16, wherein
before the measurement beam of one of the at least three heads moves off from at least two of the plurality of first grating areas and the plurality of the second grating areas including the another first or second grating area, the control system switches movement control of the first movable body using the at least three heads, to a movement control of the first movable body using at least three heads including the another head for which the correction information has been acquired, instead of the one of the at least three heads.

21. The movable body apparatus according to claim 16, wherein
the at least three heads include at least one head that irradiates at least one of the plurality of first grating areas with the measurement beam and at least two heads that irradiate at least one of the plurality of second grating areas with the measurement beams.

22. The movable body apparatus according to claim 16, wherein
the plurality of first heads include at least two heads that irradiate the measurement beams with a spacing in between that is wider than a spacing between a pair of first grating areas adjacent to each other of the plurality of the first grating areas in the first direction, and at least two heads that irradiate the measurement beams with a spacing in between that is wider than a spacing between a pair of second grating areas adjacent to each other of the plurality of second grating areas in the first direction.

23. The movable body apparatus according to claim 16, wherein
the plurality of first grating areas and the plurality of second grating areas are each formed on a plurality of scales different from each other, and each have a reflective two-dimensional grating or two reflective one-dimensional gratings whose arrangement directions are different from each other.

24. The movable body apparatus according to claim 16, wherein
each of the plurality of first heads has a measurement direction in two directions that are one of two directions intersecting each other within a predetermined plane and a third direction orthogonal to the predetermined plane, the predetermined plane including the first direction and the second direction, and
the first measurement system can measure position information on the first movable body using the at least three heads in directions of three degrees of freedom including the third direction, different from directions of three degrees of freedom within the predetermined plane.

25. The movable body apparatus according to claim 24, wherein
the correction information includes correction information to control movement of the first movable body in the third direction using the another head.

26. An exposure apparatus, comprising:
the movable body apparatus according to claim 16; and
an optical system that irradiates the object with an energy beam, and exposes the object.

27. The exposure apparatus according to claim 26, wherein
the first direction is a direction in which the object is relatively moved with respect to the optical system by the first movable body at a time of the exposure.

28. The exposure apparatus according to claim 26, wherein
the second direction is a direction in which the object having a plurality of divided areas is moved to change a target area of the exposure.

29. The exposure apparatus according to claim 26, wherein
the object is a substrate used in a flat-panel display.

30. The exposure apparatus according to claim 29, wherein
the substrate has at least one of a length of a side and a diagonal length that is 500 mm or more, and is used in a flat panel display.

31. A flat panel display manufacturing method, comprising:
exposing a substrate using the exposure apparatus according to claim 26; and
developing the substrate that has been exposed.

32. A device manufacturing method, comprising:
exposing a substrate using the exposure apparatus according to claim 26; and
developing the substrate that has been exposed.

33. A movable body apparatus that moves an object with respect to a first member, the apparatus comprising:
a first movable body that holds the object and can move with respect to the first member in a first direction and a second direction intersecting each other;
a second movable body that can move in the second direction with respect to the first member;
a drive system that moves the first movable body and the second movable body in the second direction;
a first measurement system that acquires position information on the first movable body with respect to the second movable body, by a plurality of first heads provided at one of the first movable body and the second movable body and a first grating member provided at the other of the first movable body and the second movable body, the first grating member having a plurality of first grating areas arranged separately from one another in the first direction;

a second measurement system that acquires position information on the second movable body with respect to the first member, by a second head provided at one of the second movable body and the first member and a second grating member provided at the other of the second movable body and the first member; and a control system that controls a position of the first movable body in the first direction and the second direction with respect to the first member, based on measurement information on a head irradiating at least one of the plurality of grating areas with the measurement beam, of the plurality of first heads, and the position information acquired by the second measurement system, wherein during movement of the first movable body in the first direction, the measurement beam of each of the plurality of first heads moves off from one grating area of the plurality of first grating areas and switches to another grating area adjacent to the one grating area, and the control system acquires correction information to control movement of the first movable body using another head different from a head whose measurement beam having moved off from the one grating area switches to the another grating area, of the plurality of first heads, based on measurement information on the head.

34. The movable body apparatus according to claim 33, wherein
the first member is a reference member serving as a reference on movement of the first movable body.

35. The movable body apparatus according to claim 33, wherein
each of the plurality of first heads has a measurement direction in two directions that are one of two directions intersecting each other within a predetermined plane and a third direction orthogonal to the predetermined plane, the predetermined plane including the first direction and the second direction, and
the first measurement system can measure position information on the first movable body using the at least three heads in directions of three degrees of freedom including the third direction, different from directions of three degrees of freedom within the predetermined plane.

36. The movable body apparatus according to claim 35, wherein
the correction information includes correction information to control movement of the first movable body in the third direction using the another head.

37. An exposure apparatus, comprising:
the movable body apparatus according to claim 33; and
an optical system that irradiates the object with an energy beam, and exposes the object.

38. The exposure apparatus according to claim 37, wherein
the first direction is a direction in which the object is relatively moved with respect to the optical system by the first movable body at a time of the exposure.

39. The exposure apparatus according to claim 37, wherein
the second direction is a direction in which the object having a plurality of divided areas is moved to change a target area of the exposure.

40. The exposure apparatus according to claim 37, wherein
the object is a substrate used in a flat-panel display.

41. The exposure apparatus according to claim 40, wherein
the substrate has at least one of a length of a side and a diagonal length that is 500 mm or more, and is used in a flat panel display.

42. A flat panel display manufacturing method, comprising:
exposing a substrate using the exposure apparatus according to claim 37; and
developing the substrate that has been exposed.

43. A device manufacturing method, comprising:
exposing a substrate using the exposure apparatus according to claim 37; and
developing the substrate that has been exposed.

44. A moving method, comprising:
moving a first movable body that holds an object with respect to a reference member in a first direction and a second direction intersecting each other;
moving the first movable body in the second direction by a second movable body;
acquiring position information on the first movable body with respect to the reference member by a first measurement system having a plurality of first heads and a first grating member, the plurality of first heads being provided at one of the first movable body and the second movable body, the first grating member being provided at the other of the first movable body and the second movable body, and the first grating member having measurement components in the first direction and the second direction that allow measurement of a moving range in the first direction of the first movable body by a plurality of grating areas arranged separately from one another in the first direction;
acquiring position information on the second movable body with respect to the reference member by a second measurement system having a second head and a second grating member, the second head being provided at one of the second movable body and the reference member, the second grating member being provided at the other of the second movable body and the reference member, and the second grating member having measurement components in the first direction and the second direction that allow measurement of a moving range in the second direction of the second movable body; and
controlling a position of the first movable body in the first direction and the second direction with respect to the reference member, based on measurement information on at least three heads irradiating at least one of the plurality of grating areas with the measurement beams, of the plurality of first heads, and the position information acquired by the second measurement system, wherein
in the acquiring by the first measurement system, the position information on the first movable body is acquired by the first measurement system irradiating the first grating member with a measurement beam while the first head is moved in the first direction with respect to the first grating member,
in the acquiring by the second measurement system, the position information on the second movable body is acquired by the second measurement system irradiating the second grating member with a measurement beam while the second head is moved in the second direction with respect to the second grating member,
during movement of the first movable body in the first direction, the measurement beam of each of the plurality of first heads moves off from one grating area of the plurality of grating areas and switches to another grating area adjacent to the one grating area, and correction information to control movement of the first movable body using another head of the plurality of first heads is acquired based on measurement information on the at least three heads, or position information on the first movable body measured using the at least three heads, the another head being different from the at least three heads, and the measurement beam of the another head that has moved off from the one grating area switching to the another grating area.

45. An exposure method, comprising:

moving the object in the first direction by the moving method according to claim 44; and irradiating the object moved in the first direction with an energy beam, and exposing the object.

46. A flat-panel display manufacturing method, comprising:

exposing a substrate, as the object, using the exposure method according to claim 45; and developing the substrate that has been exposed.

47. A device manufacturing method, comprising:

exposing a substrate, as the object, using the exposure method according to claim 45; and developing the substrate that has been exposed.

48. A moving method, comprising:

moving a first movable body that holds an object in a first direction and a second direction intersecting each other;

moving the first movable body in the second direction by a second movable body;

acquiring position information on the first movable body with respect to a reference member serving as a reference on movement of the first movable body in the first direction and the second direction, by a first measurement system having a plurality of first heads and a first grating member, the plurality of first heads being provided at one of the first movable body and the second movable body, the first grating member being provided at the other of the first movable body and the second movable body, and the first grating member having measurement components in the first direction and the second direction, a plurality of first grating areas arranged separately from one another in the first direction, and a plurality of second grating areas arranged separately in the first direction at a position different from the plurality of first grating areas in the second direction that allow measurement of a moving range in the first direction of the first movable body;

acquiring position information on the second movable body with respect to the reference member by a second measurement system having a second head and a second grating member, the second head being provided at one of the second movable body and the reference member, the second grating member being provided at the other of the second movable body and the reference member, and the second grating member having measurement components in the first direction and the second direction that allow measurement of a moving range in the second direction of the second movable body; and controlling a position of the first movable body in the first direction and the second direction with respect to the reference member, based on measurement information on at least three heads irradiating at least two of the plurality of first grating areas and the plurality of second grating areas, of the plurality of first heads, and the position information acquired by the second measurement system, wherein in the acquiring by the first measurement system, the position information on the first movable body is acquired by the first measurement system irradiating the first grating member with a measurement beam while moving the first head in the first direction with respect to the first grating member, in the acquiring by the second measurement system, the position information on the second movable body is acquired by the second measurement system irradiating the second grating member with a measurement beam while moving the second head in the second direction with respect to the second grating member, while the first movable body moves in the first direction, the measurement beam of each of the plurality of first heads moves off from one first or second grating area of the plurality of first grating areas and the plurality of second grating areas, and also switches to another first or second grating area adjacent to the one first or second grating area, and in the controlling, correction information to control movement of the first movable body using another head of the plurality of first heads is acquired based on measurement information on the at least three heads, or position information on the first movable body measured using the at least three heads, the another head being different from the at least three heads and the measurement beam of the another head that has moved off from the one first or second grating area switching to the another first or second grating area.

49. An exposure method, comprising:

moving the object in the first direction by the moving method according to claim 48; and irradiating the object moved in the first direction with an energy beam, and exposing the object.

50. A flat-panel display manufacturing method, comprising:

exposing a substrate, as the object, using the exposure method according to claim 49; and developing the substrate that has been exposed.

51. A device manufacturing method, comprising:

exposing a substrate, as the object, using the exposure method according to claim 49; and developing the substrate that has been exposed.

52. A moving method to move an object with respect to a first member, the method comprising:

moving a first movable body holding the object with respect to the first member in a first direction and a second direction intersecting each other;

moving the first movable body in the second direction with respect to the first member by a second movable body;

acquiring position information on the first movable body with respect to the second movable body, by a first measurement system having a plurality of first heads and a first grating member, the plurality of first heads being provided at one of the first movable body and the second movable body, the first grating member being provided at the other of the first movable body and the second movable body, and the first grating member having a plurality of first grating areas arranged separately from one another in the first direction;

acquiring position information on the second movable body with respect to the first member, by a second measurement system having a second head provided at one of the second movable body and the first member and a second grating member provided at the other of the second movable body and the first member; and controlling a position of the first movable body in the first direction and the second direction with respect to the first member, based on measurement information on a head irradiating at least one of the plurality of grating areas with the measurement beam, of the plurality of first heads and the position information acquired by the second measurement system, wherein in the acquiring by the first measurement system, during movement of the first movable body in the first direction, the measurement beam of each of the plurality of first heads moves off from one grating area of the plurality of grating areas and switches to another grating area adjacent to the one grating area, and in the controlling, correction information to control movement of the first movable body using another head different from a head whose measurement beam having moved off from the one grating area switches to the another grating area, of the plurality of heads, is acquired based on measurement information on the head.

53. An exposure method, comprising:

moving the object in the first direction by the moving method according to claim 52; and irradiating the object moved in the first direction with an energy beam, and exposing the object.

54. A flat-panel display manufacturing method, comprising:

exposing a substrate, as the object, using the exposure method according to claim 53; and developing the substrate that has been exposed.

55. A device manufacturing method, comprising:

exposing a substrate, as the object, using the exposure method according to claim 53; and developing the substrate that has been exposed.

* * * * *